United States Patent
Badding et al.

(10) Patent No.: US 10,581,115 B2
(45) Date of Patent: Mar. 3, 2020

(54) ELECTROLYTE FOR A SOLID-STATE BATTERY

(71) Applicant: CORNING INCORPORATED, Corning, NY (US)

(72) Inventors: Michael Edward Badding, Campbell, NY (US); Jacqueline Leslie Brown, Lindley, NY (US); Jennifer Anella Heine, Hammondsport, NY (US); Thomas Dale Ketcham, Horseheads, NY (US); Gary Edward Merz, Rochester, NY (US); Eric Lee Miller, Corning, NY (US); Zhen Song, Painted Post, NY (US); Cameron Wayne Tanner, Horseheads, NY (US); Conor James Walsh, Campbell, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/295,673

(22) Filed: Mar. 7, 2019

(65) Prior Publication Data

US 2019/0207252 A1 Jul. 4, 2019

Related U.S. Application Data

(63) Continuation of application No. PCT/US2017/067376, filed on Dec. 19, 2017.
(Continued)

(51) Int. Cl.
*H01M 10/0562* (2010.01)
*H01M 4/04* (2006.01)
(Continued)

(52) U.S. Cl.
CPC ......... *H01M 10/0562* (2013.01); *B28B 1/30* (2013.01); *C04B 35/62218* (2013.01);
(Continued)

(58) Field of Classification Search
CPC .................................................. H01M 10/0562
See application file for complete search history.

(56) References Cited

U.S. PATENT DOCUMENTS

| 3,223,549 A | 12/1965 | Fredley et al. |
| 4,150,317 A | 4/1979 | Laska et al. |

(Continued)

FOREIGN PATENT DOCUMENTS

| JP | 5096519 A | 4/1993 |
| JP | 08244019 A | 9/1996 |

(Continued)

OTHER PUBLICATIONS

Haken et al; "Refractive Index of Silica Glass: Influence of Fictive Temperature" Journal of Non-Crystalline Solids; 265 (2009) pp. 9-18.
(Continued)

*Primary Examiner* — Robert S Carrico
(74) *Attorney, Agent, or Firm* — Russell S. Magaziner

(57) ABSTRACT

Electrolyte for a solid-state battery includes a body having grains of inorganic material sintered to one another, where the grains include lithium. The body is thin, has little porosity by volume, and has high ionic conductivity.

6 Claims, 84 Drawing Sheets

Related U.S. Application Data

(60) Provisional application No. 62/437,157, filed on Dec. 21, 2016, provisional application No. 62/439,613, filed on Dec. 28, 2016, provisional application No. 62/470,550, filed on Mar. 13, 2017, provisional application No. 62/439,609, filed on Dec. 28, 2016, provisional application No. 62/526,806, filed on Jun. 29, 2017, provisional application No. 62/439,598, filed on Dec. 28, 2016, provisional application No. 62/483,726, filed on Apr. 10, 2017, provisional application No. 62/484,106, filed on Apr. 11, 2017, provisional application No. 62/556,712, filed on Sep. 11, 2017.

(51) Int. Cl.

| | | |
|---|---|---|
| *C04B 35/622* | (2006.01) | |
| *B28B 1/30* | (2006.01) | |
| *H01M 4/1391* | (2010.01) | |
| *H01M 4/131* | (2010.01) | |
| *H01M 4/505* | (2010.01) | |
| *G02B 6/122* | (2006.01) | |
| *H01M 10/0525* | (2010.01) | |
| *H01M 4/136* | (2010.01) | |
| *H01M 4/1397* | (2010.01) | |
| *H01M 4/58* | (2010.01) | |
| *H01M 10/052* | (2010.01) | |
| *H01M 4/02* | (2006.01) | |
| *H01M 4/525* | (2010.01) | |

(52) U.S. Cl.
CPC .......... *G02B 6/122* (2013.01); *H01M 4/0471* (2013.01); *H01M 4/131* (2013.01); *H01M 4/1391* (2013.01); *H01M 4/505* (2013.01); *H01M 10/0525* (2013.01); *H01L 2224/16225* (2013.01); *H01L 2224/48091* (2013.01); *H01L 2224/49107* (2013.01); *H01L 2224/73265* (2013.01); *H01L 2924/181* (2013.01); *H01M 4/136* (2013.01); *H01M 4/1397* (2013.01); *H01M 4/525* (2013.01); *H01M 4/5825* (2013.01); *H01M 10/052* (2013.01); *H01M 2004/028* (2013.01); *H01M 2300/0077* (2013.01)

(56) References Cited

U.S. PATENT DOCUMENTS

| | | |
|---|---|---|
| 4,444,854 A | 4/1984 | Hooke |
| 4,555,250 A | 11/1985 | Horie et al. |
| 4,795,512 A | 1/1989 | Nakatani et al. |
| 5,051,219 A | 9/1991 | Miller |
| 5,089,194 A | 2/1992 | Hoffmann et al. |
| 5,130,067 A | 7/1992 | Flaitz et al. |
| 5,177,260 A | 1/1993 | Kawajiri et al. |
| 5,250,243 A | 10/1993 | Allaire et al. |
| 5,254,191 A | 10/1993 | Mikeska et al. |
| 5,260,249 A | 11/1993 | Shiraishi et al. |
| 5,272,132 A | 12/1993 | Gyorgy et al. |
| 5,322,724 A | 6/1994 | Levens |
| 5,480,601 A | 1/1996 | Yamamoto et al. |
| 5,814,262 A | 9/1998 | Ketcham et al. |
| 5,959,124 A | 9/1999 | Hashiba et al. |
| 6,033,623 A | 3/2000 | Deevi et al. |
| 6,068,828 A | 5/2000 | Hata et al. |
| 6,218,005 B1 | 4/2001 | Moh |
| 6,344,426 B1 | 2/2002 | Hata et al. |
| 6,447,712 B1 | 9/2002 | Dogan et al. |
| 6,787,656 B2 | 9/2004 | Shima et al. |
| 6,832,493 B2 | 12/2004 | Bowden et al. |
| 6,902,790 B1 | 6/2005 | Hata et al. |
| 6,997,015 B2 | 2/2006 | Bowden et al. |
| 7,053,017 B2 | 5/2006 | Hrdina et al. |
| 7,108,827 B1 | 9/2006 | Hata et al. |
| 7,351,492 B2 | 4/2008 | Shimomura et al. |
| RE40,586 E | 11/2008 | Hrdina et al. |
| 7,506,522 B2 | 3/2009 | Bleaking et al. |
| 7,781,045 B2 | 8/2010 | Hata et al. |
| 7,807,257 B2 | 10/2010 | Hata et al. |
| 8,359,884 B2 | 1/2013 | Hawtof |
| 8,540,785 B2 | 9/2013 | Zuyev et al. |
| 8,596,094 B2 | 12/2013 | Duran et al. |
| 8,703,346 B2 | 4/2014 | Satake et al. |
| 8,713,969 B2 | 5/2014 | Duran et al. |
| 8,901,019 B2 | 12/2014 | Annamalai et al. |
| 8,962,518 B2 | 2/2015 | Okamura et al. |
| 8,987,155 B2 | 3/2015 | Annamalai et al. |
| 9,039,921 B2 | 5/2015 | Shih et al. |
| 9,238,352 B2 | 1/2016 | Merz et al. |
| 9,284,149 B2 | 3/2016 | Merz et al. |
| 9,331,355 B2 | 5/2016 | Hata |
| 9,382,150 B2 | 7/2016 | Annamalai et al. |
| 9,466,431 B2 | 10/2016 | Kobatake et al. |
| 9,502,729 B2 | 11/2016 | Badding et al. |
| 9,601,795 B2 | 3/2017 | Hata et al. |
| 9,698,443 B2 | 7/2017 | Hata et al. |
| 9,878,934 B2 | 1/2018 | Shi et al. |
| 10,103,405 B2 | 10/2018 | Choi et al. |
| 10,155,667 B2 | 12/2018 | Badding et al. |
| 2009/0023027 A1 | 1/2009 | Hata |
| 2009/0047562 A1 | 2/2009 | Hata et al. |
| 2010/0119800 A1 | 5/2010 | Yokoyama et al. |
| 2010/0159355 A1 | 6/2010 | Hata et al. |
| 2014/0017579 A1 | 1/2014 | Hata |
| 2015/0044364 A1 | 2/2015 | Katayama et al. |
| 2015/0099188 A1* | 4/2015 | Holme .............. H01M 10/0525 429/231.95 |
| 2015/0255820 A1 | 9/2015 | Shimomura et al. |
| 2016/0049688 A1* | 2/2016 | Sung ................ H01M 10/0562 264/40.1 |
| 2016/0111751 A1* | 4/2016 | Badding ............... C01G 25/006 429/322 |
| 2016/0375607 A1 | 12/2016 | Badding et al. |
| 2017/0021034 A1 | 1/2017 | Markovic et al. |
| 2017/0210634 A1 | 7/2017 | Badding et al. |
| 2017/0214084 A1* | 7/2017 | Cheng ................. C04B 35/4885 |

FOREIGN PATENT DOCUMENTS

| | | |
|---|---|---|
| JP | 9283360 A | 10/1997 |
| JP | 2003328006 A | 11/2003 |
| JP | 4357808 B2 | 11/2009 |
| JP | 2010064255 A | 3/2010 |
| WO | 2009031236 A1 | 3/2009 |
| WO | 2014050124 A1 | 4/2014 |

OTHER PUBLICATIONS

Interantional Search Report and Written Opinion of the International Searching Authority; PCT/US2017/067376; dated March 14, 2018; 26 Pages; Korean Intellectual Property Office.

Lancry et al; "Fictive Temperature in Silica-Based Glasses and Its Application to Optical Fiber Manufacturing"; Progress in Materials Science, 57 (2012); pp. 63-94.

Martinet et al; "Radial Distribution of the Fictive Temperature in Pure Silica Optical Fibers by Micro-Raman Spectroscopy"; J. Appl. Phys. 103 (2008) pp. 083506-1-083506-4.

Search Report and Written Opinion for NL2020149; dated Sep. 24, 2018; 16 Pages; European Patent Office.

European Patent Application No. 18213076.5 Office Action dated Jun. 17, 2019; 5 Pages; European Patent Office.

\* cited by examiner

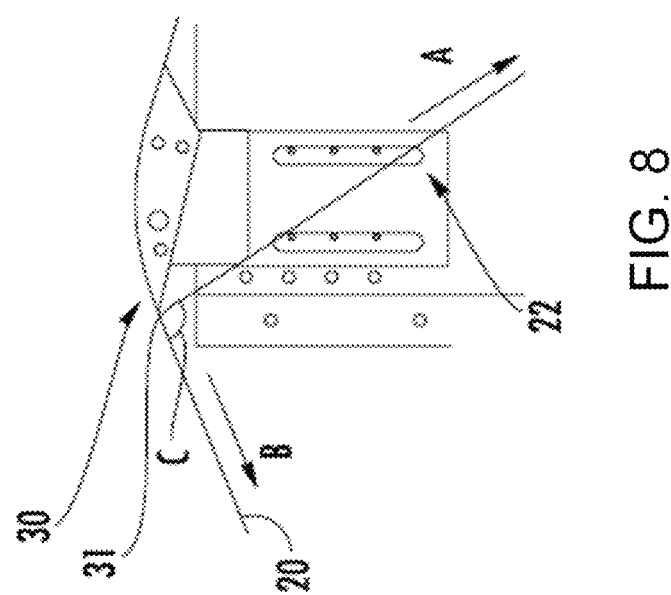
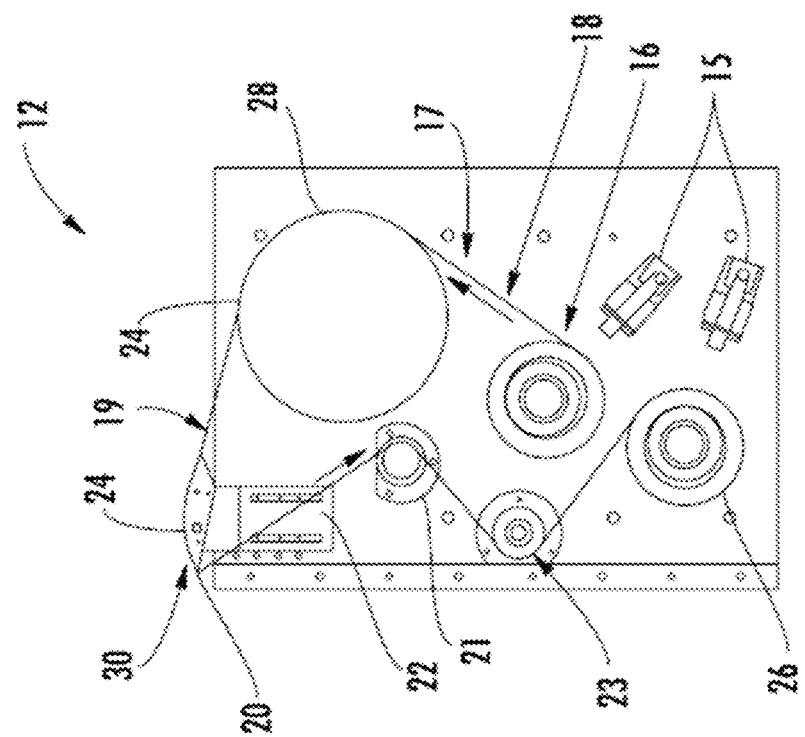

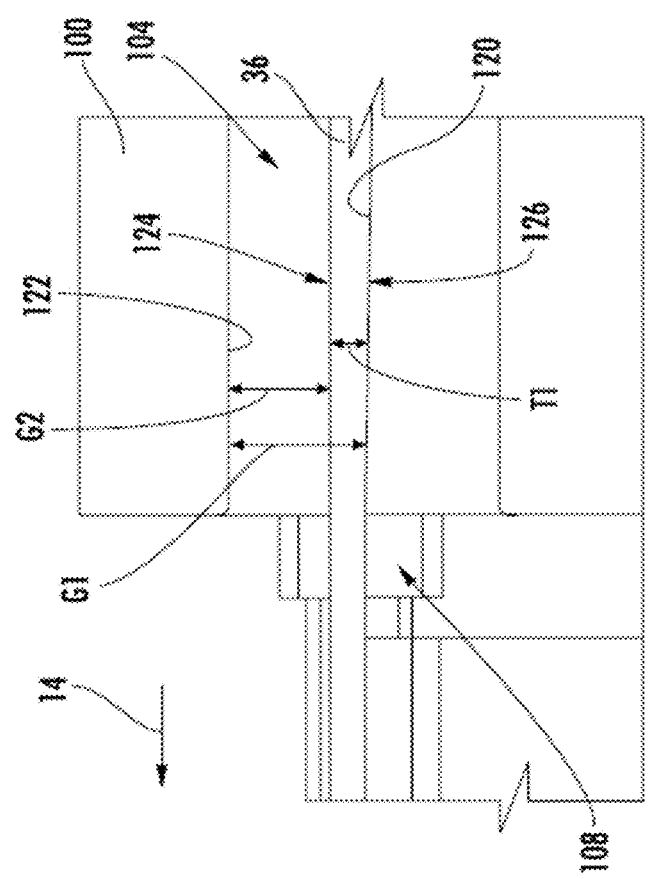
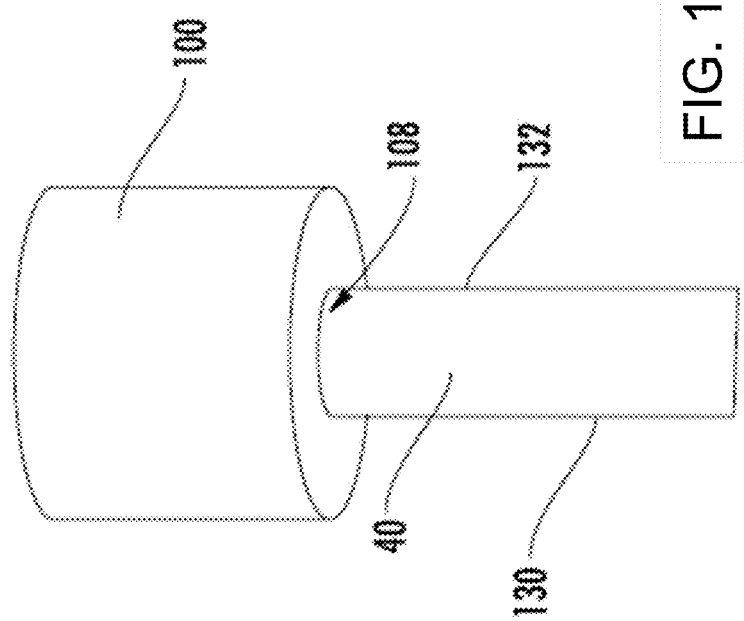
FIG. 13
FIG. 14

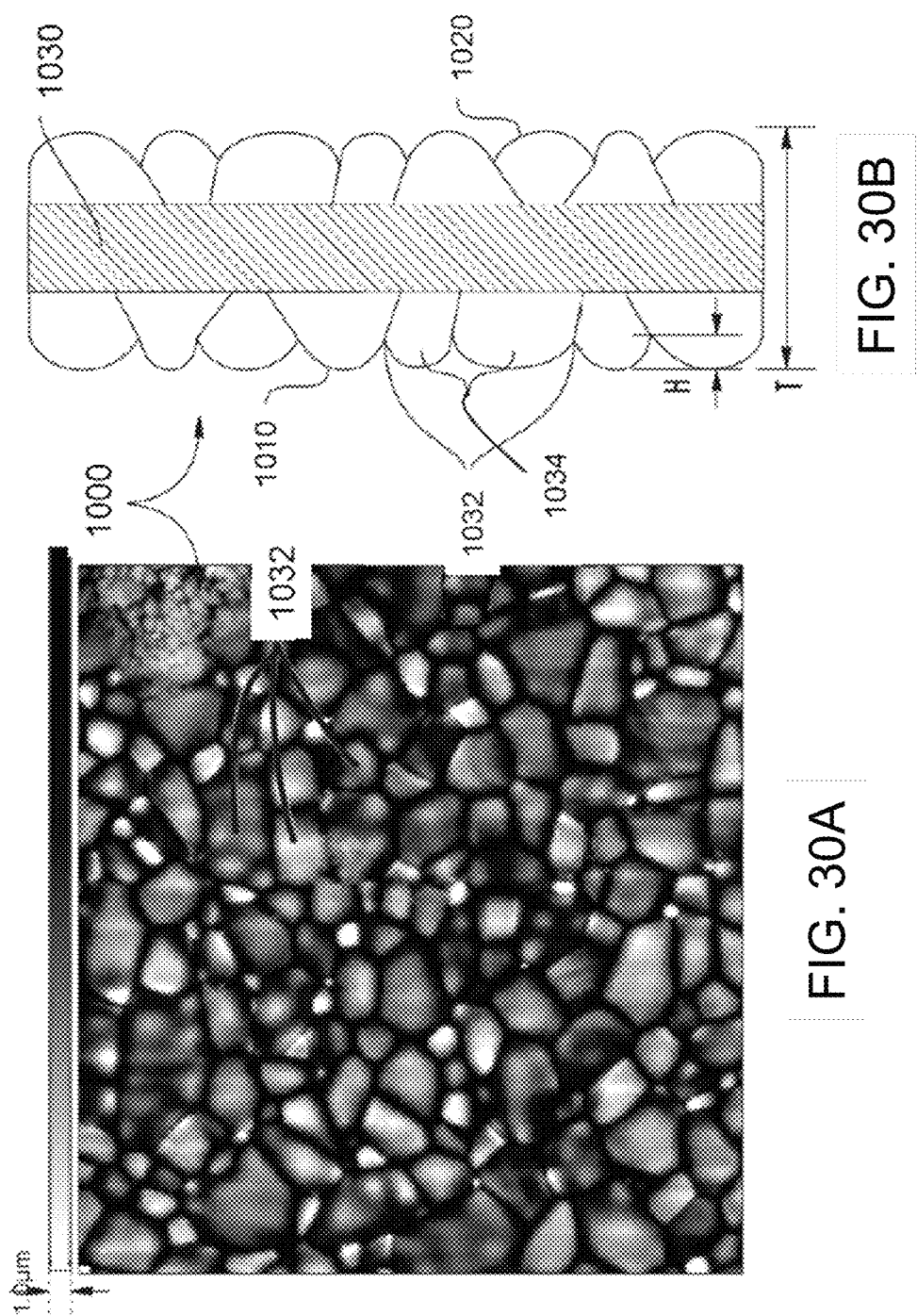

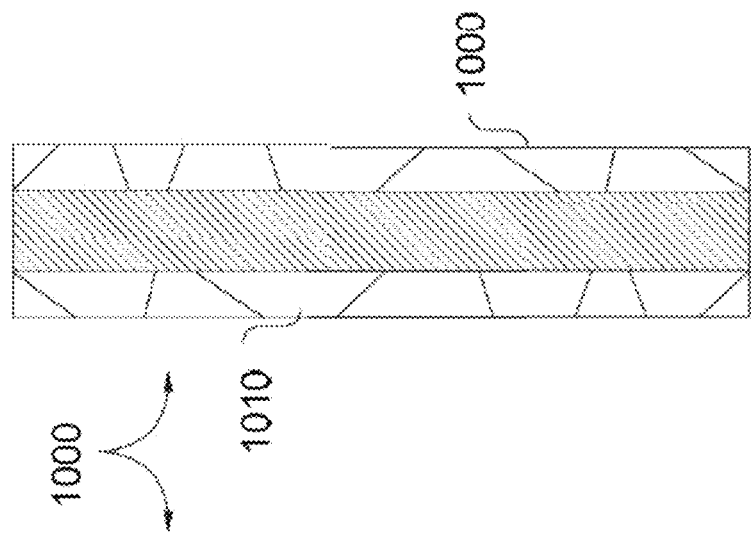
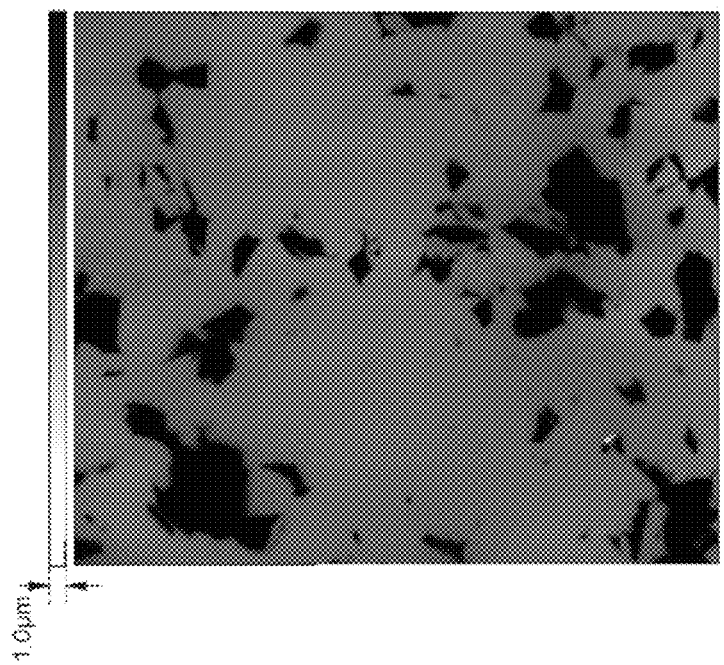
FIG. 31A
FIG. 31B

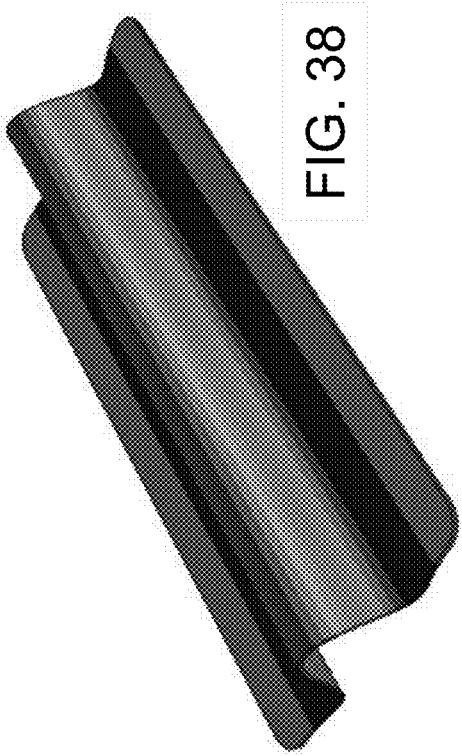

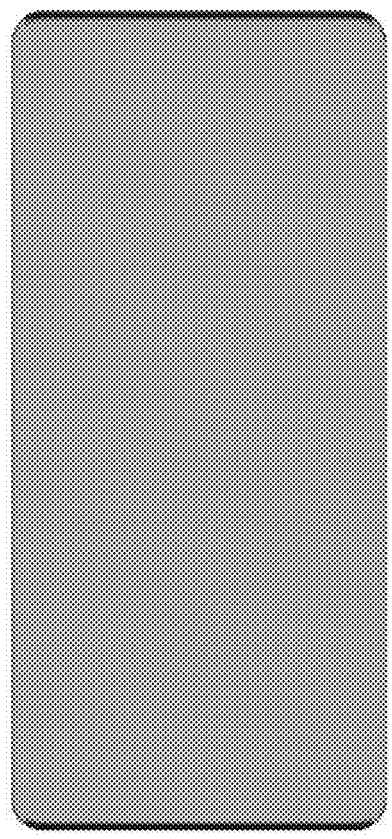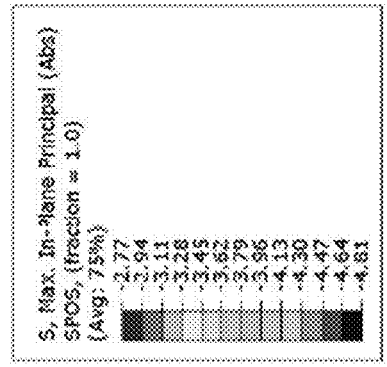
FIG. 43A
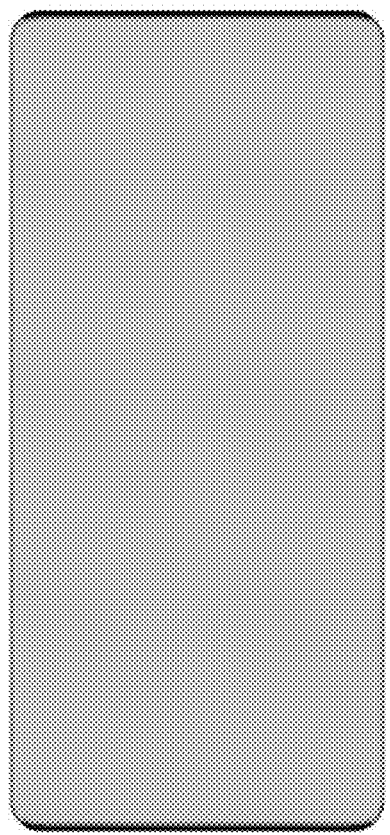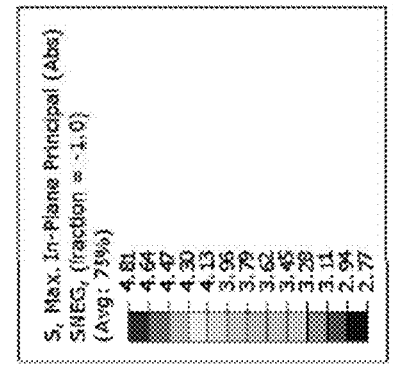
FIG. 43B

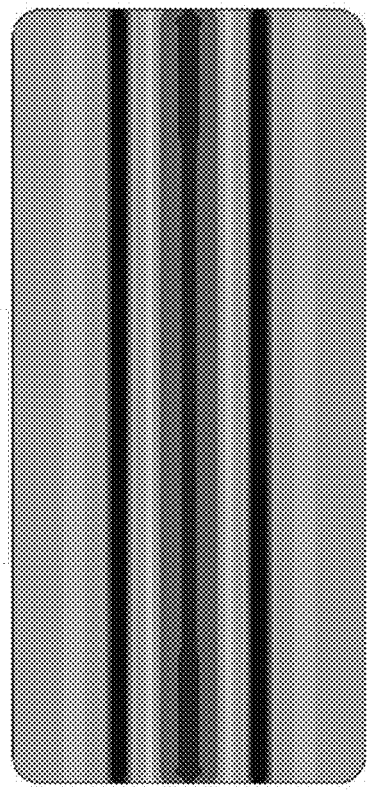
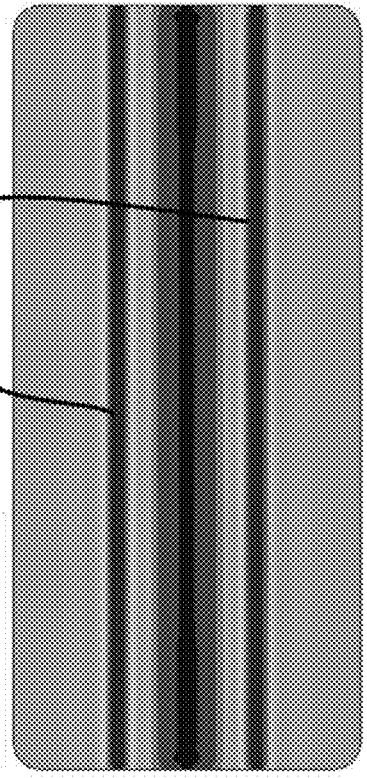

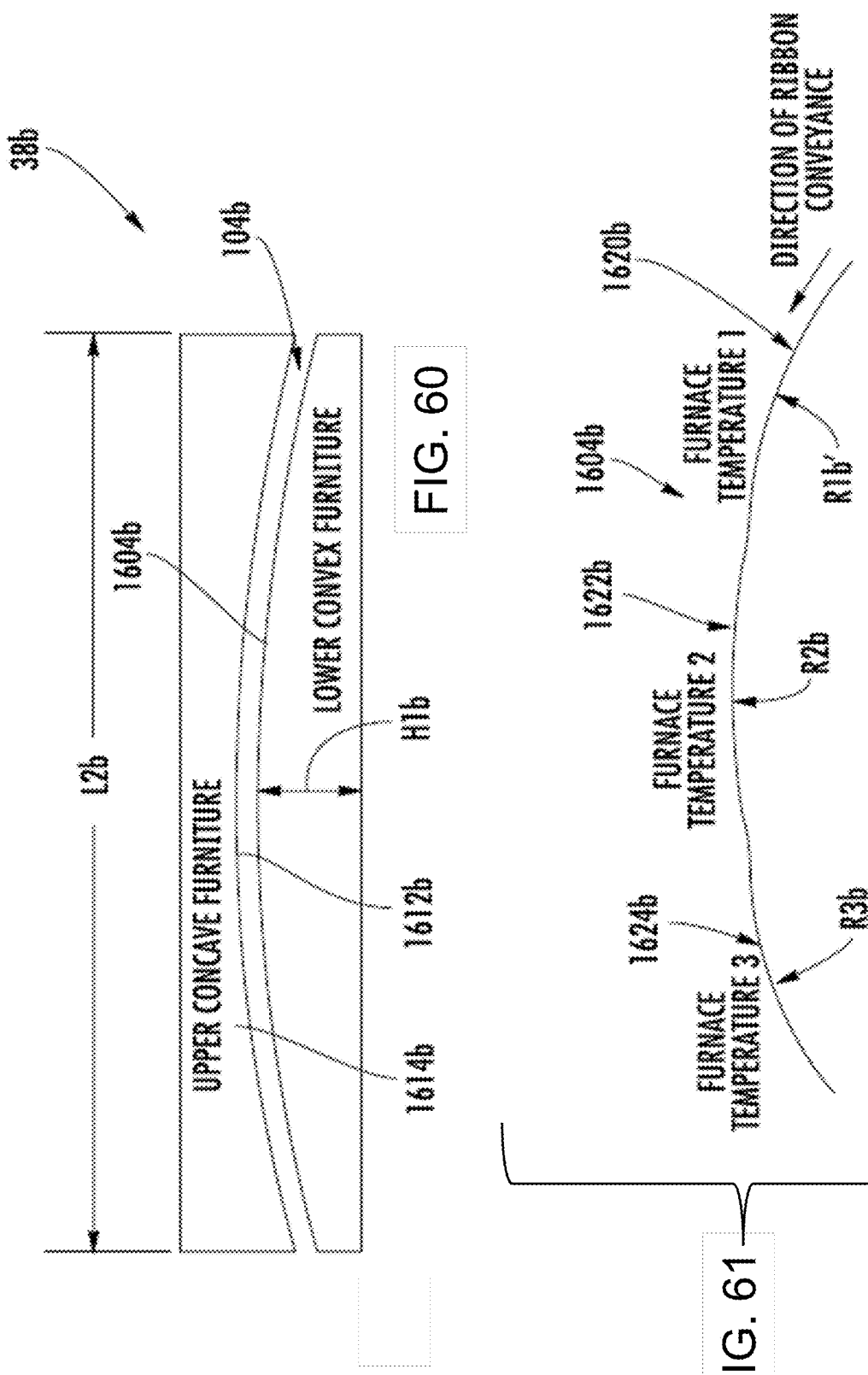

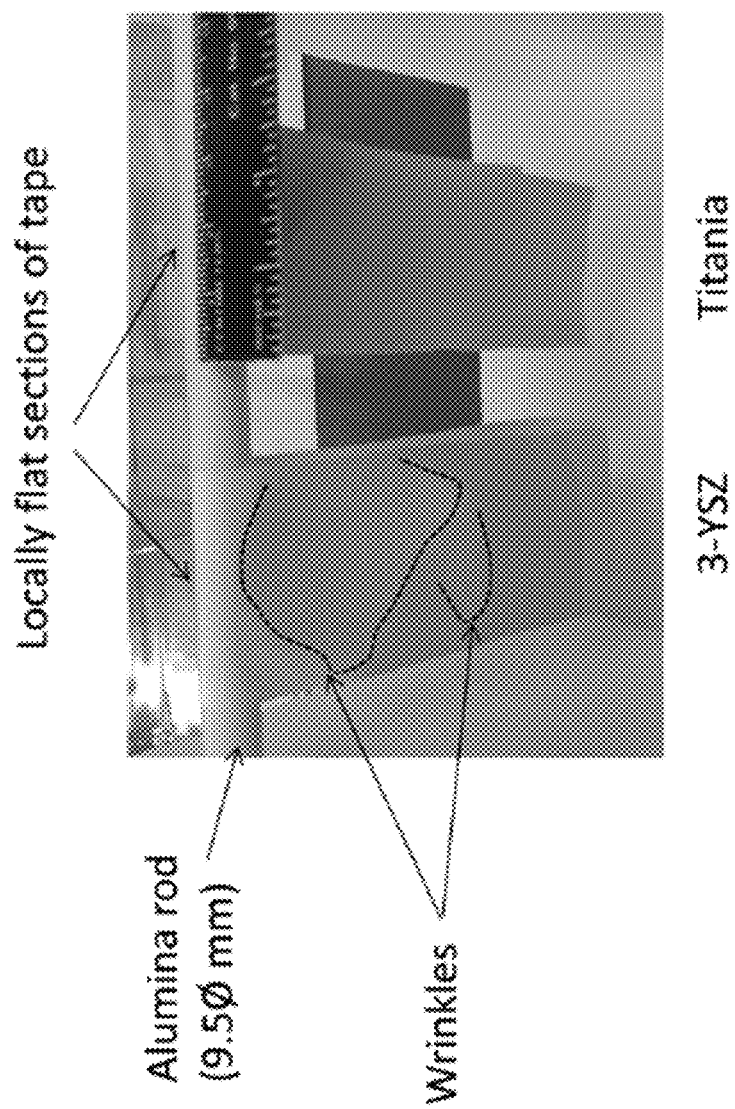

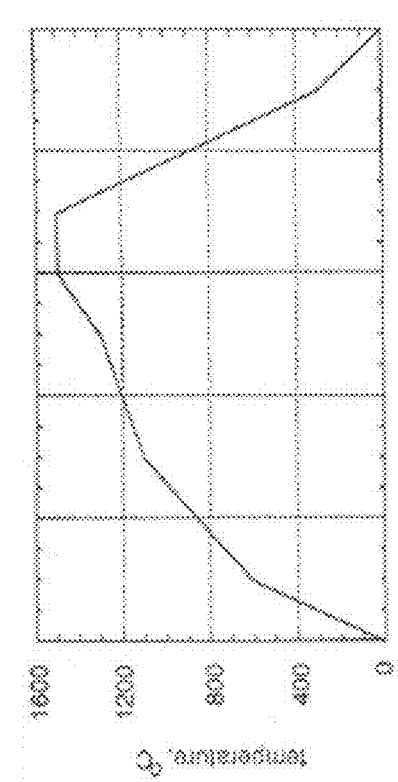
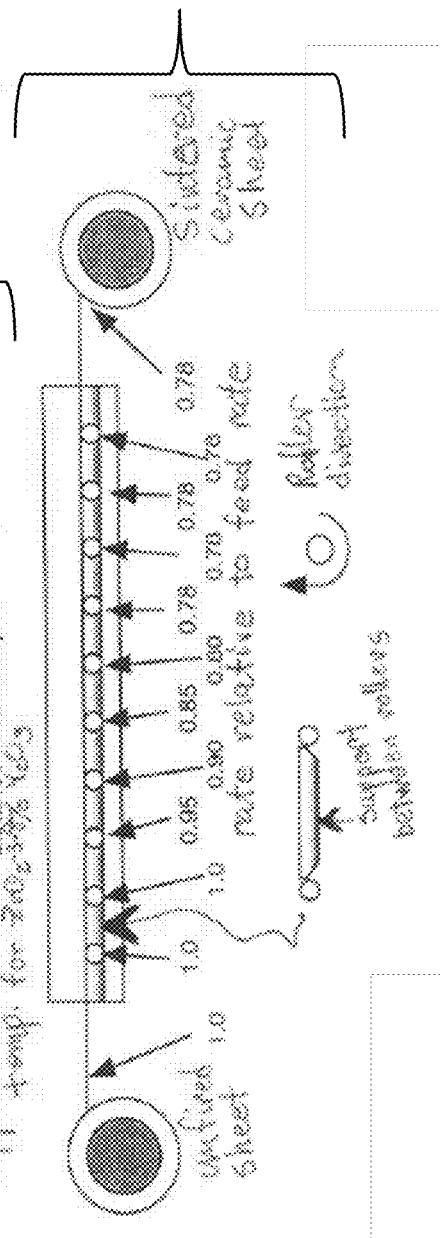
FIG. 88A
FIG. 88B

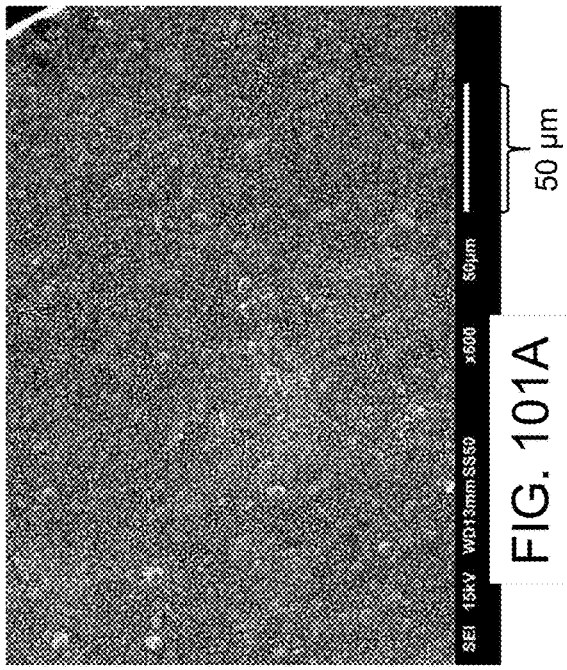
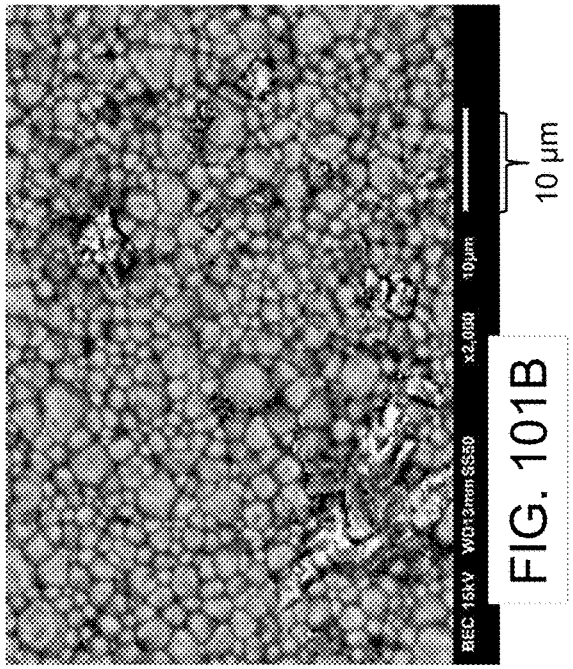
FIG. 101A  FIG. 101B
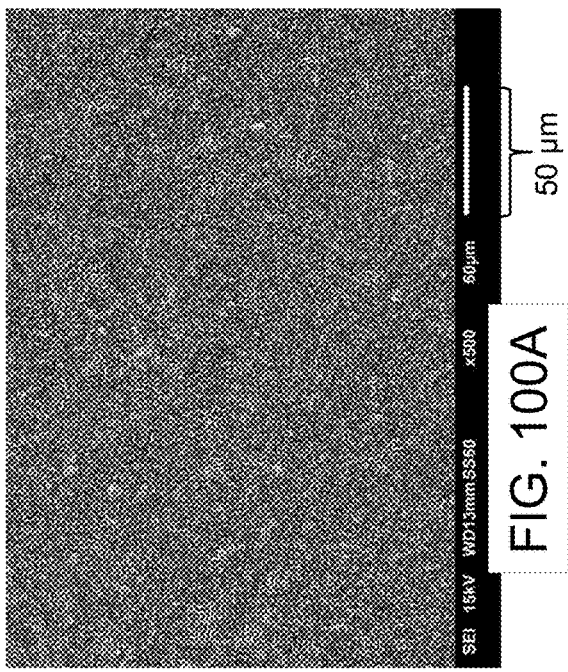
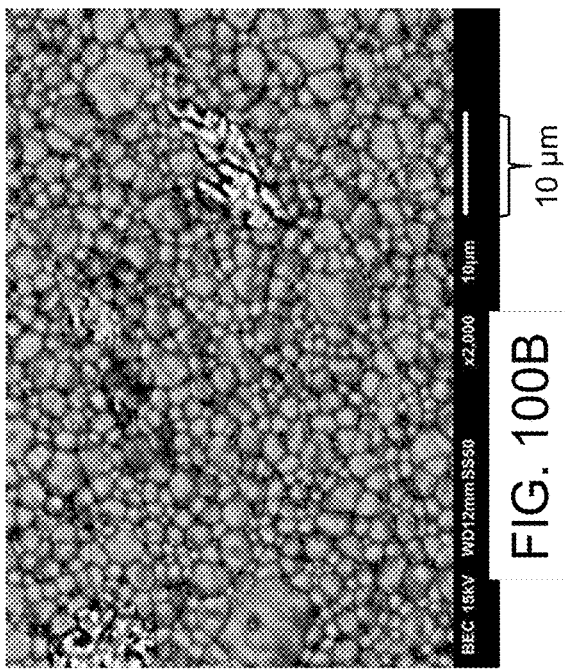
FIG. 100A  FIG. 100B

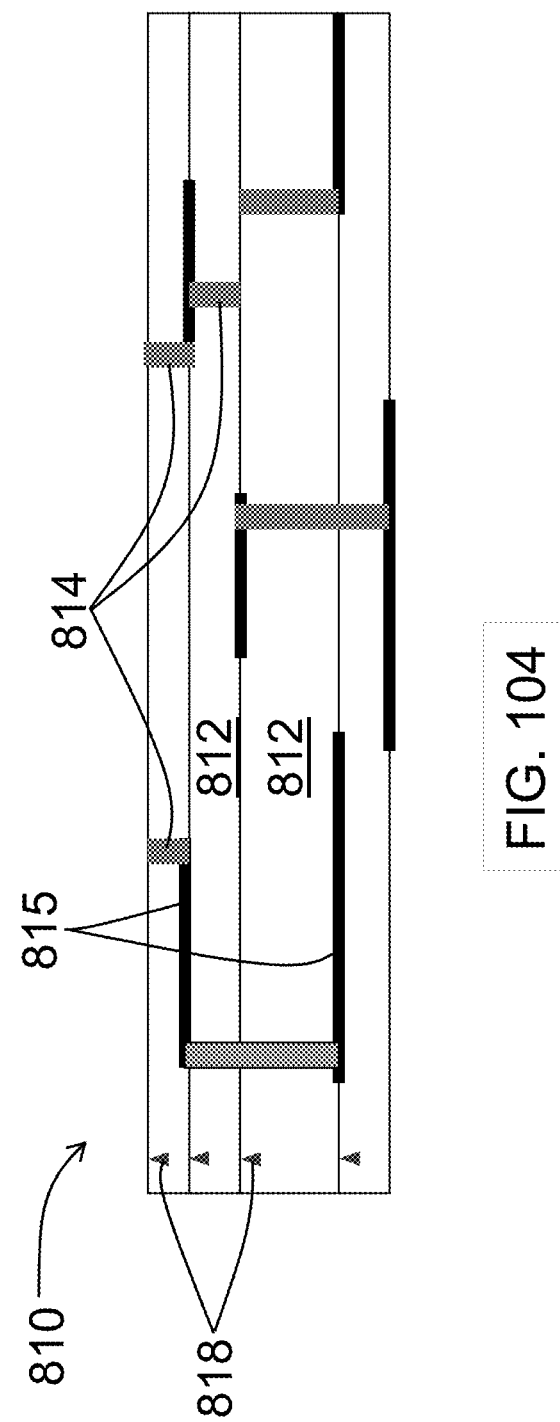

ELECTROLYTE FOR A SOLID-STATE BATTERY

PRIORITY

This Application is a continuation of International Patent Application Serial No. PCT/US17/67376 filed on Dec. 19, 2017 which claims the priority benefit of U.S. Application No. 62/437,157 filed Dec. 21, 2016; 62/439,613 filed Dec. 28, 2016; 62/470,550 filed Mar. 13, 2017; 62/439,609 filed Dec. 28, 2016; 62/526,806 filed Jun. 29, 2017; 62/439,598 filed Dec. 28, 2016; 62/483,726 filed Apr. 10, 2017; 62/484,106 filed Apr. 11, 2017; and 62/556,712 filed Sep. 11, 2017, each of which is relied upon and hereby incorporated by reference herein in its entirety.

BACKGROUND

The disclosure relates generally to processes for sintering, such as sintering green tape including polycrystalline ceramic grains or other inorganic particles, bound in a binder, as well as continuous and discrete sintered articles, such as ceramic sheets, tapes or ceramic pieces made from such processes. The disclosure relates articles, such as thin sheets, tapes, ribbons or pieces of ceramic or other inorganic materials that have many potential uses, such as serving as waveguides, when the ceramic is transmissive to light, serving as substrates that may be coated or laminated, and integrated in batteries and other components, or used as or joined with a substrate such as to act as a dielectric in an electronics package (e.g., LED package), or other applications. Various material properties, particularly of ceramic materials, such as high resistivity, low reactivity, low coefficient of thermal expansion, etc. make such articles particularly useful in a wide variety of applications.

SUMMARY

Some aspects of the present disclosure relate to a tape separation system for sintering preparation. The tape separation system includes a source of tape material comprising a green tape and a carrier web supporting the green tape. The green tape comprising grains of inorganic material in a binder. The tape separation system further includes a peeler for directing the carrier web in a rewind direction and directing the green tape in a downstream processing direction that differs from the rewind direction, and a vacuum drum positioned and configured to receive the tape material from the source and convey the tape material to the peeler. The vacuum drum comprises holes for applying suction to the carrier web to facilitate tensioning the carrier web, and tension, in force per cross-sectional area, in the carrier web is greater than tension in the green tape as the tape material is conveyed from the vacuum drum to the peeler, thereby mitigating deformation of the green tape during separation of the green tape from the carrier web.

Other aspects of the present disclosure relate to a system for processing tape for sintering preparation. The system includes a tape comprising a green portion of the tape, the green portion having grains of an inorganic material in an organic binder; and a binder burnout station comprising an active heater. The tape advances through the binder burnout station such that the binder burnout station receives the green portion of the tape and chars or burns the organic binder as the green portion of the tape interfaces with heat from the heater, thereby forming a second portion of the tape prepared for sintering the inorganic material of the tape. In some embodiments, at an instant, the tape simultaneously extends to, through, and from the binder burnout station such that, at the instant, the tape includes the green portion continuously connected to the second portion, such as where the binder burnout station chars or burns at least most of the organic binder, in terms of weight, from the green portion of the tape without substantially sintering the grains of the inorganic material. In some embodiments, system for processing tape for sintering preparation further includes an ultra-low tension dancer that includes light-weight, low-inertia rollers to redirect the tape without exerting significant tension such that tension in the second portion of the tape is less than 500 grams-force per $mm^2$ of cross section, thereby reducing chances of fracture of the second portion of the tape and facilitating long continuous lengths of the tape for sintering. In some embodiments, system for processing tape for sintering preparation blows and/or draws gas over the tape as the tape advances through the binder burnout station, and the binder burnout station heats the tape above a temperature at which the organic binder would ignite without the gas blown and/or drawn over the tape, whereby the organic binder chars or burns but the tape does not catch fire.

Additional aspects of the present disclosure relate to a manufacturing line comprising the above system for processing tape, where the binder burnout station is a first station and the manufacturing line further comprises a second station spaced apart from the first station. The second station at least partially sinters the inorganic material of the second portion of the tape to form a third portion of the tape, where, at an instant, the tape includes the green portion continuously connected to the third portion by way of the second portion. For example, in some such embodiments, the third portion of the tape is substantially more bendable than the second portion such that a minimum bend radius without fracture of the third portion is less than half that of the second portion, and the green portion is substantially more bendable than the second portion such that a minimum bend radius without fracture of the green portion is less than half that of the second portion. The manufacturing line may further include the tape separation system described above.

Some aspects of the present disclosure relate to a sintering system comprising a tape material comprising grains of inorganic material and a sintering station. The sintering station includes an entrance, an exit, and a channel extending between the entrance and the exit. At an instant, the tape material extends into the entrance of the sintering station, through the channel, and out of the exit. Heat within the channel sinters the inorganic material such that the inorganic material has a first porosity at the entrance and a second porosity at the exit that is less than the first porosity. Further, the wherein the tape material is positively tensioned as the tape material passes through the channel of the sintering station, thereby mitigating warpage. In some embodiments, the tape material moves through the sintering station at a speed of at least 1 inch per minute. In some embodiments, the channel of the sintering station is heated by at least two independently controlled heating elements, where the heating elements generate a temperature profile where the channel increases in temperature along the length of the channel in a direction from the entrance toward the exit of the sintering station, and where a sintering temperature in the channel exceeds 800° C. In some embodiments, the sintering system further includes a curved surface located along the channel of the sintering station, where the tape material bends relative to a widthwise axis of the tape material around the curved surface as the tape material moves through the sintering station, thereby influencing shape of the tape material. In some embodiments, the exit and the entrance of the sintering station lie in a substantially horizontal plane, such that an angle defined between the exit and the entrance of the sintering station relative to a horizontal plane is less than 10 degrees, thereby at least in part controlling flow of gases relative to the channel; for example, in some such embodiments, the sintering station further comprises an upward facing channel surface defining a lower surface of the channel, and a downward facing channel surface defining an upper surface of the channel, where the downward facing channel surface is positioned close to an upper surface of the tape material such that a gap between the upper surface of the tape material and the downward facing channel surface is less than 0.5 inches, thereby at least in part controlling flow of gases in the channel. The tape material may be particularly wide, long, and thin, having a width greater than 5 millimeters, a length greater than 30 centimeters, and a thickness between 3 micrometers and 1 millimeter, and the inorganic material of the tape may be at least one of a polycrystalline ceramic material and synthetic mineral.

Other aspects of the present disclosure relate to a process for manufacturing ceramic tape, the process comprising a step of sintering tape comprising polycrystalline ceramic to a porosity of the polycrystalline ceramic of less than 20% by volume, by exposing particles of the polycrystalline ceramic to a heat source to induce the sintering between the particles. The tape is particularly thin such that a thickness of the tape is less than 500 μm, thereby facilitating rapid sintering via heat penetration. Further, the tape is at least 5 mm wide and at least 300 cm long. In some embodiments, the process further includes a step of positively lengthwise tensioning the tape during the sintering. In some such embodiments, the process further includes a step of moving the tape toward and then away from the heat source during the sintering. In some embodiments, the amount of time of the sintering is particularly short, that being less than two hours in aggregate, thereby helping to maintain small grain size in the ceramic tape; for example, in some such embodiments, the time in aggregate of the sintering is less than one hour, and density of the polycrystalline ceramic after the sintering is greater than 95% dense by volume and/or the tape comprises closed pores after the sintering. In some embodiments, the tape comprises a volatile constituent that vaporizes during the sintering, where the volatile constituent is inorganic, and where the tape comprises at least 1% by volume more of the volatile constituent prior to the sintering than after the sintering.

Still other aspects of the present disclosure relate to a tape comprising a body comprising grains of inorganic material sintered to one another. The body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width. The tape is long, having a length of about 300 cm or greater. The tape is thin, having a thickness in a range from about 3 μm to about 1 mm. The tape is particularly wide, having a width of about 5 mm or greater. According to an exemplary embodiment, geometric consistency of the tape is such that a difference in width of the tape, when measured at locations lengthwise separated by 1 m, is less than 100 μm; and a difference in thickness of the tape, when measured at locations lengthwise separated by 1 m along a widthwise center of the tape, is less than 10 μm. In some embodiments, the tape is flat or flattenable such that a length of 10 cm of the tape pressed between parallel flat surfaces flattens to within 0.05 mm of contact with the parallel flat surfaces without fracturing; and for example in some such embodiments, when flattened to within 0.05 mm of contact with the parallel flat surfaces, the tape exhibits a maximum in plane stress of no more than 1% of the Young's modulus thereof. In some embodiments, the first and second major surfaces of the tape have a granular profile, where the grains are ceramic, and where at least some individual grains of the ceramic adjoin one another with little to no intermediate amorphous material such that a thickness of amorphous material between two adjoining grains is less than 5 nm. In some embodiments, the body has less than 10% porosity by volume and/or the body has closed pores. In some embodiments, the grains comprise lithium, and the body has ionic conductivity of greater than $5 \times 10^{-5}$ S/cm. In some embodiments, the body has a particularly fine grain size, that being 5 μm or less. In some embodiments, the tape further includes an electrically-conductive metal coupled to the first major surface of the body, where in some such embodiments the body comprises a repeating pattern of vias, and the electrically-conductive metal is arranged in a repeating pattern. In some embodiments, the first and second major surfaces have a granular profile, the tape further includes a coating overlaying the granular profile of the first major surface, and an outward facing surface of the coating is less rough than the granular profile of the first surface, where electrically-conductive metal coupled to the first major surface is so coupled by way of bonding to the outward facing surface of the coating. In some embodiments, the inorganic material has viscosity of 12.5 poise at a temperature greater than 900° C.

Additional aspects of the present disclosure relate to a roll of the tape of any one of the above-described embodiments, wherein the tape is wrapped around and overlapping itself, bent to a radius of less than 30 cm.

Still other aspects of the present disclosure relate to a plurality of sheets cut from tape of any one of the above-described embodiments.

Some aspects of the present disclosure relate to a tape, comprising a body comprising ceramic grains sintered to one another, the body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width; where the tape is thin, having a thickness in a range from about 3 μm to about 1 mm; and where first and second major surfaces of the tape have a granular profile, and at least some individual grains of the ceramic adjoin one another with little to no intermediate amorphous material such that a thickness of amorphous material between two adjoining grains is less than 5 nm.

Some aspects of the present disclosure relate to a tape, comprising a body comprising ceramic grains sintered to one another, the body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width; where the tape is thin, having a thickness in a range from about 3 μm to about 1 mm; where first and second major surfaces of the tape have a granular profile; and where the grains comprise lithium and the body has ionic conductivity greater than $5 \times 10^{-5}$ S/cm.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and the operation of the various embodiments.

BRIEF DESCRIPTION OF THE DRAWINGS

FIG. 4 is an enlarged view of an embodiment of the separation system shown in FIG. 3, according to an exemplary embodiment.

FIG. 8 is an enlarged view of the peeler shown in FIG. 4, according to an exemplary embodiment.

FIG. 13 is detailed view of tape material within the channel of the sintering furnace of FIG. 12, according to an exemplary embodiment.

FIG. 14 shows sintered tape material exiting a sintering furnace, according to an exemplary embodiment.

FIG. 30A is a digital image of an unpolished surface of a sintered article.

FIG. 30B is a conceptual side profile of the sintered article of FIG. 30A.

FIG. 31A is a digital image of a polished surface of a sintered article.

FIG. 31B is a conceptual side profile of the sintered article of FIG. 31A.

FIG. 37 is a height profile of the sintered article of Comparative Example 7, before being flattened, showing the measured height above the flattening plane.

FIG. 38 is a height profile of the sintered article of Comparative Example 8, before being flattened, showing the measured height above the flattening plane.

FIG. 43A is a deformation plot showing measured stress in the bottom surface of the sintered article of Example 5, after flattening.

FIG. 43B is a deformation plot showing measured stress in the top surface of the sintered article of Example 5, after flattening.

FIG. 46A is a deformation plot showing measured stress in the bottom surface of the sintered article of Comparative Example 8, after flattening.

FIG. 46B is a deformation plot showing measured stress in the top surface of the sintered article of Comparative Example 8, after flattening.

FIG. 60 is a side view of a channel of a sintering station having opposed curved upper and lower surfaces defining a sintering channel, according to an exemplary embodiment.

FIG. 61 is a side schematic view of a sintering station varying radiuses of curvature along the sintering channel, according to an exemplary embodiment.

FIG. 66 is a digital image of sintered tapes demonstrating flattening produced when the tape bent during sintering.

FIG. 88A is a graphical representation of a temperature profile through a sintering furnace according to an exemplary embodiment.

FIG. 88B is a schematic diagraph of the sintering furnace of FIG. 88A.

FIGS. 100A and 100B are tops views of surfaces of one side of a sintered material and FIGS. 101A and 101B are tops views of surfaces of another side of the sintered material according to an exemplary embodiment.

FIG. 104 is a schematic diagraph of electronics in the form of a stack of sintered articles according to an exemplary embodiment.

DETAILED DESCRIPTION

Figure 1:
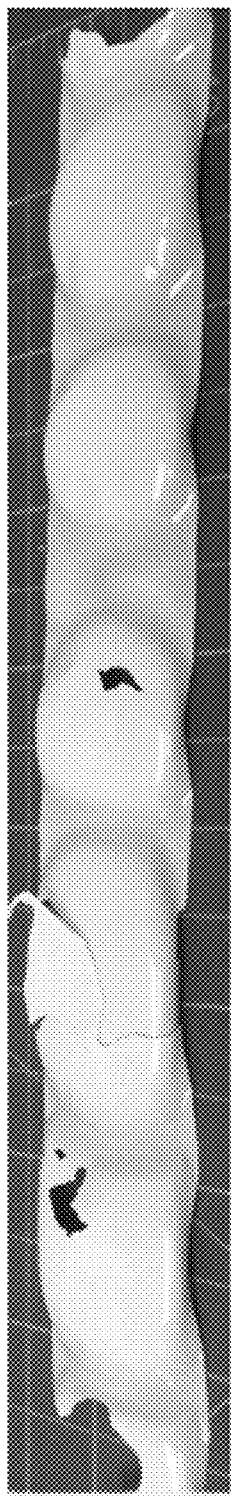
FIG. 1 shows an example of distorted, sintered ceramic tape material formed without technology disclosed herein, such as controlled green ribbon tensioning and other technology as discussed herein.

Referring generally to the figures, various embodiments of a system and process for manufacturing long, thin and/or wide sintered articles are shown and described, where by the term sinter Applicant refers to the process of coalescing (e.g., directly bonding to one another) particles or grains (e.g., of a powdered or granular material) into a solid or porous body by heating the particles or grains without completely liquefying the particles or grains such that crystal structure of the particles or grains remain in the coalesced body, however aspects of the present inventive technology may be used to manufacture amorphous material, such as those that are difficult or impossible to process using conventional manufacturing techniques, as may be intuitive to those of skill in the art of inorganic material processing. In addition, Applicant has discovered that new sintered articles having a variety of properties may be formed using the systems/processes discussed herein that were previously unachievable utilizing prior technology. Specifically, Applicant has developed material handling systems and processes that allow for a very precise level of control of a variety conditions/forces that the material experiences during formation of the sintered article, and that this precise control/material handling allows for production of long, thin and/or wide sintered tape materials believed to be unachievable with prior systems. Further, articles manufactured using technology disclosed herein may have other unique qualities, such as: strength, such as may be due to low number defects; purity, such as may be due to controlled airflow and sintering duration, and properties related to purity, such as dielectric constant and impermeability; consistency, such as along a length and/or widthwise, such as in terms of flatness, thickness, roughness, grain size, etc.; and other unique attributes.

In general, the system described herein utilizes an input roll of web supported green tape wound on a spool or reel. As explained in more detail below, the web supported green tape includes a green tape material including grains of inorganic material (e.g., such as grains of ceramic material, grains of polycrystalline ceramic material, metal grains or grains of synthetic material) bound with an organic binder material, and the green tape material is supported on carrier web (e.g., a sheet of polymer material). The input roll of web supported green tape is unwound, and the carrier web/backing layer is carefully separated from the green tape material. Applicant has found that by precisely controlling separation of the carrier web from the green tape with little or no distortion of the green tape, a sintered article having various properties (e.g., thickness, flatness, density, shape etc.) that are very consistent/controlled along its length can be produced. With that said, in other contemplated embodiments the green tape may not be web supported and/or may not be on a roll, such as if the tape is formed in-line, such as along the manufacturing line prior to sintering.

Following removal of the carrier web, the self-supporting green tape (including the grains of inorganic material supported by organic binder material) is moved through a binder removal station. In general, the binder removal station applies heat to the self-supporting green tape in a manner that removes or chemically alters the organic binder such that the tape material exiting the binder removal station is an unbound tape material. By unbound, Applicants refer to the binder material having been removed, however the unbound tape may still hold together, such as via char of the burned binder or by interweaving or bonding between the inorganic particles, or by other means (e.g., electrostatic forces, air pressures). Following removal of the organic binder, the unbound tape material is moved into a sintering station that applies heat to the unbound tape material that sinters (e.g., fully sinters or partially sinters) the inorganic particles forming a sintered article which exits the sintering station.

Applicant has found that, surprisingly, the grains of inorganic material will support themselves as an unbound tape material even after the organic binder is removed and/or that the tape may be otherwise supported, as described above. However, following removal of the organic binder, the unbound tape material is very delicate prior to sintering or may be very delicate prior to sintering. Thus, Applicant has further identified a new binder removal and sintering station arrangement that allows for handling of the delicate unsupported tape material in a manner that allows for production of very high quality sintered articles. (By unsupported in the preceding sentence, Applicant means unsupported by organic binder after the binder has been removed or burned.) In particular, wide, long, high quality sintered articles suitable for roll to roll handling are produced without introducing substantial distortion or without breaking the article during binder removal or sintering.

In particular, Applicant has identified that air flow (e.g., turbulent air flow generated by thermal gradients) within the binder removal station and/or sintering station may impinge upon the tape material causing distortion or breakage of the tape material. Further, Applicant has discovered that a highly horizontal processing path within the binder removal station and/or sintering station reduces or eliminates turbulent airflow which in turn produces or may produce sintered articles without significant distortion. Further, Applicant has determined that eliminating air flow based distortion is particularly important when forming wide sintered articles (e.g., articles having width greater than 5 mm) because Applicant believes that susceptibility to air flow based distortion increases as the width of the tape material increases. Further, Applicant has determined that eliminating or reducing air flow based distortion is particularly important to allow for roll to roll processing as Applicant has found that even minor levels of distortion may cause the sintered article to break or otherwise not wind properly on the uptake reel (also called a tape-up reel).

Identification of horizontal positioning of the tape during binder removal and/or sintering was a surprising discovery given the inorganic green material and prior sintering technologies. For example, some tape material sintering may use downwardly angled positioning (e.g., a 12 to 20 degree downward incline) of the tape material as a means of utilizing gravity to pull the delicate tape material through the heating steps of the system, possibly intended for application of an evenly distributed force across the tape material to pull the tape material through heating steps of the process.

However, Applicant has discovered that when the heating portions of a sintering system are positioned at an incline, turbulent air flows may form as the hot air rises through channels of the heating system that holds the tape material. Thus, this flowing air impinges on the tape material, possibly forming distortions or potentially breaking the tape. Further Applicant discovered that incidence of air flow based distortions created in the sintered tape formed using a non-horizontal heating arrangement may increase as the width of the tape material increases. With that said, aspects of technology disclosed herein may be used with systems that include non-horizontal heating channels or systems, such as a binder removal station. Further, aspects of technology disclosed herein, such as unique materials and form factors (e.g., thin ribbons of garnet or other materials or geometries), may be manufactured using non-horizontal heating channels or systems.

Applicant attempted to sinter a wider tape (e.g. a tape having a width greater than 5 mm, and specifically a green tape of 25 microns thickness, width of 32 mm, with zirconia—3 mole % $Y_2O_3$ inorganic particles) using an incline arrangement. As shown in FIG. 1, when partially sintered at 1250° C., the partially sintered article formed had significant and periodic distortions or bubbles along the length of the tape. The height of the distortion was on the order of greater than 1 mm and were large enough to prevent spooling of the tape on a core having a diameter of 3-6 inches. Applicant believes that the bubbles were formed as turbulent air flow pushed upward on the tape as the hot air flowed up the sloped support surface underneath the tape during the heated stages of tape processing (e.g., during sintering and binder removal).

Figure 2:
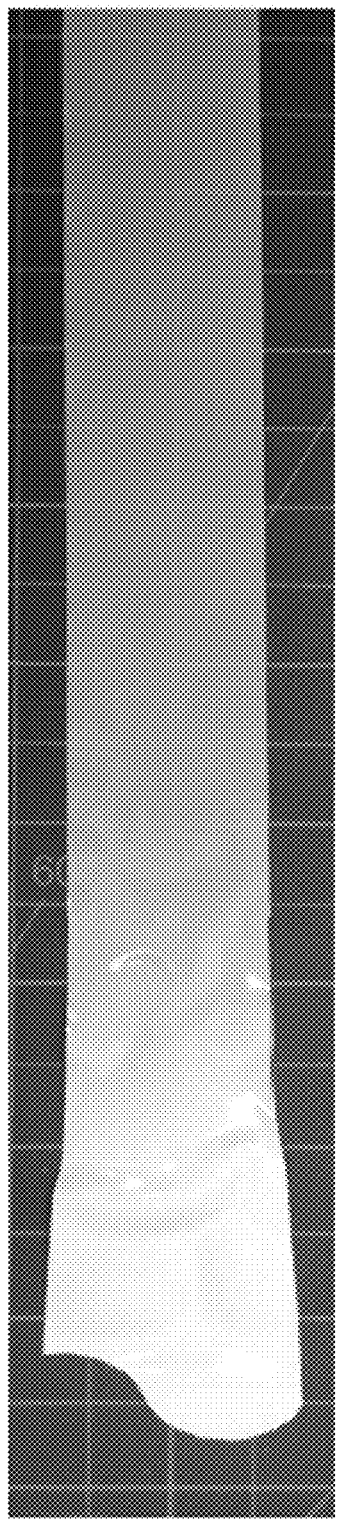
FIG. 2 shows an example of distorted, sintered ceramic tape material produced utilizing a temperature profile and tape speed which caused non-uniform sintering.

In addition to air flow control, Applicant has identified that control of the thermal profiles within the binder removal station and/or sintering station is or may be important to forming a high quality sintered article. In particular, Applicant has discovered that when heating a wide tape material in a roll to roll process, such as the one discussed herein, the thermal stresses that the tape material is exposed to, particularly during sintering, should be precisely controlled to limit distortion or breakage that may otherwise occur as the tape material shrinks/densifies during sintering for at least some materials and/or forms disclosed herein, such as at least some thin, wide tapes of inorganic material. As an example shown in FIG. 2, a section of ceramic tape (specifically alumina tape) including the portion of the tape at the transition from unsintered to sintered material is shown as formed using a process with steep temperature increases within the high temperature sintering zone. As shown in FIG. 2, this steep temperature increase causes or may cause distortion or cross-web shape due to stress internal to the tape material as the tape sinters following the fast rise in temperature in the sintering zone. With that said, in other embodiments, such as for different materials (e.g., lithium garnet), a steep temperature increase may be beneficial, such as by reducing exposure to oxidation or impurities, and distortions may be controlled via other factors, such as air flow control and narrower width of tape for example.

Thus, as shown and described below, Applicant has determined that by utilizing a sintering furnace with independently controlled heating zones and/or multiple independently controlled sintering furnaces, a wide, long segment of tape material may be sintered without significant distortion and/or breakage at a high process throughput rate. Similarly, the binder removal furnace and sintering furnaces are designed and positioned relative to each other to limit the thermal shock (e.g., exposure to a sharp temperature gradient) that the tape is exposed to as the tape transitions between different heated zones within the system discussed herein.

Following sintering, the wide, sintered tape is or may be wound onto an uptake reel forming a roll of sintered tape material. In contemplated embodiments the roll is cylindrical or otherwise shaped, such as when rolled around geometry that is not circular, such as oblong, triangular with rounded vertices, etc. Because of the high quality (e.g., low distortion) of the tape formed by the system(s) discussed herein, in at least some embodiments the tape may be wound into a roll in a manner that allows for the sintered tape roll be used conveniently and efficiently in subsequent manufacturing processes, e.g., as a substrate in downstream, roll-to-roll manufacturing processes. Applicant has found that the high level of width, length, thickness, shape and/or flatness consistency and/or other attributes (purity, strength, impermeability, dielectric performance) of the tape or other articles produced by the system(s) discussed herein allows for spooling of the tape on the uptake reel. In contrast, a tape with high levels of distortion or irregularities would or may tend to break or otherwise form a distorted, inconsistent tape roll and may be unsuitable for uptake onto a reel to form a roll of sintered tape. With that said, some contemplated non-horizontal sintering systems, especially those that employ technology disclosed herein, may allow for undistorted tapes, such as if air flow is controlled, the tape is thin enough and sufficiently tensioned, the rate of sintering and temperatures are controlled, for example, as disclosed herein.

Lastly, some conventional sintered articles are formed in systems in which discreet unsintered pieces or pieces of green tape are placed upon a surface, called a setter board, and placed inside a furnace that burns off the organic binder and sinters the inorganic grains. Applicant has identified that roll-to-roll formation of a sintered article will provide a number of advantages not found by discreet, conventionally sintered articles. For example, wide, wound rolls of sintered articles can be formed at high throughput speeds (e.g., speed of 6 inches per minute or greater). In addition, system(s)/process(es) discussed herein forms wide, thin sintered (e.g., thin ceramic and/or sintered articles) which allows for use of the sintered article as a substrate to form small and low cost devices (e.g., semi-conductor devices, batteries, etc.). Similarly, providing a roll of sintered material allows the sintered material be used as an input substrate roll to high throughput downstream manufacturing processes, further allowing for downstream articles to be formed at high speed and/or at low cost utilizing the sintered articles discussed herein.

System Overview

Figure 3:
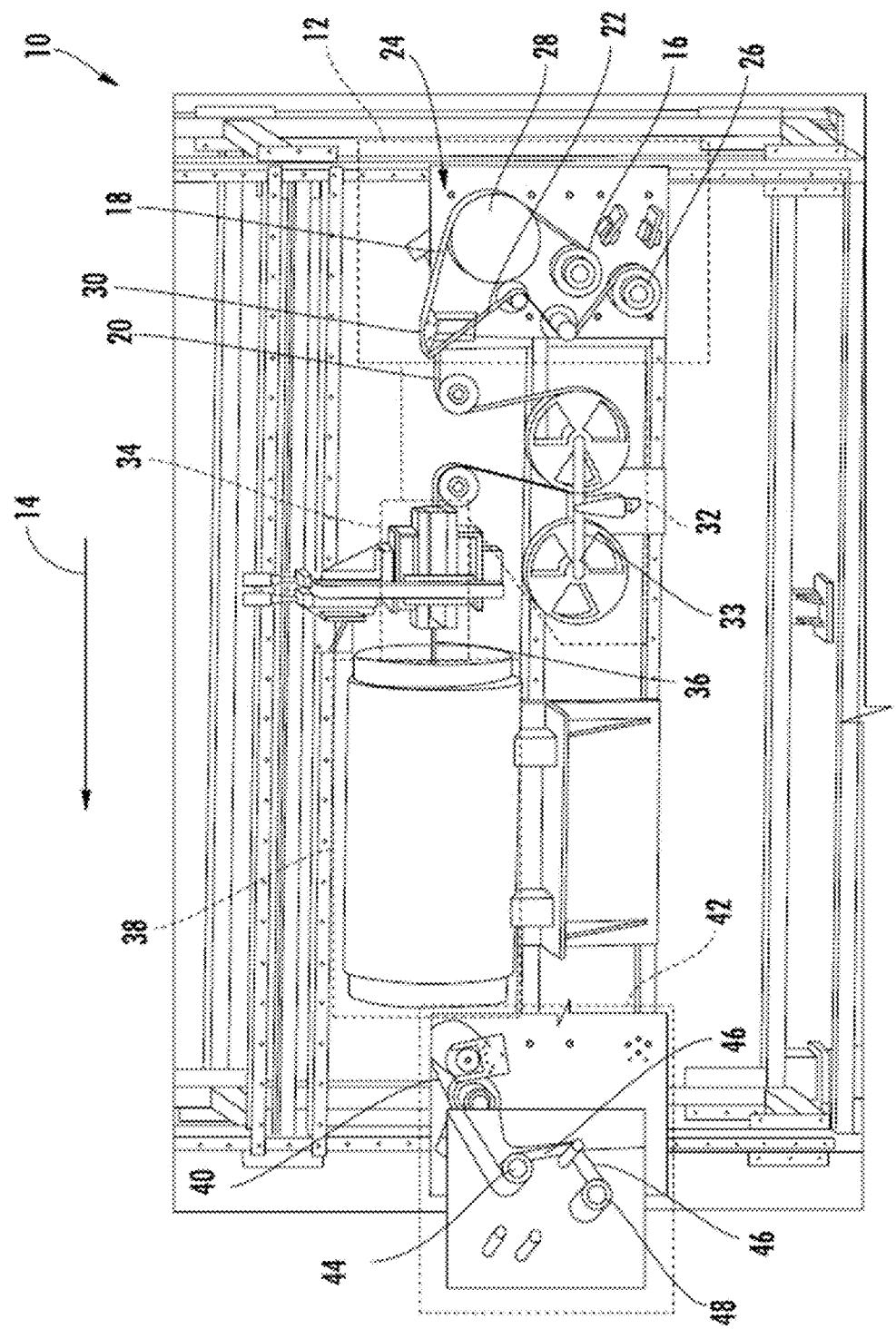
FIG. 3 is a roll-to-roll system for producing a sintered article according to an exemplary embodiment.

Referring to FIG. 3, a system 10 for producing a sintered tape article is shown according to an exemplary embodiment. In general, green tape material is provided to system 10 at an input side, separation system 12, and the green tape material moves through system 10 generally in the processing direction 14. Within separation system 12, a source 16 of continuous tape material 18 (continuous' meaning long lengths, as disclosed herein, such as 300 cm or longer, which can be provided in the form of a spool or belt) is provided, and is fed to the downstream portions of system 10.

In general, continuous tape material 18 includes a layer of green tape material 20 that includes grains of inorganic, sinterable material bound together with an organic binder (e.g., (e.g., polyvinyl butyral, dibutyl phthalate, polyalkyl carbonate, acrylic polymers, polyesters, silicones, etc.). The green tape material 20 of the continuous tape material 18 is or may be supported on a carrier web or backing layer 22. As will be discussed in more detail below, in specific embodiments, system 10 is configured to form long, wide and/or thin sintered articles and in such embodiments, the green tape material 20 coming into the system 10 is also relatively long, wide and/or thin. For example, in specific embodiments, green tape material 20 has a width greater than 5 mm, greater than 10 mm, greater than 40 mm or greater than 125 mm. In specific embodiments, green tape material 20 has a length greater than 10 meters (m), specifically greater than 30 m, and more specifically greater than 60 m. In specific embodiments, green tape material 20 has a thickness between 3 microns and 1 millimeter. In addition, incoming green tape material 20 has a porosity that is greater than the porosity of the sintered article produced by system 10. In other contemplated embodiments, the green tape material 20 may have a width less than 5 mm, such as at least 0.5 mm, at least 1 mm, at least 2.5 mm, or smaller than 0.5 mm in some such embodiments. Similarly, the tape may have another thickness and/or length and/or porosity. In some embodiments, the tape material 20 may have a non-rectangular cross-section orthogonal to its length, such as round, oblong, parallelogram, rhomboid, etc., where, as may be intuitive, width of such embodiments refers to a maximum cross-sectional dimension orthogonal to length and thickness is a minimum cross-sectional dimension orthogonal to length.

Separation system 12 includes carrier web removal station 24. At carrier web removal station 24, carrier web 22 is separated from green tape material 20, and the removed carrier web 22 is or may be wound onto an uptake reel 26.

In general, carrier web removal station 24 includes a tension isolator 28, which can include a vacuum drum, and a peeler 30 that removes carrier web 22 in manner that does not distort or compress green tape material 20 and that isolates the tension within carrier web 22 generated by uptake reel 26 from green tape 20. Following separation from carrier web 22, green tape 20, is or may be a self-supporting green tape including the grains of inorganic material supported by the organic binder material, but does not include a carrier web or other support structure to hold the tape material together during downstream processing through system 10.

Self-supporting green tape 20 moves or may move into an ultralow tension control system 32. In general, self-supporting green tape 20 is a relatively delicate structure that is being pulled through system 10 via the operation of various spools, reels, rollers, etc. The pulling action imparts a tension to self-supporting green tape 20. Applicant has found that a uniform, low level (e.g., gram levels; 0.1 grams to less than 1 kg; at least 1 gram, at least 5 grams, and/or no more than 100 grams, depending upon the tape size and binder strength) of tension applied to self-supporting green tape 20 is or may be advantageous as it improves various characteristics, such as cross-width shape and flatness of the final sintered article. However, due to the delicate nature of the self-supporting green tape 20 (which becomes even more delicate following binder removal as described in more detail below), the low level of tension is precisely controlled such that enough tension is provided to tape 20 to limit distortion during binder removal/sintering of tape 20 while also limiting maximum tension to ensure tape 20 does not break. With that said, in other contemplated embodiments, greater tension, such as for stronger tapes, or zero tension, other than tension due to weight of the tape itself, is applied.

In one or more embodiments, as shown in FIG. 3, tension control system 32 includes an ultralow tension dancer 33 which utilizes light weight, low inertia carbon fiber rollers. Ultralow tension dancer 33 may include air-bearings to facilitate low friction rotation of the carbon fiber rollers of tension dancer 33. In other embodiments, a free loop of material or a vacuum box may be utilized to provide consistent, gram levels of tension to tape 20.

Following tension control system 32, self-supporting green tape 20 moves into binder removal station 34. In general, binder removal station 34 includes one more heating element that delivers heat to a channel formed with the station 34. Heat within binder removal station 34 chemically changes and/or removes at least a portion of the organic binder material of self-supporting green tape 20 such that an unbound tape 36 exits binder removal station 34. In general, unbound tape 36 includes the grains of inorganic material with very little or no organic binder remaining. Applicant has found that unbound tape 36 will hold itself together even without the presence of the organic binder in manner that allows the unbound tape 36 to be moved into sintering station 38, such as utilizing the tension-control, air flow control, proximity of the binder removal station 34 to the sintering station 38 and temperature control therebetween, orientation and alignment of the tape and stations 34, 38 as shown in FIG. 3.

In general, binder removal station 34 is arranged and controlled in a manner that provides for low distortion of tape 20 as it traverses the binder removal station 34. Further, binder removal station 34 may include heating elements that allow for removal of volatile organic compounds without applying too much heat too quickly, which otherwise may ignite the organic binder compounds. Ignition may also be controlled by air flow.

In addition, binder removal station 34 is positioned in manner relative to sintering station 38 such that the thermal shock or temperature gradient that unbound tape 36 is exposed to during movement from binder removal station 34 into sintering station 38 is low (e.g., spaced apart, but with pathways aligned linearly and respective openings aligned and/or close to one another, such as within 1 m, such as within 10 cm, such as within 2 cm, and/or closer). Applicant has found that due to the delicate nature of unbound tape 36, limiting the thermal shock experienced by the tape 36 between stations 34 and 38 further provides for production of flat, consistent and/or unwarped sintered tape by limiting/eliminating distortion that would otherwise occur due to the temperature gradients experienced between stations 34 and 38.

In various embodiments, temperature within station 34 is precisely controlled to achieve the desired properties of tape 36 leaving station 34. In various embodiments, the temperature within station 34 is between 200 degrees Celsius (° C.) (or about 200° C.) and 500° C. (or about 500° C.), and station 34 is heated to provide a temperature profile along its length such that very little or no binder material remains within the tape material exiting binder removal station 34. Further, in some embodiments, some sintering (e.g., shrinkage, increase in density, decrease in porosity, etc.) of the grains of inorganic material may occur during traversal of binder removal station 34.

Following binder removal in station 34, unbound tape 36 moves into the sintering station 38. In general, sintering station 38 includes one or more heating element (see, e.g., further discussion of heating elements and types thereof below) that heats sintering station 38 to temperatures above 500 degrees ° C. (e.g., between 500° C. (or about 500° C.) and 3200° C. (or about 3200° C., such as 3200° C.±10% of 3200° C.)) which causes sintering of the grains of inorganic material of unbound tape 36. In general, the porosity of the inorganic material decreases during sintering. This decrease in porosity may also result in a shrinkage (e.g., a reduction in width, thickness, length, etc.) of the tape material as the material is sintered, such as in sintering station 38. With some materials, during sintering, the elastic modulus can increase, the strength can increase, the shape of the porosity can change, without a significant decreasing in porosity or significant shrinkage. In some embodiments, the sintering station 38 transforms the tape 38 into a bisque material that is partially, but not fully sintered.

Applicant has found that as unbound tape 36 traverses sintering station 38, the unbound tape 36 is susceptible to deformation or breakage which may be caused by a variety of forces that the unbound tape 36 encounters during sintering. In particular, as noted above, Applicant has discovered that forces caused by turbulent air flow through sintering station 38 is one source of significant deformation, and Applicant has also found that the stress internal to tape 36 during sintering is another significant potential source of deformation. Based on these discoveries, Applicant has arranged or configured sintering station 38 in variety of ways in order to limit these forces to produce a sintered article having acceptably low levels of distortion.

In particular, as shown in FIG. 3, sintering station 38 is arranged in a substantially horizontal arrangement such that unbound tape 36 traverses station 38 in a substantially horizontal orientation. Applicant has found that by maintaining the substantially horizontal arrangement of sintering station 38, turbulent airflow can be reduced or minimized, which in turn results in formation of a sintered tape material at the output of sintering station 38 that has low levels of deformation, low levels of cross-tape shape, and/or is flat. In various embodiments, Applicant believes that for various wide tape materials, low turbulence and consequently low distortion can be achieved by maintaining an angle less than 10 degrees, specifically less than 3 degrees and even more specifically less than 1 degree between the processing path of the tape material relative to the horizontal plane. In some embodiments, the tape may move over an arced path that is generally horizontal, as discussed below. In still other embodiments, the path through the sintering station 38 may be more inclined than 10 degrees above horizontal, as discussed above.

As shown in the embodiment of FIG. 3, binder removal station 34 is also positioned in the substantially horizontal position such that turbulent air flow does not cause distortion, breakage, etc. during the heating with binder removal station 34. Similarly, binder removal station 34 is aligned in the vertical direction (i.e. so that the respective openings are aligned and face one another) with sintering station 38 such that unbound tape 36 remains in the horizontal position as tape 36 traverses from binder removal station 34 to sintering station 38.

In addition, Applicant has discovered that if unbound tape 36 is exposed to a temperature profile along the length of sintering station 38 that has drastic rises/drops in temperature, high levels of stress are or may be generated within tape 36 which in turn causes or may cause deformation or breakage of tape 36 during sintering. Further, Applicant has discovered that the sintering stresses increase the risk of deformation as the width of tape 36 increases. Thus, based on these discoveries, Applicant has determined that by utilizing a sintering station 38 with multiple, independently controllable heating elements (and potential multiple sintering furnaces), a temperature profile along the length sintering station 38 can be generated that keeps the stress with tape 36 below a threshold that Applicant has discovered that tends to causes deformation or breakage based on a particular tape configuration.

Following traversal of sintering station 38, a partially or fully sintered tape material 40 exits sintering station 38 and enters the output side, uptake system 42. Sintered tape material 40 is wound upon uptake reel 44. An interlayer support material 46 is paid off of a reel 48. Support material 46 is wound unto uptake reel 44 such that a layer of support material 46 is or may be located between each layer or at least some layers of sintered tape material 40 on uptake reel 44. This arrangement forms a roll or spool of supported sintered tape material 50. In general, support material 46 is a compliant, relatively high friction material that allows sintered tape material 40 to be held on to uptake reel 44 at a relatively low wind tension. The compliance of support material 46 can compensate for cross-web shape that may be present in tape 40 (sintered tape material 40). The support material 46 also increases friction between adjacent layers of tape 40 (sintered tape material 40) on reel 44 which limits tape 40 (sintered tape material 40) from sliding/telescoping of reel 44. Applicant believes that without support material 46, sintered tape material 40 tends to slide off (e.g., telescope) of spool 50 at least in part because the modulus of sintered tape 40 (sintered tape material 40) is relatively high, limiting the ability of tape 40 (sintered tape material 40) to stretch under wind tension, which in turn tends to or may result in poor roll integrity.

As discussed herein, system 10 is configured to form a sintered tape material 40 having low levels of distortion, low level risk of breakage, consistent properties along its length, etc. despite the width and/or length of the sintered article. As Applicant has discovered, the risk of distortion and breakage of tape at various stages of system 10 may increase, particularly as the width of the tape increases. For example, in specific embodiments, sintered tape 40 (sintered tape material 40) has a width greater than 5 mm, greater than 10 mm, greater than 40 mm or greater than 125 mm, and the various arrangements of system 10 discussed herein limit the deformation or breakage risk despite the width of the tape material. In other embodiments the sintered tape has a width less than 5 mm and/or at least 0.5 mm, such as at least 1 mm, such as at least 2 mm.

In addition, the various material handling and heating mechanism(s) of system 10 allow for sintered tape 40 (sintered tape material 40) to be formed at a high throughput rate. In specific embodiments, the roll to roll processing of system 10 allows for production of sintered tape at speeds believed to be substantially faster than other sintering processes, such as tunnel kiln processing in at least some instances, such as conventional tunnel kiln processing. In specific embodiments, system 10 is configured to produce sintered tape 40 at a rate of at least 6 inches per minute, at least 8 inches per minute, at least 19 inches per minute, at least 29 inches per minute, and at least 59 inches per minute. In yet additional specific embodiments, system 10 is configured to produce sintered tape 40 at a rate of at least 3 inches per minute for green tape 20 having a width greater than 50 mm, of at least 5 inches per minute for green tape 20 having a width between 35 mm and 50 mm, of at least 9 inches per minute for green tape 20 having a width between 15 mm and 35 mm, and of at least 10 inches per minute for green tape 20 having a width between 5 mm and 15 mm. In additional specific embodiments, system 10 is configured to produce sintered tape 40 at a rate of at least 1 inches per minute (ipm) for green tape 20 having a width greater than 50 mm, of at least 1.5 inches per minute for green tape 20 having a width between 35 mm and 50 mm, of at least 2 inches per minute for green tape 20 having a width between 15 mm and 35 mm, and of at least 3 inches per minute for green tape 20 having a width between 5 mm and 15 mm.

Support Web Removal Station

Formation of the embodiments of the sintered articles described herein includes applying a uniform web tension to the green tape material before and after sintering. The separation system according to one or more embodiments of this disclosure is designed to apply such uniform web tension, along with uniform velocity, to a green tape material as it is separated from a supporting carrier web. Accordingly support of web removal, as disclosed herein, allows for consistency of the shape of the green tape material, reducing or eliminating instances of necking or contracting of the green tape as well as reducing or eliminating instances of imprinting features of surfaces of the equipment on the green tape, which in turn may otherwise be present in the sintered tape. With that said, technology disclosed herein may be used without the support web removal station to produce new sintered tapes as disclosed herein, where the tapes may have characteristics attributed to the lack of support web removal station, such as changes in thickness, repeating imprinted surface features, etc.

Figure 5:
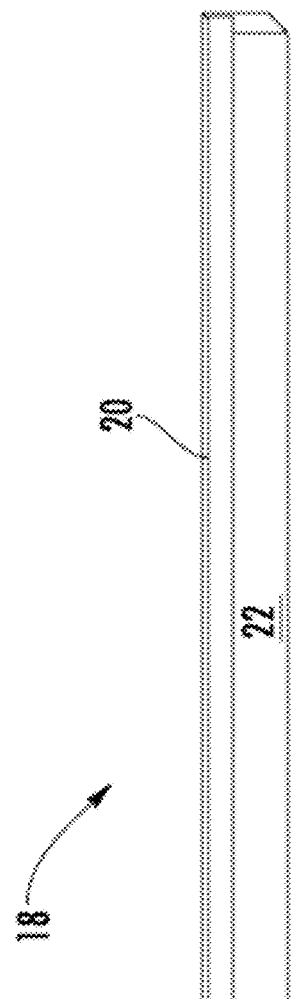
FIG. 5 is a side view of the continuous tape material, according to an exemplary embodiment.

As noted above, system 10 includes a support web removal station generally at the input side of system 10. One aspect of the support web removal station includes a separation system 12. Referring to FIG. 4, the separation system 12 is configured to separate a green tape material 20 from a carrier web 22 such that the green tape material 20 can be processed downstream. In one or more embodiments, a source 16 of continuous tape material 18 to be separated is provided. As shown more clearly in FIG. 5, the continuous tape material 18 includes the green tape material 20 supported on the carrier web 22. In FIG. 4, the source 16 is provided in the form of a spool that unwinds the continuous tape material 18 to a carrier web removal station 24 (including a tension isolator 28 and a peeler 30). In one or more embodiments, the source 16 may include a belt or other form to feed a continuous tape material. In other contemplated embodiments, a source of the green tape material may be another station on the manufacturing line that continuously produces or may continuously produce green material, form and condition green tape for subsequent handling in the system(s) disclosed herein. Still other contemplated embodiments may use green tape material separated by organic material that is burned or otherwise removed, such as by the binder removal station disclosed herein.

According to an exemplary embodiment, the green tape material 20 includes grains of inorganic material (as described herein) that are sinterable and are bound together with an organic binder. The carrier web 22 may include a polymer, paper or a combination of a polymer and a paper material. In some embodiments, the green tape material includes an amount of polymer that is less than the polymer content of the carrier web 22, where polymer content is in terms of volume percent of the respective material. According to an exemplary embodiment, the green tape material 20 and the carrier web 22 each have a respective thickness (t) defined as a distance between the first major surface and the second major surface, a respective width (W) defined as a first dimension of one of the first or second surfaces orthogonal to the thickness, and a respective length (L) defined as a second dimension of one of the first or second surfaces orthogonal to both the thickness and the width, such as for green tape having a continuous cross-sectional geometry that is rectangular or oblong (e.g., where edges may be removed after sintering to form straight sides). In other contemplated embodiments, a tape of inorganic, sinterable material may be held together by an inorganic binder, such as an inorganic binder that becomes part of the sintered tape after processing in the system 10. In still other contemplated embodiments, the tape of inorganic material may be held together by bonding of the inorganic material to itself, such as with a partially sintered bisque tape as opposed to green tape, as disclosed herein, for example.

As will be described herein, according to an exemplary embodiment, the carrier web 22 provides or may provide the primary contact surface for conveying the continuous tape material through the separation system 12 and, in particular conveying the continuous tape material through the carrier web removal station 24. In other words, in at least some such embodiments the carrier web 22 is primarily contacted, leaving the green tape material 20 substantially uncontacted and thus, is substantially free of defects or flaws that are or may be generated by contact, such as repeating surface features due to imprinting of the surface of a wheel or roller on the green material of the tape that may be detectable in a finished sintered product. Other embodiments may include such defects or flaws, such as when aspects of technology disclosed herein are used without the carrier web removal station 24, for example.

When the source 16 is a spool, the continuous tape material has a first tension, which is relatively low (as will be further described herein) and has a propensity to unwind at relatively high speeds even when the continuous material is held in a constant and low tension. The separation system 12 functions or may function as a brake to reduce or otherwise control or limit the speed of unwind of the continuous tape material from the source 16.

According to at least some such exemplary embodiments, the carrier web removal station 24 includes a tension isolator 28 positioned in proximity to and downstream from the source 16 and a peeler 30 positioned downstream from the tension isolator 28. The tension isolator 28 and peeler 30 separate the carrier web 22 from green tape material 20 without damaging the green tape material. In particular the tension isolator 28 is designed and used to grip the carrier web and pace the velocity of the continuous tape material through the separation system. In one or more embodiments, after the carrier web 22 is separated from the green tape material, the speed at which the carrier web 22 is collected after separation from the green tape material 20 is controlled to maintain constant tension in the carrier web 22, and thus in the continuous green tape material 20. In one or more embodiments, the tension isolator 28 isolates the separation of the carrier web 22 from the green tape material 20 from the quality of the incoming green tape material 20 from the source 16. Without the tension isolator 28, any or some inconsistencies in the wind quality of the continuous tape material (i.e. too loose a wind, which can result in cinching during unwinding or feeding to the peeler 30) can cause tension and velocity variations at the peeler 30.

According to an exemplary embodiment, the continuous tape material 18 is fed at a first tension to the tension isolator 28, and the tension isolator of one or more embodiments has a structure or is configured to apply a second tension to carrier web 22, which is greater than the first tension of the continuous tape material 18, when conveying the continuous tape material 18 to the peeler 30. In some embodiments, the second tension (i.e. tensile force) is at least 20% greater than the first tension and/or at least 25 millinewtons (mN) greater, such as at least 100 mN greater, such as at least 200 mN greater. According to some such embodiments, the second tension is applied to the carrier web 22, but not or at least substantially not applied to the green tape material. In one or more embodiments, the green tape material 20 maintains the first tension as the continuous tape material is moved along the tension isolator 28. In one or more embodiments, as the continuous tape material is moved along the tension isolator 28, the green tape material comprises or has no tension or no tension beyond tension to support its own weight, or substantially no tension beyond tension to support its own weight, such as less than 1 newton (N) beyond tension to support its own weight. Accordingly, the tension isolator 28 creates a first tension zone 17 between the tension isolator 28 and the source 16 and a second tension zone 19 between the tension isolator 28 and the peeler 30. The tension applied to the carrier web 22 in the first tension zone 17 is less than the tension applied to the carrier web 22 in the second tension zone 19. In one or more embodiments, the tension (i.e. tensile stress) applied to the carrier web 22 in the second tension zone 19 is about 2.5 pounds per (linear) inch (PLI) or less. For example, in one or more embodiments, the tension applied to the carrier web 22 is about 2.4 PLI or less, about 2.3 PLI or less, about 2.2 PLI or less, about 2.1 PLI or less, about 2 PLI or less, about 1.8 PLI or less, about 1.6 PLI or less, about 1.5 PLI or less, about 1.4 PLI or less, about 1.2 PLI or less, or about 1 PLI or less. In one or more embodiments, the first tension is equal to or less than about 50% (e.g., about 45% or less, about 40% or less, about 35% or less, about 30% or less, or about 25% or less) of the second tension. In some embodiments, tension (i.e. tensile force) applied to the carrier web 22 in the second tension zone 19 is at least 20% greater than tension applied to the carrier web 22 in the first tension zone 17 and/or at least 25 millinewtons (mN) greater, such as at least 100 mN greater, such as at least 200 mN greater. In one or more embodiments, (nominal) additional tension is applied to the green tape material, other than the tension that is applied on the green tape material through the application of tension on the carrier web 28. In such embodiments, the carrier web may stretch due to such application of tension on the carrier web, which in turn creates some tension on the green tape material, such as where the overwhelming bulk of tension is borne by the carrier web.

In one or more embodiments, the tension isolator 28 applies a tension to the carrier web 22 that is greater than the tension applied to the green tape material 20. In some embodiments, the tension isolator applies a tension to the carrier web that is equal to or greater than about 2 times the tension applied to the green tape material, as the continuous tape material is moved from the source 16 to the peeler 30. In some embodiments, the tension isolator 28 applies a tension to the carrier web 22 that is at least 20% greater than the tension applied to the green tape material 20 and/or at least 25 millinewtons (mN) greater, such as at least 100 mN greater, such as at least 200 mN greater. As may be intuitive, tension as used herein generally refers to the lengthwise or axial pulling apart of material and when given units of force herein, tension refers to tensile force, and when given units of stress, tension refers to tensile stress, and/or tension herein may be given other units and refer to another related parameter, such as pounds per linear inch or the metric equivalent.

Figure 7:
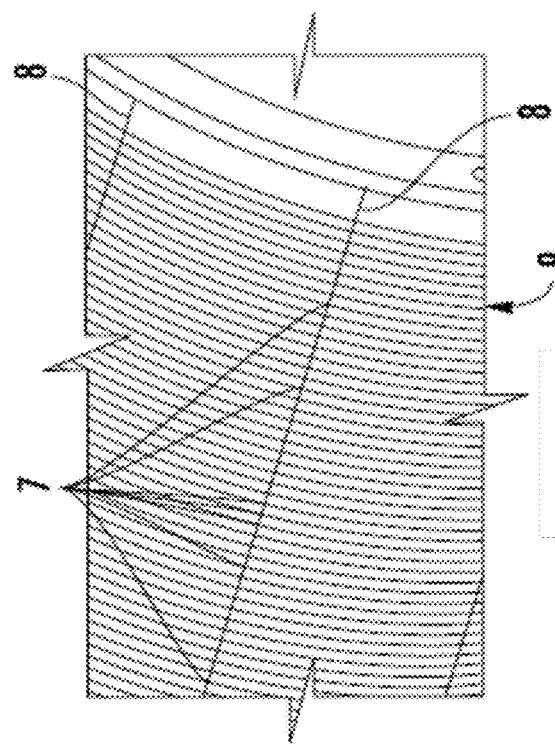
FIG. 7 is an enlarged view of the vacuum drum shown in FIG. 6, according to an exemplary embodiment.
Figure 6:
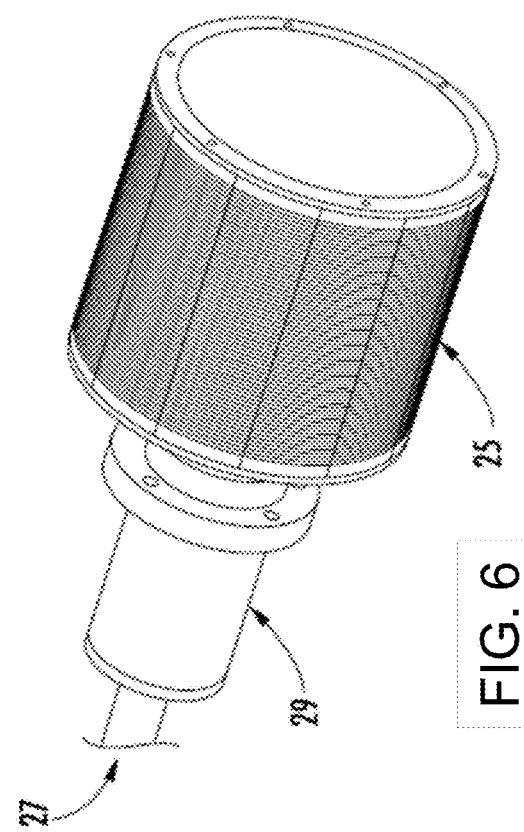
FIG. 6 is a perspective view of a vacuum drum, according to an exemplary embodiment.

In the embodiment shown in FIG. 4, the tension isolator 28 may include a vacuum drum 25. As illustrated in FIG. 6, in one or more embodiments, the vacuum drum 25 is rotated to move the continuous tape material by a drive motor input 27, which is connected to the vacuum drum by a bearing housing 29. As shown in FIG. 7, the vacuum drum may include an outer surface including a plurality of vacuum holes 7 disposed in a uniform distribution. The vacuum holes 7 may be formed along a plurality of axial grooves 8 and/or radial grooves, which intersect one another at a vacuum hole 7. A vacuum is supplied to the vacuum drum 25 via a vacuum source (e.g., a vacuum blower), which through the vacuum holes 7, grips the carrier web 22, thereby facilitating tensioning the carrier web, as described herein. In one or more embodiments, the distribution of the vacuum holes 7 and the configuration of the vacuum drum (including the diameter and vacuum force utilized) apply or help to apply a uniform tension to the carrier web along the width of the carrier web. Through this action and configuration, the vacuum drum paces the velocity of the carrier web (and thus the continuous tape material) as it travels through the separation system 12. In one or more embodiments, the tension isolator pulls the continuous tape material from the source along the first tension zone 17. Any or some inconsistencies in the delivery of the green tape material from the source 16 to the peeler 30, such as a loose wind (which can result in cinching during conveyance from the source to the peeler) do not or may not affect the separation process. Vacuum drum 25 provides a bonding or attracting force between the tape material (e.g. carrier web) and the vacuum drum 25 in addition to normal force and friction that are proportional to tension, thus increasing the bonding or attracting force without necessarily increasing tension in the tape material. At least because of this advantage, Applicants believe that use of a vacuum drum to control the bonding or attracting force between the tape material and a roller (i.e.

the vacuum drum) during the step of separating the green tape from the carrier web is a unique and effective process for protecting and controlling the shape of the green tape, which may be particularly delicate. With that said, aspects of the present technology may be used to create new sintered products, such as tapes that do have the indicia of separation without use of a vacuum drum as disclosed herein, such as repeating defects from rollers, changes in tape thickness, shorter lengths of tape, etc.

In one or more embodiments, the tension isolator 28 increases tension in the continuous tape material (and more particularly in the carrier web or mostly the carrier web) along the second tension zone 19 as the continuous tape material is conveyed to the peeler 30. In the embodiment shown in FIG. 4, the separation system 12 includes a load controller 21 to maintain the tension on the carrier web. In one or more embodiments, the load controller 21 is also used to adjust the velocity of the uptake reel 26 relative to the tension isolator 28.

In one or more embodiments, the peeler 30 is disposed downstream from the tension isolator 28 and directs the carrier web 22 in a rewind direction A and directs the green tape material 20 in a downstream processing direction B that differs from the rewind direction A, as shown in FIG. 8. In one or more embodiments, the rewind direction A and the downstream processing direction form an angle C that is greater than about 90 degrees (e.g., 95 degrees or greater, 100 degrees or greater, 110 degrees or greater or about 120 degrees or greater).

In one or more embodiments, the peeler 30 includes a sharp knife or edge to create a line of separation in the green tape material, such as at or proximate to the vertex of the angle C, shown as tip 31. In one or more embodiments, the sharp knife or edge creates a line of separation in the green tape material, but not the carrier web, just prior to a tip 31 or proximate to the tip 31, as shown in FIG. 8. In one or more embodiments, the tip has a radius of about 0.05 inches or less (e.g., about 0.04 inches or less, about 0.035 inches or less, about 0.03125 inches or less, about 0.03 inches or less, or about 0.025 inches or less).

As continuous tape material passes over the tip 31, the tip 31 separates the carrier web 22 from the green tape material 20. In one or more embodiments, the tip 31 separates the carrier web 22 from the green tape material 20 before directing the carrier web in the rewind direction A and directing the green tape material in the downstream processing direction B. In one or more embodiments, the tip 31 separates the carrier web 22 from the green tape material 20 simultaneously with directing the carrier web 22 in the rewind direction A and directing the green tape material 20 in the downstream processing direction B.

As shown in FIG. 4, the separation system 12 includes an uptake reel 26 for collecting the separated carrier web 22. In the embodiment shown, an optional idle roller 23 may be used to further control and maintain tension in the carrier web 22. In one or more embodiments, sensors 15 may also be used to control and maintain tension in the carrier web as the source 16 diameter decreases and the uptake reel 26 diameter increases, as more continuous tape material is conveyed through the separation system.

Another aspect of the support web removal station pertains to a method for separating two materials (e.g., the green tape material and the carrier web). In one or more embodiments, the method includes feeding the continuous tape material 18 to the tension isolator 28, applying tension to the carrier web 22 that is greater than a tension applied to the green tape material 20 with the tension isolator, and directing the carrier web to move in the rewind direction and directing the green tape material in a downstream processing direction that differs from the rewind direction, as described herein. In one or more embodiments, the method includes separating the carrier web from the green tape material before directing the carrier web in a rewind direction and directing the green tape material in the downstream processing direction. In one or more embodiments, the method includes separating the carrier web from the green tape material simultaneously with directing the carrier web in the rewind direction and directing the green tape material in the downstream processing direction. As taught above, embodiments of this method have the carrier web contacting the vacuum drum. In other embodiments, tape materials may have carrier webs on both sides of the tape, and elements of the separation station may be repeated and used to remove both carrier webs.

In one or more embodiments, the method includes applying no tension or substantially no or very little tension (as disclosed above) to the green tape material. In one or more exemplary embodiments, the method includes applying no tension or substantially no or very little tension to the green tape material as the continuous tape material moves from the source 16 to the tension isolator 28 along the first tension zone 17. In one or more exemplary embodiments, the method includes applying no tension or substantially no or very little tension to the green tape material as the continuous tape material moves from the tension isolator 28 to the peeler 30 along the second tension zone 19. In one or more embodiments, the method includes applying no tension or substantially no or very little tension to the green tape material 20 as the continuous tape 18 moves from the source 16 to the tension isolator 28 (along the first tension zone) and to the peeler 30 (along the second tension zone). In one or more embodiments, the method includes applying tension to the carrier web 22 that is at least two times greater than the tension applied to the green tape material 20 (at any point along the separation system 12). Selecting a carrier web with low elasticity may facilitate having the carrier web bear a bulk of tension applied to the tape material.

In one or more embodiments, the method includes applying no additional tension to the green tape material, other than the tension that is applied on the green tape material through the application of tension on the carrier web 28. In such embodiments, the carrier web may stretch due to such application of tension on the carrier web, which in turn creates some tension on the green tape material. In one or more exemplary embodiments, the method includes applying no additional tension to the green tape material as the continuous tape material moves from the source 16 to the tension isolator 28 along the first tension zone 17. In one or more exemplary embodiments, the method includes applying no additional tension to the green tape material as the continuous tape material moves from the tension isolator 28 to the peeler 30 along the second tension zone 19. In one or more embodiments, the method includes applying no additional tension to the green tape material 20 as the continuous tape 18 moves from the source 16 to the tension isolator 28 (along the first tension zone) and to the peeler 30 (along the second tension zone).

In one or more embodiments, the method for separating two materials (i.e., the green tape material and the carrier web) includes feeding the continuous tape material to the tension isolator and applying a first tension to the carrier web, applying a second tension to the carrier web that is greater than the first tension, and directing the carrier web to move in a rewind direction and directing the green tape material in a downstream processing direction that differs from the rewind direction. In one or more embodiments, applying a first tension comprises applying no tension or little tension as disclosed herein. In one or more embodiments, applying a first tensions comprises applying no or little tension to the carrier web as the continuous tape material moves from the source 16 to the tension isolator 28 along the first tension zone. In one or more embodiments, the second tension is about 2.5 PLI or less. For example, in one or more embodiments, the tension applied to the carrier web 22 is about 2.4 PLI or less, about 2.3 PLI or less, about 2.2 PLI or less, about 2.1 PLI or less, about 2 PLI or less, about 1.8 PLI or less, about 1.6 PLI or less, about 1.5 PLI or less, about 1.4 PLI or less, about 1.2 PLI or less, or about 1 PLI or less. In one or more embodiments, the first tension is equal to or less than about 50% (e.g., about 45% or less, about 40% or less, about 35% or less, about 30% or less, or about 25% or less) of the second tension.

In one or more embodiments, the method includes at least partially sintering the green tape material (as will be discussed in more detail herein related to the sintering station), after it is separated from the carrier web 22. In one or more embodiments, the method includes spooling the carrier web 22 onto an uptake reel 26, after the carrier web 22 is separated from the green tape material 20. In one or more embodiments, the method includes continuously maintaining the tension on the carrier web 22 along the second tension zone and until the carrier web is spooled onto the uptake reel.

Binder Removal Station

As noted above regarding FIG. 3, system 10 includes a heating station configured to remove binder material from green tape 20 which, in at least some embodiments, is actively and independently heated separately from the sintering stations. In other embodiments, such as with firing of bisque tapes as disclosed herein, there may be no heating station. Applicant believes that actively heating a station dedicated to binder removal with its own controllable heat source, independent of heaters within the sintering furnace, allows for greater control of the binder removal process, reducing likelihood of combustion of volatiles in the binder of the green tape, which is particularly beneficial for wide green tapes (e.g., at least 5 mm, at least 10 mm, at least 30 mm, at least 50 mm). Other embodiments include passively-heated binder removal stations disclosed herein, where the stations use heat emitted from an adjoining sintering furnace.

Figure 9:
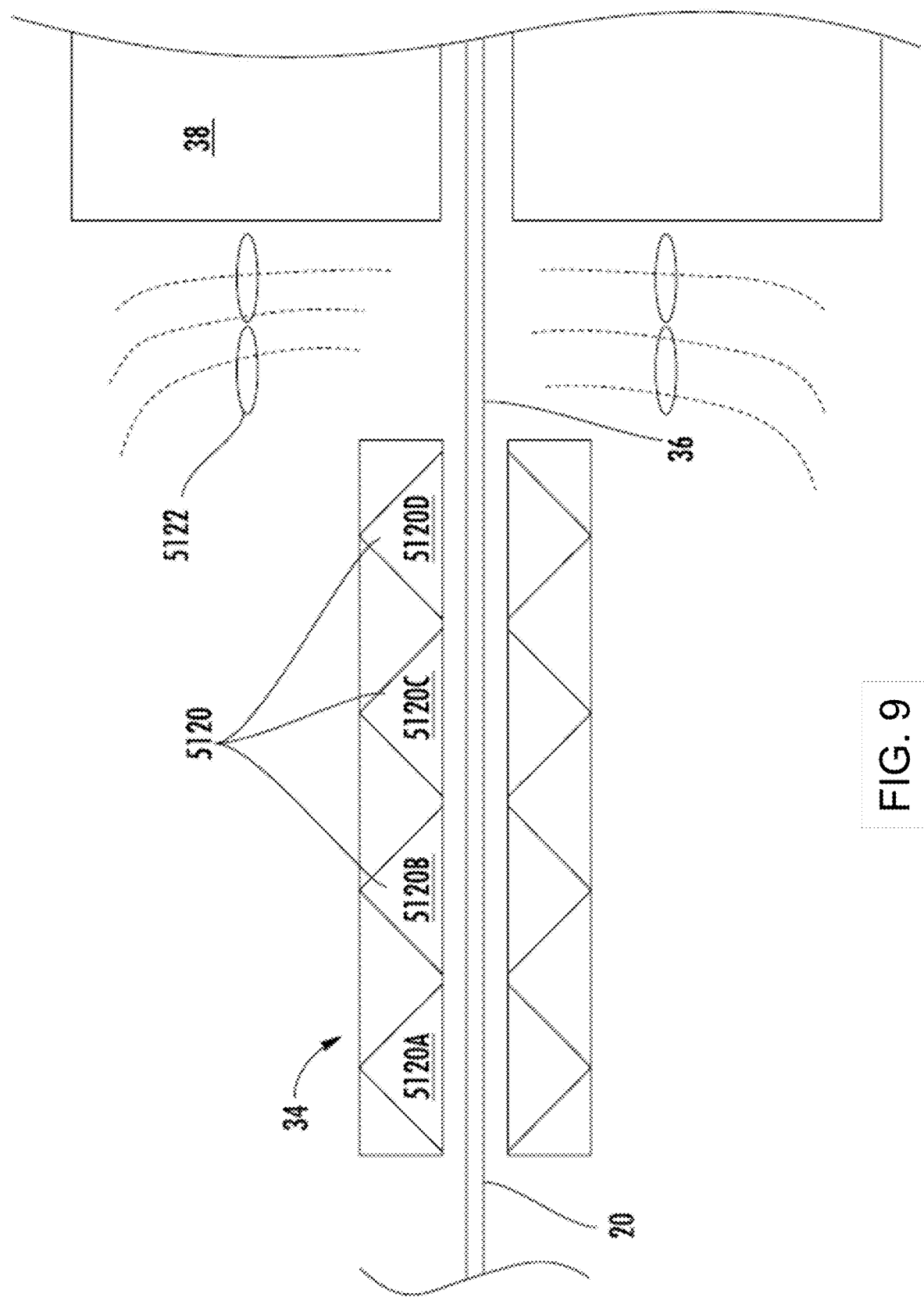
FIG. 9 is a conceptual side view of a station of a manufacturing line to prepare green tape for sintering, according to an exemplary embodiment.

According to an exemplary embodiment, as shown in FIG. 3, a binder removal station 34 receives green tape 20 from separation station 12, and green tape 20 then advances through the binder removal station 34. Referring now to FIG. 9, a detailed view of binder removal station 34 of system 10 is shown and described in more detail.

As discussed above, the green tape 20 includes grains of an inorganic material bound by a binder as disclosed herein, such as an organic binder. The binder removal station 34 receives the green tape 20 and prepares the green tape 20 for sintering by chemically changing the binder and/or removing the binder from the green tape 20, leaving the grains of the inorganic material, to form self-supporting, unbound tape 36, which may be moved in the processing direction 14 into sintering station 38, as discussed in more detail below. According to an exemplary embodiment, at an instant (i.e. a single moment in time) the green tape 20 simultaneously extends toward, into, through, within, adjacent to, and/or away from the station 34. Accordingly, as will be understood, the tape material being processed in system 10 simultaneously includes the green tape 20 which is continuously connected to unbound tape 36, as the tape material traverses binder removal station 34.

According to an exemplary embodiment, the binder of the green tape 20 may be a polymer binder and the binder is chemically changed and/or removed from the green tape 20 by heating the binder to burn or char the binder. According to an exemplary embodiment, the binder removal station 34 chars or burns at least most of the organic binder in terms of weight from the first portion of the green tape 20 without sintering the grains of the inorganic material, which can be measured by weighing the green tape before binder removal at the station 34 as well as the inorganic material prior to forming the green tape, then weighing the unbound tape 36 following operation of the binder removal station 34 and comparing differences. If remnants of the binder remain, such as carbon, Applicant believes that subsequent sintering, at higher temperatures, may generally remove those remnants. In other contemplated embodiments, the binder may be chemically removed, such as formed from a material selected to chemically react with another material (e.g., catalyst, gas) delivered to the green tape at a binder removal station prior to sintering. In still other contemplated embodiments, the binder may be evaporated or otherwise vaporized and outgassed from the green tape 20 at a station prior to sintering.

Still referring to FIG. 9, according to an exemplary embodiment, the binder removal station 34 comprises an active heater 5120 to char or burn at least most of the organic binder from the green tape 20 as the green tape 20 interfaces with the binder removal station 34 to form the unbound tape 36 (e.g., by reducing weight of the portion of the green tape 20 that is not inorganic material to be sintered by greater than 50%, such as greater than 70%, such as greater than 90%; by reducing weight of the overall green tape 20 by greater than 30%, such as greater than 50%). The active heater 5120 provides heat energy to the green tape 20 to burn out the binder. In some embodiments, the heater 5120 is or includes an electrical heating element, such as an inductive or resistive heating element. In other embodiments, the heater 5120 is or includes a combustion heating element, such as a gas heating element. In still other embodiments, the heater 5120 is or includes a microwave and/or a laser or other heating element. Such heating elements may also be used in the sintering station 38, but heat to different temperatures as disclosed herein.

According to an exemplary embodiment, the active heater 5120 of the binder removal station 34 includes heating zones, such as zones 5120A, 5120B, 5120C, 5120D such that the rate of heat energy received by the green tape 20 increases as the green tape 20 advances through the binder removal station 34. In some embodiments, the rate of heat energy received by the green tape 20 increases in a nonlinear manner, such as slowly increasing at first, as the binder degrades and emits combustible gaseous byproducts, and then faster as the potential for the green tape 20 catching fire is reduced. This heat zone approach and more specifically the non-linear approach may be particularly useful for sintering of tapes, as disclosed herein, which may travel a manufacturing line, such as system 10, at a constant rate. According to an exemplary embodiment, temperatures experienced by the green tape 20 in the binder removal station 34 may be at least 200° C., such as at least 250° C., and/or below a sintering temperature for the inorganic grains carried by the green tape 20, such as less than 1200° C., such as less than 900° C. In contemplated embodiments, for at least some materials disclosed herein, the binder removal station 34 may sinter, at least to some degree, inorganic material of the tape, such as possibly bonding individual grains to one another, which may increase tensile strength of the tape.

According to an exemplary embodiment, the binder removal station 34 blows and/or draws gas over and/or under (e.g., over and under) the green tape 20 as the green tape 20 advances through the binder removal station 34. In some embodiments, the heater 5120 may provide a flow of hot air to communicate some or all of the heat energy to the green tape 20, as may be delivered through an array of nozzles through a wall from a plenum, or through a porous wall material. In other embodiments, flow of the gas is facilitated by fans or pumps adjoining the binder removal station 34, such as fan 5122 shown in FIG. 9. Tanks of pressurized gas may also be used as sources to supply gas to be blown over the tape. In some embodiments, the gas is air. In other embodiments, the gas is an inert gas, such as argon.

In some embodiments, gas is blown and/or drawn over both the topside and underside of the green tape 20, while in other embodiments, the gas is directed only over the topside or the underside. In some such embodiments, the green tape 20 is directly supported by a gas bearing and/or an underlying surface and moves relative to that surface. For example, the green tape 20 may slide along and contact an underlying surface, such as a surface made of stainless steel. In some embodiments the gas is heated to a temperature above room temperature before blowing or drawing it over the tape, such as to at least 100° C., which Applicants have found may help prevent thermal shock of the green tape 20, which may influence properties of resulting sintered material, such as providing increased strength or flatness due to fewer sites of surface irregularities and stress concentrations.

Actively blowing or drawing gas over the green tape 20, especially air or gas containing oxygen, may be counterintuitive to those of skill in the art because one might expect the oxygen to fuel and promote the tape catching fire, which could distort the shape of the green tape 20 and/or otherwise harm quality of the green tape 20 as tape 20 traverses station 34. However, Applicant has found that as the green tape 20 is conveyed through the binder removal station 34, blowing and/or drawing gas, including air in some embodiments, over the green tape 20 actually helps the tape not to catch fire. For example, Applicant has found that while the binder is removed and/or charred by the binder removal station 34 without catching fire, that the tape catches fire when moving at the same rate through the station 34 if air is not blown over the green tape 20. Applicant contemplates that risk of catching the green tape 20 on fire may also be reduced and/or eliminated by moving the green tape 20 slower through the binder removal station 34, further spacing apart the heat zones 5120A, 5120B, 5120C, 5120D, using flame retardants in the binder and increasing ventilation of the binder removal station 34, and/or combinations of such technologies.

While gas may be actively blown and/or drawn over the green tape 20 and/or the unbound tape 36, Applicant has found that the unbound tape 36 may be particularly susceptible to damage from vibration and/or out-of-plane bending depending upon how the gas flows. Accordingly, in some embodiments, the gas flowing through the binder removal station 34 is and/or includes laminar flow. The flow of the air may be diffused and/or may not be directed to the unbound tape 36. In some embodiments, a gas source or motivator (e.g., fan, pump, pressurized supply) delivers at least 1 liter of gas per minute through the binder removal station 34, such as through the passage 5128 (see FIG. 10).

According to some embodiments, the green tape 20 advances horizontally, not vertically through the binder removal station 34. Orienting the tape horizontally may help control airflow through the binder removal station 34, such as by reducing a "chimney effect," where hot gasses rise and pull too much air through the binder removal station 34, vibrating the unbound tape 36. Air pumps, fans, and surrounding environmental air conditions (e.g., high temperatures) offset and/or control the chimney effect without horizontally orienting the green tape 20 through the binder removal station 34 in other contemplated embodiments.

According to an exemplary embodiment, the unbound tape 36 is under positive lengthwise tension as the green tape 20 advances through station 34. Tension in the green tape 20 may help hold the green tape 20 in a flat orientation, such as if the green tape 20 subsequently passes into another station of the manufacturing system for further processing, such as a sintering station 38. Without the binder (e.g., following binder removal in station 34), the unbound tape 36 may be weaker than the green tape material 20, such as having lesser ultimate tensile strength, such as half or less, such as a quarter or less. According to an exemplary embodiment, lengthwise tension (i.e. tensile stress) in the unbound tape 36 is less than 500 grams-force per $mm^2$ of cross section. Applicant believes the green tape 20 is substantially more bendable than the unbound tape 36 such that a minimum bend radius without fracture of the green tape 20 is less than half that of the unbound tape 36 (e.g., less than a quarter, less than an eighth), when measured via ASTM standards, see E290, where bend radius is the minimum inside radius the respective portions of the green tape 20 can bend about a cylinder without fracture.

In at least some embodiments, following processing through the binder removal station 34, the unbound tape material 36 moves into sintering station 38 (discussed in more detail below), which at least partially sinters the inorganic material of the unbound tape 36 to form sintered tape 40. Accordingly, for continuous processing, at an instant the green tape 20 is continuously connected to sintered tape 40 by way of the unbound tape 36.

In some such embodiments, binder removal station 34 is close to the sintering station 38 such that distance therebetween is less than 10 m (e.g., less than 10 mm, less than 2.5 cm, less than 5 cm, less than 10 cm, less than 25 cm, less than 100 cm, less than 5 m, etc. between the outlet opening of the binder removal station 34 and the entrance opening 106 (see FIG. 12) of the sintering station 38) thereby mitigating thermal shock that unbound tape 36 may experience in the gap between station 34 and station 38, which may influence properties of resulting sintered material, such as providing increased strength or flatness due to fewer sites of surface irregularities and stress concentrations. In contemplated embodiments, binder removal station 34 is in direct contact with and adjoins the sintering station 38 and/or is under a common housing therewith, however in at least some such embodiments an intermediate vent draws away fumes or other byproducts of the binder removal.

Figure 10:
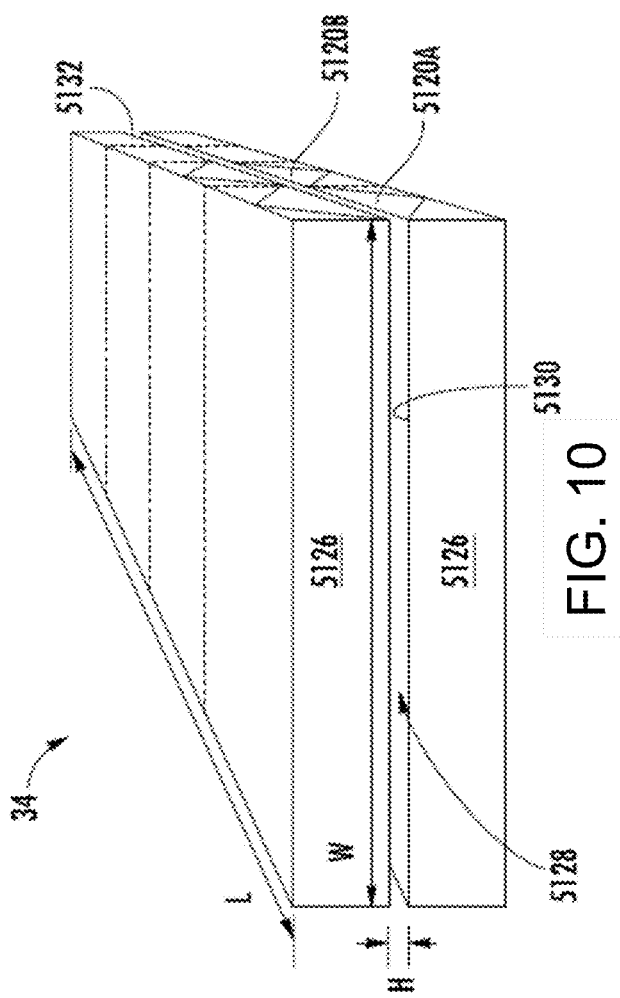
FIG. 10 is a front perspective of the station of FIG. 9, according to an exemplary embodiment.

Referring now to FIG. 10, the binder removal station 34 includes walls 5126 defining a passage 5128 having inlet and outlet openings 5130, 5132 on opposing ends of the passage 5128. The passage has a length L between the inlet and outlet openings 5130, 5132, which in some embodiments is at least 5 cm, such as at least 10 cm, and/or no more than 10 m. According to an exemplary embodiment, the outlet opening 5132 and/or the inlet opening 5130 is narrow and elongate, such as having a height H and a width W orthogonal to the height H where the height H is less than half the width W, such as less than a fifth the width W, such as less than a tenth the width W. In some such embodiments, the height H is less than 5 cm, such as less than 2 cm, such as less than 1 cm, and/or at least greater than a thickness of green tape 20 to be processed thereby, such as at least greater than thicknesses of green tape disclosed herein, such as at least greater than 20 μm. Applicant has found that having a narrow opening(s) improves performance of the binder removal station 34 by limiting circulation of gas (e.g., ambient airflow) at the inlet and outlet openings 5130, 5132. In some embodiments, the passage 5128 is straight, while in other embodiment the passage is gently arcing, such as having a radius of curvature of greater than 1 m, where the arcing and corresponding curvature of the tape may help shape or flatten the tape.

Figure 11:
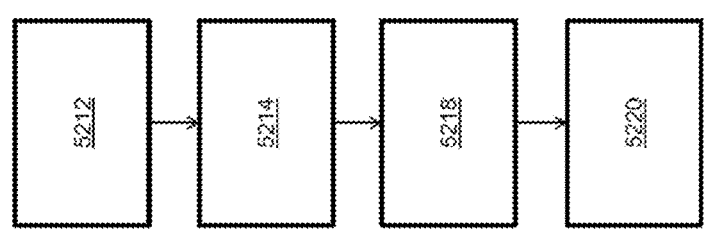
FIG. 11 is a block diagram of a method for processing a green tape to at least in part prepare the green tape for sintering, according to an exemplary embodiment

Referring to FIG. 11, a method of processing tape 5210 includes a step of advancing tape through a manufacturing system 5212 (e.g., binder removal station 34 or other manufacturing systems disclosed herein), such as where the tape includes a first portion having grains of an inorganic material bound by a binder (e.g., green tape 20). The method further includes a step of preparing the tape for sintering 5214 by forming a second portion of the tape (e.g., unbound tape 36) at a station of the manufacturing system by chemically changing the binder and/or removing the binder from the first portion of the tape, leaving the grains of the inorganic material, thereby forming a second portion of the tape.

In some such embodiments, the step of preparing the tape for sintering 5214 further comprises charring or burning at least most of the binder from the first portion of the tape (e.g., as discussed above) with or without contemporaneously sintering the grains of the inorganic material. In some embodiments, the station of the manufacturing system is a first station and the method of processing 5210 further comprises steps of receiving the second portion of the tape at a second station 5218, and at least partially and/or further sintering the inorganic material of the second portion of the tape 5220 at the second station to form a third portion of the tape.

In some embodiments, the method of processing 5210 further comprises positively tensioning the second portion of the tape as the tape advances 5212. In some such embodiments, positively tensioning is such that lengthwise tension (i.e. tensile stress) in the second portion of the tape is less than 500 grams-force per mm$^2$ of cross section. In some embodiments, the method of processing 5210 further comprises blowing and/or drawing gas over the tape while preparing the tape for sintering 5214. In some embodiments, the step of advancing the tape 5212 further comprises horizontally advancing the tape through the station, and/or directly supporting the tape by a gas bearing and/or an underlying surface and moving the tape relative to that surface and/or relative to the opening 5128.

Example of Binder Removal

Applicant has used a binder burn-out furnace similar to binder removal station 34 to remove binder from green tape prior to sintering. In one example, the green tape was tape cast zirconia ceramic grains loaded with polymer binder forming a ribbon of about 42 mm wide and about 25 μm thick. The green tape was feed through a horizontal six-hot-zone binder burnout furnace at 20 inches per minute. The binder burnout furnace was set at 325° C. inlet to 475° C. outlet with 0 to 25° C. increasing degree increments for the other four hot zones. About 7.5 liters per minute of air flow at temperatures 0 to 250° C. was also provided. The air flow was divided between both sides of the binder burn-out furnace. The furnace was 36 inches long and had an 18-inch hot zone.

Sintering Station

Referring to FIG. 12 through FIG. 20, sintering station 38 is shown and described in more detail. In general, following removal of binder material from green tape 20 within binder removal station 34, unbound tape 36 moves into sintering station 38.

In at least one specific embodiment, sintering station 38 includes a sintering furnace 100. Sintering furnace 100 includes an insulated housing 102. In general, insulated housing 102 includes a plurality of internal walls that define a channel 104 that extends through sintering furnace 100 between an entrance, shown as entrance opening 106, and an exit, shown as exit opening 108. Binder removal station 34 is located adjacent to entrance opening 106 such that green tape material 20 passes through binder removal station 34 producing unbound tape material 36 as described above. Unbound tape material 36 passes into entrance opening 106 and through channel 104. While within channel 104, heat generated by a heater (explained in more detail below, and above with regard to different types of heating elements) causes sintering of unbound tape 36 to form sintered tape 40, and sintered tape 40 passes out through exit opening 108 for further processing or uptake as shown in FIG. 3. Depending on the temperature profile that unbound tape 36 is exposed to during sintering, upon exiting sintering furnace 100, tape 40 may be fully sintered or partially sintered. Whether tape 40 is partially sintered or fully sintered, the porosity of tape 40 is less than the porosity of green tape 20 due to the sintering that occurs within furnace 100. Similarly, in some embodiments, the width of tape 40 is less than the width of green tape 20. In some such and yet other embodiments, shrinkage of unbound tape 36 may be controlled during sintering such that thickness, width and/or length of tape 40 is less than the thickness of green tape 20.

Figure 12:
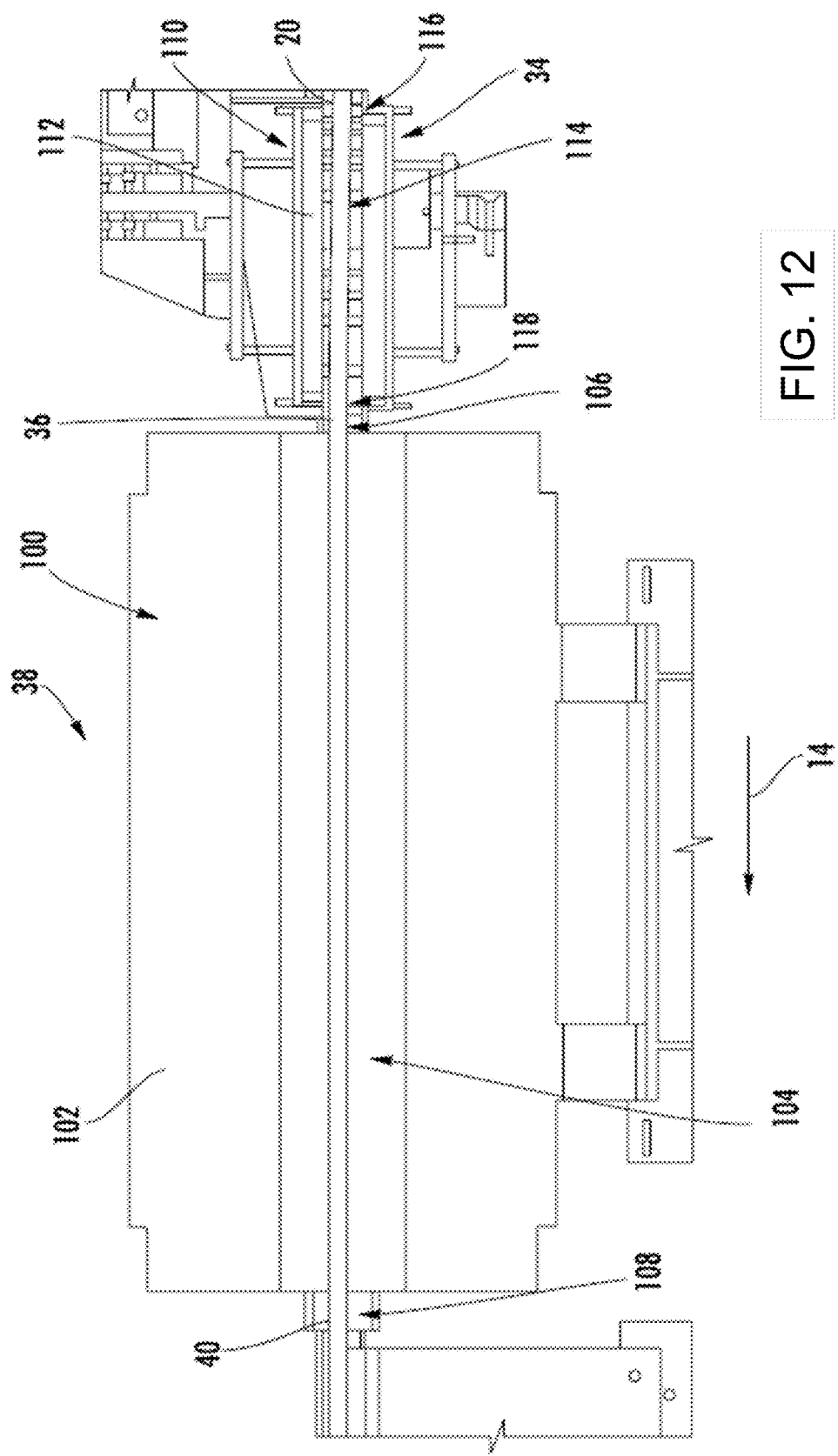
FIG. 12 is a detailed view of the binder removal station and the sintering station of the system of FIG. 3, according to an exemplary embodiment.
Figure 15:
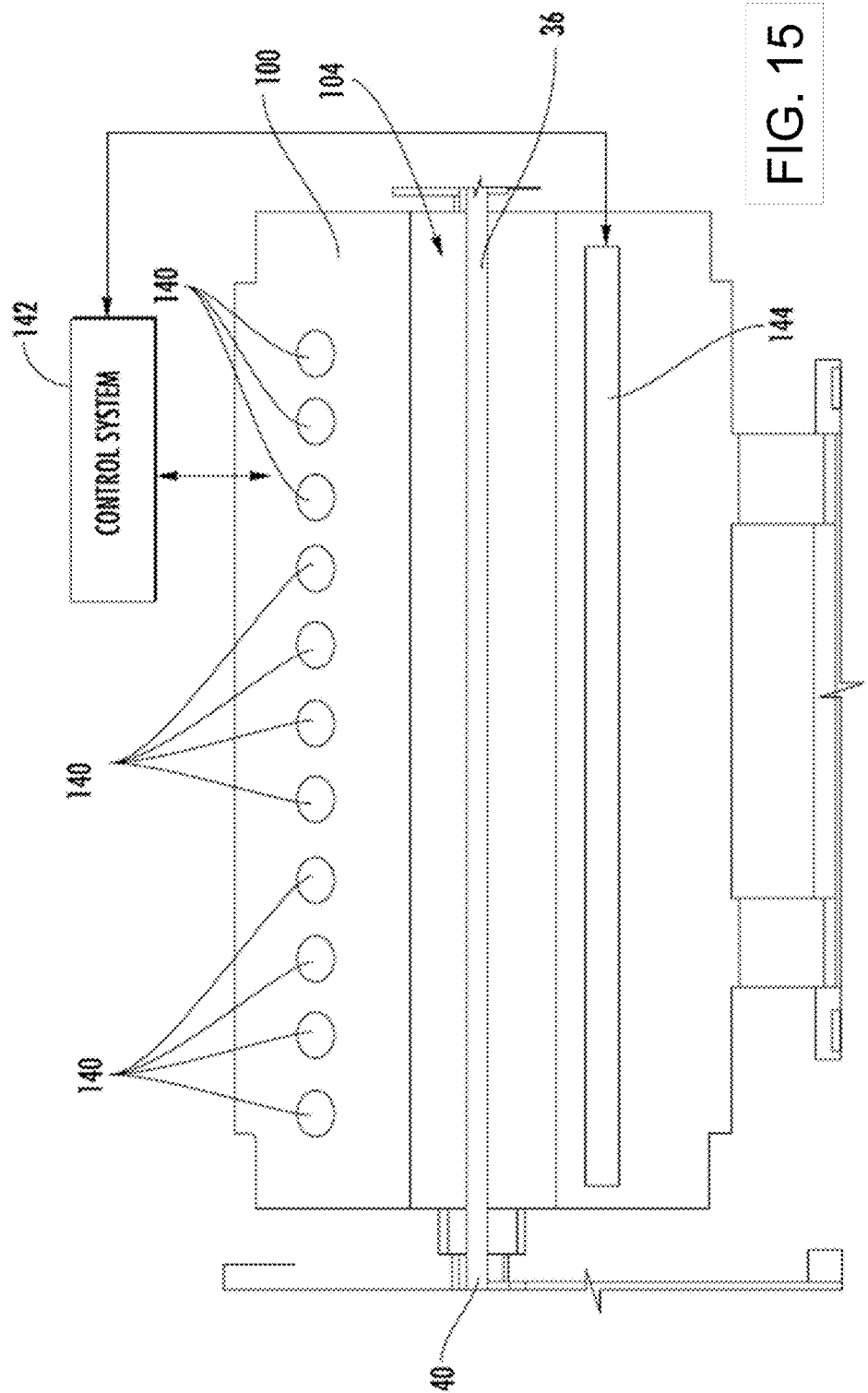
FIG. 15 is a view of the sintering station of FIG. 12 showing a heating system, according to an exemplary embodiment.

As can be seen in FIG. 12, and in contrast to typical discreet piece based sintering systems, unbound tape 36 is a continuous length of material that extends completely through furnace 100. In this arrangement, a single continuous length of unbound tape 36, extends into entrance 106, through channel 104 and out of exit 108. As will be understood, because unbound tape 36 is continuous through furnace 100, its left edge, its right edge and its centerline (e.g., a longitudinal line located parallel to and equidistance from the left edge and the right edge) also or may also extend the entire distance through furnace 100 between entrance 106 and exit 108. For reference, FIG. 14, shows the edges referenced above, as edges 130 and 132, after exiting sintering furnace 100. This relationship between the continuous tape 36 and furnace 100 is believed to be unique to the roll-to-roll sintering process discussed herein and is different from the physical arrangement of tunnel kiln processing for sintering in which discreet pieces of material move through a furnace supported by a setter board that moves through the furnace with the piece that is being sintered. For example, in some embodiments, the tape slides along and/or relative to a surface(s) (e.g., lower surface 126) through channel 104 of furnace 100, and is not carried on a setter or conveyor, which may reduce bonding to and adhesive wear of the tape associated with setters and static versus dynamic friction and adhesion.

As noted above, Applicant has found that a high level of horizontality of channel 104 and/or of unbound tape 36 within channel 104 reduces the effect of turbulent air flow on tape 36 during sintering. As shown in FIG. 12, channel 104, entrance 106, and exit 108 lie in a substantially horizontal plane. In specific embodiments, the path defined through the central axes of channel 104, entrance 106, and exit 108 defines a substantially horizontal plane and/or gradual arc or curve (e.g., having a radius of curvature of at least 1 m). Similarly, in such embodiments, unbound tape 36 may also lie within a substantially horizontal plane and/or gradual arc or curve within channel 104 (e.g., upper surface 124 and/or lower surface 126 of tape 36, shown in FIG. 13, lie in a substantially horizontal plane). As used herein a substantially horizontal plane of tape 36 and defined by channel 104, entrance 106, and exit 108 is one that forms angle of 10 degrees or less relative to a horizontal reference plane. In other specific embodiments, channel 104, entrance 106, and exit 108 and/or tape 36 within channel 104 lie in an even more horizontal plane, such as a plane forming an angle of 3 degrees or less relative to a horizontal reference plane, and more specifically at an angle of 1 degree or less relative to a horizontal reference plane. In other embodiments, the channel 104 is not so oriented, and the corresponding sintered tape may have indicia (e.g., rolling surface mounds or bumps) associated with the "chimney effect" or irregular heating, such as if air flow through the channel 104 is turbulent.

To further control or limit turbulent air flow that the tape material of system 10 is exposed to during traversal of system 10, binder removal station 34 may be positioned relative to sintering station 38 in manner that maintains the tape material (e.g., green tape material 20 within binder removal station and unbound tape material 36 within sintering station) in a substantially horizontal position as tapes 20 and 36 traverse binder removal station 34 and sintering station 38. In such embodiments, similar to the horizontal positioning of sintering channel 104, binder removal station 34 is or may be also oriented in a substantially horizontal position, such as where openings 116, 118 are aligned to form a line therebetween that is within 10 degrees of horizontal.

In such embodiments, binder removal station 34 includes a binder burn out furnace 110. Binder burn out furnace 110 includes an insulated housing 112. In general, insulated housing 112 includes a plurality of internal walls that defines a channel 114 that extends through binder burnout furnace 110 between an entrance opening 116, and an exit opening 118.

As shown in FIG. 12, referring to binder burn out furnace 110, channel 114, entrance opening 116, and exit opening 118 lie in a substantially horizontal plane. In specific embodiments, the path defined through the central axes of channel 114, entrance 116, and exit 118 defines a substantially horizontal plane. Similarly, in such embodiments, green tape 20 may also lie within a substantially horizontal plane within channel 114. As used herein a substantially horizontal plane of green tape 20 and of channel 114, entrance opening 116, and exit opening 118 is one that forms an angle of 10 degrees or less relative to a horizontal reference plane. In other specific embodiments, channel 114, entrance opening 116, and exit opening 118 and/or green tape 20 within channel 114 lie in an even more horizontal plane, such as a plane forming an angle of 3 degrees or less relative to a horizontal reference plane, and more specifically at an angle of 1 degree or less relative to a horizontal reference plane. In still other embodiments, these features may not be so horizontally aligned.

In addition to maintaining horizontality of green tape 20 and unbound tape 36 within binder burnout furnace 110 and sintering furnace 100, respectively, binder burnout furnace 110 (also called binder removal station) and sintering furnace 100 are aligned relative to each other such that unbound tape 36 maintains a horizontal position as unbound tape 36 transitions from binder burnout furnace 110 to sintering furnace 100. Applicant has found that at this transition point, unbound tape 36 is particularly susceptible to deformation or breakage due to various forces (such as force caused by turbulent airflow) because with most of the organic binder removed, the unsintered inorganic grains of unbound tape 36 are held together by relatively weak forces (e.g., Van der Walls forces, electrostatic interaction, a small amount of remaining organic binder, frictional interaction/engagement between adjacent particles, low levels of inorganic carried in the binder, plasticizer, liquid vehicle, perhaps some particle-to-particle bonding etc.), and thus, even relatively small forces, such as those cause by turbulent airflow interacting with unbound tape 36, can cause deformation or breakage.

Thus, as shown in FIG. 12, to limit turbulent airflow, channel 114 of binder burnout furnace 110 is aligned with channel 104 of sintering furnace 100 in the vertical direction. Following the tape path through sintering furnace 100 and binder burnout furnace 110, green tape 20 moves in the horizontal direction from the input roll (shown in FIG. 3) into binder burnout entrance 116, through binder burnout channel 114 and out of binder burnout exit 118. While within channel 114, heat generated by the heater of furnace 110 chemically changes and/or removes at least a portion of the organic binder material of green tape 20, called "burnout." In addition, the relative positioning of binder burnout furnace 110 and sintering furnace 100 is such that unbound tape 36 moves into sintering furnace 100 from binder burnout furnace 110 all while remaining in a horizontal position or a generally horizontal position as described above. Thus, the vertical alignment between channels 104 and 114 allows unbound tape 36 to remain in the substantially the same horizontal plane (i.e., without shifting up or down between furnaces 110 and 100) as the tape material traverses both furnaces 100 and 110, at least in some embodiments.

Applicant has determined that a benefit of horizontal binder removal and/or horizontal sintering becomes more important as the width of the tape material increases because wider tape materials are more susceptible to airflow turbulence-based deformation. Thus, Applicant believes that the horizontal arrangement of sintering furnace 100 and/or binder burnout furnace 110 allows for production of wider and/or longer sintered tape materials without significant deformation or breakage believed not achievable using prior systems.

Referring to FIG. 13 and FIG. 14, in addition to horizontal positioning of binder burnout furnace 110, of the sintering furnace 100 and of the tape materials (e.g., green tape 20 and unbound tape 36) within the furnaces, Applicant has also discovered that turbulent airflow can be limited by providing sintering channel 104 with a relatively low height dimension (which in turn relates to a relatively low clearance relative to unbound tape 36). Applicant has discovered that turbulent airflows, that may otherwise be experienced due to the very hot air within channel 104, can be limited by decreasing the volume of the region within which thermal gradients can develop and within which such thermal gradients can cause air to move.

As shown in FIGS. 13 and 12, channel 104 is defined in part by a horizontal, and generally upwardly facing surface 120 which defines at least a portion of the lower surface of channel 104. Similarly, channel 104 is also defined in part by a horizontal, and generally downwardly facing surface 122 which defines at least a portion of the upper surface of channel 104. A first gap, shown as G1, is the vertical distance between upwardly facing surface 120 and downwardly facing surface 122, and G2 is the vertical distance or clearance between downwardly facing surface 122 and upper surface 124 of unbound tape 36.

As noted above, in various embodiments, G1 and G2 are relatively small such that turbulent air flow is limited, but G1 and G2 should generally be large enough that various processing steps (e.g., threading of channel 104 for example) are possible. In various embodiments, G2 is less than 0.5 inches (less than 12.7 mm), specifically is less than 0.375 inches (less than 9.5 mm) and more specifically is 0.25 inches (about 6.35 mm). As will be understood, G1 is generally equal to G2 plus the thickness T1 of unbound tape 36. Thus, in various embodiments, because T1 is relatively low, e.g., between 3 microns and 1 millimeter, G1 is less than 1 inch (less than 25.4 mm), specifically less than 0.75 inches (less than 19 mm), and for thin tape materials may be less than 0.5 inches (less than 12.7 mm), and for very thin tape materials may be less than 0.375 inches (less than 9.5 mm).

FIG. 14 shows exit 108 of sintering furnace 100 showing the small clearance, G2, relative to tape 40 according to an exemplary embodiment. In various embodiments, G1 and G2 may represent the maximum gap distances between the relevant surfaces and in another embodiment, G1 and G2 may represent the average gap distances between the relevant surfaces measures along the length of channel 104.

In specific embodiments, surface 120 and/or surface 122 are also substantially horizontal surfaces (as described above) that extend between entrance 106 and exit 108 of furnace 100. In such embodiments, surfaces 120 and 122 therefore define a substantially horizontal channel 104. In some specific embodiments, surfaces 120 and/or 122 may be flat, planar horizontal surfaces extending the entire distance between entrance 106 and exit 108 of furnace 100. In other specific embodiments, surfaces 120 and/or 122 may be gradually arcing or curving as described above, as may also be the case with the binder removal station. In specific embodiments, surfaces 120 and/or 122 are substantially horizontal such that the surfaces form an angle less than 10 degrees, specifically less than 3 degrees and even more specifically less than 1 degree relative to the horizontal reference plane.

As shown in FIG. 13, a lower surface 126 of unbound tape 36 is in contact with upwardly facing surface 120 such that lower surface 126 of unbound tape 36 slides along or relative to upwardly facing surface 120, as unbound tape 36 advances through furnace 100. In particular embodiments, the sliding contact between lower surface 126 and upwardly facing surface 120 during sintering creates or may create various longitudinal features (e.g., longitudinally extending marks, troughs, ridges, etc.) formed in lower surface 126 but not on the upper surface 124. Therefore, in specific embodiments, the surface features on lower surface 126 are different from those of upper surface 124 which is not in contact with an opposing surface during sintering. In particular, this sliding contact is substantially different from the arrangement in some firing processes, such as tunnel kiln processes, in which a ceramic material is placed on a setter board and both move together through the sintering furnace. In specific embodiments, surfaces 120 and 122 are or comprise alumina, such as inner surfaces of an alumina tube that defines channel 104.

In addition the positional arrangements and airflow control arrangements discussed above, Applicant has also found that control of the temperature profile through furnace 100, that unbound tape 36 is exposed to, is important to limit tape deformation or breakage, which Applicant has discovered may occur if the temperate rise is too fast (e.g., sintering rate is too fast or over too short a distance in the tape). In general referring to FIG. 15, furnace 100 may include a plurality of independently controlled heating elements 140 positioned to deliver heat to channel 104 in order to cause sintering of unbound tape 36 as tape 36 traverses furnace 100. While the maximum and minimum sintering temperatures will vary at least in part based on the type of inorganic material grains carried by tape 36, in general, heating elements 140 are configured to generate a temperature of at least 500 degrees C. along at least a portion of channel 104. In some embodiments, for example for sintering $ThO_2$ (thoria) and/or $TiO_2$ (titania), channel 104 may be heated to maximum temperatures above 3100 degrees C. There are some materials, e.g., carbides, tungsten, that have melting points above 3200 degrees, and in some such embodiments, the temperature range generated by heaters 140 is between 500 degrees C. and a higher temperature, e.g., 3500 degrees C., or 3600 degrees C. In specific embodiments, heating elements 140 may be U-shaped molybdenum disilicide heating elements and/or other heating elements disclosed herein.

In general, each heating element 140 may be under the control of a control system 142 which is configured (e.g., physically arranged, programmed, etc.) to independently control individual heating elements 140 of the furnace 100 to generate a temperature profile along the length of channel 104 to provide the desired level of sintering in sintered tape 40, while limiting deformation during sintering. In some embodiments, control system 142 may be in communication with one or more temperature sensors 144, which detects temperature within channel 104. In such embodiments, control system 142 may control heating elements 140 based on an input signal received from sensor 144 such that a desired temperature profile is maintained during continuous sintering of continuous unbound tape 36. In some embodiments, control system 142 may also receive input signals indicative of tape movement speed, position, shrinkage, and tension and control temperature and/or movement speed based on these signals or other signals, which may be related to these or other tape properties.

As will be demonstrated in relation to the sintering furnace examples set forth below, Applicant has discovered that application of a sintering temperature profile along the length of channel 104 is or may be important to maintaining a low or controlled level of deformation in the tape material during sintering. In particular, Applicant has discovered that if the rise of temperature that unbound tape 36 is exposed to during sintering is too great (e.g., the slope of the temperature profile is too steep), unacceptably high levels of stress are or may be formed within tape 36 as the material sinters and shrinks, which in turn results in out of plane deformation in tape 36, such as that shown in FIG. 2. In particular, Applicant has discovered that by controlling stresses at edges 130 and 132 and/or along the centerline of tape 36 during sintering, deformation of tape 36 during sintering can be controlled. A similar potentially deleterious effect on tape 36 may be experienced if the transition from the heated portions of system 10 to the room temperature portions of system 10 (e.g., upon exit from furnace 100) occurs too sharply. With that said, technology of the present application may be used to sinter tape without such temperature control or profile, where the resulting new tape or other sintered articles may have such characteristic deformation or other defects.

Figure 16:
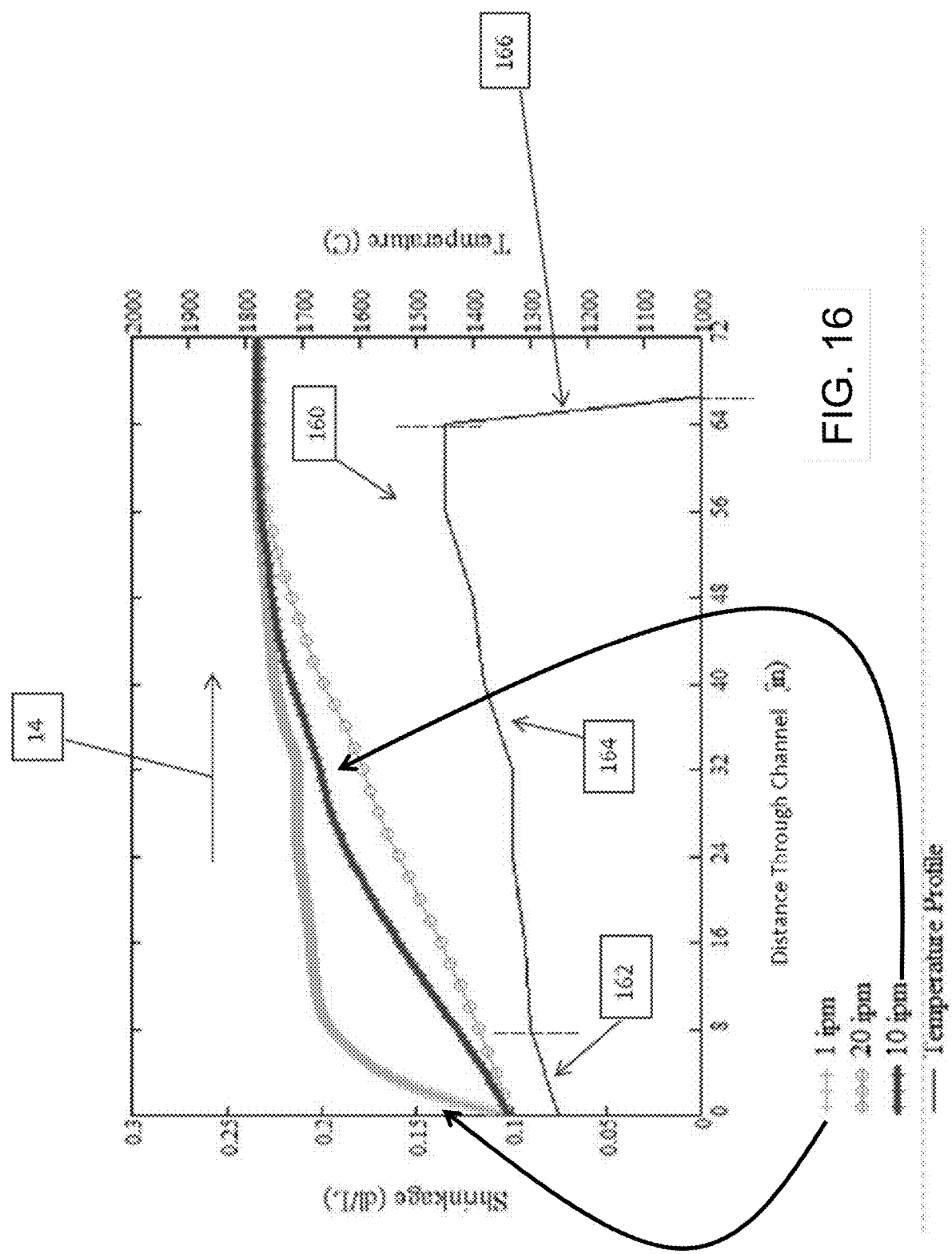
FIG. 16 is a graph of a prophetic thermal profile and modeled sintering shrinkage versus distance for different tape transport speeds, according to an exemplary embodiment.
Figure 17:
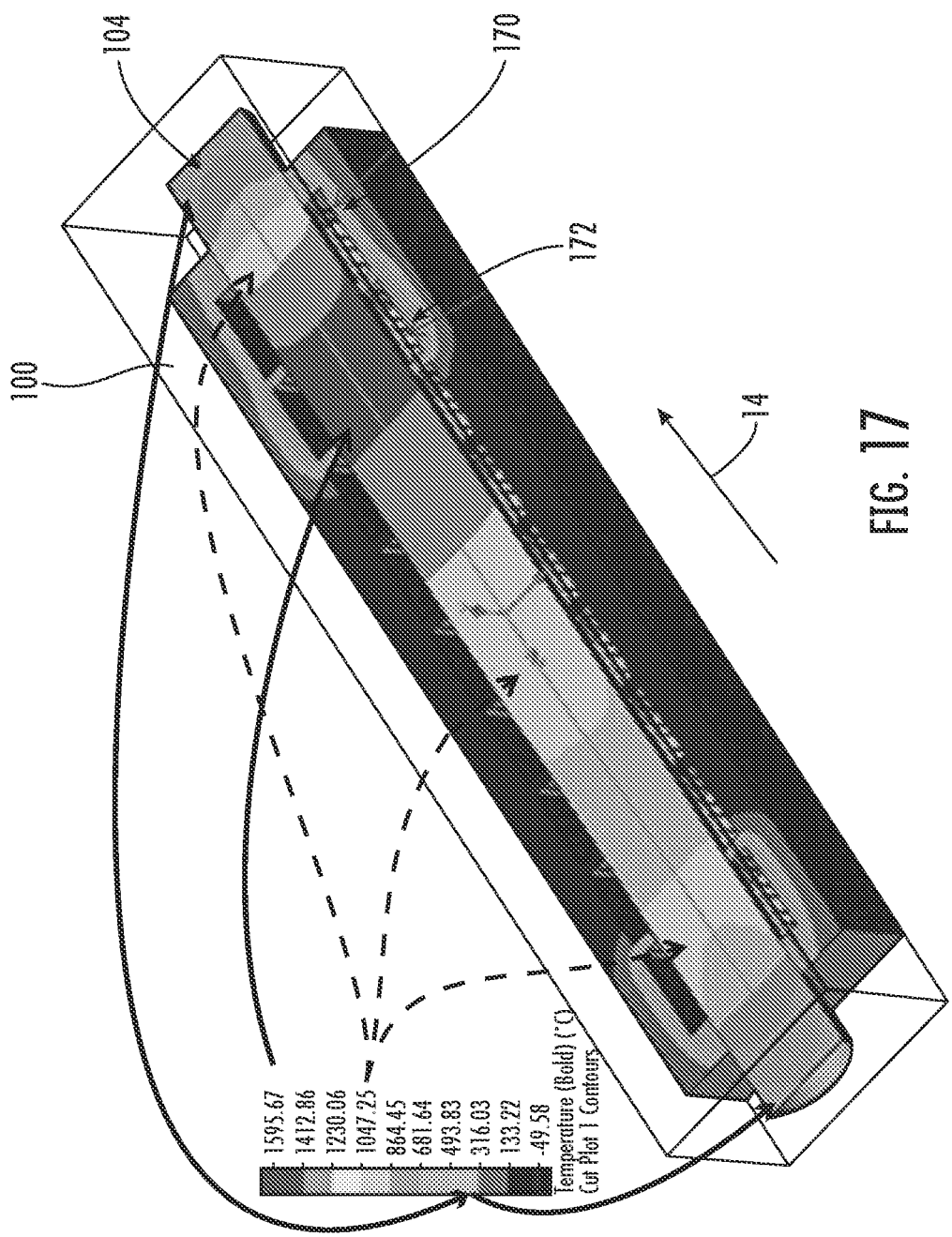
FIG. 17 shows a prophetic sintering temperature profile projected along the channel of a sintering furnace, according to an exemplary embodiment.

Referring to FIG. 16 and FIG. 17, temperature profiles 160 and 170 generated by heating elements 140 along the length of sintering channel 104 is shown according to exemplary embodiments. Referring to FIG. 16, temperature profile 160 shows that the temperature within channel 104 generally increases along the length of channel 104 in the processing direction 14. Profile 160 includes at least three sections: a first section 162 representing the temperature within the region of channel 104 adjacent to entrance opening 106; a second section 164 representing the temperature along the majority (e.g., at least 50%, at least 75%, etc.) of the length of channel 104; and a third section 166 representing the temperature within the region of channel 104 adjacent to exit opening 108.

As shown in FIG. 16, the average slope of first section 162 is greater than the average slope of second section 164 showing a relatively rapid increase in temperature within channel 104 adjacent the entrance opening 106. The average slope of second section 164 is relatively low (and lower than that of first section 162). The low average slope of second section 164 represents the gradual rise in temperature that tape 36 experiences as it moves along most of the length of channel 104. As will be discussed below, this gradual rise is selected to maintain stresses within tape 36 below determined thresholds that maintain deformation below the desired level. The average slope of third section 166 is a negative slope representing the cool down section within channel 104 adjacent exit opening 108 which limits thermal shock experienced by tape 36 upon exit from furnace 100.

In various embodiments, the gradual temperature rise represented by the low slope of section 164 may be achieved by controlling the rate of temperature increase along the length of channel 104. In various embodiments, as represented by the x-axis in the plot of FIG. 16, the length of channel 104 may be relatively large such as at least 1 meter, at least 50 inches, at least 60 inches or more. In the specific sintering furnace modeled and shown in FIG. 16, the heated channel 104 is 64 inches.

In various embodiments, profile 160 is shaped to maintain an acceptably low level of compressive stress within tape 36 during sintering such that undesirable deformation is avoided. Applicant has discovered that tape deformation, if not controlled as discussed herein, is a challenge particularly for wide tape materials and high throughput sintering systems. In particular, wider tapes are more susceptible to this type of deformation, and in addition, width wise deformation makes or may winding on uptake reel difficult or impossible. With that said, aspects of the presently disclosed technology (e.g., carrier separation, tension control, binder removal, etc.) may be practiced and used to create new materials and products without the temperature profiles, such as where resulting products are narrower and/or have defects or deformation characteristic of such processing.

Thus, in various embodiments, profile 160 is shaped such that compressive stress at the left edge 130 and/or right edge 132 of unbound tape 36 during sintering remains below an edge stress threshold and that compressive stress at a centerline of the unbound tape 36 during sintering remains below a centerline stress threshold. In general, the edge stress threshold and the centerline stress threshold are defined as the compressive stresses above which unbound tape 36 experiences out of plane (length-width plane) deformation of greater than 1 mm during sintering. Applicant has discovered that for at least some materials and tape widths, out of plane deformation can be limited to below 1 mm during sintering by maintain the edge compressive stresses and centerline compressive stresses below thresholds of 100 MPa, specifically 75 MPa and more specifically 60 MPa. In a specific embodiment, Applicant has discovered that for at least some materials and tape widths, out of plane deformation can be limited to below 1 mm during sintering by maintaining centerline compressive stresses below thresholds of 100 MPa, specifically 75 MPa and more specifically 60 MPa, and by maintaining edge stresses below thresholds of 300 MPa, specifically 250 MPa and more specifically 200 MPa.

In a specific embodiment, the slope of sections 162 and 166 may be controlled to provide for particularly low tape stresses on entry to and exit from furnace 100. In one such embodiment, control system 142 is configured to control the temperature profile within sections 162 and 166 in combination with control of the speed of tape through furnace 100. In such embodiments, this combination of controlling temperature within sections 162 and 166, coupled with speed control, give a uniform sintering shrinkage (strain) and thus a low stress and low deformation within tape 36 during sintering.

Referring to FIG. 17, another exemplary temperature profile 170 is shown projected along a view of channel 104. As shown, profile 170 shows an increase to the maximum temperature at zone 172 over approximately at least 75% of the total length of channel 104. In particular embodiments, sintering furnace 100 can be can be made of a high thermal conductivity material (such as steel or high conductivity ceramic) to lower temperature gradients in the cross web (tape/sheet) width direction. As shown in FIG. 17, there is low or no temperature variance in the width direction. As will be generally understood, the temperature profile for a particular sintering system will be based on a number of factors including the material type, inorganic particle size, particle density, particle size distribution, porosity, porosity size, porosity size distribution, the sintering atmosphere, the stress thresholds/allowable deformation for the part as discussed above, length of the channel 104, throughput speed, etc. as well as desired outcome.

Figure 18:
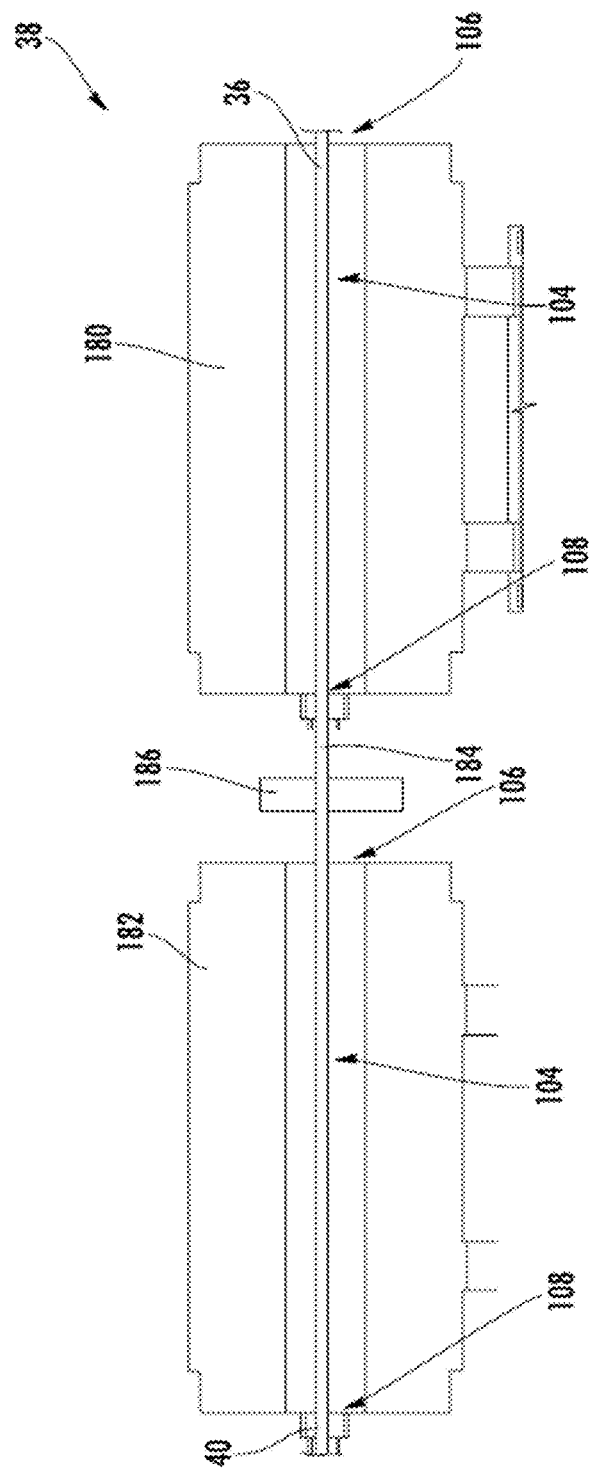
FIG. 18 shows an inline multi-furnace sintering station, according to an exemplary embodiment.

Referring to FIG. 18, another embodiment of sintering station 38 is shown according to an exemplary embodiment. In this embodiment, sintering station 38 includes two furnaces 180 and 182 positioned in series with each other. In general, furnaces 180 and 182 are substantially the same as furnace 100 discussed above, except that, in at least some embodiments, the temperature profile of furnace 180 is different than the temperature profile within furnace 182. In this arrangement, unbound tape 36 enters entrance 106 of furnace 180. Within furnace 180, unbound tape 36 is partially sintered forming partially sintered tape 184 which leaves furnace 180 through exit 108. Then partially sintered tape 184 enters second furnace 182 through entrance 106, and additional sintering occurs along the length of channel 104 of furnace 182 such that sintered tape 40 exits furnace 182 through exit 108 for reel uptake as discussed above.

In various embodiments, each furnace 180 and 182 includes a plurality of independently controllable heating elements such that a different and independent temperature profile can be formed in each furnace 180 and 182. In some embodiments, utilizing two thermally isolated furnaces, such as furnace 180 and 182, may provide more precise control of the temperature profiles that the tape material is exposed to during sintering, as compared to a single long furnace having the same channel length as the combined channel length of furnaces 180 and 182. In other contemplated embodiments, the tape can be moved back through the same furnace, but along a different path and/or exposed to a different temperature profile for additional sintering.

In addition, in some embodiments, application of differential tension between furnace 180 and 182 may be desirable. In such embodiments, a tension control system 186 is located along the sintering path defined by the channels 104 of furnaces 180 and 182. In specific embodiments, tension control system 186 is located between furnaces 180 and 182 and applies tension to partially sintered tape 184 such that the tension with tape 184 within second furnace 182 is greater than the tension with unbound tape 36 within furnace 180. In various embodiments, increasing tension in the second sintering furnace may be desirable to provide for improved flatness or deformation reduction during the final or subsequent sintering of furnace 182. In addition, this increased tension may be suitable for application to partially sintered tape 184 because the partial sintering increases the tensile strength of tape 184 as compared to the relatively low tensile strength of unbound tape 36 within furnace 180.

Figure 19:
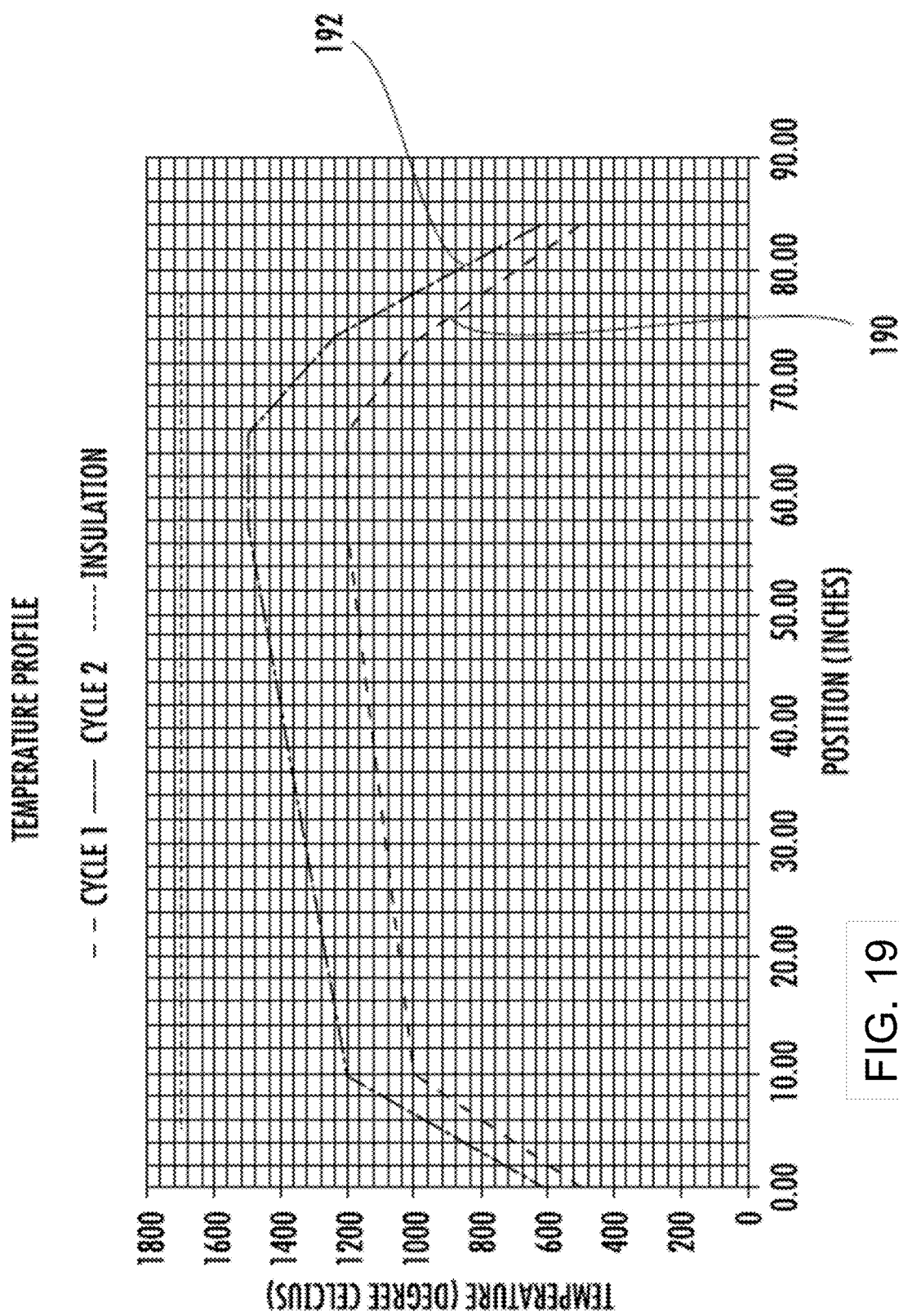
FIG. 19 shows prophetic temperature profiles for the two sintering furnaces of FIG. 18, according to an exemplary embodiment.

Referring to FIG. 19, prophetic temperature profiles within furnaces 180 and 182 are shown according to an exemplary embodiment. As shown in FIG. 19, the heating elements of furnace 180 are controlled to generate temperature profile 190, and the heating elements of furnace 182 are controlled to generate temperature profile 192. As will be noted, both profiles 190 and 192 have the same, low stress generating, gradual temperature increase similar to that of temperature profile 160 discussed above. However, profile 192 is located above profile 190 (e.g., has a higher average temperature than profile 190) which causes the additional, higher levels of sintering (e.g., additional shrinkage, additional decrease in porosity) that occurs as partially sintered tape 184 traverses furnace 182.

Figure 20:
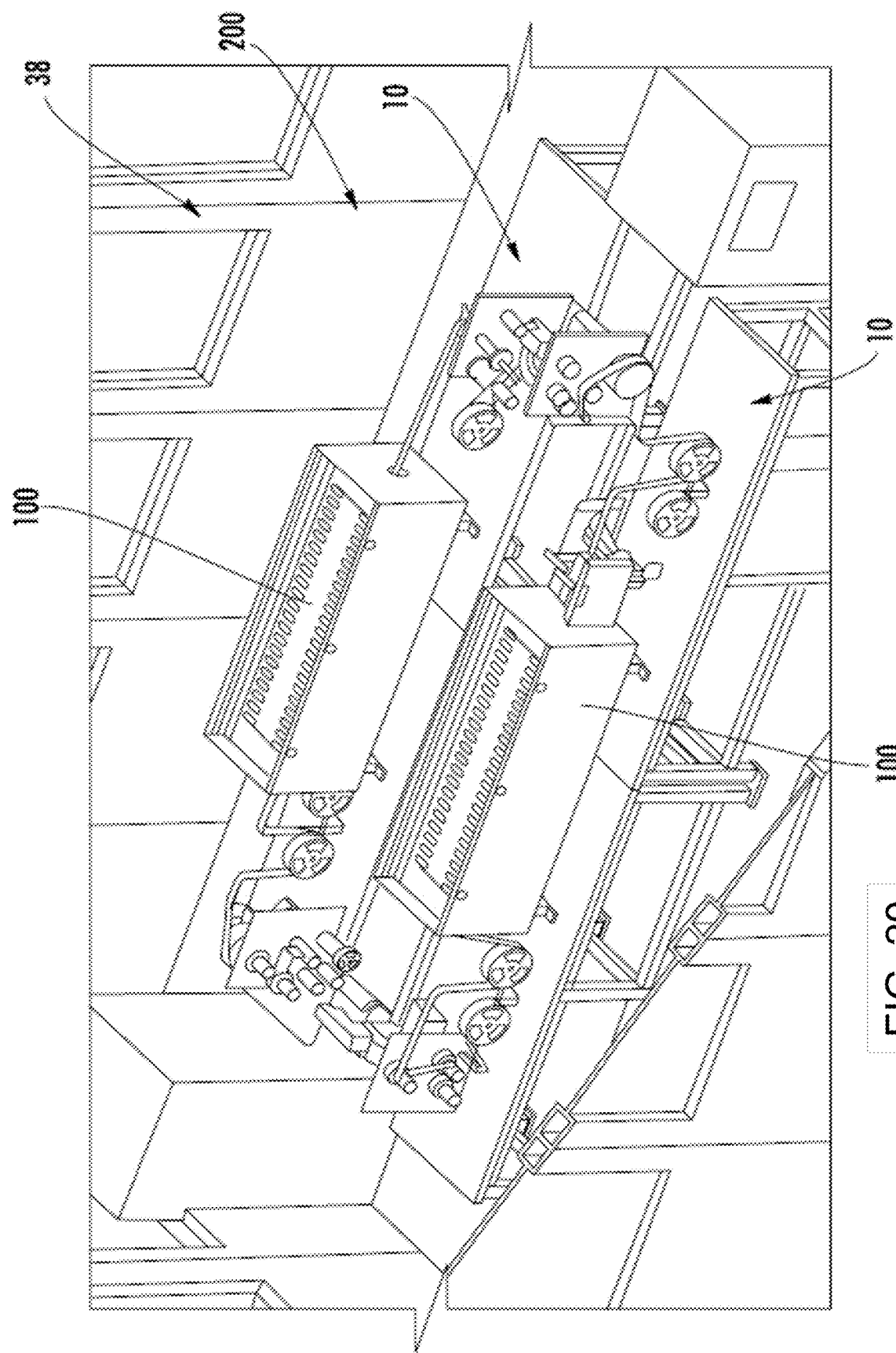
FIG. 20 shows a sintering system having two parallel production systems, according to an exemplary embodiment.

Referring to FIG. 20, a high throughput sintering system 200 is shown according to an exemplary embodiment. In general, system 200 includes two parallel systems 10, each sintering a tape material. System 200 may be operated to increase the output of a single type of sintered tape material, similar to the arrangement in FIG. 18. Alternatively, each system 10 of system 200 may output a different sintered tape material. In various embodiments, system 200 may include 3, 4, 5, etc. systems 10 in parallel to further increase output of sintered tape material.

Sintering Station Examples and Models

Referring to FIG. 21 through FIG. 28, various sintering tests and sintering models are described demonstrating the sintering relations discussed herein, such as the relation between temperature profile and shrinkage rate, the relation between the temperature profile and stress with the tape material, the relationship between stress and tape deformation, and the relationship between tape width and risk of sintering deformation.

Physical Sintering Test Example 1

In one example, a horizontal furnace with an actively controlled multiple zone binder burnout furnace was tested. In this test, a tape cast "green" zirconia ceramic ribbon (ceramic loaded with polymer binder), 42 mm wide and about 25 microns thick, was fed through a horizontal apparatus with the multi-zone binder burnout furnace (similar to furnace 38 and binder removal station 34 above) at 20 inches per minute. The binder burnout furnace was set at 325 degrees C. at the inlet to 475 degrees C. at the outlet with 0-25 increasing degree C. increments for the four central hot zones. Air flow at 7.5 liter per minute at a temperature range from about 0° C. to about 250° C. was also provided, and the air flow was divided between both sides of the burn out furnace. The sintering furnace was 36 inches long and had an 18 inch long hot zone. The tape was transported within the sintering furnace by sliding it over an alumina "D" tube, with a tension 20 grams and with the furnace set at 1225° C. A resulting 10-20 feet of sintered zirconia tape was made and spooled on a take-up reel 3 inches in diameter. Sintering shrinkage across the width was about 12%.

Sintering Model 1

Figure 21:
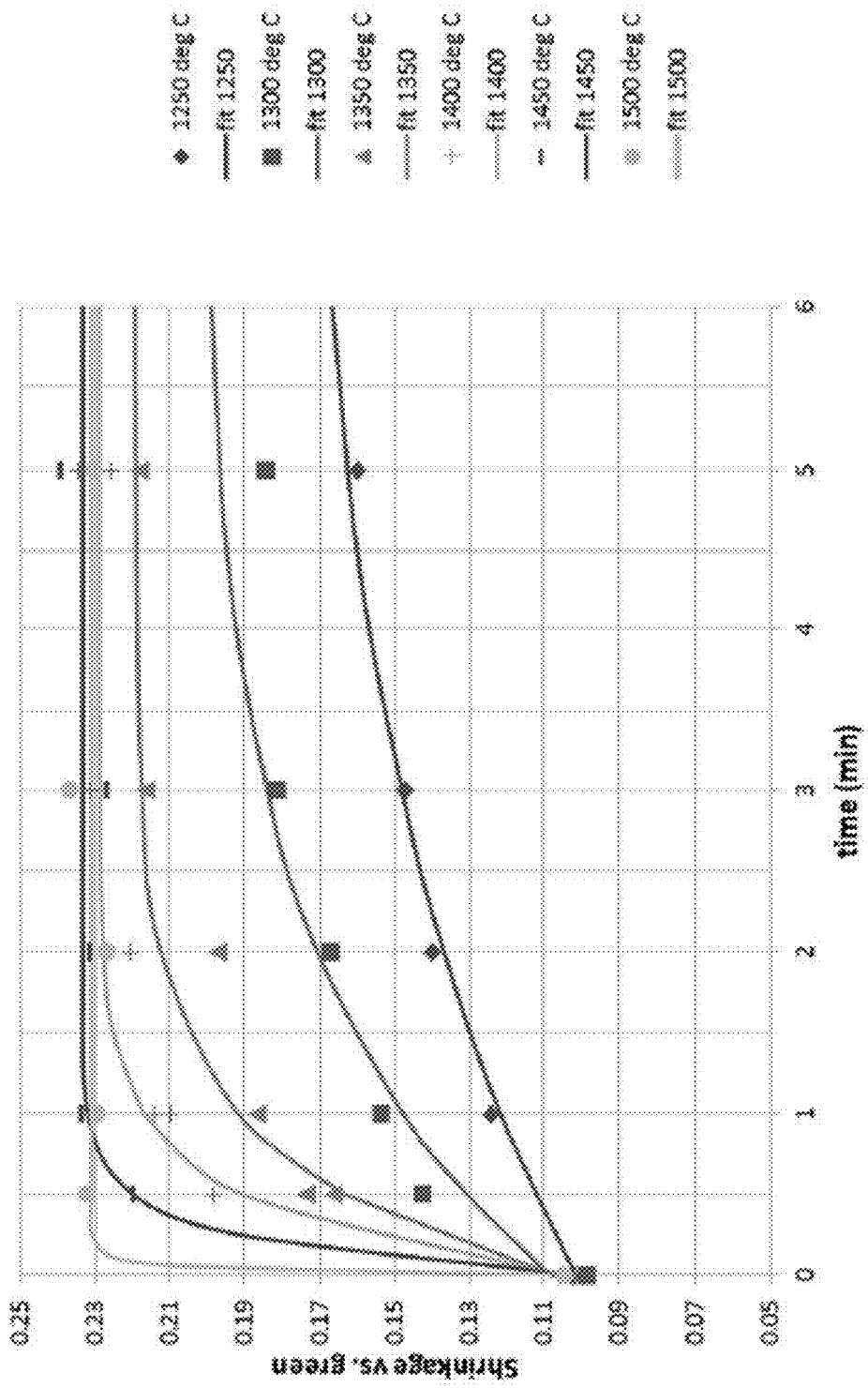
FIG. 21 is a graph of sintering shrinkage of a zirconia tape at various temperatures and times at temperatures including curves fit to the data for each temperature.
Figure 22:
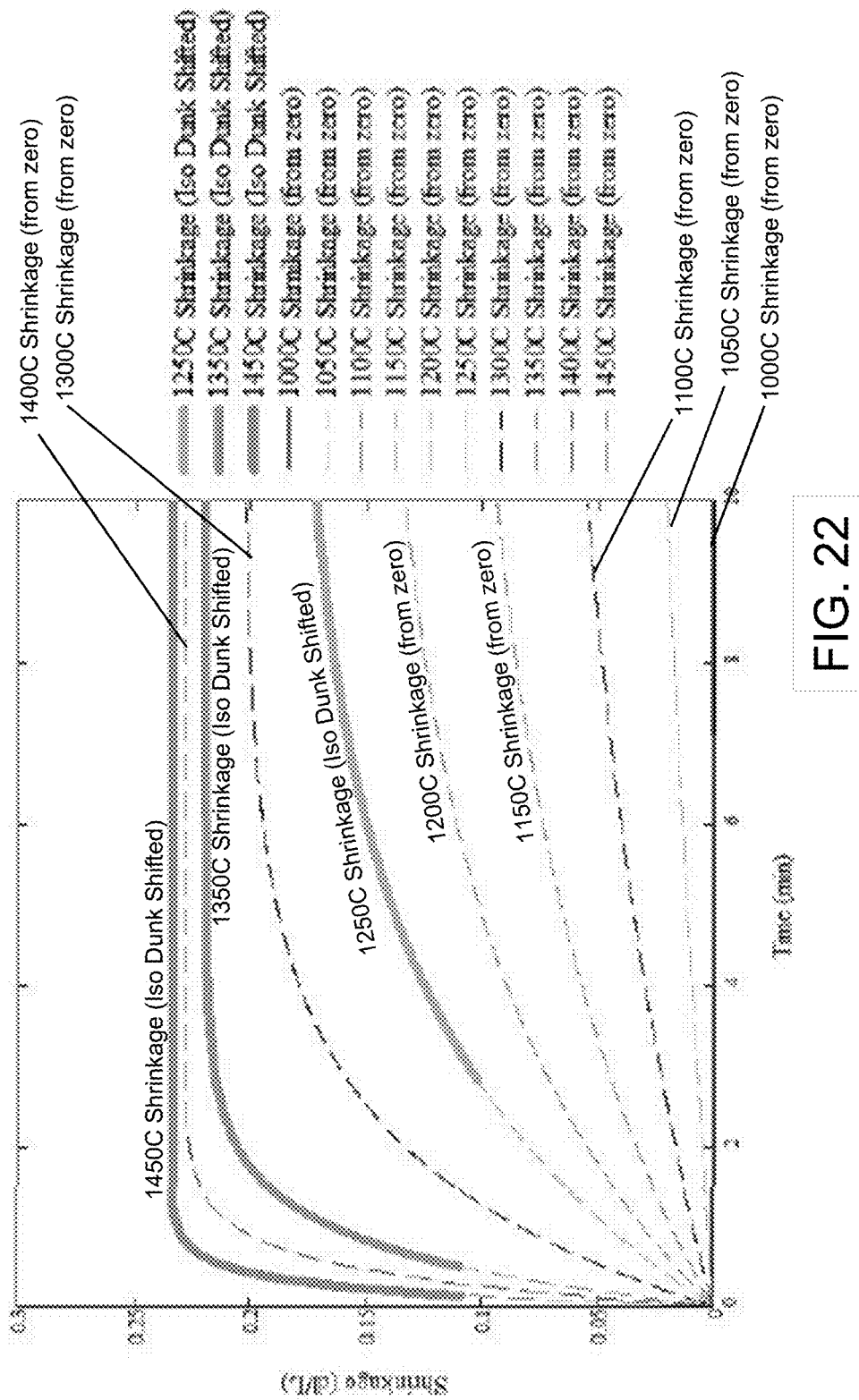
FIG. 22 is a graph of a curve fit of a mathematical function of the sintering shrinkage of a zirconia tape at various temperatures and times at various temperatures.

Referring to FIG. 21 and FIG. 22, sintering shrinkage of zirconia as a function of time and temperature is shown. FIG. 21 shows a graph of sintering shrinkage of a zirconia tape at various temperatures and times at temperature. FIG. 22 shows a graph of curves generated by a mathematical function of the sintering shrinkage of a zirconia tape at various temperatures and times at temperature.

To generate the data points shown in FIG. 21, a tape cast "green" zirconia ceramic ribbon (ceramic loaded with polymer binder) about 15 mm wide, 25 microns thick was "bisque" fired to 1200° C. at 8 inches per minute in the apparatus described in Physical Sintering Test Example 1, above. Bisque fired tapes produced in this manner were plunge fired in a narrow hot zone furnace for 30 seconds, 1 minute, 2 minutes, 3 minutes and 5 minutes at 1250° C., 1300° C., 1350° C., 1400° C., 1450° C., and 1500° C. Sintering shrinkage was measured, and these data points are shown in FIG. 21.

From the sintering data, mathematical curves describing the sintering shrinkage as a function of temperature and time were fitted and extrapolated to lower and intermediate temperatures than those actually tested. This curve fitting and extrapolation is shown in FIG. 22. Based on the testing and curve fitting shown in FIG. 21 and FIG. 22, the relation between sintering shrinkage, sintering time and temperature for zirconia was determined. Applicant believes this information can be used to develop sintering temperature profiles for zirconia to achieve a desired shrinkage rate and to reduce stress below the deformation thresholds as discussed above.

In one specific embodiment, this data was used to model the 64 inch sintering furnace and temperature profile shown in FIG. 16. As shown in FIG. 16, the thermal gradient/profile 160 started at 1250° C. and ended at 1450° C. The modeled temperature increased from 1250° C. to 1300° C. from 0 to 8 inches into the furnace, was increased from 1300° C. to 1312.5° C. from 8 to 16 inches, increased from 1312.5 to 1325° C. from 16 to 24 inches, was maintained at 1325° C. from 24 to 32 inches, increased from 1325 to 1375° C. from 32 to 40 inches, was increased at 1375° C. to 1400° C. from 40 to 48 inches, increased from 1400 to 1450° C. from 48 to 56 inches, was maintained at 1450° C. from 56 to 64 inches, then cooled to below 1000° C. after 64 inches.

Shrinkage was modeled as a function of tape transport speed. As shown in FIG. 16, the model showed that a faster transport speed, 20 inches per minute (ipm), gave more uniform sintering shrinkage over the length of the hot zone. Thus, this modeling demonstrates that uniform shrinkage over longer lengths is desirable because the shorter the distance over which the sintering strain/shrinkage occurs, the larger the stress in the tape and the greater propensity of buckling, and out of plane plastic deformation.

Sintering Model 2

Figure 23:
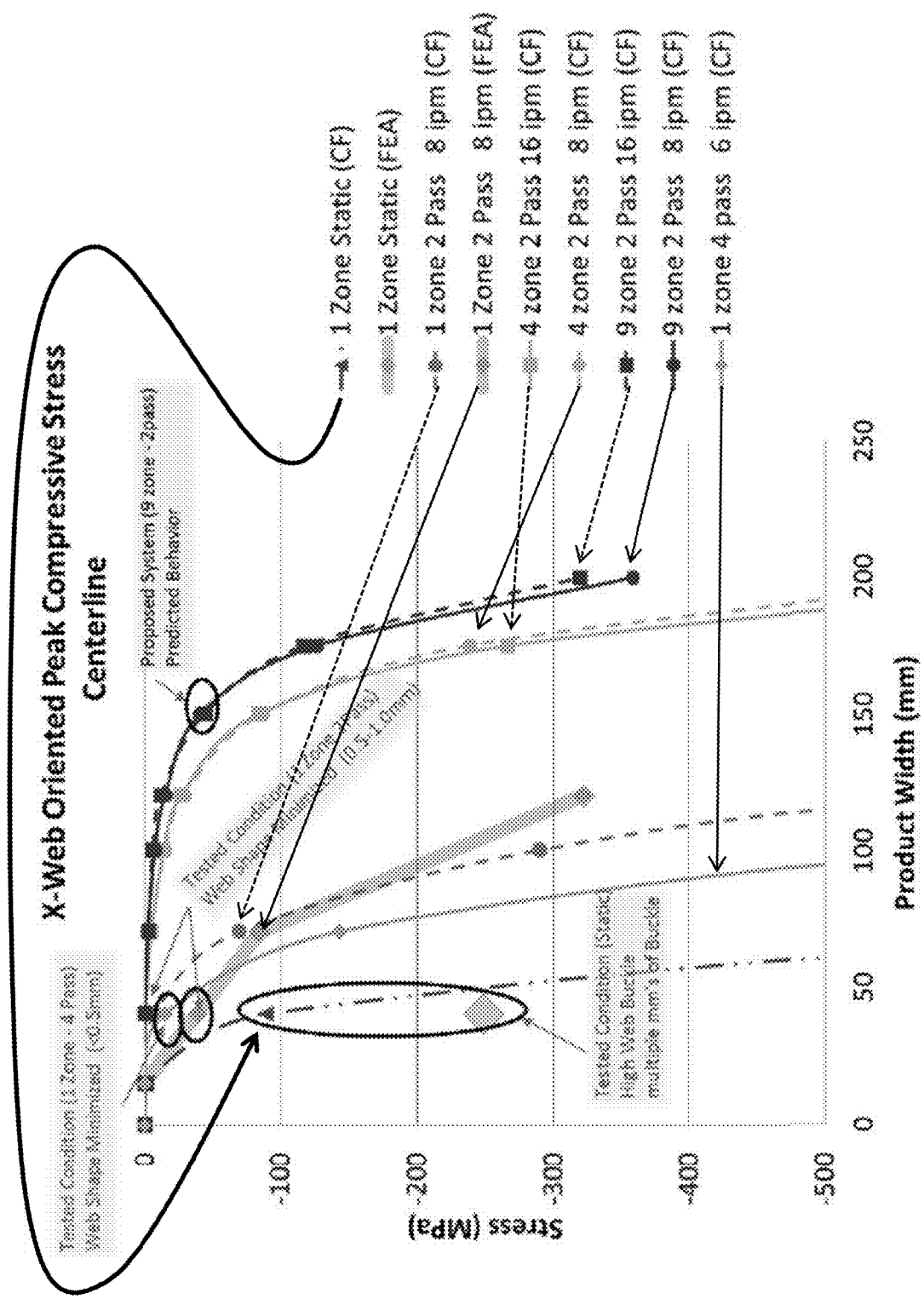
FIG. 23 is a modeled graph of peak stresses at the centerline of a zirconia tape during sintering as a function of number of heating zones, passes, tape transport speed as a function of tape width.
Figure 24:
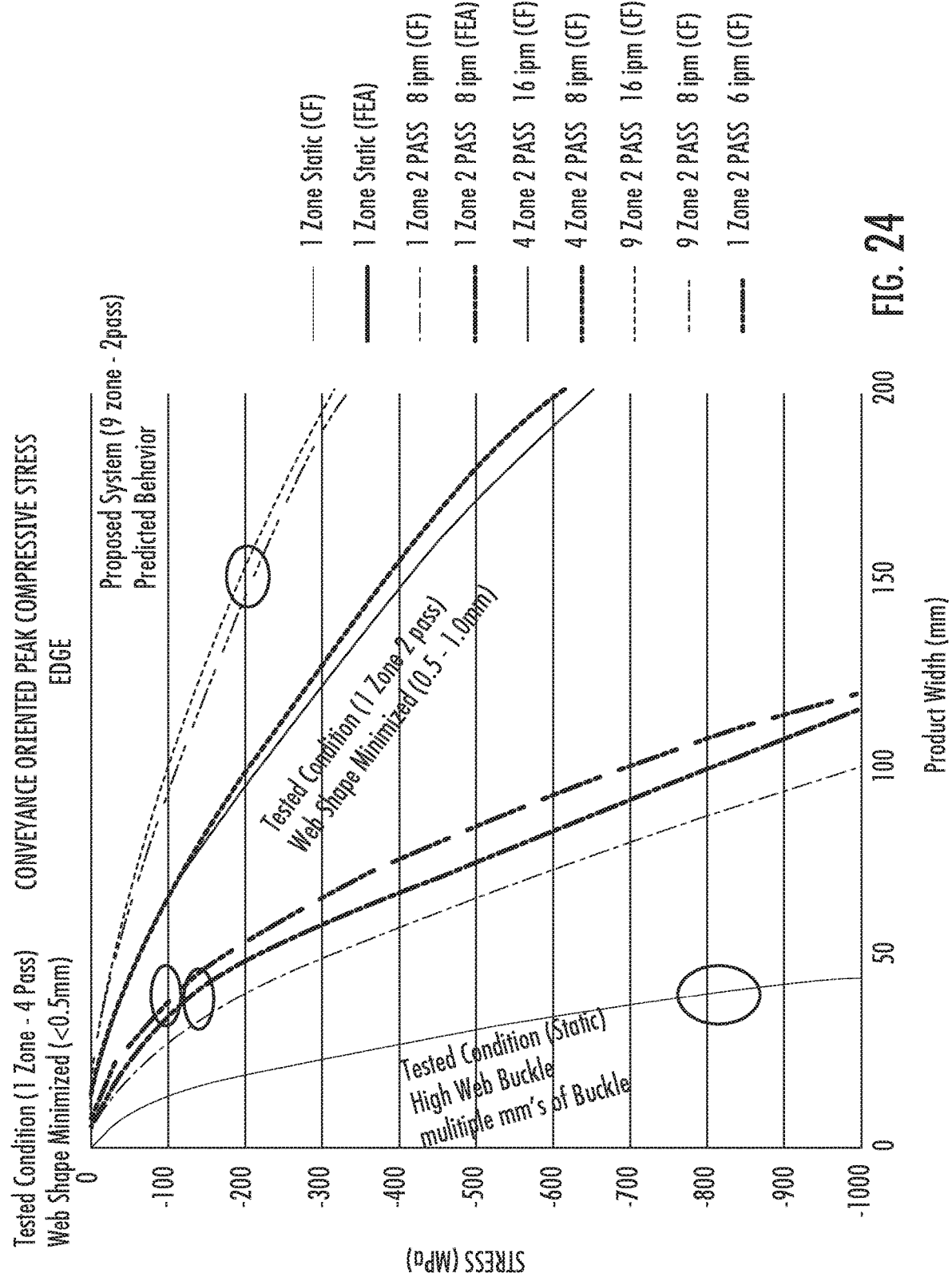
FIG. 24 is a modeled graph of peak stresses at the edge of a zirconia tape during sintering as a function of the number of heating zones, passes, and tape transport speed as a function of tape width.

Referring to FIGS. 23 and 16, sinter stress was modeled by finite element analysis (FEA) and a closed form (CF) solution. As demonstrated in FIG. 23 and FIG. 24, as the tape being sintered gets wider, extreme sintering stress of greater than −1000 MPa are calculated for 100 mm wide stationary tapes (single hot zone), for 100 mm wide tapes where there are only two hot zones and for tape transported at 8 and 16 inches per minute. In contrast, when 9 hot zones are used with 2 sintering passes (equivalent to 18 hot zones in a single pass), edge stresses less than about −200 MPa were modeled for 150 mm wide sheet. In the single and 4 hot zone tests, each hot zone was modeled having a length of 450 mm (18 inches) with the furnace being 900 mm (36 inches) and thus, in these two modeling examples additional hot zones equates to a longer hot zone. For example, the 1 zone, 2 pass hot zone generally equates to a total 900 mm long (36 inches) hot zone. However, for a 9 zone, 2 pass hot zone is equivalent to a total 3660 mm (144 inch) (length) hot zone. Thus, FIG. 23 and FIG. 24 demonstrate that wider and wider tapes (e.g., greater than 50 mm, 100 mm, 150 mm, 200 mm, 250 mm, etc.) can be accommodated by controlling the number of hot zones (e.g., the total length of the sintering hot zone), the temperature profile the tape is exposed to, and the movement rate of the tape through the hot zone, sintering stress can be maintained at levels low enough to avoid generation of deformation, buckling, or breakage.

Sintering Model 3

Figure 25:
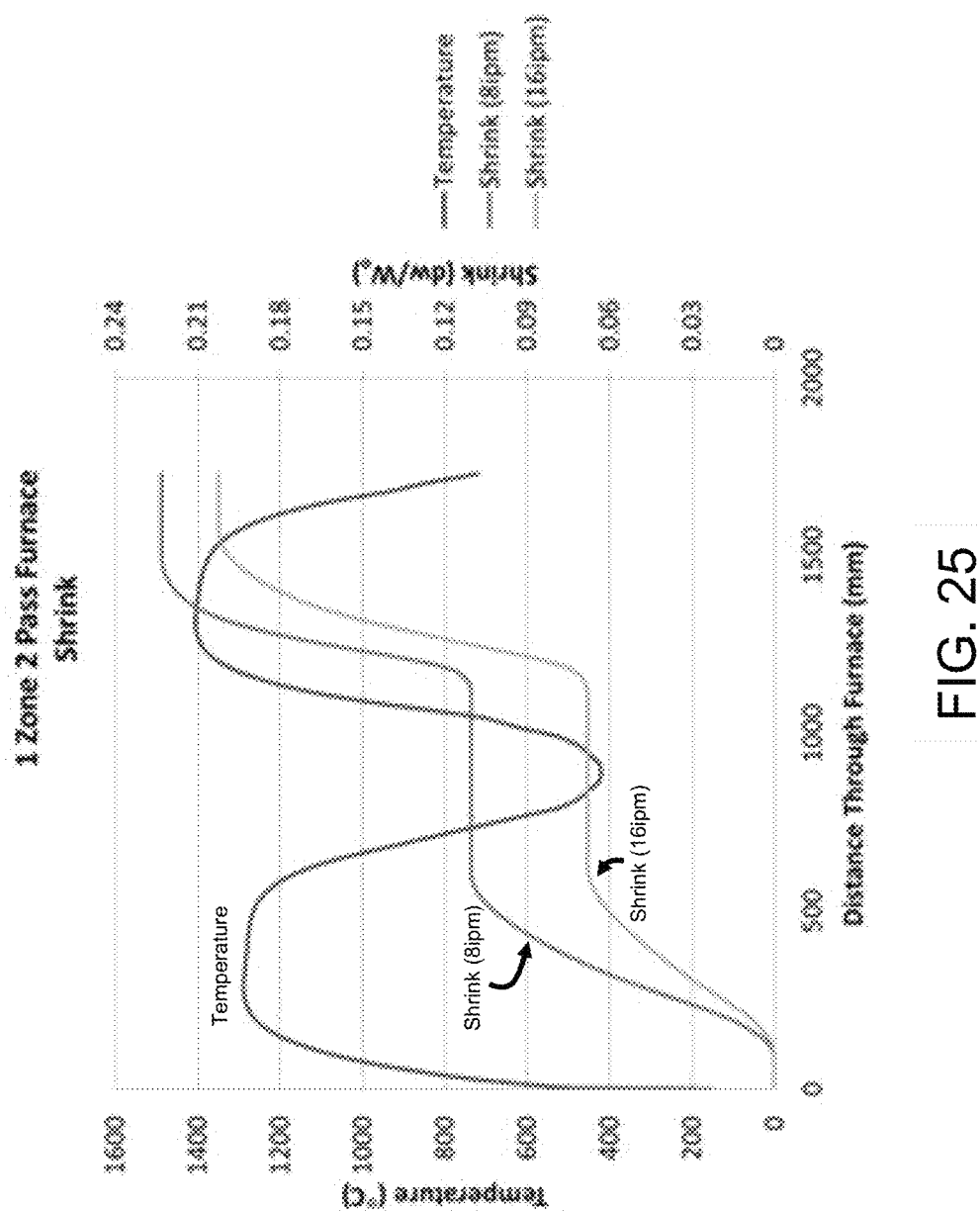
FIG. 25 is a modeled graph of shrinkage in a zirconia tape during sintering using two passes through a single hot zone furnace for two tape transport speeds.
Figure 26:
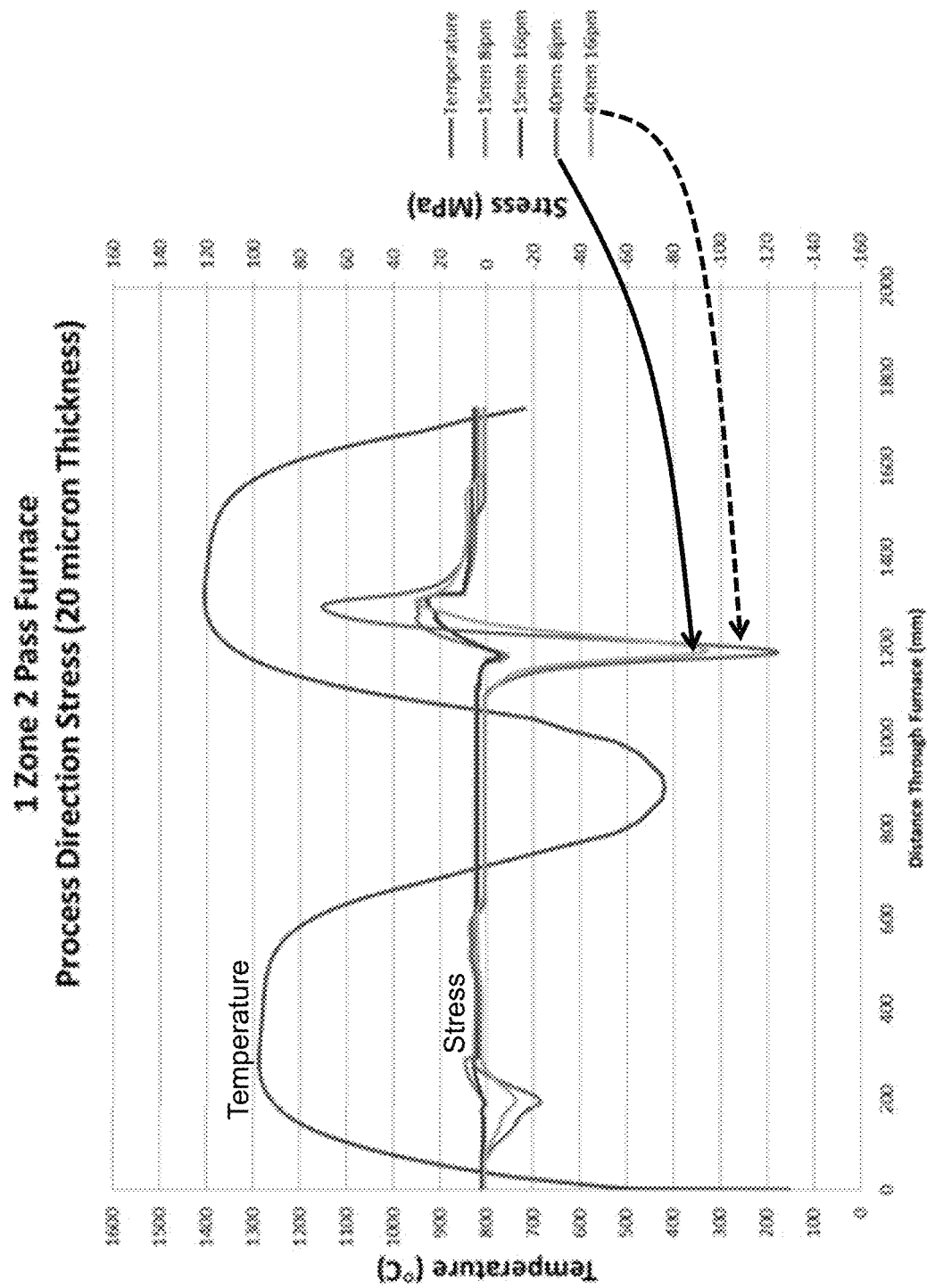
FIG. 26 is a modeled graph of stress in a zirconia tape during sintering using two passes through a single hot zone furnace for two tape transport speeds.

FIG. 25 and FIG. 26 show a model of a bisque zirconia tape (i.e., a partially sintered tape) that is passed twice through a single hot zone with steep temperature gradients. The hot zones were set at 1250° C. for the first pass and then 1400° C. for the second pass. Tape transport speeds of 8 and 16 inches per minute were inputs. The tape was modeled to be 20 microns thick and 15 mm and 40 mm wide. FIG. 25 shows shrinkage through the hot zones, and FIG. 26 shows that substantial compressive stress, greater than 90 MPa (for 40 mm wide tape at 8 ipm) is generated in the tape and greater than 120 MPa (for 40 mm wide tape at 16 ipm) due to the rapid sintering strain. This is believed to lead to buckling and out of plane deformation for tape having these widths and thicknesses.

Sintering Model 4

Figure 27:
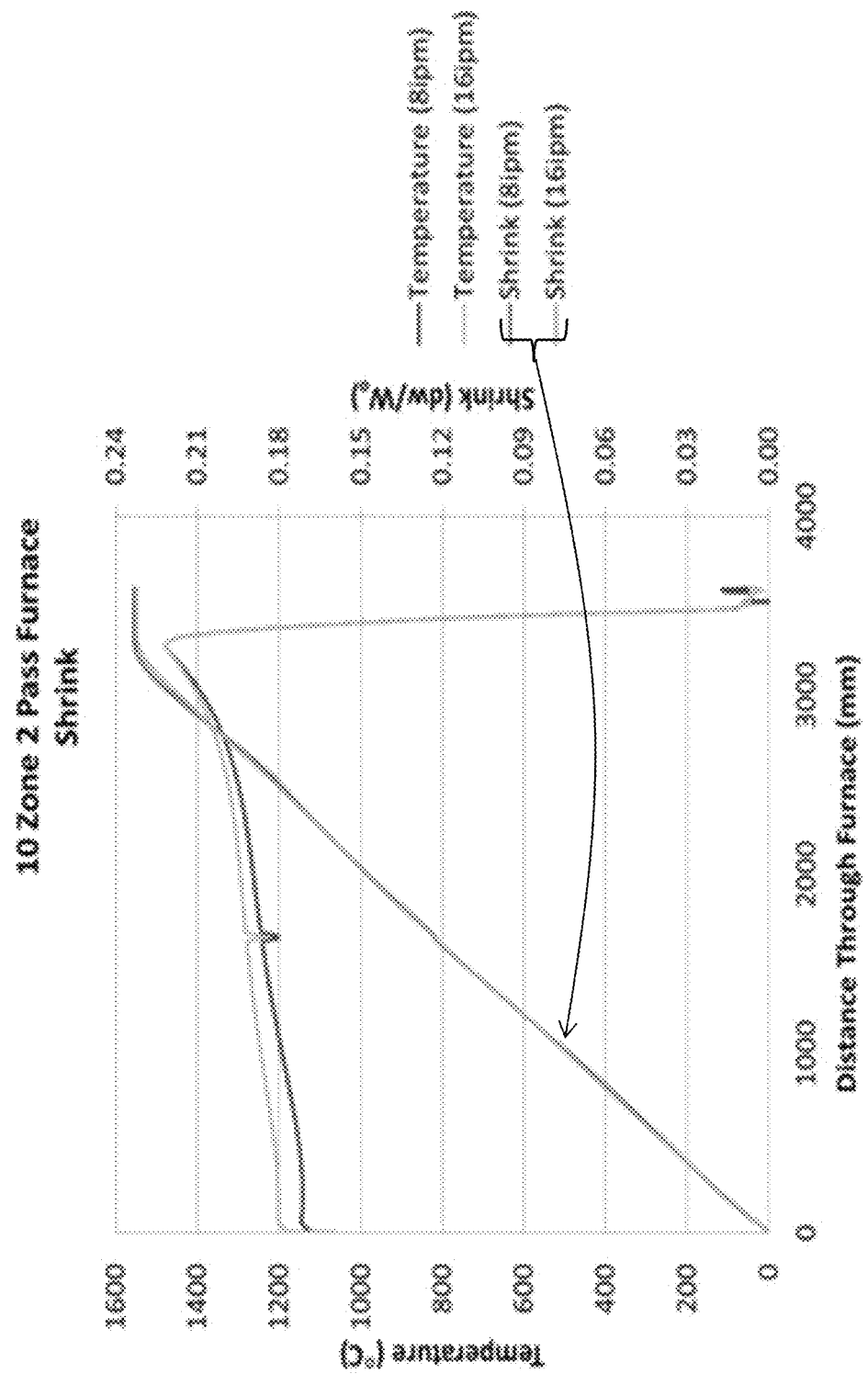
FIG. 27 is a modeled graph of shrinkage in a zirconia tape during sintering using two passes through a 10 hot zone furnace for two tape transport speeds.
Figure 28:
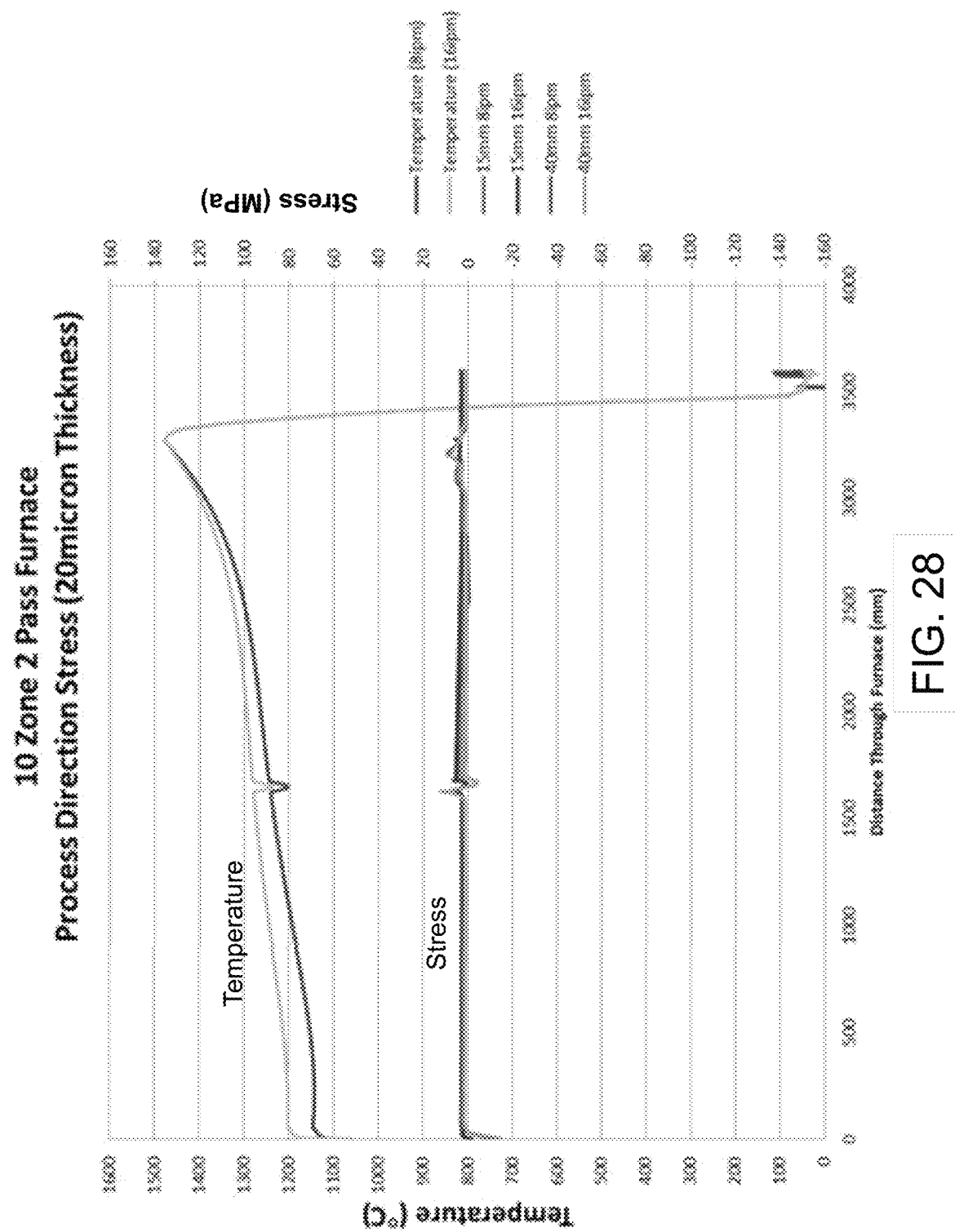
FIG. 28 is a modeled graph of stress (in MPa) in a zirconia tape during sintering using two passes through a 10 hot zone furnace for two tape transport speeds and various tape widths.

FIG. 27 and FIG. 28 show the results when the model uses a multi-zone furnace with ten hot zones and two passes with the second pass set at higher temperatures than the first pass. The modeled stress drops by an order of magnitude for both tape transport speed and tape widths as compared to the stress shown in FIG. 26. This lower stress is believed to lead to much flatter tape, e.g., less deformation. Further, this model demonstrates the effect of a controlled sintering temperature profile or gradual rise of temperature during sintering on stress and consequently deformation.

Physical Sintering Test Example 2

In another test example, a tape cast "green" zirconia ceramic ribbon (ceramic loaded with polymer binder) about 25 microns thick and 15 cm wide was made with a vertically-oriented sintering apparatus at a sintering temperature of 1100° C. About 50 feet was made and spooled on a take-up reel 3 inches in diameter. Bisque sintering shrinkage width was about 10%

This 1100° C. "bisque" tape was then passed through a horizontal sintering furnace, substantially the same as that shown in FIG. 12 at speeds of about 3, 10, 20, 30, 60 and 75 inches per minute with the furnace set at 1550° C. A resulting length of 40 feet of sintered tape was made and spooled on a take-up reel of 3 inches in diameter. Tension on the tape during sintering was in the range of 10 grams, even at 75 inches per minute with the tape in the hot zone for less than about 15 seconds, a porosity of less than 20% was achieved. Slower speeds gave denser material. Thus this test demonstrates that longer sintering furnaces lead to higher density/lower porosity in the sintered tape and also that higher temperature lead to higher density/lower porosity in the sintered tape.

Physical Sintering Test Example 3

In another test example, a tape cast "green" alumina ceramic ribbon (ceramic loaded with polymer binder) about 50 microns thick was fed through a system substantially the same as that shown in FIG. 3, at 4-6 inches per minute. The binder burnout furnace was set at 325° C. inlet to 475° C. outlet with 0-25 increasing degree increments for the four central hot zones. A 5-7.5 liter per minute air flow at 0-250° C. was used. The sintering furnace was 36 inches long with an 18 inch hot zone set at 1300° C. The green tape was passed through the 18 inch sintering hot zone at 1300° C., producing a partially sintered, "bisque" tape. The width of the partially sintered tape was 7% less than the width of the green tape.

The 1300° C. "bisque" tape was then passed through the sintering furnace a second time at 2 inches per minute with the sintering furnace set at 1550° C., producing about 20 feet of fully sintered alumina tape. The tape was spooled on a take-up reel 6 inches in diameter. Tension on the tape was about 100 grams during sintering, and sintering shrinkage width for the second pass was about 15%. After sintering, the tape was translucent, almost transparent. When set on a written document you could read through it. The grain size was below about 2 microns and the material had less than about 1% porosity.

Test Example 4

In another test example, a tape cast "green" zirconia ceramic ribbon (ceramic loaded with polymer binder) about 50 microns thick was fed through a system substantially the same as that shown in FIG. 3 at 6 inches per minute. The binder burnout furnace was set at 300-475 degrees ° C., with −7.5 liters per minute of air flow at 200-250° C. The sintering furnace was 36 inches long with an 18 inch hot zone. Temperature gradients were 25° C. to 1225° C. in less than 9 inches and 1000° C. to 1225° C. over 3-4 inches. Two D tubes spaced apart by about ⅜ inch were used to restrict air circulation and lessen the temperature gradients. Tension in the tape was 20-60 grams, and the sintering furnace was set at 1225° C. A resulting length of 50 feet of sintered zirconia was made and spooled on a take-up reel of 3 inches in diameter. Sintering shrinkage width was about 12%.

To physically model a furnace with a shallow temperature gradient, the 1225° C. sintered "bisque tape" was passed through the single zone furnace three times at progressively higher temperatures, which reduces the sintering shrinkage for each pass, reducing the out of plane deformation. Specifically, the 1225° C. "bisque" tape was then passed through the furnace a second time at 6 inches per minute with the furnace set at 1325° C. Via this process 45 feet of sintered zirconia tape was made and spooled on a take-up reel 3 inches in diameter. Tension on the tape during sintering was 100-250 grams, and sintering shrinkage width for this pass was 5-6%.

The 1325° C. tape was then passed through the furnace a third time at 6 inches per minute with the furnace set at 1425° C. About 40 feet of sintered zirconia tape was made and spooled on a take-up reel 3 inches in diameter. Tension on the tape during sintering was 100-250 grams, and sintering shrinkage width for this pass was 5-6%. After the 1425° C. pass the tape was translucent, almost transparent. When set on a written document you could read through it.

The 1425° C. tape was then passed through the furnace a fourth time at 3-6 inches per minute with the furnace set at 1550° C. A few feet of 1550° C. sintered tape was made and spooled on a take-up reel 3 inches in diameter. Tension on the tape during sintering was 100-300 grams and sintering shrinkage (width) for this pass was 0-2%.

Sintered Article

Embodiments of the sintered articles formed using the systems and processes described herein will now be described. The sintered articles may be provided in the form of a sintered tape (i.e., a continuous sintered article) or a discrete sintered article(s). Unless otherwise indicated, the term "sintered article" is intended to refer to both a continuous sintered article and a discrete sintered article(s). In addition, "sintered" refers to both partially sintered articles and fully sintered articles. In one aspect, embodiments of the sintered article comprise dimensions not previously achievable. In one or more embodiments, the sintered article also exhibit uniformity of certain properties along these dimensions. According to another aspect, embodiments of the sintered article exhibits a flattenability that indicates the sintered article can be flattened or subjected to flattening without imparting significant stress in the sintered article and thus can be used successfully in downstream processes. Another aspect pertains to embodiments of a rolled sintered article, and yet another aspect pertains to embodiments of a plurality of discrete sintered articles. Still other aspects include new compositions of materials, or compositions with new microstructures, such as in terms of unique grain boundaries, for example.

Figure 29:
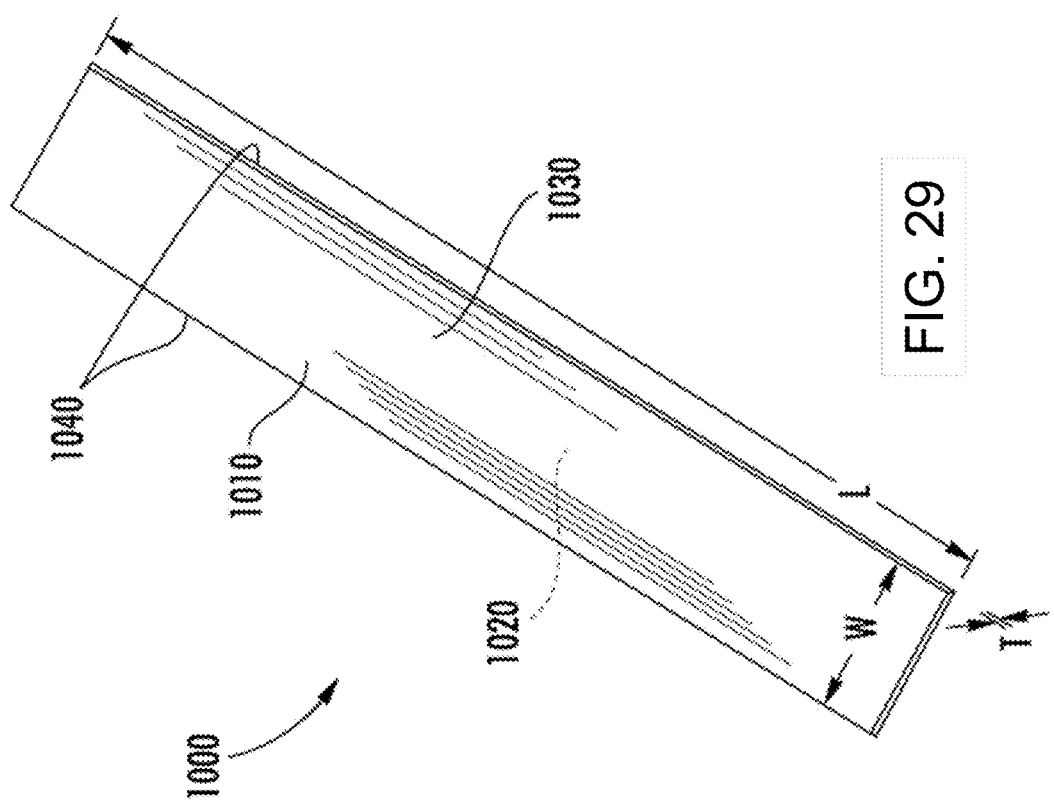
FIG. 29 is a perspective view of an illustration of a portion of a sintered article, according to an exemplary embodiment.

Referring to FIG. 29, a sintered article 1000 according to one or more embodiments includes a first major surface 1010, a second major surface 1020 opposing the first major surface, and a body 1030 extending between the first and second surfaces. The body 1030 has a thickness (t) defined as a distance between the first major surface and the second major surface, a width (W) defined as a first dimension of one of the first or second surfaces orthogonal to the thickness, and a length (L) defined as a second dimension of one of the first or second surfaces orthogonal to both the thickness and the width. In one or more embodiments, the sintered article includes opposing minor surfaces 1040 that define the width (W). In specific embodiments, sintered article 1000, as described herein, is an example of sintered tape 40 produced using system 10, albeit some tapes of the present technology may be longer than the tape shown in FIG. 29.

In one or more embodiments, the sintered article is a continuous sintered article having a width of about 5 mm or greater, a thickness in a range from about 3 µm to about 1 mm, and a length in a range of about 300 cm or greater. In other embodiments, the width is less than 5 mm, as described above.

In one or more embodiments, the sintered article has a width in a range from about 5 mm to about 200 mm, from about 6 mm to about 200 mm, from about 8 mm to about 200 mm, from about 10 mm to about 200 mm, from about 12 mm to about 200 mm, from about 14 mm to about 200 mm, from about 15 mm to about 200 mm, from about 17 mm to about 200 mm, from about 18 mm to about 200 mm, from about 20 mm to about 200 mm, from about 22 mm to about 200 mm, from about 24 mm to about 200 mm, from about 25 mm to about 200 mm, from about 30 mm to about 200 mm, from about 40 mm to about 200 mm, from about 50 mm to about 200 mm, from about 60 mm to about 200 mm, from about 70 mm to about 200 mm, from about 80 mm to about 200 mm, from about 90 mm to about 200 mm, from about 100 mm to about 200 mm, from about 5 mm to about 150 mm, from about 5 mm to about 125 mm, from about 5 mm to about 100 mm, from about 5 mm to about 75 mm, from about 5 mm to about 50 mm, from about 5 mm to about 40 mm, from about 5 mm to about 30 mm, from about 5 mm to about 20 mm, or from about 5 mm to about 10 mm.

In some embodiments, the sintered article has a width W of at least 0.5 mm, such as at least 1 mm, such as at least 2 mm, such as at least 5 mm, such as at least 8 mm, such as at least 10 mm, such as at least 15 mm, such as at least 20 mm, such as at least 30 mm, such as at least 50 mm, such as at least 75 mm, such as at least 10 cm, such as at least 15 cm, such as at least 20 cm, and/or no more than 2 m, such as no more than 1 m, such as no more than 50 cm, such as no more than 30 cm. In other embodiments, the sintered article has a different width W.

In one or more embodiments, the sintered article has a thickness (t) in a range from about 3 µm to about 1 mm, from about 4 µm to about 1 mm, from about 5 µm to about 1 mm, from about 6 µm to about 1 mm, from about 7 µm to about 1 mm, from about 8 µm to about 1 mm, from about 9 µm to about 1 mm, from about 10 µm to about 1 mm, from about 11 µm to about 1 mm, from about 12 µm to about 1 mm, from about 13 µm to about 1 mm, from about 14 µm to about 1 mm, from about 15 µm to about 1 mm, from about 20 µm to about 1 mm, from about 25 µm to about 1 mm, from about 30 µm to about 1 mm, from about 35 µm to about 1 mm, from about 40 µm to about 1 mm, from about 45 µm to about 1 mm, from about 50 µm to about 1 mm, from about 100 µm to about 1 mm, from about 200 µm to about 1 mm, from about 300 µm to about 1 mm, from about 400 µm to about 1 mm, from about 500 µm to about 1 mm, from about 3 µm to about 900 µm, from about 3 µm to about 800 µm, from about 3 µm to about 700 µm, from about 3 µm to about 600 µm, from about 3 µm to about 500 µm, from about 3 µm to about 400 µm, from about 3 µm to about 300 µm, from about 3 µm to about 200 µm, from about 3 µm to about 100 µm, from about 3 µm to about 90 µm, from about 3 µm to about 80 µm, from about 3 µm to about 70 µm, from about 3 µm to about 60 µm, from about 3 µm to about 50 µm, from about 3 µm to about 45 µm, from about 3 µm to about 40 µm, from about 3 µm to about 35 µm, from about 3 µm to about 30 µm, or from about 3 µm to about 30 µm.

In some embodiments, the sintered article has a thickness t of at least 3 µm, such as at least 5 µm, such as at least 10 µm, such as at least 15 µm, such as at least 20 µm, such as at least 25 µm, such as at least 0.5 mm, such as at least 1 mm, and/or no more than 5 mm, such as no more than 3 mm, such as no more than 1 mm, such as no more than 500 µm, such as no more than 300 µm, such as no more than 100 µm. In other embodiments, the sintered article has a different thickness t.

In one or more embodiments, the sintered article is continuous and has a length L in a range from about 300 cm to about 500 m, from about 300 cm to about 400 m, from about 300 cm to about 200 m, from about 300 cm to about 100 m, from about 300 cm to about 50 m, from about 300 cm to about 25 m, from about 300 cm to about 20 m, from about 350 cm to about 500 m, from about 400 cm to about 500 m, from about 450 cm to about 500 m, from about 500 cm to about 500 m, from about 550 cm to about 500 m, from about 600 cm to about 500 m, from about 700 cm to about 500 m, from about 800 cm to about 500 m, from about 900 cm to about 500 m, from about 1 m to about 500 m, from about 5 m to about 500 m, from about 10 m to about 500 m, from about 20 m to about 500 m, from about 30 m to about 500 m, from about 40 m to about 500 m, from about 50 m to about 500 m, from about 75 m to about 500 m, from about 100 m to about 500 m, from about 200 m to about 500 m, or from about 250 m to about 500 m.

In some embodiments, the sintered article has a continuous, unbroken length L of at least 5 mm, such as at least 25 mm, such as at least 1 cm, such as at least 15 cm, such as at least 50 cm, such as at least 1 m, such as at least 5 m, such as at least 10 m, and/or no more than 5 km, such as no more than 3 km, such as no more than 1 km, such as no more than 500 m, such as no more than 300 m, such as no more than 100 m. In other embodiments, the sintered article has a different length L. Such continuous long lengths, particularly of materials and qualities disclosed herein, may be surprising to those of skill in the art without technologies disclosed herein, such as the controlled separation, tension control, sintering zones, binder removal techniques, etc.

In one or more embodiments, the body of the sintered article includes a sintered inorganic material. In one or more embodiments, the inorganic material includes an interface having a major interface dimension of less than about 1 mm. As used herein, the term "interface" when used with respect to the inorganic material is defined as including either a chemical inhomogeneity or a crystal structure inhomogeneity or both a chemical inhomogeneity and a crystal structure inhomogeneity.

Exemplary inorganic materials include ceramic materials, glass ceramic materials and the like. In some embodiments, the inorganic material may include any one or more of a piezoelectric material, a thermoelectric material, a pyroelectric material, a variable resistance material, or an optoelectric material. Specific examples of inorganic materials include zirconia (e.g., yttria-stabilized zirconia), alumina, spinel, garnet, lithium lanthanum zirconium oxide (LLZO), cordierite, mullite, perovskite, pyrochlore, silicon carbide, silicon nitride, boron carbide, sodium bismuth titanate, barium titanate, titanium diboride, silicon alumina nitride, aluminum oxynitride, or a reactive cerammed glass-ceramic (a glass ceramic formed by a combination of chemical reaction and devitrification, which includes an in situ reaction between a glass frit and a reactant powder(s)).

In one or more embodiments, the sintered article exhibits compositional uniformity across a specific area. In one or more specific embodiments, the sintered article comprises at least 10 square cm of area along the length that has a composition (i.e., relative amounts of chemicals in weight percent (%)) wherein at least one constituent of the composition varies by less than about 3 weight % (e.g., about 2.5 weight % or less, about 2 weight % or less, about 1.5 weight % or less, about 1 weight % or less, or about 0.5 weight % or less), across that area. For example, when the inorganic material comprises alumina, the amount of aluminum may vary by less than about 3 weight % (e.g., about 2.5 weight % or less, about 2 weight % or less, about 1.5 weight % or less, about 1 weight % or less, or about 0.5 weight % or less), across the at least 10 square cm of area. Such compositional uniformity may be attributed at least in part to new, unique processes, as disclosed herein, such as the furnace heat zones with individually controlled elements, careful and gentle handling of green tape, steady state of the continuous tape processing, etc. In other embodiments, new and inventive tapes or other products of at least some technology disclosed herein may not have such compositional uniformity.

In one or more embodiments, the sintered article exhibits crystalline structure uniformity across a specific area. In one or more specific embodiments, the sintered article includes at least 10 square cm of area along the length that has a crystalline structure with at least one phase having a weight % that varies by less than about 5 percentage points, across that area. For illustration only, the sintered article may include at least one phase that constitutes 20 weight % of the sintered article and the amount of this phase is within the range from about 15 weight % to about 25 weight % across the at least 10 square cm of area. In one or more embodiments, the sintered article includes at least 10 square cm of area along the length that has a crystalline structure with at least one phase having a weight % that varies by less than about 4.5 percentage points, less than about 4 percentage points, less than about 3.5 percentage points, less than about 3 percentage points, less than about 2.5 percentage points, less than about 2 percentage points, less than about 1.5 percentage points, less than about 1 percentage point, or less than about 0.5 percentage points, across that area. Such crystalline structure uniformity may be attributed at least in part to new, unique processes, as disclosed herein, such as the furnace heat zones with individually controlled elements, careful and gentle handling of green tape, steady state of the continuous tape processing, etc. In other embodiments, new and inventive tapes or other products of at least some technology disclosed herein may not have such crystalline structure uniformity.

In one or more embodiments, the sintered article exhibits a porosity uniformity across a specific area. In one or more specific embodiments, the sintered article comprises at least 10 square cm of area along the length that has a porosity varies by less than about 20%. As used herein, the term "porosity" is described as a percent by volume (e.g., at least 10% by volume, or at least 30% by volume), where the "porosity" refers to the portions of the volume of the sintered article unoccupied by the inorganic material. Accordingly, in one example, the sintered article has a porosity of 10% by volume and this porosity is within a range from about greater than 8% by volume to less than about 12% by volume across the at least 10 square cm of area. In one or more specific embodiments, the sintered article comprises at least 10 square cm of area along the length that has a porosity varies by 18% or less, 16% or less, 15% or less, 14% or less, 12% or less, 10% or less, 8% or less, 6% or less, 5% or less, 4% or less or about 2% or less, across that area. Such porosity uniformity may be attributed at least in part to new, unique processes, as disclosed herein, such as the furnace heat zones with individually controlled elements, careful and gentle handling of green tape, steady state of the continuous tape processing, etc. In other embodiments, new and inventive tapes or other products of at least some technology disclosed herein may not have such porosity uniformity.

In one or more embodiments, the sintered article exhibits a granular profile, such as when viewed under a microscope, as shown in the digital image of FIG. 30A for an example of such a granular profile structure, and conceptually shown in the side view of FIG. 30B, that includes grains 1034 protruding generally outward from the body 1030 with a height H (e.g., average height) of at least 25 nanometers (nm) and/or no more than 150 micrometers (μm) relative to recessed portions of the surface at boundaries 1032 between the grains 1034. In one or more embodiments, the height H in a range from about 25 nm to about 125 μm, from about 25 nm to about 100 μm, from about 25 nm to about 75 μm, from about 25 nm to about 50 μm, from about 50 nm to about 150 μm, from about 75 nm to about 150 μm, from about 100 nm to about 150 μm, or from about 125 nm to about 150 μm. In one or more embodiments, the height H in a range from about 25 nm to about 125 nm, from about 25 nm to about 100 nm, from about 25 nm to about 75 nm, from about 25 nm to about 50 nm, from about 50 nm to about 150 nm, from about 75 nm to about 150 nm, from about 100 nm to about 150 nm, or from about 125 nm to about 150 nm. In other embodiments, the height H may be otherwise sized. In still other embodiments, processing conditions (e.g., time, temperature) may be such that the sintered material has essentially zero height H. In some embodiments, for materials and manufacturing disclosed herein, products (e.g., tape) include a height H of grains of at least 25 nm, such as at least 50 nm, such as at least 75 nm, such as at least 100 nm, such as at least 125 nm, such as at least 150 nm, and/or no more than 200 μm, such as no more than 150 μm, such as no more than 100 μm, such as no more than 75 μm, such as no more than 50 μm. Size and shape of such microstructure may be controlled using technology disclosed herein, such as rate of conveyance through the furnace, temperature(s) and temperature profile of the furnace, composition, particle/grain size and density of inorganic material in the green tape, and other factors as disclosed herein.

The granular profile is or may be an indicator of the process of manufacturing used to form the sintered article 1000. In particular, the granular profile is or may be an indicator that the article 1000 was sintered as a thin continuous article (i.e., as a sheet or tape), as opposed to being cut from a boule, and that the respective surface 1010, 1020 has not been substantially polished. Additionally, compared to polished surfaces, the granular profile may provide benefits to the sintered article 1000 in some applications, such as scattering light for a backlight unit of a display, increasing surface area for greater adhesion of a coating or for culture growth. In contemplated embodiments, the surfaces 1010, 1020 have a roughness from about 10 nm to about 1000 nm across a distance of 10 mm in one dimension along the length of the sintered article, such as from about 15 nm to about 800 nm. In contemplated embodiments, either or both of the surfaces 1010, 1020 have a roughness of from about 1 nm to about 10 μm over a distance of 1 cm along a single axis.

In one or more embodiments, the one or both surfaces 1010, 1020 may be polished, where grain boundary grooves and grain asperities (or hillocks) are generally removed due to the polishing. In contemplated embodiments, sintered articles 1000 manufactured according to the processes disclosed herein may be polished, with a surface similar to that shown in FIGS. 31A-31B for example; depending upon, for example, the particular intended use of the article. For example, use of the sintered article 1000 as a substrate may not require an extremely smooth surface, and the unpolished surface of FIGS. 30A-30B may be sufficient; whereas use of the article as a mirror or as a lens may require polishing as shown in FIG. 31A-31B. However, as disclosed herein, polishing may be difficult for particularly thin articles or those that are thin with large surface areas. As indicated, substrates disclosed herein may also receive coatings which may change surface qualities, such as smoothness.

Without being bound by theory, it is believed that sheets of sintered ceramic or other materials cut from boules may not have readily identifiable grain boundaries present on surfaces thereon, in contrast to the article of FIGS. 30A-30B. Without being by theory, boule-cut articles may typically be polished to correct rough surfaces from the cutting, such as with grooves from abrasion; however surface polishing may be particularly difficult or cumbersome for very thin articles of sintered ceramic or other materials, with the degree of difficulty increasing as such articles are thinner and the surface areas of such articles are larger. However, sintered articles manufactured according to the presently disclosed technology may be less constrained by such limitations because articles manufactured according to the present technology may be continuously manufactured in long lengths of tape. Further, dimensions of furnace systems, as disclosed herein, may be scaled to accommodate and sinter wider articles as described herein.

In some embodiments, such as where the sintered article 1000 is in the form of a sheet or tape, the surface consistency is such that either one or both of the first and second surfaces 1010, 1020 have few surface defects. In this context, surface defects are abrasions and/or adhesions having a dimension along the respective surface of at least 15 μm, 10 μm, and/or 5 μm. In one or more embodiments, one or both the first major surface 1010 and second major surface 1020 have fewer than 15, 10, and/or 5 surface defects having a dimension greater than 15 μm, 10 μm, and/or 5 μm per square centimeter. In one example, one or both the first major surface 1010 and second major surface 1020 have fewer than 3 or fewer than 1 such surface defects on average per square centimeter. In one or more embodiments, one of or both the first major surface and the second major surface have at least ten square centimeters of area having fewer than one hundred surface defects from adhesion or abrasion with a dimension greater than 5 μm. Alternatively or additionally, one of the first and major surface has at least ten square centimeters of area having fewer than one hundred surface defects from adhesion or abrasion with a dimension greater than 5 μm, while the other of the first major surface and the second major surface comprises surface defects from adhesion or abrasions with a dimension of greater than 5 μm. Accordingly, sintered articles manufactured according to inventive technologies disclosed herein may have relatively high and consistent surface quality. Applicant believes that the high and consistent surface quality of the sintered article 1000 facilitates increased strength of the article 1000 by reducing sites for stress concentrations and/or crack initiations.

The sintered article may be described as having a flatness in a range from about 0.1 μm (100 nm) to about 50 μm over a distance of 1 cm along a single axis (e.g., such as along the length or the width of the sintered article). In some embodiments, the flatness may be in a range from about 0.2 μm to about 50 μm, from about 0.4 μm to about 50 μm, from about 0.5 μm to about 50 μm, from about 0.6 μm to about 50 μm, from about 0.8 μm to about 50 μm, from about 1 μm to about 50 μm, from about 2 μm to about 50 μm, from about 5 μm to about 50 μm, from about 10 μm to about 50 μm, from about 20 μm to about 50 μm, from about 25 μm to about 50 μm, from about 30 μm to about 50 μm, from about 0.1 μm to about 45 μm, from about 0.1 μm to about 40 μm, from about 0.1 μm to about 35 μm, from about 0.1 μm to about 30 μm, from about 0.1 μm to about 25 μm, from about 0.1 μm to about 20 μm, from about 0.1 μm to about 15 μm, from about 0.1 μm to about 10 μm, from about 0.1 μm to about 5 μm, or from about 0.1 μm to about 1 μm. Such flatness, in combination with the surface quality, surface consistency, large area, thin thickness, and/or material properties of materials disclosed herein, may allow sheets, substrates, sintered tapes, articles, etc. to be particularly useful for various applications, such as tough cover sheets for displays, high-temperature substrates, flexible separators, and other applications. With that said, embodiments may not have such flatness. Flatness is measured with a respective national standard (e.g. ASTM A1030).

Figure 32:
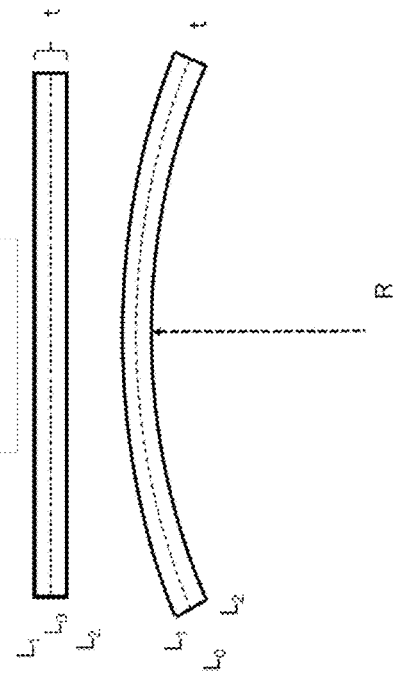
FIG. 32 is a side view along the width of a sintered article according to one or more embodiments.

In one or more embodiments, the sintered article exhibits a striated profile along the width dimension as shown in FIG. 32. In one or more embodiments, the body 1030 has a striated profile with a thickness that is substantially constant along the width. For example, the thickness along the entire width is in a range from about 0.9t to about 1.1t (e.g., from about 0.95t to about 1.1t, from about 0.1t to about 1.1t, from about 0.105t to about 1.1t, from about 0.9t to about 1.05t, from about 0.9t to about t, or from about 0.9t to about 0.95t), where t is the thickness values disclosed herein. As shown in FIG. 32, the striated profile includes two or more undulations along the width. As used herein, undulations mean a full period. In some embodiments, the striated profile includes 3 or more undulations, 4 or more undulations, 5 or more undulations or 10 or more undulations along the entire width, with the upper limit of undulations being about less than about 20 undulations along the entire width. In one or more embodiments, the striations may be measured in terms of optical distortion. In one or more embodiments, the sintered article may be placed in proximity to a zebra board that consists of a white board with straight black stripes disposed diagonally across the board. When viewing the zebra board through the sintered article, distortions in the black stripes may be visually detected and measured using methods and tools known in the art. In one example, the distortions may be measured according to ASTM C 1048. In other embodiments, such as with polished or otherwise formed articles disclosed herein, there may be fewer or no distortions. In still other embodiments, distortions may be greater in quantity and/or magnitude.

In one or more embodiments, the sintered article may be planar. In one or more embodiments, a portion of the sintered article or a discrete sintered article (as will be described herein) may have a have a three-dimensional shape. For example, in one or more embodiments, a portion of the sintered article or a discrete sintered article may have a saddle shape (which has a convex shape along the width and a concave shape along the length, or a concave shape along the width and a convex shape along the length). In one or more embodiments, a portion of the sintered article or a discrete sintered article may have a c-shape (which has a single concave shape along the length). In one or more embodiments, the shape magnitude (which means the maximum height of the portion of the sintered article or a discrete sintered article measured from the plane on which it is disposed) is less than about 0.75 mm (e.g., about 0.7 mm or less, 0.65 mm or less, 0.6 mm or less, 0.55 mm or less, 0.5 mm or less, 0.45 mm or less, 0.4 mm or less, 0.35 mm or less, 0.3 mm or less, 0.25 mm or less, 0.2 mm or less, 0.15 mm or less, or 0.1 mm or less).

According to another aspect, the embodiments of the sintered article may be described in terms of flattenability or being flattenable in standard, room temperature (at 23° C.) conditions, without heating the sintered article near melting or sintering temperature to soften the article for flattening. In some embodiments, a portion of the sintered article is flattenable. A portion of the sintered article that is flattenable may have a length of about 10 cm or less. In some embodiments, the sintered article may have dimensions otherwise described herein (e.g., width is about 5 mm or greater, the thickness is in a range from about 3 μm to about 1 mm, and the length is about 300 cm or greater), with the portion of the sintered article that is flattenable having a length of 10 cm or less. In some embodiments, for instance where the sintered article is a discrete sintered article, the entire sintered article is flattenable.

As used herein, flattenability is determined by flattening the sintered article by pinching the sintered article (or portion of the sintered article) between two rigid parallel surfaces, or by applying surface pressure on a first major surface 1010 of the sintered article (or portion of the sintered article) against a rigid surface to flatten the sintered article (or portion of the sintered article) along a planar flattening plane. The measure of flattenability may be expressed as the force required to pinch the sintered article (or portion of the sintered article) flat to within a distance of 0.05 mm, 0.01 mm or 0.001 mm from the flattening plane, when the sintered article (or portion of the sintered article) is pinched between two rigid parallel surfaces. The measure of flattenability may alternatively be expressed as the surface pressure applied to a first major surface 1010 to push the sintered article (or portion of the sintered article) flat to within a distance of 0.001 mm from the flattening plane, when the sintered article (or portion of the sintered article) is pushed against a rigid surface. The measure of flattenability may be expressed as the absolute maximum in plane surface stress (compressive or tensile) on the sintered article (or portion of the sintered article) when the sintered article (or portion of the sintered article) is flattened to within a distance of 0.05 mm, 0.01 mm or 0.001 mm from the flattening plane using either flattening method (i.e., pinching between two rigid parallel surfaces or against a rigid surface). This stress may be determined using the thin plate bend bending equation, $\sigma_x = Et/2R(1-v^2)$.

Figure 33:
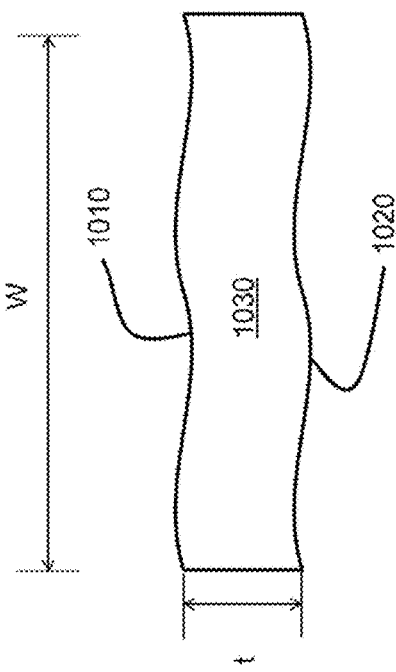
FIG. 33 is a drawing to illustrate the thin bending equation.

The thin plate bend stress equation is derived from the equation $\sigma_x = [E/(1-v^2)] \cdot (\varepsilon_x + v\varepsilon_y)$, where E is elastic modulus, v is Poisson's ratio and $\varepsilon_x$ and $\varepsilon_y$ are strain in the respective directions. With a thick beam, where deflection is much less than the beam thickness, $\varepsilon_x$ is proportional to thickness squared. However, when the beam thickness is significantly less than the bend radius (e.g., the sintered article may have a thickness t of about 20 μm and is bent to a bend radius of a millimeter magnitude), $\varepsilon_y = 0$ is applicable. As illustrated in FIG. 33, it is assumed that the thin plate (or sintered article) is bent into a section of a circle where the length of the neutral axis, $L_0$ is $\Theta \times R$, where $\Theta$ is in radians and R is the bend radius, the length of the outer fiber, $L_1$ is $\Theta \times (R + t/2)$, where $\Theta$ is in radians and R is the bend radius and t is the thickness, $\varepsilon_x$ on the outer fiber is $(L_1 - L_0)/L_0$, and thus, $\varepsilon_x = [\Theta \times (R + t/2) - (\Theta \times R)] \times 1/(\Theta \times R) = t/2R$. The equation $\sigma_x = [E/(1-v^2)] \cdot t/2R$ becomes the thin plate bending equation above ($\sigma_x = Et/2R(1-v^2)$).

In one or more embodiments, the sintered article or the portion of the sintered article, when flattened at least to magnitudes described above, exhibits a maximum in plane stress (which is defined as the maximum absolute value of stress regardless of whether it is compressive stress or tensile stress, as determined by the thin plate bend bending equation) of less than or equal to 25% of the bend strength (which is measured by 2-point bend strength) of the sintered article. For example, the maximum in plane stress of the sintered article or the portion of the sintered article may be less than or equal to 24%, less than or equal to 22%, less than or equal to 20%, less than or equal to 18%, less than or equal to 16%, less than or equal to 15%, less than or equal to 14%, less than or equal to 12%, less than or equal to 10%, less than or equal to 5%, or less than or equal to 4%, of the bend strength of the sintered article.

In one or more embodiments, the sintered article or a portion of the sintered article is flattenable such that the sintered article or portion of the sintered article exhibits a maximum in plane stress of less than or equal to 1% of the Young's modulus of the sintered article, when flattened as described herein. In one or more embodiments, the maximum in plane stress of the sintered article may be less than or equal to 0.9%, 0.8%, 0.7%, 0.6%, 0.5%, 0.4%, 0.3%, 0.2%, 0.1% or 0.05% of the Young's modulus of the sintered article.

In one or more embodiments, the sintered article or a portion of the sintered article is flattenable such that when the sintered article or the portion of the sintered article has a thickness in a range from about 40 μm to about 80 μm (or other thicknesses disclosed herein) and is bent to a bend radius of greater than 0.03 m, the sintered article or portion hereof exhibits a maximum in plane stress of less than or equal to 25% of the bend strength of the article. In one or more embodiments, the sintered article or a portion of the sintered article is flattenable such that when the sintered article or the portion of the sintered article has a thickness in a range from about 20 μm to about 40 μm (or other thicknesses disclosed herein) and is bent to a bend radius of greater than 0.015 m, the sintered article or a portion of the sintered article exhibits a maximum in plane stress of less than or equal to 25% of the bend strength (as measured by 2-point bend strength) of the article. In one or more embodiments, when the sintered article has a thickness in a range from about 3 μm to about 20 μm (or other thicknesses disclosed herein) and is bent to a bend radius of greater than 0.0075 m, the sintered article or a portion of the sintered article exhibits a maximum in plane stress of less than or equal to 25% of the bend strength (as measured by 2-point bend strength) of the article.

In one or more embodiments, the sintered article or a portion of the sintered article is flattenable such that when the sintered article or the portion of the sintered article has a thickness of about 80 μm (or other thicknesses disclosed herein) and is bent to a bend radius of greater than 0.03 m, the sintered article or portion hereof exhibits a maximum in plane stress of less than or equal to 25% of the bend strength of the article. In one or more embodiments, the sintered article or a portion of the sintered article is flattenable such that when the sintered article or the portion of the sintered article has a thickness of about 40 μm (or other thicknesses disclosed herein) and is bent to a bend radius of greater than 0.015 m, the sintered article or a portion of the sintered article exhibits a maximum in plane stress of less than or equal to 25% of the bend strength (as measured by 2-point bend strength) of the article. In one or more embodiments, when the sintered article has a thickness of about 20 μm (or other thicknesses disclosed herein) and is bent to a bend radius of greater than 0.0075 m, the sintered article or a portion of the sintered article exhibits a maximum in plane stress of less than or equal to 25% of the bend strength (as measured by 2-point bend strength) of the article.

In one or more embodiments, the sintered article or a portion thereof is flattenable such that the sintered article or a portion thereof exhibits a maximum in plane stress of less than 250 MPa when flattened to within a distance of 0.05 mm, 0.010 mm or 0.001 mm from the flattening plane using either flattening method (i.e., pinching between two rigid parallel surfaces or against a rigid surface). In one or more embodiments, the maximum in plane stress may be about 225 MPa or less, 200 MPa or less, 175 MPa or less, 150 MPa or less, 125 MPa or less, 100 MPa or less, 75 MPa or less, 50 MPa or less, 25 MPa or less, 15 MPa, 14 MPa or less, 13 MPa or less, 12 MPa or less, 11 MPa or less, 10 MPa or less, 9 MPa or less, 8 MPa or less, 7 MPa or less, 6 MPa or less, 5 MPa or less, or 4 MPa or less.

In one or embodiments, the sintered article or a portion thereof is flattenable such that a force of less than 8 N (or 7 N or less, 6 N or less, 5 N or less, 4 N or less, 3 N or less, 2 N or less, 1 N or less, 0.5 N or less, 0.25 N or less, 0.1 N or less, or 0.05 N or less) is required to flatten the sintered article or a portion thereof within a distance of 0.05 mm, 0.010 mm or 0.001 mm from the flattening by pinching between two rigid parallel surfaces.

In one or more embodiments, the sintered article or a portion thereof is flattenable such that a pressure of 0.1 MPa or less is required to push the sintered article (or portion of the sintered article) flat to within a distance of 0.05 mm, 0.010 mm or 0.001 mm from the flattening plane, when the sintered article (or portion of the sintered article) is pushed against a rigid surface. In some embodiments, the pressure may be about 0.08 MPa or less, about 0.06 MPa or less, about 0.05 MPa or less, about 0.04 MPa or less, about 0.02 MPa or less, about 0.01 MPa or less, about 0.008 MPa or less, about 0.006 MPa or less, about 0.005 MPa or less, about 0.004 MPa or less, about 0.002 MPa or less, about 0.001 MPa or less, or 0.0005 MPa or less.

Figure 34B:
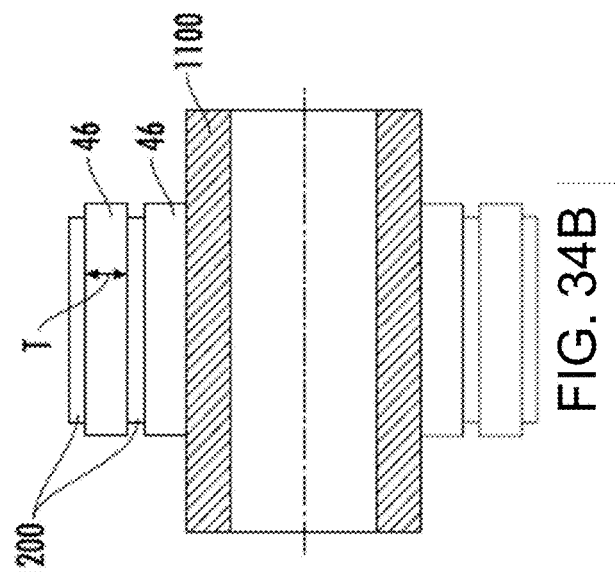
FIG. 34B is a cross-sectional view of the rolled sintered article of FIG. 34A, according to an exemplary embodiment.
Figure 34A:
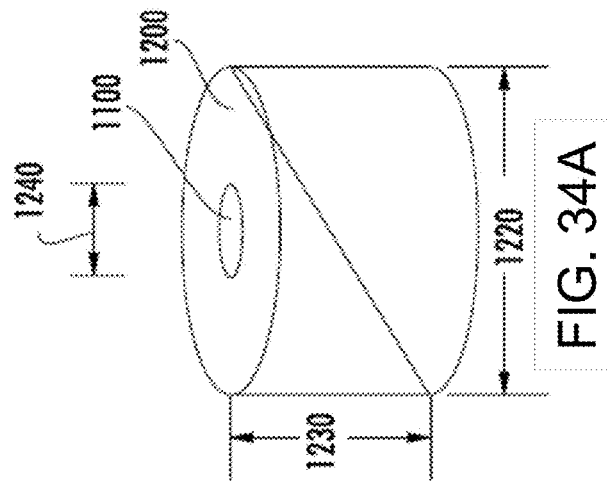
FIG. 34A is a perspective side view of a rolled sintered article, according to an exemplary embodiment.

According to another aspect, the sintered article may be a sintered tape material that is rolled into a rolled sintered article as shown in FIG. 34A. In such embodiments, the rolled sintered article includes a core 1100 and a sintered article 1200 (according to one or more embodiments described herein) wound around the core. In one or more embodiments, the core is cylindrical and has a diameter 1240 of less than 60 cm (or about 20 inches). For example, the core may have a diameter of about 55 cm or less, 50 cm or less, about 48 cm or less, about 46 cm or less, about 45 cm or less, about 44 cm or less, about 42 cm or less, about 40 cm or less, about 38 cm or less, about 36 cm or less, about 35 cm or less, about 34 cm or less, about 32 cm or less, about 30 cm or less, about 28 cm or less, about 26 cm or less, about 25 cm or less, about 24 cm or less, about 22 cm or less, about 20 cm or less, about 18 cm or less, about 16 cm or less, about 15 cm or less, about 14 cm or less, about 12 cm or less, about 10 cm or less, about 8 cm or less, about 6 cm or less, about 5 cm or less, about 4 cm or less, or about 2 cm or less. In other embodiments the core is otherwise shape and the roll bends around the core in arcs corresponding to the above diameter dimensions.

In one or more embodiments, the sintered article wound around the core is continuous and has the dimensions otherwise described herein (e.g., a width that is about 5 mm or greater, a thickness in a range from about 3 μm to about 1 mm, and a length is about 30 cm or greater).

Spooling of a continuous sintered article (and in particular, a continuous sintered inorganic material such as ceramics) onto a core presents several challenges because the sintered article has cross web shape, and web tensions that the sintered article can tolerate, particularly in the binder burn out and bisque states, are extremely low (e.g., tensions of gram level magnitude). Furthermore, the modulus of the sintered material can be very high (e.g., up to and including about 210 GPa) and therefore, the sintered article does not stretch under tension and, when wound around a core, the resulting wound roll integrity may be poor. During handling the successive convolutions, a continuous sintered article can easily telescope (i.e., the successive wraps can move out of alignment).

Applicants have found that rolled sintered article of one or more embodiments has superior integrity by using a compliant interlayer support material when spooling the continuous sintered article onto a core. In one or more embodiments, the continuous sintered article is disposed on an interlayer support material and the continuous sintered article and interlayer support material are wound around the core such that each successive wrap of the continuous sintered article is separated from one another by the interlayer support material. As described above with reference to FIG. 3, the sintered article (or sintered tape material) 40 is wound upon uptake reel 44. The interlayer support material 46 is or may be paid off of a reel 48 and the interlayer support material 46 is or may be wound onto uptake reel 44 such that a layer of interlayer support material 46 is located between each layer, most, or at least some layers of continuous sintered article 1000 (e.g., sintered article 1200 or sintered tape material 40) on uptake reel 44. This arrangement forms the rolled sintered material 50.

Referring to FIG. 34B, a detailed cross-sectional view of the rolled sintered article 1200 of FIG. 34A is shown according to an exemplary embodiment, where the sintered article 1200 has been twice rolled around the core 1100 and interlayer support material 46 is positioned between the sintered article 1200 and the core 1100, and then between successive winds of the sintered article 1200. As may be intuitive from FIG. 34B, when viewed from an end, the sintered article 1200 (in this case a tape) and the interlayer support material 46 form intertwined spirals about the core 1100. In other contemplated embodiments, the sintered article may be cut into discrete sheets and still wound on a core and separated from adjoining winds by a continuous interlayer support material 46, such as where the net length of the sheets when added together is a length L as described herein. As shown in FIG. 34B, in various embodiments, the rolled sintered article includes interlayer support material 46 between each layer of rolled sintered article (e.g., sintered article 1000, sintered article 1200 or sintered tape material 40) is shown according to an exemplary embodiment. In various embodiments, the interlayer support material includes a first major surface and a second major surface opposing the first major surface, an interlayer thickness (t) defined as a distance between the first major surface and the second major surface, an interlayer width defined as a first dimension of one of the first or second surfaces orthogonal to the interlayer thickness, and an interlayer length defined as a second dimension of one of the first or second major surfaces orthogonal to both the interlayer thickness and the interlayer width of the interlayer support material. In one or more exemplary embodiments, the interlayer thickness is greater than the thickness of the sintered article. In one or more embodiments the interlayer width may be greater than the width of the rolled sintered article.

In one or more embodiments, the interlayer support material 46 comprises a tension (or is under a tension) that is greater than a tension on the continuous sintered article, as measured by a load cell. In one or more embodiments, the interlayer support material has a relatively low modulus (compared to the sintered article) and thus is stretched under low tension. It is believed that this creates higher interlayer roll pressures that improve the wound roll integrity. Furthermore, the tension in the wound roll in some embodiments is controlled by controlling the tension applied to the interlayer support material and that tension can be tapered as a function of wound roll diameter. In some such embodiments, the interlayer support material 46 is in tension, while the sintered article (e.g., tape) is in compression.

In one or more embodiments, the interlayer support material is thickness compliant (i.e., the thickness can be decreased by applying pressure to a major surface and can therefore compensate for variation in the cross web shape or thickness in the sintered article generated by the sintering process). In some such embodiments, when viewed from the side, the sintered article may be hidden within the roll by the interlayer support material, where the interlayer support material contacts adjoining winds of interlayer support material and, at least to some degree, shields and isolates the sintered article, such as where the interlayer support material is wider than the sintered article as shown in FIG. 34B and extends beyond both width-wise edges of the sintered article (e.g. tape).

Referring to FIG. 34A, in one or more embodiments, the rolled article is on a cylindrical core and has a diameter 1220 and a side wall width 1230 that are substantially constant. The interlayer support material enables spooling of the continuous or non-continuous sintered article around the core, without causing telescoping, which can increase the side wall width of the rolled article. In some embodiments, the core comprises a circumference and a core centerline along the circumference, the continuous sintered article comprises an article centerline along a direction of the length, and the distance between the core centerline and the article centerline is 2.5 mm or less, along at least 90% or the entire length of the continuous or non-continuous sintered article.

In one or more embodiments, the rolled article comprises a frictional force between the interlayer support material and the continuous or non-continuous sintered article that is sufficient to resist lateral telescoping of the successive convolutions in the wound roll, even when very low tension is applied to the interlayer support material. A constant tension may be applied to the interlayer support material; however, the tension applied to the interior portions of the rolled article toward the core may be greater than the tension applied to exterior portions of the rolled article away from the core due to the diameter of the rolled article increasing from the core to the exterior portions as more interlayer support material and continuous sintered article is wound around the core. This compresses or may compress the rolled article, which, when coupled with the friction between the interlayer support material and the continuous sintered article, prevents or limits telescoping and relative movement between sintered article surfaces to at least help prevent defects.

In one or more embodiments, the interlayer support material comprises any one of or both a polymer and a paper. In some embodiments, the interlayer support material is a combination of polymer and paper. In one or more embodiments, the interlayer support material may include a foamed polymer. In some embodiments, the foamed polymer is closed cell.

Figure 35:
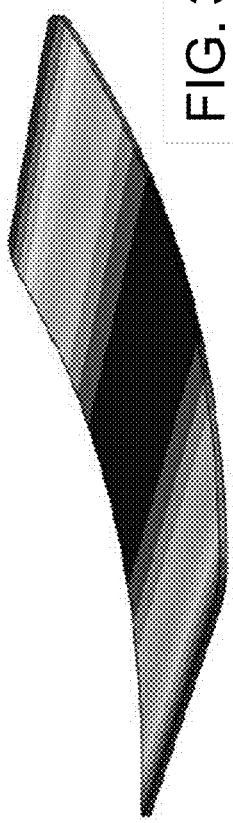
FIG. 35 is a height profile of the sintered article of Example 5, before being flattened, showing the measured height above the flattening plane.
Figure 36:
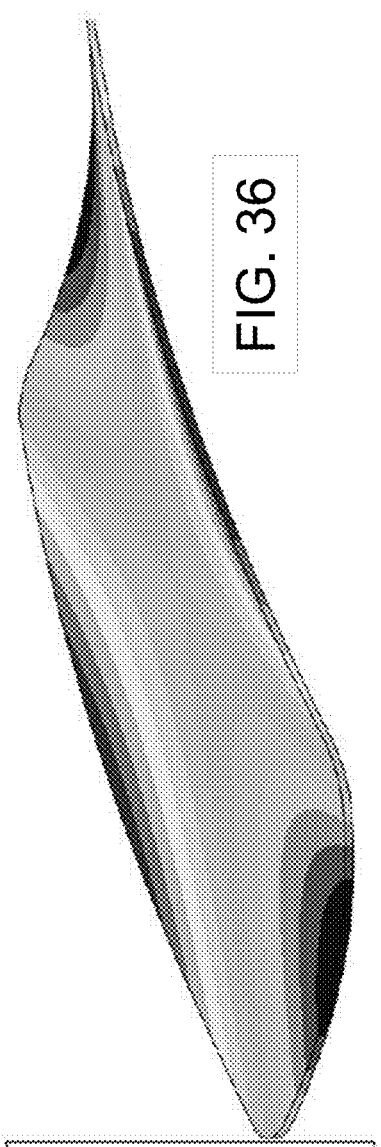
FIG. 36 is a height profile of the sintered article of Example 6, before being flattened, showing the measured height above the flattening plane.

According to another aspect, the sintered articles described herein may be provided as a plurality of discrete sintered articles, as disclosed above, as illustrated in FIG. 35 and FIG. 36. In one or more embodiments, the discrete sintered articles may be formed from a rolled sintered article or a continuous sintered article, as described herein. For example, the discrete sintered articles may be laser cut or otherwise separated from a larger sintered article (which may be in sheet or tape form). In one or more embodiments, each of the plurality of discrete sintered articles has a uniformity or consistency with respect to some or all others of the plurality of discrete sintered articles, as may be due to the improved processes and material properties described herein. In one or more embodiments, each of the plurality of sintered articles include a first major surface, a second major surface opposing the first major surface, and a body extending between the first and second surfaces. The body includes a sintered inorganic material and a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width. As may be intuitive, the discrete sheets or other sintered articles cut or formed from a longer tape have uniform and consistent compositions as disclosed above, uniform and consistent crystal structure, uniform and consistent thickness, levels of defects, and other properties described herein that are or may be present in a tape or other elongate article manufactured with the inventive equipment and processes disclosed herein.

In one or more embodiments, some, most, or each of the plurality of sintered articles is flattenable, as described herein. In one or more embodiments, some, most, or each of the plurality of sintered articles, when flattened, exhibits a maximum in plane stress (which is defined as the maximum absolute value of stress regardless of whether it is compressive stress or tensile stress, as determined by the thin plate bend bending equation) of less than or equal to 25% of the bend strength (which is measured by 2-point bend methods) of the sintered article. For example, the maximum in plane stress of some, most, or each of the plurality of sintered articles may be less than or equal to 24%, less than or equal to 22%, less than or equal to 20%, less than or equal to 18%, less than or equal to 16%, less than or equal to 15%, less than or equal to 14%, less than or equal to 12%, less than or equal to 10%, less than or equal to 5%, or less than or equal to 4%, of the bend strength of the sintered article.

In one or more embodiments, some, most, or each of the plurality of sintered articles is flattenable such that some, most, or each of the plurality of sintered articles exhibits a maximum in plane stress of less than or equal to 1% of the Young's modulus of the sintered article, when flattened as described herein. In one or more embodiments, the maximum in plane stress of some, most, or each of the plurality of sintered articles may be less than or equal to 0.9%, 0.8%, 0.7%, 0.6%, 0.5%, 0.4%, 0.3%, 0.2%, 0.1% or 0.05% of the Young's modulus of the respective sintered article.

In one or more embodiments, some, most, or each of the plurality of sintered articles is flattenable such that when the sintered article has a thickness in a range from about 40 μm about 80 μm (or other thickness disclosed herein) and is bent to a bend radius of greater than 0.03 m, the sintered article exhibits a maximum in plane stress of less than or equal to 25% of the bend strength of the article. In one or more embodiments, some, most, or each of the plurality of sintered articles is flattenable such that when the sintered article has a thickness in a range from about 20 μm to about 40 μm (or other thickness disclosed herein) and is bent to a bend radius of greater than 0.015 m, the sintered article exhibits a maximum in plane stress of less than or equal to 25% of the bend strength (as measured by 2-point bend strength) of the article. In one or more embodiments, some, most, or each of the plurality of sintered articles is flattenable such that when the sintered article has a thickness in a range from about 3 μm to about 20 μm (or other thickness disclosed herein) and is bent to a bend radius of greater than 0.0075 m, the sintered article exhibits a maximum in plane stress of less than or equal to 25% of the bend strength (as measured by 2-point bend strength) of the article.

In one or more embodiments, some, most, or each of the plurality of sintered articles is flattenable such that when the sintered article has a thickness of about 80 μm (or other thickness disclosed herein) and is bent to a bend radius of greater than 0.03 m, the sintered article exhibits a maximum in plane stress of less than or equal to 25% of the bend strength of the article. In one or more embodiments, some, most, or each of the plurality of sintered articles is flattenable such that when the sintered article has a thickness of about 40 μm (or other thickness disclosed herein) and is bent to a bend radius of greater than 0.015 m, the sintered article exhibits a maximum in plane stress of less than or equal to 25% of the bend strength (as measured by 2-point bend strength) of the article. In one or more embodiments, some, most, or each of the plurality of sintered articles is flattenable such that when the sintered article has a thickness of about 20 μm (or other thickness disclosed herein) and is bent to a bend radius of greater than 0.0075 m, the sintered article exhibits a maximum in plane stress of less than or equal to 25% of the bend strength (as measured by 2-point bend strength) of the article.

In one or more embodiments, some, most, or each of the plurality of sintered articles is flattenable such that the sintered article exhibits a maximum in plane stress of less than 250 MPa when flattened to within a distance of 0.05 mm, 0.01 mm, or 0.001 mm from the flattening plane using either flattening method (i.e., pinching between two rigid parallel surfaces or against a rigid surface). In one or more embodiments, the maximum in plane stress may be about 225 MPa or less, 200 MPa or less, 175 MPa or less, 150 MPa or less, 125 MPa or less, 100 MPa or less, 75 MPa or less, 50 MPa or less, 25 MPa or less, 15 MPa, 14 MPa or less, 13 MPa or less, 12 MPa or less, 11 MPa or less, 10 MPa or less, 9 MPa or less, 8 MPa or less, 7 MPa or less, 6 MPa or less, 5 MPa or less, or 4 MPa or less.

In one or embodiments, some, most, or each of the plurality of sintered articles is flattenable such that a force of less than 8 N (or 7 N or less, 6 N or less, 5 N or less, 4 N or less, 3 N or less, 2 N or less, 1 N or less, 0.5 N or less, 0.25 N or less, 0.1 N or less, or 0.05 N or less) is required to flatten the sintered article or a portion thereof, respectively, when the sintered article is flattened to within a distance of 0.05 mm, 0.01 mm, or 0.001 mm from the flattening by pinching between two rigid parallel surfaces.

In one or embodiments, some, most, or each of the plurality of sintered articles is flattenable such that a pressure of 0.1 MPa or less is required to push the sintered article flat to within a distance of 0.05 mm, 0.01 mm, or 0.001 mm from the flattening plane, when pushed against a rigid surface. In some embodiments, the pressure may be about 0.08 MPa or less, about 0.06 MPa or less, about 0.05 MPa or less, about 0.04 MPa or less, about 0.02 MPa or less, about 0.01 MPa or less, about 0.008 MPa or less, about 0.006 MPa or less, about 0.005 MPa or less, about 0.004 MPa or less, about 0.002 MPa or less, about 0.001 MPa or less, or 0.0005 MPa or less.

In one or more embodiments, the thickness of some, most, or each of the plurality of sintered articles is within a range from about 0.7t to about 1.3t (e.g., from about 0.8t to about 1.3t, from about 0.9t to about 1.3t, from about t to about 1.3t, from about 1.1t to about 1.3t, from about 0.7t to about 1.2t, from about 0.7t to about 1.1t, from about 0.7t to about 1t, or from about 0.9t to about 1.1t), where t is the thickness values disclosed herein.

In one or more embodiments, some, most, or each of the plurality of sintered article exhibits compositional uniformity. In one or more embodiments, at least 50% (e.g., about 55% or more, about 60% or more, or about 75% or more) of the plurality of sintered articles comprise an area and a composition, wherein at least one constituent of the composition (as described herein) varies by less than about 3 weight % across the area. In some embodiments, at least one constituent of the composition varies by about 2.5 weight % or less, about 2 weight % or less, about 1.5 weight % or less, about 1 weight % or less, or about 0.5 weight % or less), across that area. In one or more embodiments, the area is about 1 square centimeter of the sintered article, or the area is the entire surface area of the sintered articles.

In one or more embodiments, some, most, or each of the plurality of sintered article exhibits crystalline structure uniformity. In one or more embodiments, at least 50% (e.g., about 55% or more, about 60% or more, or about 75% or more) of the plurality of sintered articles comprise an area and a crystalline structure with at least one phase having a weight percent that varies by less than about 5 percentage points (as described herein) across the area. For illustration only, some, most, or each of the plurality of sintered article may include at least one phase that constitutes 20 weight % of the sintered article and, in at least 50% (e.g., about 55% or more, about 60% or more, or about 75% or more) of the plurality of sintered articles, this phase is present in an amount in a range from about 15 weight % to about 25 weight % across the area. In one or more embodiments, at least 50% (e.g., about 55% or more, about 60% or more, or about 75% or more) of some, most, or each of the plurality of sintered articles comprise an area and a crystalline structure with at least one phase having a weight percent that varies by less than about 4.5 percentage points, less than about 4 percentage points, less than about 3.5 percentage points, less than about 3 percentage points, less than about 2.5 percentage points, less than about 2 percentage points, less than about 1.5 percentage points, less than about 1 percentage point, or less than about 0.5 percentage points, across that area. In one or more embodiments, the area is about 1 square centimeter of the sintered article, or the area is the entire surface area of the sintered articles.

In one or more embodiments, at least 50% (e.g., about 55% or more, about 60% or more, or about 75% or more) of the plurality of sintered article comprise an area and a porosity (as described herein) that varies by less than about 20%. Accordingly, in one example, some, most, or each of the plurality of sintered articles has a porosity of 10% by volume and this porosity is within a range from about greater than 8% by volume to less than about 12% by volume across the area in at least 50% of the plurality of sintered articles. In one or more specific embodiments, at least 50% of the plurality of sintered articles comprises an area and has a porosity that varies by 18% or less, 16% or less, 15% or less, 14% or less, 12% or less, 10% or less, 8% or less, 6% or less, 5% or less, 4% or less or about 2% or less across the area. In one or more embodiments, the area is about 1 square centimeter of the sintered article, or the area is the entire surface area of the sintered article.

Examples 5-6 and Comparative Examples 7-8

Examples 5-6 and Comparative Examples 7-8 are discrete sintered articles formed from a continuous sintered article of tetragonal or tetra zirconia polycrystalline material. Examples 5-6 were formed according to the process and system described herein and Comparative Examples 7-8 were formed using other processes and systems that do not include at least some of the presently disclosed technology (e.g., tension control, zoned sintering furnace, air flow control). Each of Examples 5-6 and Comparative Examples 7-8 had length of 55.88 mm, a width of 25.4 mm, a thickness of 0.04 mm, and a corner radius of 2 mm. Each of Examples 5-6 and Comparative Examples 7-8 had a Young's modulus of 210 GPa, Poisson's ratio (ν) of 0.32, and a density (ρ) of 6 g/cm$^3$.

Figure 39:
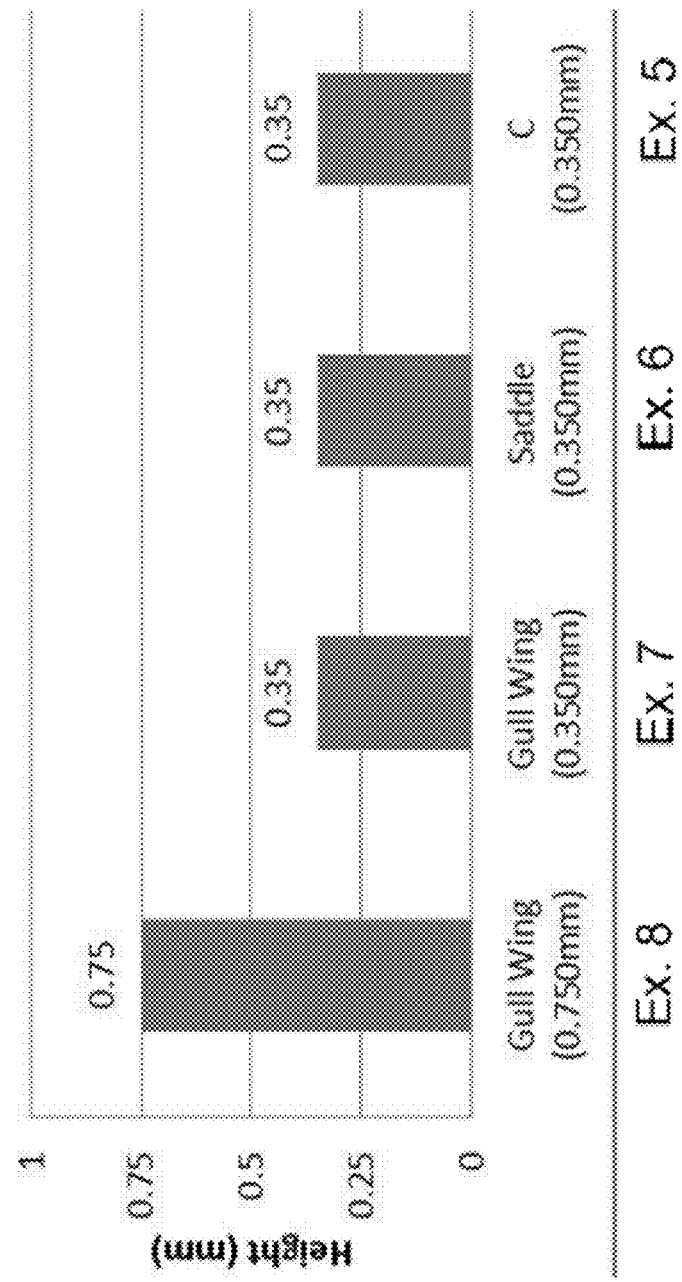
FIG. 39 is a plot of the maximum height above the flattening plane of each of the sintered articles of Examples 5-6 and Comparative Examples 7-8.

Example 5 had a c-shape as shown in FIG. 35, with 0.350 mm shape magnitude. Example 6 had a saddle shape as shown in FIG. 36, with 0.350 mm shape magnitude. Comparative Example 7 had a gullwing shape with 0.350 mm shape magnitude as shown in FIG. 37. Comparative Example 8 had a gullwing shape with 0.750 mm shape magnitude as shown in FIG. 38. The shape magnitude of each sintered article about the plane prior to flattening is compared in FIG. 39.

The flattenability of the Examples was evaluated using the two loading methods otherwise described herein (i.e., pinching the sintered articles between two rigid parallel surfaces or applying a surface pressure on one major surface of the sintered article to push the sintered article against a rigid surface, to flatten the sintered article along a flattening plane).

Figure 40:
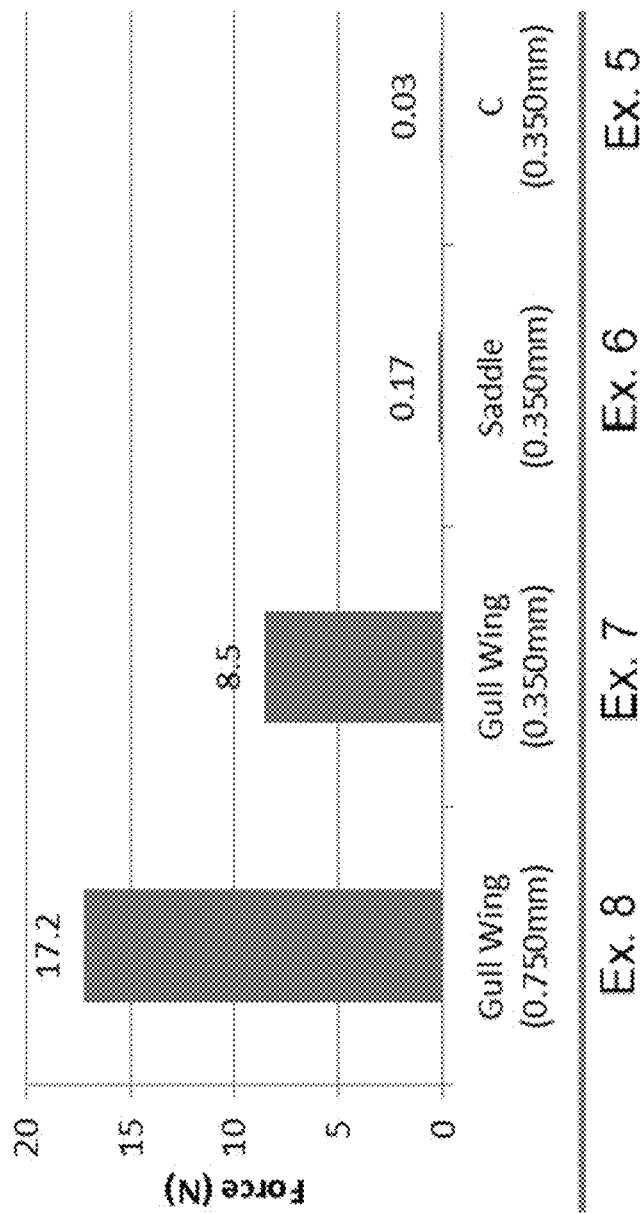
FIG. 40 is a plot of the force required to flatten the sintered articles of Examples 5-6 and Comparative Examples 7-8.
Figure 41:
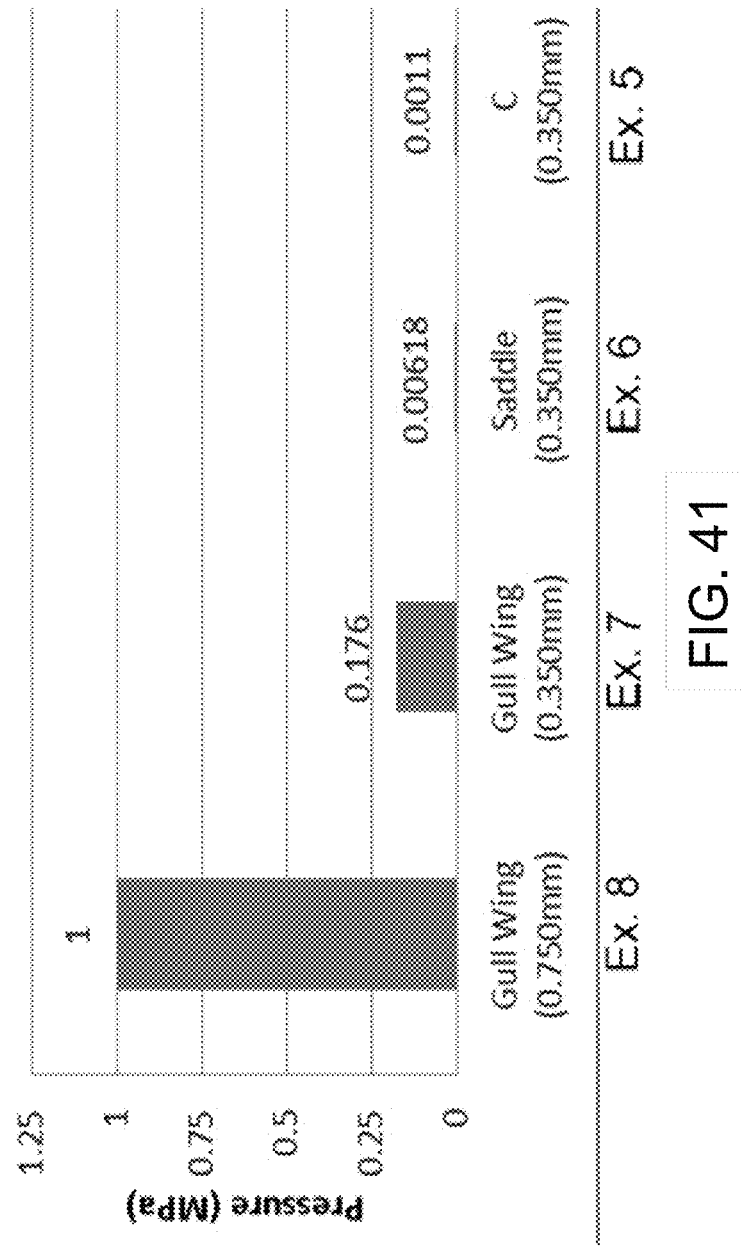
FIG. 41 is a plot of the pressure required to flatten the sintered articles of Examples 5-6 and Comparative Examples 7-8.
Figure 42:
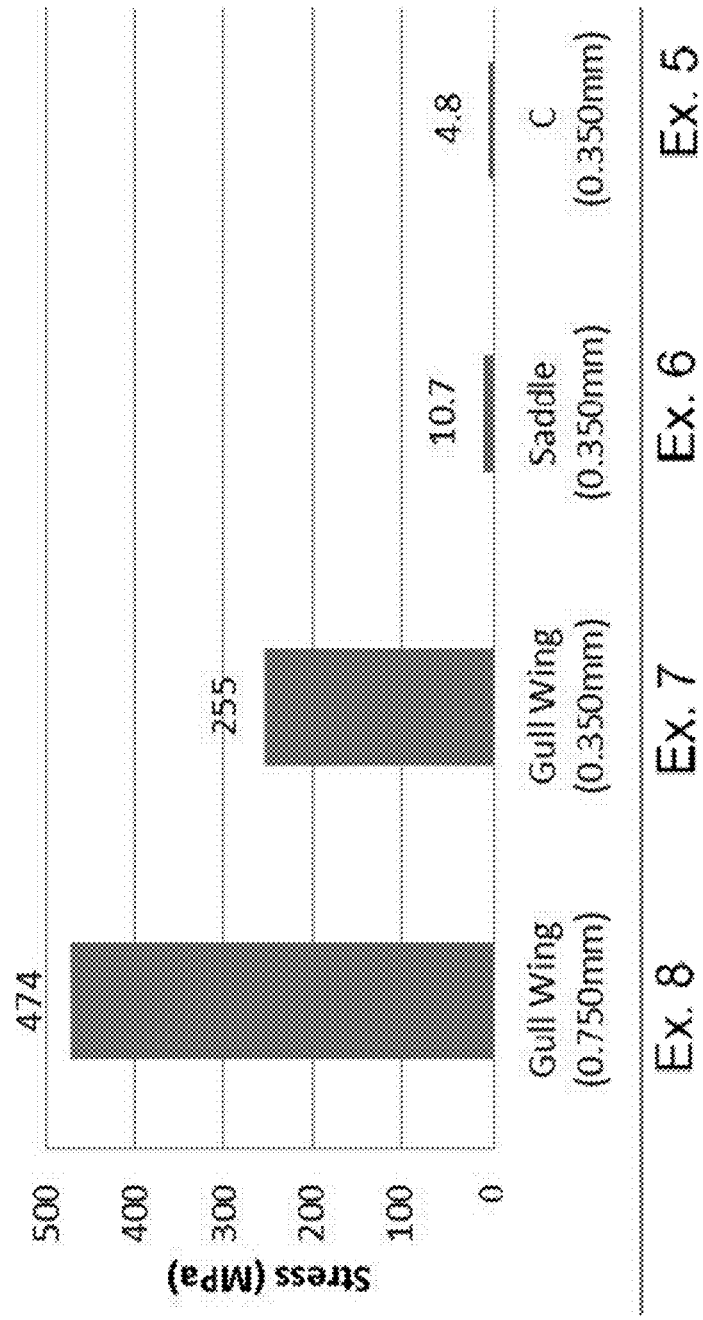
FIG. 42 is a plot of the maximum in plane stress after flattening in the sintered articles of Examples 5-6 and Comparative Examples 7-8.
Figure 44A:
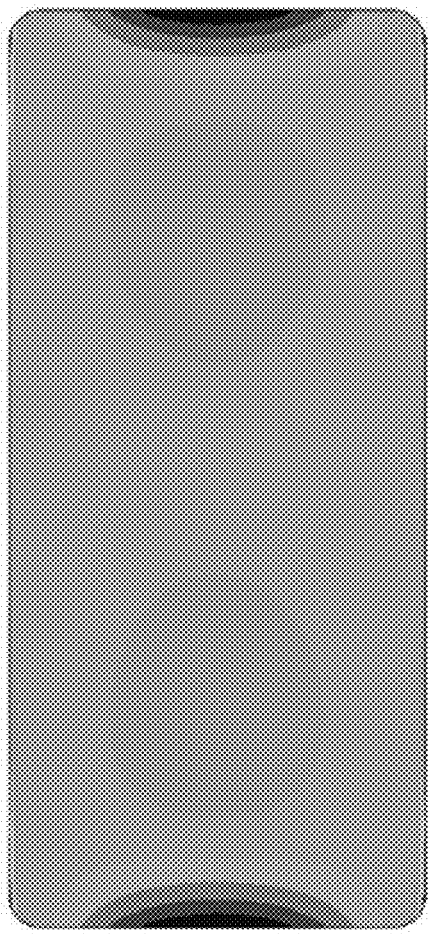
FIG. 44A is a deformation plot showing measured stress in the bottom surface of the sintered article of Example 6, after flattening.
Figure 44B:
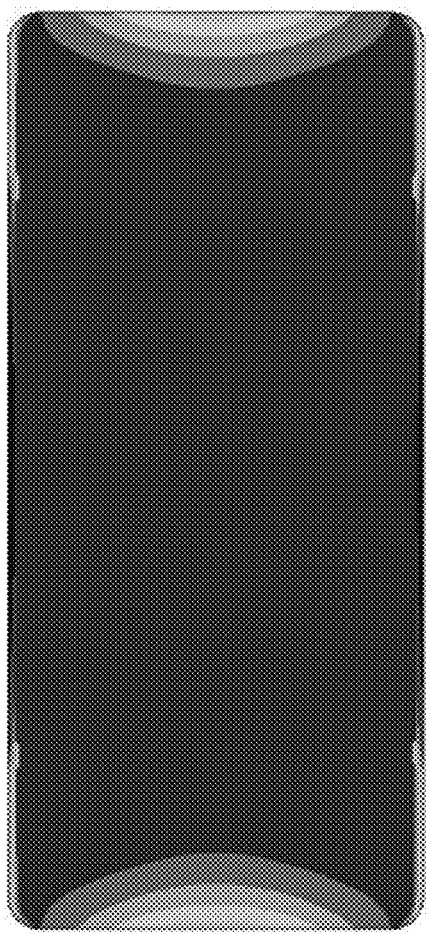
FIG. 44B is a deformation plot showing measured stress in the top surface of the sintered article of Example 6, after flattening.
Figure 45A:
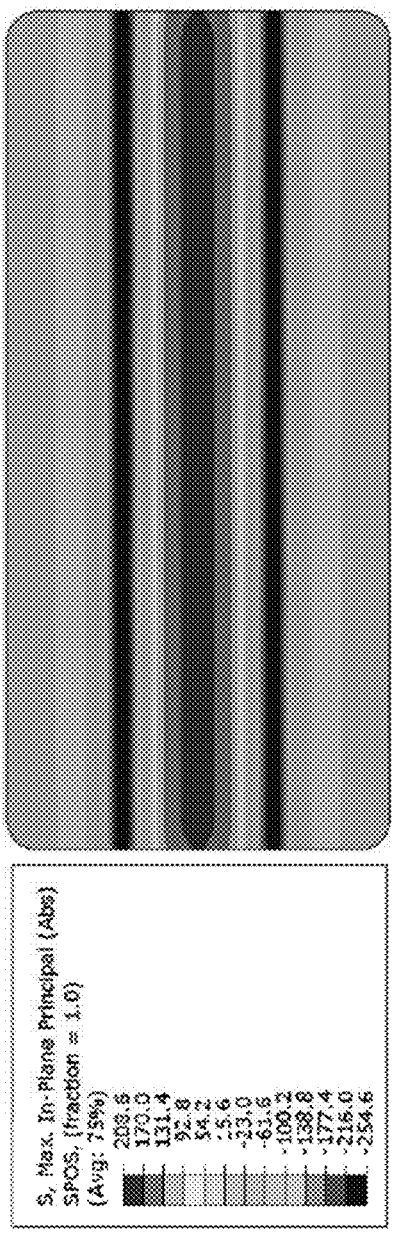
FIG. 45A is a deformation plot showing measured stress in the bottom surface of the sintered article of Comparative Example 7, after flattening.
Figure 45B:
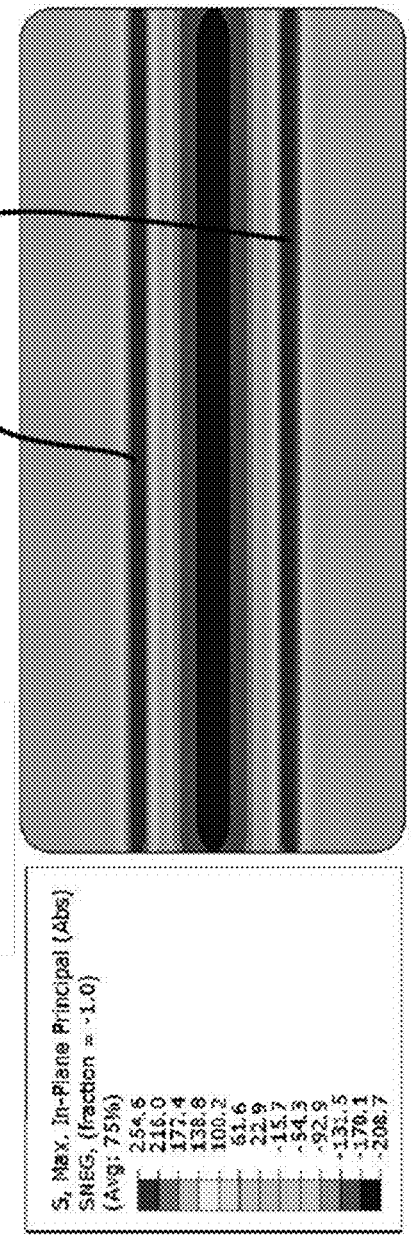
FIG. 45B is a deformation plot showing measured stress in the top surface of the sintered article of Comparative Example 7, after flattening.

FIG. 40 shows the force (in N) required to pinch each of the sintered articles of Examples 5-6 and Comparative Examples 7-8 flat to within a distance of 0.001 mm from the flattening plane, by pinching between two rigid parallel surfaces. As shown in FIG. 40, Examples 5-6 require significantly less force to flatten the sintered articles, indicating a greater flattenability. Moreover, the ability to flatten the sintered articles at such low force indicates that such articles can be manipulated in or subjected to downstream processing without fracturing, breaking or otherwise forming defects. Downstream processes may include, for example, the application of coatings which may include conductive or nonconductive coatings. This same flattenability is also demonstrated when the pressure required to push each of the sintered articles of Examples 5-6 and Comparative Examples 7-8 flat to within a distance of 0.001 mm from the flattening plane, by pushing the sintered article against a rigid surface, was measured. The results are shown in FIG. 41, which demonstrate Examples 5-6 require a significantly less pressure to flatten when compared to Comparative Examples 7-8. FIG. 42 shows the maximum in plane surface stress in the flattened sintered articles of Examples 5-6 and Comparative Examples 7-8. Examples 5-6 exhibit less than 11 MPa of stress, while Comparative Examples 7-8 exhibit more than 20 times that stress, indicating the sintered articles of Comparative Examples 7-8 are more likely to fracture, break or have defects during downstream processing. The location of the stress in Example 5 is shown in FIGS. 43A (bottom surface stress when flattened) and 43B (top surface stress when flattened). The location of the stress in Example 6 is shown in FIGS. 44A (bottom surface stress when flattened) and 44B (top surface stress when flattened). The location of the stress in Comparative Example 7 is shown in FIGS. 45A (bottom surface stress when flattened) and 45B (top surface stress when flattened). In Comparative Example 7, on the bottom surface, the central portion exhibits a tensile stress of 208.6 MPa, which is flanked on both sides by compressive stress of −254.6 MPa. Correspondingly, on the front surface, the central portion is under a compressive stress of about −208.6 MPa and is flanked on both sides by a tensile stress of 254.6 MPa. The location of the stress in Comparative Example 8 is shown in FIGS. 46A (bottom surface stress when flattened) and 46B (top surface stress when flattened). In Comparative Example 8, on the bottom surface, the central portion exhibits a tensile stress of 399.01 MPa, which is flanked on both sides by compressive stress of −473.63 MPa. Correspondingly, on the front surface, the central portion is under a compressive stress of about −399.08 MPa and is flanked on both sides by a tensile stress of 473.60 MPa. The high stress at the points X in Comparative Examples 7-8 indicate these sintered articles will likely fracture along the high stress locations.

In some semiconductor packages and similar light emitting diode (LED) containing packages, much of the electrical energy provided to or through the package may be lost or dissipated as heat energy. The heat dissipation capacity of these and similar semiconductor packages may be a limiting factor when trying to provide additional electrical energy (or current) through the package. Also, in at least some LED containing packages, brightness of the LED may be limited by the heat dissipation capacity of the LED containing package. It may be desirable to reduce and maintain the temperature of the components in a semiconductor package, such as from about 75° C. to about 85° C.

Figure 47:
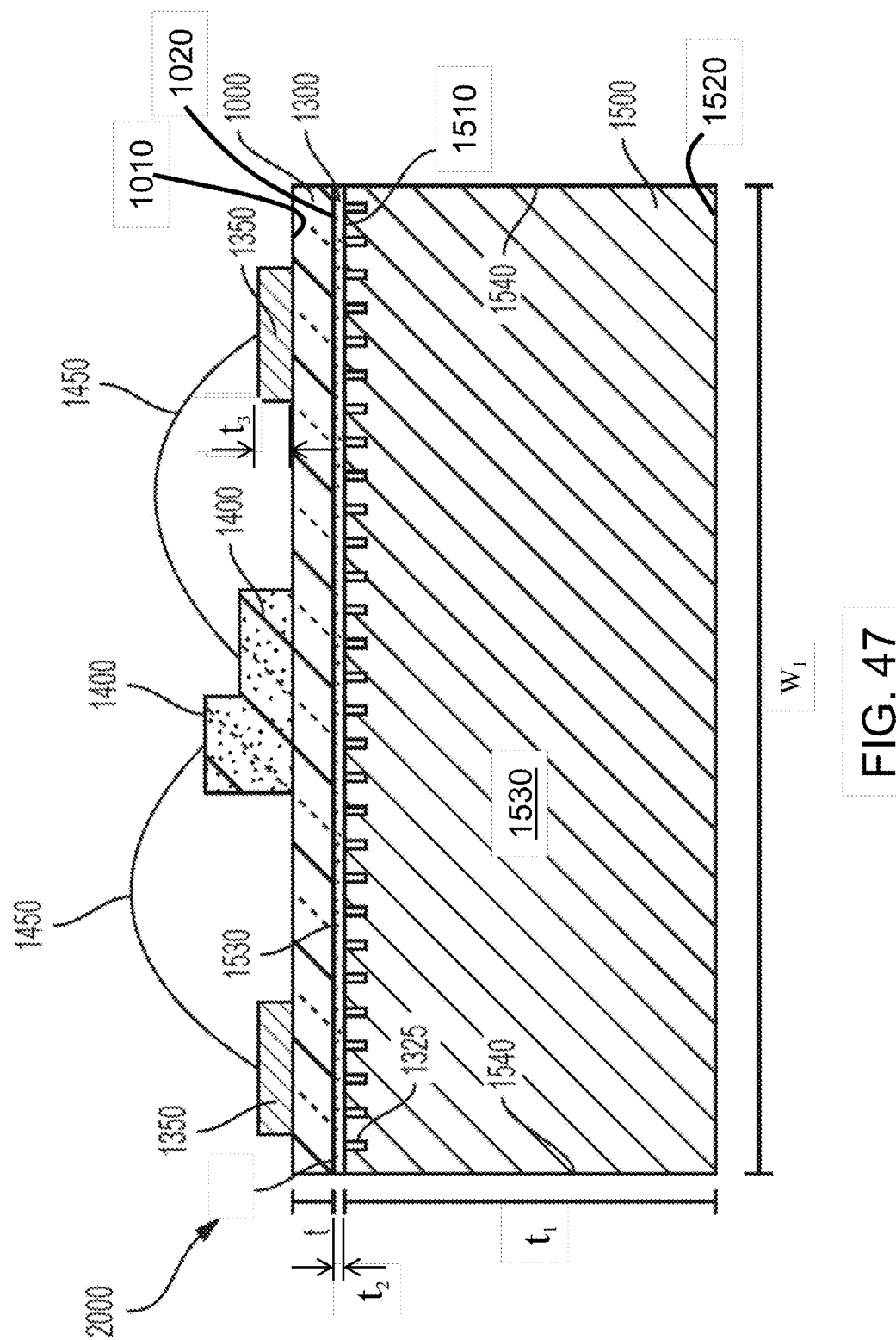
FIG. 47 is a cross-sectional view of a segment of a package including the sintered article, according to an exemplary embodiment.

In one or more embodiments and referring to FIG. 47, sintered article as described herein (e.g., sintered article 1000, sintered article 1200, or sintered tape material 40) is directly or indirectly joined, bonded, connected, or otherwise attached to a substrate 1500 to form a package 2000. Sintered article 1000 may act as a dielectric in package 2000. In some embodiments, package 2000 is a semiconductor package, an electrical package, a power transmission package, a light emitting diode (LED) package, or similar. Package 2000 of the present disclosure provides improved performance (e.g., heat dissipation capacity, lower thermal resistance, etc.) when compared with conventional packages. In other such embodiments, sintered article as described herein (e.g., sintered article 1000, sintered article 1200, or sintered tape material 40) is or is also substrate 1500.

In some embodiments, package 2000 includes an interlayer 1300 between substrate 1500 and sintered article 1000. Interlayer 1300 may include a material that joins, bonds, connects, or otherwise attaches or facilitates attachment of substrate 1500 and sintered article 1000. Interlayer 1300 may include a plurality of discrete layers joined or joined together to form interlayer 1300. In some embodiments, interlayer 1300 is a material with high thermal conductivity properties such that heat generated by electrical components (e.g., a semiconductor device or chip) or metal-based layers is conducted through interlayer 1300 to substrate 1500. In some embodiments, interlayer 1300 includes a thermal conductivity greater than that of sintered article 1000. In some embodiments, interlayer 1300 includes a thermal conductivity less than substrate 1500. Interlayer 1300 may have a thermal conductivity greater than about 8 W/m·K to about 20 W/m·K, greater than about 8 W/m·K to about 16 W/m·K, or greater than about 8 W/m·K to about 13 W/m·K, or greater than about 9 W/m·K to about 12 W/m·K, such as 8, 9, 10, 11, 12, 13, 14, 15, 16, 17, 18, 19, or 20 W/m·K, including all ranges and subranges therebetween. In some embodiments, interlayer 1300 is an adhesive-like material. In some embodiments, interlayer 1300 is a compliant material which is configured to deform and/or to withstand shearing forces from coefficient of thermal expansion (CTE) differences between substrate 1500 and sintered article 1000 which occur as a result of heating and cooling of package 2000.

In some embodiments, interlayer 1300 includes a matrix of a polyimide, an epoxy, or combinations thereof. In some embodiments, the matrix of interlayer 130 may include nonconductive particles (e.g., boron nitride), conductive particles (e.g., silver, copper, etc.), or combinations thereof. The conductive and/or non-conductive particles may be homogeneously or non-homogeneously distributed throughout the matrix of interlayer 130. In some embodiments, interlayer 1300 conducts heat from metal-based layer 1350 and components 1401 (FIG. 50(e)) and transfers the conducted heat to substrate 1500. In some embodiments, interlayer 1300 may have a length (L) and a width (W) substantially similar to that of one or both of substrate 1500 and/or sintered article 1000. In some embodiments, interlayer may have a thickness ($t_2$) from about 0.1 µm to about 100 µm, or from about 10 µm to about 75 µm, or from about 15 µm to about 35 µm, or even from about 20 µm to about 40 µm, such as 5, 10, 15, 20, 25, 30, 35, or 40 µm, including all ranges and subranges therebetween.

In one or more embodiments, substrate 1500 includes a first major surface 1510, a second major surface 1520 opposing the first major surface, and a body 1530 extending between the first and second surfaces 1510, 1520. Sintered article 1000 may be directly or indirectly joined, bonded, connected, or otherwise attached to first major surface 1510 or second major surface 1520 of substrate 1500. The body 1530 has a thickness ($t_1$) defined as a distance between the first major surface 1510 and the second major surface 1520, a width ($W_1$) defined as a first dimension of one of the first or second surfaces orthogonal to the thickness, and a length defined as a second dimension of one of the first or second surfaces orthogonal to both the thickness and the width. In one or more embodiments, substrate 1500 includes opposing minor surfaces 1540 that define the width $W_1$. In some embodiments, the lengths and widths of sintered article 1000 and substrate 1500, respectively, are substantially equivalent (e.g., the lateral dimensions within 5% of each other). In some embodiments, the thickness ($t_1$) of substrate 1500 is greater than the thickness (t) of sintered article 1000, such as the thicknesses (t) disclosed herein for sintered article 1000. In some embodiments, the thickness ($t_1$) of substrate 1500 is about 25% greater than, about 50% greater than, about 75% greater than, about 100% greater than, about 200% greater than, about 500% greater than or more than the thickness (t) of sintered article 1000. In some embodiments, the thickness ($t_1$) of substrate 1500 is from about 0.5 mm to about 5.0 mm, or from about 1.0 mm to about 2.0 mm, or from about 1.0 mm to about 1.6 mm, or even from about 1.2 mm to about 1.5 mm. In some embodiments, substrate 1500 acts as a heat sink for package 2000. In some embodiments, substrate 1500 comprises an electrically conductive metal, such as aluminum, copper, or combinations thereof.

Figure 48:
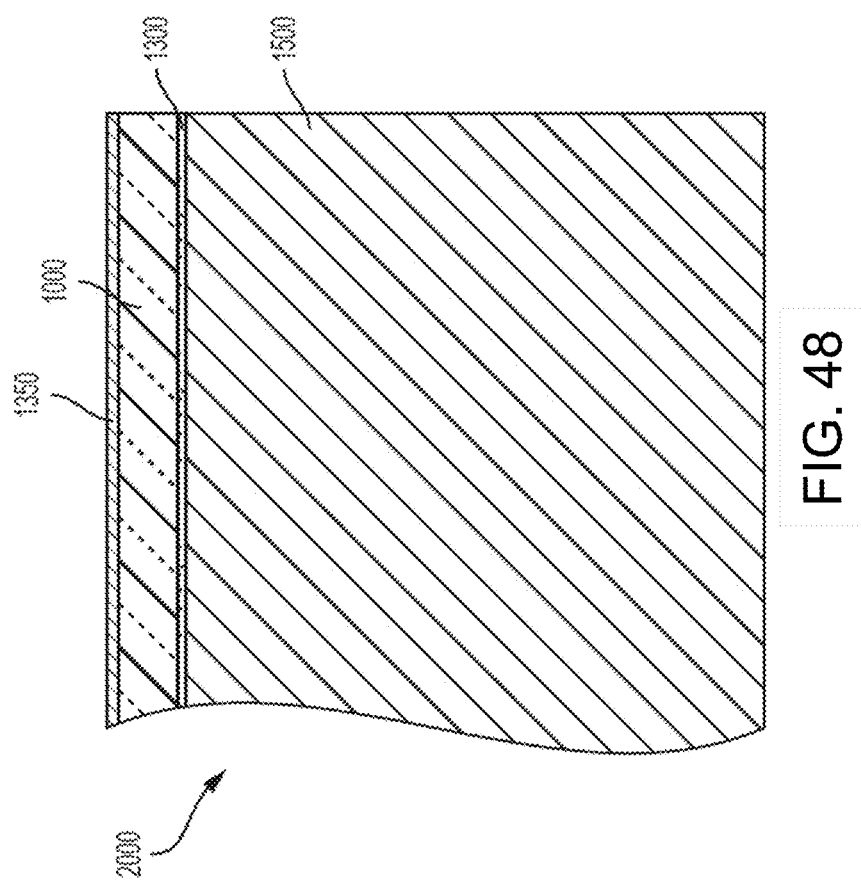
FIG. 48 is a length-wise cross-sectional view of a segment of a package including the sintered article, according to an exemplary embodiment.

FIGS. 47 and 48 provide cross-sectional views of a segment of an example package 2000 in which interlayer 1300 joins substrate 1500 to sintered article 1000. A metal-based layer 1350 may be provided on a major surface of sintered article 1000 opposite the major surface bonded to interlayer 1300. That is, sintered article 1000 may include interlayer 1300 on one major surface and metal-based layer 1350 on the opposite major surface. Interlayer 1300 may be applied to one or both of substrate 1500 and sintered article 1000. Subsequently, substrate 1500 and sintered article 1000 may be assembled or joined together with interlayer 1300 between a major surface of each. Interlayer 1300 may be activated with thermally energy, actinic wavelengths, pressure, or other similar method to join, bond, connect, or otherwise attach substrate 1500 to sintered article 1000 via interlayer 1300.

As illustrated in FIG. 47, one or both of major surfaces 1510, 1520 of substrate 1500 may be patterned to include grooves 1325. Grooves 1325 may assist with joining interlayer 1300 to substrate 1500. Grooves 1325 may also help minimize sheer stresses experienced by interlayer 1300 as a result of CTE differences between substrate 1500 and sintered article 1000. In some embodiments, grooves 1325 cover at least a portion of a major surface of substrate 1500. Grooves 1325 may have a depth from about 0.1 μm to about 1 mm, or from about 10 μm to about 50 μm in a major surface of substrate 1500. Interlayer 1300 may extend at least partially within grooves 1325 of substrate 1500. Grooves 1325 may be rectangular, square, circular, triangular, or other similar shapes or combinations of several shapes in cross-section and may be continuous, dashed, or otherwise extending on a major surface of sintered article 1000.

Metal-based layer 1350 may be directly or indirectly joined to sintered article 1000 by electroplating, printing, physical vapor deposition, chemical vapor deposition, sputtering, or other similar techniques. Metal-based layer 1350 is an electrically conductive material capable of conducting or providing electrical energy (or current) across and through package 2000. In some embodiments, metal-based layer is configured to minimize electrical resistance and heat generation across its length. In some embodiments, metal-based layer 1350 comprises copper, nickel, gold, silver, gold, brass, lead, tin, and combinations thereof. Metal-based layer 1350 may be indirectly joined to sintered article 1000 via a seed layer 1375. That is, seed layer 1375 may provide a foundation for joining metal-based layer 1350 to sintered article 1000. In some embodiments, seed layer 1375 that joins metal-based layer 1350 to sintered article 1000 is "reflowed" in a reflow oven to electrically connect the metal-based layer 1350 to other electrical components in the package 2000. In some embodiments, seed layer 1375 comprises tin, titanium, tungsten, lead, or combinations thereof. Seed layer 1375 may be applied to a major surface of sintered article 1000 by electroplating, printing, physical vapor deposition, chemical vapor deposition, sputtering, or other similar techniques.

Figure 49:
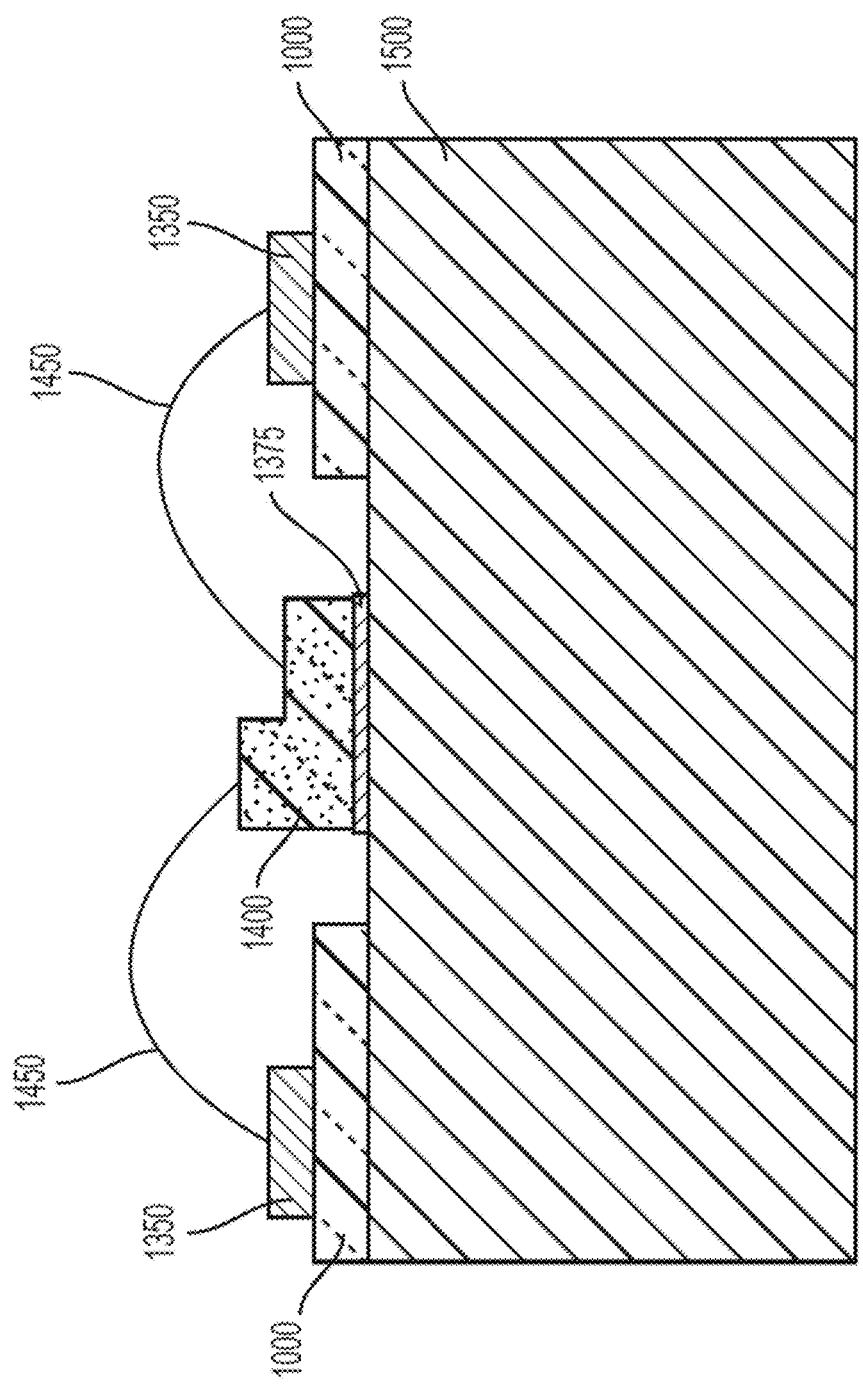
FIG. 49 is another cross-sectional view of a segment of a package including the sintered article, according to an exemplary embodiment.

In some embodiments, metal-based layer 1350 may be directly or indirectly joined to sintered article 1000 before, during, or after sintered article 1000 is joined to substrate 1500. In some embodiments, metal-based layer 1350 is a continuous, semi-continuous, or discontinuous array or "circuit" on a major surface of sintered article 1000. In some embodiments, prior to applying metal-based layer 1350 and/or seed layer 1375 on sintered article 1000, portions of one or both major surfaces of sintered article 1000 may be masked or covered to prevent application of metal-based layer 1350 and/or seed layer 1375 on said masked portions of sintered article 1000. That is, the masking portions of one or both major surfaces of sintered article 1000 may be used to form a semi-continuous or discontinuous array or "circuit" of metal-based layer 1350 and/or seed layer 1375 on a major surface of sintered article 1000. After metal-based layer 1350 is applied to an unmasked portion of a major surface of sintered article 1000, masking may be removed to expose that portion of the major surface (without a metal based layer and/or seed layer thereon) where the masking was present. FIGS. 47 and 49 provide examples of metal-based layer 1350 as an array on a major surface of sintered article. Metal-based layer 1350 includes a thickness ($t_3$) from about 0.1 μm to about 1 mm, or from about 2 μm to about 100 μm, from about 5 μm to about 70 μm, or even from about 5 μm to about 50 μm.

In one or more embodiments, package 2000 includes a semiconductor device or chip 1400. In some embodiments, semiconductor device 1400 is directly or indirectly joined, bonded, connected, or otherwise attached to first major surface 1010 or second major surface 1020 of substrate 1000. Semiconductor device 1400 may be indirectly joined to sintered article 1000 via seed layer 1375 as shown in FIG. 49. Semiconductor device 1400 may include one or more light emitting diodes (LED). In some embodiments, semiconductor device 1400 is connected to metal-based layer 1350 by one or more leads 1450. Leads 1450 may be rigid or flexible wires or electrical connectors (e.g., similar to the metal-based layer 1350) that electrically connect semiconductor device 1400 and metal-based layer 1350. FIGS. 47 and 49 illustrate lead 1450 as bridging the distance between semiconductor device 1400 and metal-based layer 1350. Of course, leads 1450 may run along or contact the surface of sintered article 1300 in one or more embodiments. Leads 1450 may provide electrical energy between metal-based layer 1350 and semiconductor device 1400. In some embodiments, electrical energy running through metal-based layer 1350 is transmitted through leads 1450 to semiconductor device 1400. In some embodiments, electrical energy provided to semiconductor device 1400 powers an LED thereon which emanates one or more light wavelengths (λ). Semiconductor device 1400 may include one or more lenses 1405 to intensify or directly light from LEDs thereon. Semiconductor device 1400 may also include a phosphor material 1475 to filter and transmit specific wavelengths (k) therethrough from light wavelengths (λ) emanating from the LEDs.

In one or more embodiments, methods of making package 2000 include providing sintered article 1000. Sintered article 1000 maybe in on a roll including a round or cylindrical core having a diameter of less than 60 cm, the continuous sintered article wound around the core. Sintered article 1000 may also be provided as discrete flattened lengths. In one or more embodiments, methods of making package 2000 include providing a carrier or temporary substrate 1499 (FIG. 50), which may be on a roll or as a large, flat sheet. In some embodiments, a length of sintered article 1000 is joined, bonded, connected, or otherwise attached to a length of carrier or temporary substrate 1499 to form precursor package 1999. Carrier or temporary substrate 1499 may support the sintered article 1000 for subsequently rolling onto a core. In some embodiments, carrier or temporary substrate 1499 supports sintered article 1000 during subsequent processes which may damage, degrade, or destroy substrate 1500. In some embodiments, carrier or temporary substrate 1499 comprises glass, a polymer, or combinations thereof. In some embodiments, carrier or temporary substrate 1499 is polymeric, such as a polyamide tape.

In some embodiments, precursor package 1999 includes a precursor interlayer 1299 (FIG. 50) between sintered article 1000 and temporary substrate 1499. Precursor interlayer 1299 may include a material that joins, bonds, connects, or otherwise attaches temporary substrate 1499 and sintered article 1000. In some embodiments, precursor interlayer 1299 is a high-temperature resistant adhesive. Precursor interlayer 1299 may be activated with thermal energy, actinic wavelengths, pressure, or other similar method to join, bond, connect, or otherwise attach temporary substrate 1499 to sintered article 1000. In some embodiments, precursor interlayer 1299 may be deactivated by similar or different means than that for activation so that sintered article 1000 can be detached or disconnected from temporary substrate 1499. In some embodiments, precursor interlayer 1299 and temporary substrate 1499 are configured to withstand (not degrade) during subsequent processing of precursor package 1999, including application of metal-based layer 1350, seed layer 1375, semiconductor device 1400, leads 1450, and/or other similar components.

Figure 50:
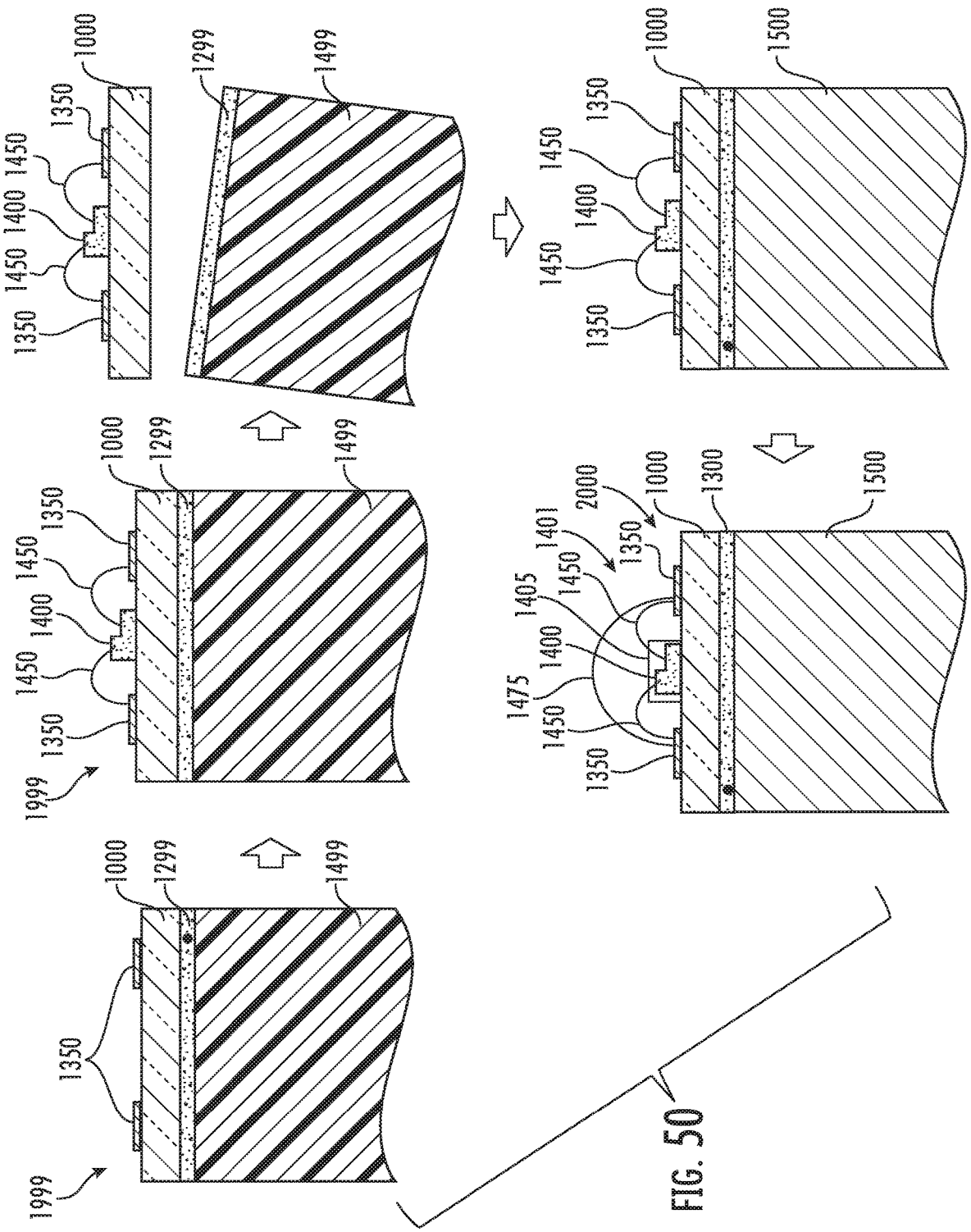
FIG. 50 is an example method of making a package including the sintered article, according to an exemplary embodiment.

FIG. 50 illustrates a method of forming package 2000 from a precursor package 1999. Step (a) in the FIG. 50 illustrates precursor package 1999 following applying metal-based layer 1350 on a major surface of sintered article 1000 opposite the surface joined with precursor interlayer 1299. Step (a) in FIG. 50 also illustrates precursor package 1999, following removing masking from sintered article 1000 (e.g., between metal-based layers 1350). Before or after step (a), seed layer 1375 may be applied to sintered article 1000. Step (b) in FIG. 50 illustrates applying parts (i.e., semiconductor device 1400 and leads 1450) of components 1401 to sintered article 1000 to electrically connect semiconductor device 1400 and metal-based layer 1350. In some embodiments, carrier or temporary substrate 1299 and precursor interlayer 1299 are configured to support sintered article 1000 and not degrade or deform during steps (a) and (b) illustrated in FIG. 50, which may be completed at high temperatures (e.g., up to or greater than 320° C.). Step (c) in FIG. 50 illustrates separating sintered article 1000 (including metal-based layer 1350, semiconductor device 1400, and leads 1450 thereon) from temporary substrate 1499. In some embodiments, step (c) may be completed by deactivating precursor interlayer 1299 with thermal energy, actinic wavelengths, pulling, or other similar method. In some embodiments, sintered article 1000 (including metal-based layer 1350, semiconductor device 1400, and leads 1450 thereon) is pulled from temporary substrate 1499 by a machine or by hand. In some embodiments, step (c) occurs in a reflow furnace while seed layer 1375 or solder electrically connects the parts of component 1401. Precursor interlayer 1299 may transfer with sintered article 1000, with temporary substrate 1499, or with both (a portion on each). Step (c) in FIG. 50 illustrates an embodiment where precursor interlayer 1299 is transferred with temporary substrate 1499. In some embodiments, precursor interlayer 1299 may become interlayer 1300 in subsequent processing (e.g., heating) or by bonding or contacting substrate 1500. Step (d) in FIG. 50 illustrates joining sintered article 1000 and substrate 1500 with interlayer 1300 therebetween. In some embodiments, precursor interlayer 1299 may be the same as interlayer 1300. Step (e) in FIG. 50 illustrates applying additional parts (e.g., lens 1405 and phosphor 1475) of components 1401 to sintered article 1000. In some embodiments, parts of components 1401 may be applied at lower temperatures (e.g., <150° C.) such that interlayer 1300 and substrate 1500 are not degraded or deformed while completing the building of components 1401. Package 2000 as shown in step (e) of FIG. 50 may include one or more of components 1401.

Figure 51:
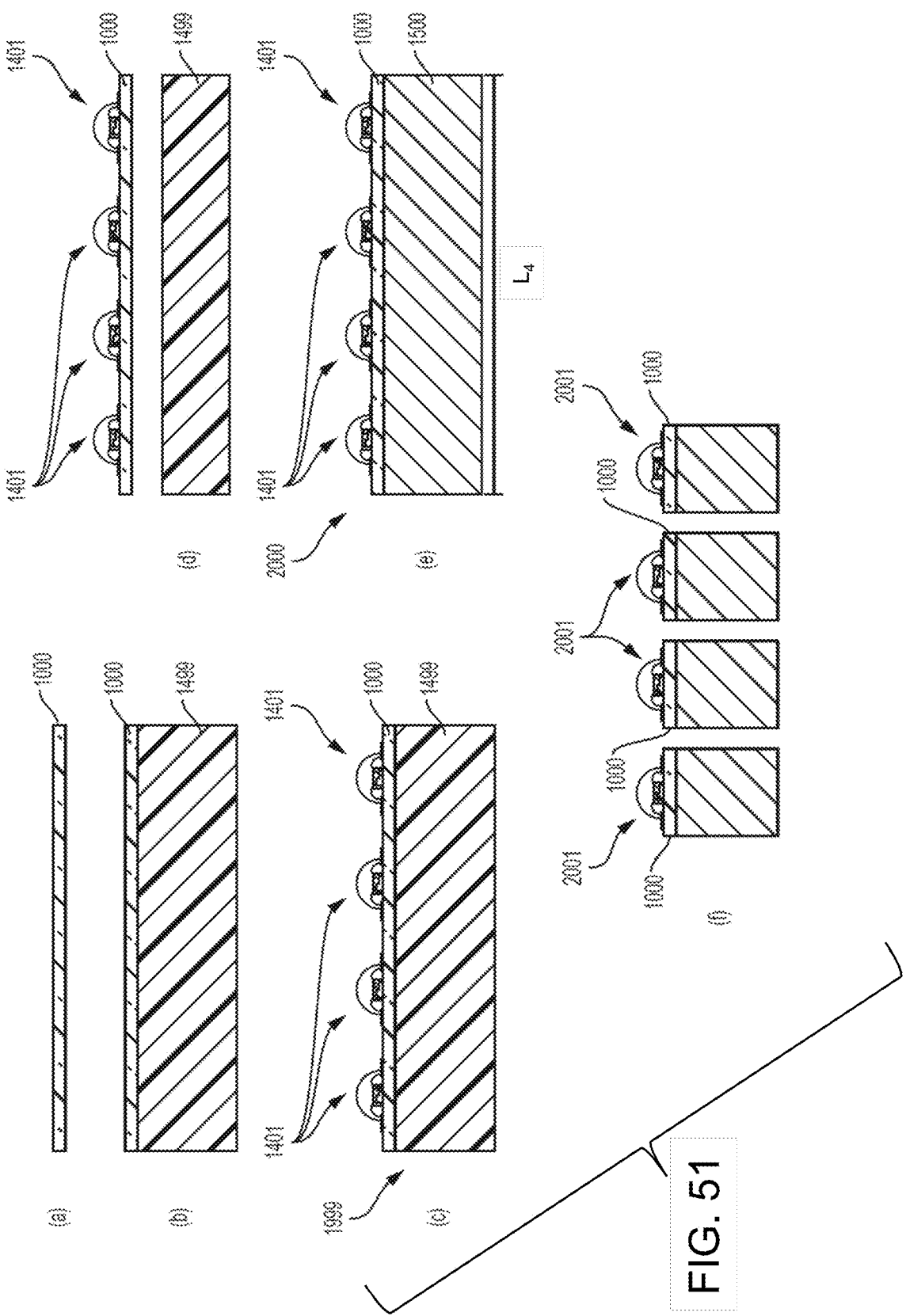
FIG. 51 is another example method of making a package including the sintered article, according to an exemplary embodiment.

FIG. 51 provides another illustrative method of forming package 2000 via a precursor package 1999. Step (a) of FIG. 51 illustrates providing flattened sintered article 1000 from a rolled core, as flattened sheets, or otherwise. Step (b) of FIG. 51 illustrates joining the flattened sintered article 1000 and carrier or temporary substrate 1499 to form precursor package 1999. Precursor interlayer 1299 or a similar such layer may be located between sintered article 1000 and carrier or temporary substrate 1499. Precursor package 1999 may be rolled onto a core, stored, shipped, or sold for subsequent processing. Step (c) of FIG. 51 illustrates applying metal-based layer 1350 and the parts (e.g., semiconductor device 1400, leads 1450, lens 1405, phosphor 1475, etc.) of light-emitting components 1401 to sintered article 1000. Step (c) may include several stages which electrically connect metal-based layer 1350 with semiconductor device 1400 and any LEDs thereon on sintered article 1000. Step (c) may also include a solder reflow operation in a solder furnace to electrically connect all the parts of components 1401. Step (d) of FIG. 51 illustrates detaching or separating sintered article 1000 (including components 1401) and temporary substrate 1499. Step (d) may be accomplished by pulling sintered article 1000 (including components 1401) from temporary substrate 1499 by a machine or by hand. Step (d) may be catalyzed by heat, exposure to actinic wavelengths, cooling, exposure to solvents, or other similar methods. Of course, precursor interlayer 1299 (if present) may transfer with sintered article 1000, with temporary substrate 1499, or with both (a portion on each). Step (e) of FIG. 51 illustrates joining sintered article 1000 (including components 1401) and substrate 1500 to form package 2000. In some embodiments, sintered article 1000 (including components 1401) and substrate 1500 may be joined by interlayer 1300 or a similar layer therebetween to form package 2000. Step (f) of FIG. 51 illustrates cutting package 2000 at different points along its length $L_4$ into a plurality of segments 2001. Package 2000 may be cut along its length $L_4$ into segments 2001 with localized cutting pressure, laser energy (e.g., UV ablation laser), or with similar techniques. In some embodiments, each segment 2001 includes at least one or more components 1401. Segments 2001 of package 2000 may be used in a variety of applications including as a filament for a light bulb, an electronic device, a handheld device, a heads-up display, a vehicle instrument panel, or similar.

Figure 52:
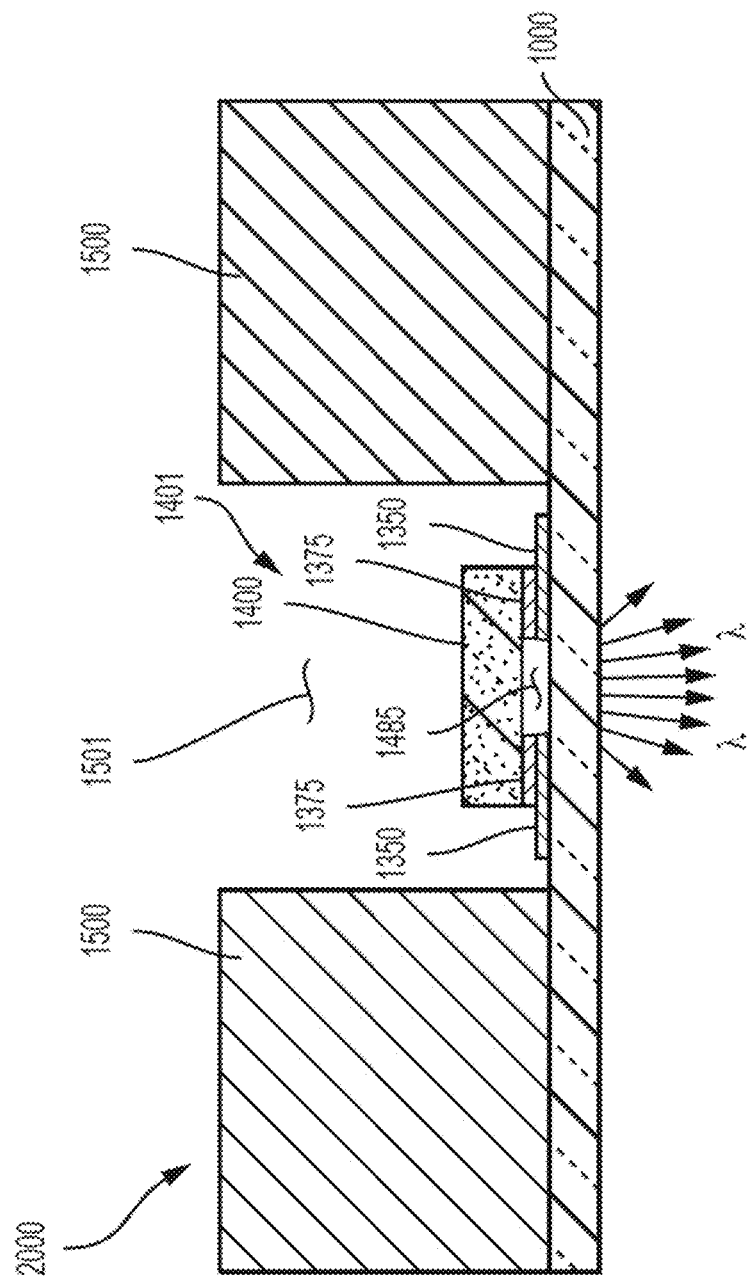
FIG. 52 is an example cross-sectional view of a segment of a package including the sintered article and a "flip-chip" configuration, according to an exemplary embodiment.
Figure 53:
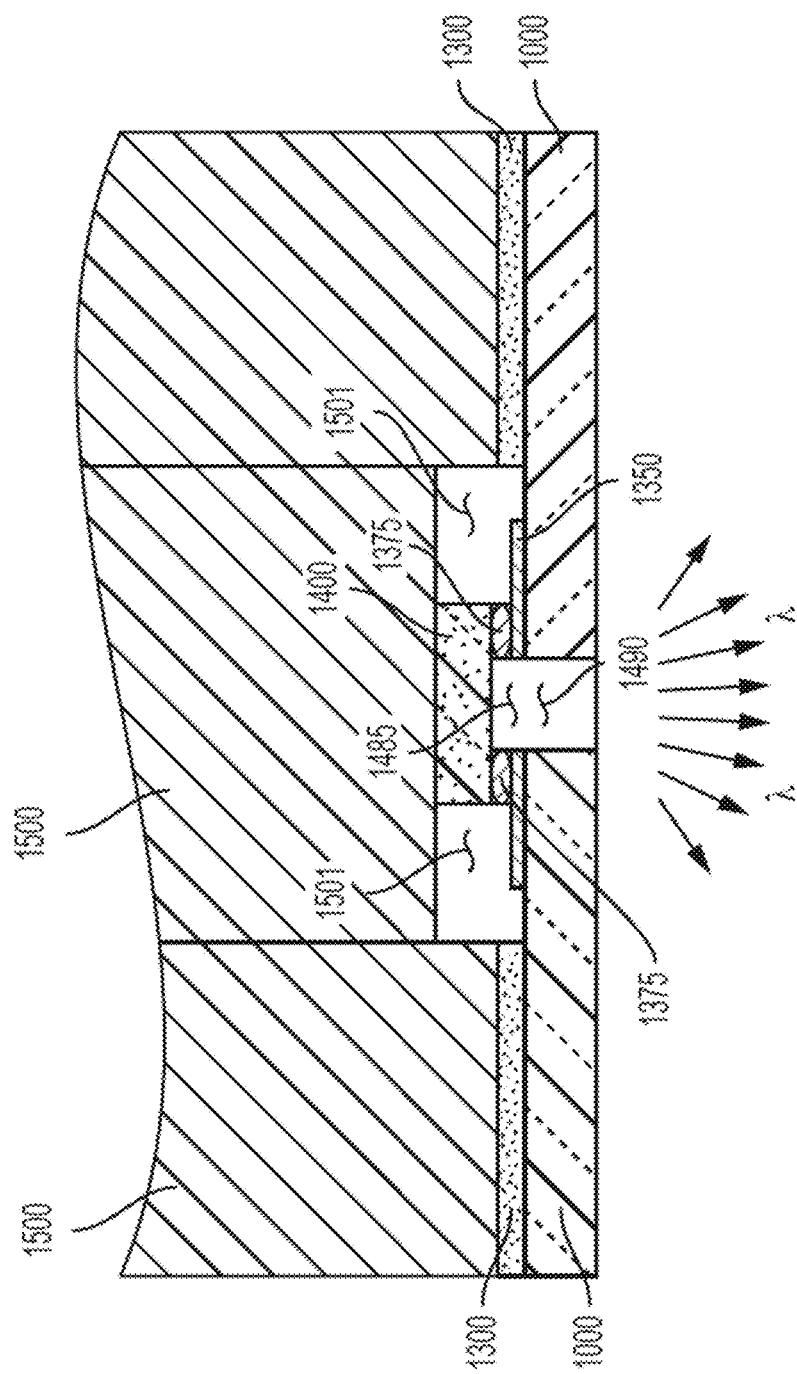
FIG. 53 is another example cross-sectional view of a segment of a package including the sintered article and a "flip-chip" configuration, according to an exemplary embodiment.
Figure 54:
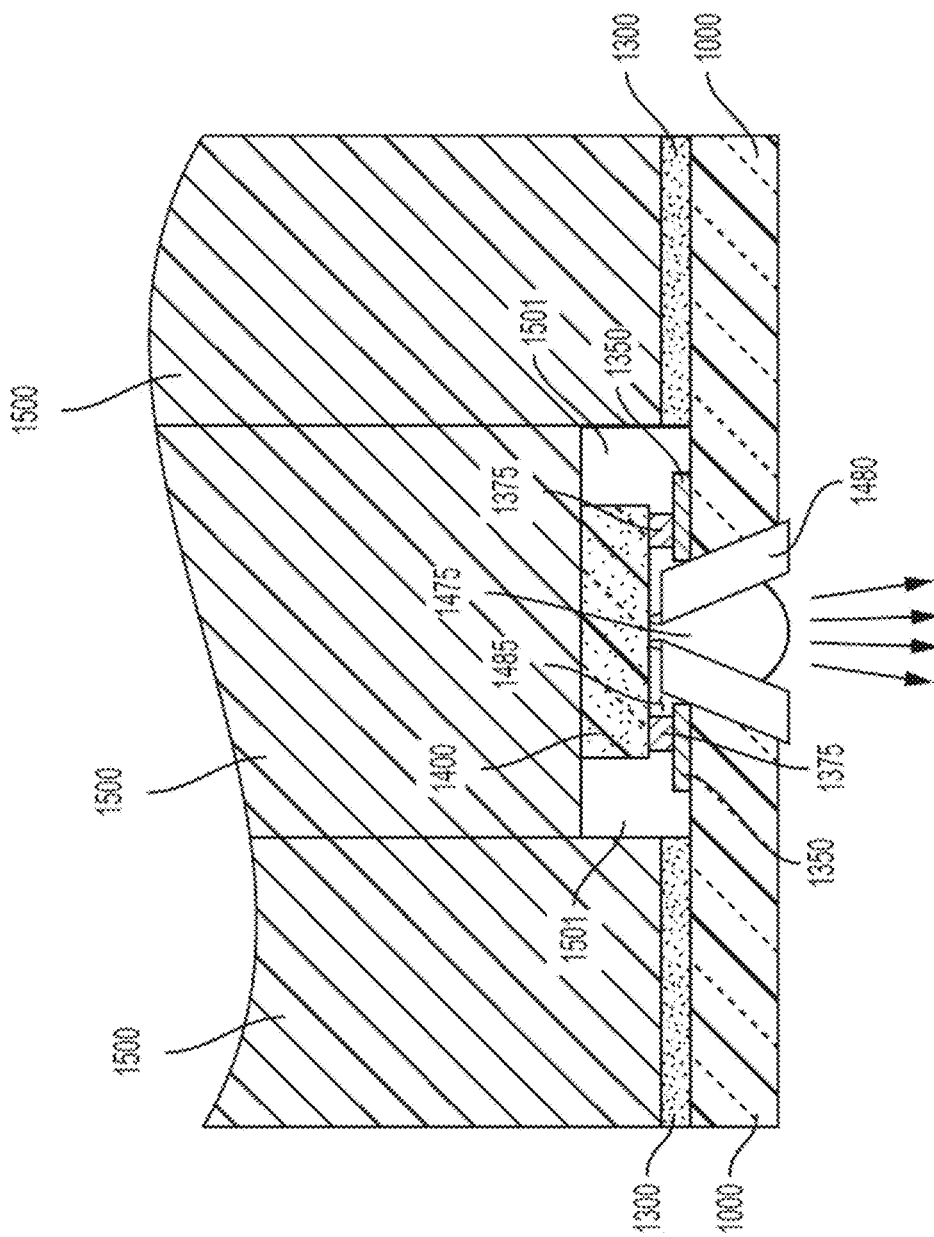
FIG. 54 is yet another example cross-sectional view of a segment of a package including the sintered article and a "flip-chip" configuration, according to an exemplary embodiment.

FIGS. 52-54 illustrate cross-sectional views of package 2000 including sintered article 1000 and a "flip-chip" configuration of semiconductor device 1400. In these embodiments, a segment of package 2000 may include an aperture 1501 in substrate 1500. Aperture 1501 may be formed by drilling, cutting, or removing part of substrate 1500. Aperture 1501 may also be formed by spacing two parts of substrate 1500 apart on one major surface of sintered article 1000. In some embodiments, metal-based layer 1350 may be joined, bonded, connected, or otherwise attached to the same major surface of sintered article 1000 as substrate 1500.

FIG. 52 illustrates an example cross-sectional views of a segment of package 2000 including sintered article 1000 joined with substrate 1500. In some embodiments, metal-based layer 1350 is provided within aperture 1501. That is, metal-based layer 1350 is joined on the same major surface of sintered article 1000 as substrate 1500. In some embodiments, seed layer 1375 is applied to and bonded with metal-based layer 1350. Seed layer 1375 may assist with bonding metal-based layer 1350 and semiconductor device 1400 in a "flip-chip" configuration. In one or more embodiments, seed layer 1375 comprises tin, titanium, tungsten, lead, or alloys thereof. In some embodiments, seed layer 1375 is electrically conductive and may eliminate the need for leads to electrically connect metal-based layer and semiconductor device 1400. In some embodiments, a volume 1485 may be formed between sintered article 1000 and semiconductor device 1400. Together with metal-based layer 1350 and/or seed layer 1375, volume 1485 may be sealed between sintered article 1000 and semiconductor device 1400. In some embodiments, an LED on semiconductor device 1400 is opposite volume 1485 and within aperture 1501. In some embodiments, an LED on semiconductor device 1400 is within volume 1485. Phosphor material 1475 may be provided within volume 1485. In the FIGS. 52 and 53, sintered article 100 may be translucent or substantially transparent such that light wavelengths (λ) emanating from an LED on semiconductor device 1400 transmits through sintered article 1000. In some embodiments, sintered article 1000 may transmit from about 35% to about 95%, or from about 45% to about 85%, or from about 55% to about 75%, such as 35%, 40%, 50%, 60%, 65%, 75%, 85%, 90%, 95%, or more up to 99%, including all ranges and subranges therebetween, of some, most, or all the visible light wavelengths (λ) emanating from an LED or transmitted through phosphor material 1475.

The total light transmitted (T) through the sintered article 1000 may be defined by the follow equation 1:

$$T = \Phi_e^t / \Phi_e^i \quad (1)$$

where, $\Phi_e^t$ is the radiant flux transmitted by that surface; and
$\Phi_e^i$ is the radiant flux received by that surface.

The measurement of these quantities is described in ASTM standard test method D1003-13.

Figure 55:
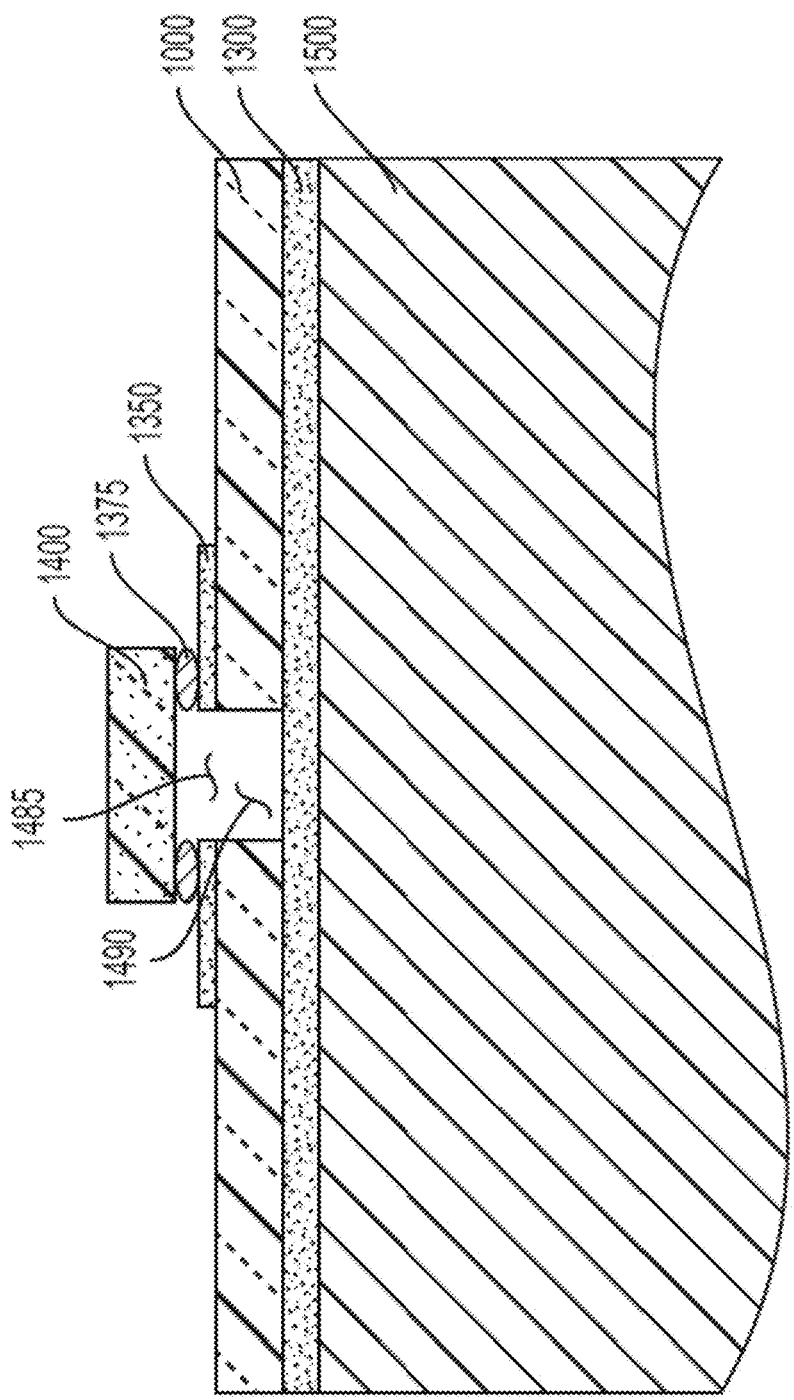
FIG. 55 is another cross-sectional view of a segment of a package including the sintered article, according to an exemplary embodiment.

Although similar to FIG. 52, FIG. 53 illustrates interlayer 1300 between sintered article 1000 and substrate 1500. FIG. 53 further illustrates an embodiment where at least a portion of aperture 1501 (shown in FIG. 52) is plugged with substrate 1500 which may be isolated from or connected with adjacent portions of substrate 1500. In other embodiments, at least a portion of aperture 1501 is plugged with a filler material (e.g., epoxy, plastic, polymeric material, etc.) to seal chip 1400 and metal-based layer 1350 within package 2000. In FIG. 53, substrate 1500 contacts semiconductor device 1500 to conduct heat from semiconductor device 1400 generated when electrical energy is provided to package 2000. In some embodiments, sintered article 1000 includes a hole 1490 through its thickness. As illustrated in FIGS. 53 and 55, hole 1490 in sintered article 1000 intersects volume 1485. Hole 1490 may allow phosphor material 1475 within volume 1485 to be cooled by ambient convection. Hole 1490 may also allow light wavelengths (λ) from an LED in volume 1485 to emanate from package 2000. As shown in FIG. 54, a reflector 1480 may be included within volume 1485 and/or hole 1490 to intensify or reflect light wavelengths (λ) emanating from an LED on semiconductor device 1400. Reflector 1480 may have a conical, a hemispherical, a tapering, or a curved shape. In some embodiments, reflector 1480 may be coated with a coating to intensify light wavelengths (λ) emanating from an LED on semiconductor device 1400. FIG. 55 shows another possible configuration.

In one or more embodiments, the sintered articles described herein may be used in microelectronics applications or articles. For example, such microelectronics articles may include a sintered article (according to one or more embodiments described herein) including a first major surface, a second major surface opposing the first major surface. In one or more embodiments, the microelectronics article may include a continuous (e.g., long tape, as described herein) or discrete (e.g., sheets cut or singulated from a tape) sintered article. In one or more embodiments, the microelectronics article includes a continuous or discrete sintered article having a width of about 1 mm or greater, about 1 cm or greater, about 5 cm or greater, or about 10 cm or greater. In one or more embodiments, the microelectronics article includes a sintered article having a length of about 1 m or greater, 5 m or greater, or about 10 m or greater. In one or more embodiments, the microelectronics article includes a continuous or discrete sintered article having a thickness of less than 1 mm, about 0.5 mm or less, about 300 micrometers or less, about 150 micrometers or less, or about 100 micrometers or less. In one or more embodiments of a microelectronic article includes a sintered article having a crystalline ceramic content by volume of about 10% or greater, about 25% or greater, 50% or greater, about 75% or greater, or about 90% or greater.

In one or more embodiments, the sintered article includes one or more vias (e.g., holes, apertures, wells, pipes, passages, linkages; see hole 1490 of FIG. 53) disposed along a given area of the first major surface of the sintered article. In one or more embodiments, the vias partially or wholly extend through the thickness of the sintered articles. In one or more embodiments, the vias may be disposed in a pattern that may be repeating or periodic, such as where the vias are formed along the tape in a continuous roll-to-roll process, where the tape may later be singulated to form individual components, such as for semiconductors or other electronics. In one or more embodiments, the vias may be spaced from one another such that there is a distance of about 0.5 m or less, 10 cm or less, or 5 cm or less between the vias (i.e. at least between some, most, or each via and the next closest via). In some embodiments, this via spacing may be present in sintered articles having a thickness of less than 1 mm, about 0.5 mm or less, about 300 micrometers or less, about 150 micrometers or less, or about 100 micrometers or less. In one or more specific embodiments, this via spacing may be present in sintered articles having a thickness of about 50 micrometers or less. Vias may be cut by laser, masks and etchants, punch, or other methods, such as prior to, during (e.g., when partially sintered) or after sintering. Forming vias after sintering may help precision of placement and sizing of the vias; however due to the consistency of processes and materials described herein, vias may be formed in green tape or partially sintered tape for example, and accuracy of placement, sizing, wall geometry, etc. may be within desired tolerances for some applications.

In one or more embodiments, the sintered article includes a conductive layer (e.g., copper, aluminum, or other conductive layer; see generally layer 1350 of FIG. 47) disposed on the first major surface, the second major surface, or both the first major surface and the second major surface. In one or more embodiments, the conductive layer partially or wholly covers the major surface on which it is disposed, such as overlaying at least 20% of the respective surface, at least 40%, at least 60%, at least 80%. In other words, the conductive layer may form a continuous layer on the entire area of the surface on which it is disposed or may form a discontinuous layer on the surface on which it is disposed. The conductive layer may form a pattern that may be repeating or periodic, such as for not-yet-singulated semiconductor components formed on a tape. In one or more embodiments, the sintered article may include one or more additional layers disposed on top of the conductive layer or between the conductive layer and the sintered article, and/or intermediate to the conductive layer and the tape (or other sintered article as disclosed herein). Such one or more additional layers may partially or wholly covers the surface on which it is disposed (i.e., a major surface of the sintered article or the conductive layer), such as according to the percentages described above for the conductive layer. In other words, the one or more additional layers may form a continuous layer on the entire area of the surface on which it is disposed or may form a discontinuous layer on the surface on which it is disposed. The one or more additional layers may form a pattern that may be repeating or periodic.

In some embodiments, the one or more additional layers may also be conductive layers, dielectric layers, sealing layers, adhesive layers, surface-smoothing layers, or other functional layers. In some embodiments, the conductive layer and, optionally, the one or more additional layers, may be present in sintered articles having a thickness of less than 1 mm, about 0.5 mm or less, about 300 micrometers or less, about 150 micrometers or less, about 100 micrometers or less or about 50 micrometers or less. Accordingly, the layers and the sintered article may be flexible, and/or may be rolled onto a roll or spool as disclosed herein.

In some embodiments, the sintered article may include two or more of a plurality of vias, a conductive layer and one or more additional layers.

In one or more embodiments, system 10 for producing a sintered tape article may include a fabrication system for further processing a green tape, partially sintered articles, and/or sintered articles described herein for use in a microelectronics article. In one or more embodiments, the fabrication system may be disposed downstream of the binder burn out furnace 110 but upstream of the sintering station 38 to process tape without binder, or after the sintering station 38 to process a partially sintered article or before the furnace 110 to process the green tape, which would then be sintered as otherwise described herein. In one or more embodiments, the fabrication system may be disposed downstream of the sintering station 38 but upstream of the uptake system 42 to process a sintered article. In one or more embodiments, the fabrication system may be disposed downstream of the uptake reel 44 but upstream of the reel 48, to process a sintered article. In one or more embodiments, the fabrication system may be disposed downstream from the reel 48 to process a sintered article. In such embodiments, the fabrication system would process the green tape material, partially sintered article or sintered article when it is continuous (and not discrete). Other configurations are possible to process the sintered article as a discrete article.

In one or more embodiments, the fabrication system may expose at least a portion of the green tape material, partially sintered article or sintered article to a mechanism for forming vias, such as laser energy, or a drill. The fabrication system of one or more embodiments using laser energy to create the vias may include a hug drum (see generally vacuum drum 25 of FIG. 6) having a surface with a curvature, wherein the hug drum pulls the green tape material, partially sintered article or sintered article to the match its curvature to facilitate formation of the vias on the major surface of the sintered article. In one or more embodiments, the hug drum would facilitate focus of the laser beam on the major surface of the green tape material, partially sintered article or sintered article.

In one or more embodiments, the vias may be created by mechanical means. For example, the fabrication system may include a flat plate on which a portion of the green tape material, partially sintered article or sintered article is temporarily secured. In this manner, one major surface of the green tape material, partially sintered article or sintered article is in contact with the flat plate. The conveyance of the green tape material, partially sintered article or sintered article to the fabrication system may use a step and repeat motion, acceleration or deceleration velocity, or continuous velocity to allow for a portion of the sintered article to be temporarily secured to the flat plate. In one or more embodiments, a vacuum may be used to temporarily secure a portion of the green tape material, partially sintered article or sintered article to the flat plate.

In one or more embodiments, fabrication system may form vias by mechanically separating a portion of the green tape material, partially sintered article or sintered article. In one or more embodiments, the fabrication system may include the use of photolithography, with solvents or acids to remove a portion of the green tape material, partially sintered article or sintered article. In such embodiments, when the fabrication system is applied to green tape material or partially sintered articles, the fabrication system may include a control mechanism for controlling the scale and pattern scale of the vias, due to shrinkage of the green tape material or partially sintered article when it is fully sintered. For example, the control mechanism may include a sensor at the outlet of the sintering station 38 that measures the distance between the vias and the spacing of the vias and feedback this information to the fabrication system for adjustment. For example, if the fabrication system was forming vias having a diameter of about 75 micrometers, and a distance or pitch of 500 micrometers between the vias, and it was assumed that the full sintering shrinkage from the green tape material to the sintered article was 25%, then the fabrication system would or may adjust to form the vias in the green tape material to have a pitch of 667 microns and a diameter of about 100 micrometers. After processing, the full sintering shrinkage is measured to be 23% then, the fabrication system could further adjust to the correct spacing for the vias in the green tape material would be 649 microns, to accommodate for 23% full sintering shrinkage. Vias in some embodiments have a widest cross-sectional dimension (coplanar with a surface of the sheet or tape) that is at least 250 nm, such as at least 1 µm, such as at least 10 µm, such as at least 30 µm, such as at least 50 µm, and/or no more than 1 mm, such as no more than 500 µm, such as no more than 100 µm. In some embodiments, the vias are filled with an electrically conductive material, such as copper, gold, aluminum, silver, alloys thereof, or other materials. The vias may be laser cut, laser and etchant formed, mechanically drilled, or otherwise formed. The vias may be arranged in a repeating pattern along a sheet or tape, which may later be singulated into individual electronics components.

FIG. 104 shows an example in cross-section of a stacked arrangement 810 of ceramic sheets 812 with vias 814 extending to metal layers 816. Fiducial 818 may help align the sheets 812.

The system 10 described herein provides other ways to control via spacing during the sintering process. For example, tension in the processing direction 14 during sintering can stretch the sintering article and bias the sintering shrinkage. This tension can increase the spacing of the vias in the processing direction 14, effectively reducing the sintering shrinkage in the processing direction 14. Differential sintering in the processing direction 14 as opposed to the direction perpendicular to the processing direction 14 has been observed, and can be in a range from about 2% to about 3%, when tension is applied. Accordingly, some otherwise round vias may be oval or oblong.

The size and shape of the vias can be controlled and adjusted with a combination of the sintering shrinkage along the direction parallel to the processing direction 14, sintering shrinkage across the direction perpendicular to the processing direction 14, tension in the two directions and the shape of the sintering station 38 and/or through use of air bearings to transport the green tape material, the partially sintered article or the sintered article while sintering or hot.

In one or more embodiments, ceramic material may be added at any step within the system 10 to decrease the sintering shrinkage. Ceramic material can be added by ink jet print heads, which can apply such ceramic material uniformly to a porous partially sintered article or sintered article, while such articles have open porosity. In one or more embodiments, small amounts of ceramic material can be added to the porous partially sintered article or sintered article by printing. Lasers, photolithography, ink jets, atomic layer deposition, and some printing and other processing means can be accomplished from the inner radius of a curved air bearing or with a sectioned hug drum with open areas for the exposure of the partially sintered article or sintered article to the processing equipment. Accordingly, tape or other articles as disclosed herein may be or include a portion thereof of two or more co-fired inorganic materials (e.g., ceramics or phases), such as where one of the materials infiltrates and fills pores of the other material. In contemplated embodiments, the filling/infiltrating material may be chemically the same as the porous material, but may be distinguishable in terms of crystal content (e.g., grain size, phase).

In one or embodiments, vias can be formed on sintered article having with patterns of conductor layers on one or both sides. The conductor layer(s) can be printed or patterned (screen printing, electroless deposition, etc.) after via formation and final sintering. In one or more embodiments, the conductor layer(s) but can also be printed or deposited prior to final sintering of the sintered article. In some sintering processes that sinter only discrete pieces (and not continuous ribbons) small sheets (e.g., having length and width dimensions of about 20 cm by 20 cm), the conductor layer(s) are printed after via formation, and/or but on green tape material only. For multi-layer substrates, individual green tape layers are or may be aligned and laminated, with some multi-layer substrates using as many as 30-40 green tape layers. Alumina with tungsten, molybdenum or platinum conductors may be co-sintered and form low firing ceramic packages based on cordierite (glass ceramics) using conductors based on copper. In some embodiments described herein, conductive layer(s) may be formed (i.e., by printing or deposition) prior to the final sintering step, and the technology disclosed herein may help control the dimensions of the vias and conductor patterns during the sintering steps.

Moreover, the continuous sintering processes and system 10 offers means to control the vias spacing and patterns and conductive layer(s) patterns in terms of spacing during the sintering process. Tension in the processing direction during the sintering can stretch the green tape material, partially sintered article, or sintered article and/or bias the sintering shrinkage as disclosed above. This tension can increase the vias spacing and patterns and conductive layer(s) patterns in the processing direction, effectively reducing the sintering shrinkage in the process direction. Differential sintering in the processing direction versus the direction perpendicular to the processing direction may range from about 2% to about 3%, such as where tape is stretched in the processing or lengthwise direction.

Controlled curvature sintering station 38 or curved air bearings can be used to transport the green tape material, partially sintered article, or sintered article in the processing direction 14 and may prevent the green tape material, partially sintered article, or sintered article from having excessive curvature across the width of the green tape material, partially sintered article, or sintered article. If there is a mild cross-ribbon- or sheet-curvature, the tension in the direction parallel to the processing direction may provide some tension perpendicular to the processing direction, controlling or limiting distortion.

Providing tension to the direction perpendicular to the processing direction 14 can be difficult, particularly at the temperatures where the sintered article is plastically deformable and/or is sintering and plastically deformable. Rollers (see, e.g., FIG. 88B) angled away from a direction parallel to the processing direction 14 in such regions of the system 10 (or particularly sintering station 38) can apply some tension perpendicular to the processing direction 14 (e.g., in a widthwise direction of tape). This tension may increase the spacing of the vias perpendicular to the processing direction 14, effectively reducing the sintering shrinkage perpendicular to the processing direction 14.

Fiducial marks for alignment can be made by lasers, mechanical means, chemical means such as slight composition changes with visible results. These marks help align further processing steps such as conductor printing, patterning, and/or laminating.

Another aspect of this disclosure pertains to a multi-layer sintered article having a width of about 1 mm or greater, 1 cm or greater, 5 cm or greater, 10 cm or greater, or 20 cm or greater, with a length of 1 m or greater, 3 m or greater, 5 m or greater, 10 m or greater, or 30 m or greater, where the sintered article has a thickness of less than 1 mm, less than about 0.5 mm, less than about 300 microns, less than about 150 microns, less than about 100 microns. In one or more embodiments, the sintered article has a crystalline ceramic content of more than 10% by volume, more than 25% by volume, more than 50% by volume, more than 75% by volume, or more than 90% by volume. The article has at least two layers of sintered articles and may have more than 40 such layers. The sintered article layers have at thickness of 150 microns or less, 100 microns or less, 75 microns or less, 50 microns or less, 25 microns or less, 20 microns or less, 15 microns or less, 10 microns or less, 5 microns or less, and/or such as at least 3 microns (i.e. at least 3 micrometers). In one or more embodiments, the sintered article layers need not be the same composition and some such layers include glass. In some embodiments, such glass layers may include 100% glass, such as at least 100% amorphous silicate glass.

In one or embodiments, the multi-layer sintered article includes a plurality of vias, conductive layer(s) and/or optional additional layers, as described herein with respect to microelectronics articles.

In one or more embodiments, the system 10 may include a process and an apparatus to make such multi-layer sintered articles. The multi-layer can be made by casting or web coating multiple layers of green tape material (i.e., with ceramic particles with polymer binder) over one another. The multi-layer green tape material structure may then be processed through the system 10 as described herein. In one or more embodiments, the multi-layer green tape material structure can also be formed by laminating multiple green tapes with ceramic particles at near room temperature in a continuous fashion and then by feeding the laminated tapes into the system 10. Partially sintered articles can also be laminated together with minor pressure in the sintering station 38. The pressure can be caused by having a mild curvature in the sintering station 38 that the partially sintered articles are drawn across. Each partially sintered article can have its own tensioning and payout speed control means. Each partially sintered article can have fiducial marks to assist alignment of the articles. Tension and payout speed can be used to match sintering shrinkage from article to article to align vias and conductors from article to article. If the fiducial marks are not aligned as the multi-layer article exits the furnace, the layer payout speeds and/or tensions can be adjusted to bring the layers back into alignment. Additional pressure normal to the length and width of multi-layer articles can be provided by rollers at high temperature as described above.

As electrical conductors and ceramic materials in multi-layer electronic substrates may not have the same thermal expansion coefficient, some designs may provide for an overall stress reduction (balance) for "top" side to "bottom" side of the multi-layer sintered articles. In essence such designs have a similar amount of metal or ceramic on the top and bottom of the multi-layer, such as by mirroring the layers about a central plane in the respective stack. With thin ceramic layers, a structure that is not stress/CTE balanced may experience deformation of the ceramic and/or curling of the overall stacked structure.

In one or more embodiments, a circuit board for electronics comprises a sintered article, as described herein, having electronic conductors patterned on it. The conductors for the circuit board may be directly printed onto the green tape material, the partially sintered article, or the sintered article and/or may be printed onto a coating(s) or layer(s) bonded to the green tape material, the partially sintered article, or the sintered article, such as an adhesion promoting layer, a surface smoothing layer, and/or other functional layers. The printing can be from a direct screen printing, electroless deposition and pattering, lithography, using a silicone carrier intermediate between the pattern formation and the application of the pattern on the sintered article by gavure patterning rollers, and/or by other processes.

The conductors for the circuit board can be directly printed on the partially sintered article, after an intermediate firing step but before the final sintering, and/or printed onto coatings thereon. Porosity in the partially sintered article or sintered article can improve adhesion of the conductor print or pattern. The printing can be from a direct screen printing, lithography, using a silicone carrier intermediate between the pattern formation and the application of the pattern on the ceramic by gavure patterning rollers, or other processes.

One aspect of the process and apparatus may be to use a hug drum while simultaneously patterning the long continuous porous ceramic ribbon or sheet. The hug drum pulls the ceramic ribbon or sheet to match the curvature on the surface of the drum, making printing of the conductor pattern less difficult. Photolithography can also be used with solvents or acids to etch or wash away some of the conductor pattern on the green ribbon or sheet prior to final sintering, photolithography can be accomplished on a hug drum. When the conductor is patterned prior to final sintering, a means to control the pattern, size, scale, or pitch with the sintering shrinkage is advisable. Unfortunately, sintering shrinkage of a ceramic ribbon or sheet can vary by a percent or more from one continuous green ribbon (or sheet) to another continuous green ribbon (or sheet), sometimes even within a single green ribbon or sheet. One method to insure an accurate spacing of the conductor pattern is to have a sensor at the outlet of the final sintering step and measure the distance of the conductor pattern spacing. This information can be feed to the printing pattern means (e.g., laser, drill, punch, etch system), photolithography exposure means (e.g., radiation or light source, mask), to adjust the conductor pattern in the pre-final sintered ribbon or sheet to match the current sintering shrinkage. (The length of the ribbon or sheet between the measuring means and the "patterning" means may not be perfectly precise, however may be more accurate than either batch sintering with a periodic kiln or use of a tunnel kiln, such as where a great deal of final product may be lost due to inaccuracy.)

Continuous sintering (e.g., roll to roll sintering, continuous fired ceramic) offers another means to control the via spacing during the sintering process. Tension in the web transport direction (i.e. lengthwise direction for a tape) provided during the sintering can stretch the sintering article (e.g., ribbon or sheet) and/or bias the sintering shrinkage. This tension can increase spacing of the conductor pattern in the ribbon or sheet transport direction, effectively reducing the sintering shrinkage in the ribbon transport direction. Differential sintering in the ribbon transport direction versus the direction perpendicular to the ribbon transport direction has been observed, up to 2 to 3% when tension is applied.

Photolithography, ink jets, atomic layer deposition, some printing and other processing means can be accomplished from the inner radius of a curved air bearing or with a sectioned hug drum with open areas for the exposure of the ceramic ribbon or tape to the conductor patterning processing equipment.

Alumina with tungsten, molybdenum or platinum conductors may be co-sintered with other inorganic materials disclosed herein and form low firing ceramic packages based on cordierite (glass ceramics) using conductors based on copper.

Controlled curvature kiln furniture or curved air bearings, that the ceramic ribbon or web with a conductor pattern is pulled through or over, can keep the ceramic ribbon or sheet with a conductor pattern from having excessive curvature across the short length of the ribbon perpendicular to the ribbon transport direction in some such embodiments.

Providing tension to the direction perpendicular to the ribbon transport direction, (cross web direction), can be difficult, particularly at the temperatures where the ceramic ribbon with conductor pattern is plastically deformable or is sintering and plastically deformable. Rollers angled away from parallel to the ribbon transport direction in the hot zones of the furnace can apply some tension perpendicular to the ribbon transport direction. This tension can increase the spacing of the vias perpendicular to the ribbon transport direction, effectively reducing the sintering shrinkage perpendicular to the ribbon transport direction. The size and pitch of the conductor patterns can be controlled and adjusted with a combination of the sintering shrinkage along the direction parallel to the ribbon transport direction (long length of the ceramic ribbon), sintering shrinkage across the direction perpendicular to the ribbon transport direction, tension in the two directions and the shape of the kiln furnace and/or air bearing that the ceramic ribbon or sheet is on while sintering or hot.

Fiducial marks for alignment can be made by lasers, mechanical means, chemical means such as slight composition changes with visible results. These marks help align further processing steps such as conductor printing/patterning and laminating.

Multi-layer structures with ceramic and conductor may be bonded at high temperature from final sintered conductor plus ceramic sheets or ribbons with fewer layers, even from sheets with only a single ceramic plus conductor layer.

Thin circuit boards with ceramic insulator layers benefit from having a stress balance from top to bottom. This may be accomplished by having a patch or pattern of material printed on the side opposite to the desired conductor pattern that can alleviate the coefficient of thermal expansion CTE or thermal expansion related stress between the conductor and ceramic (and sometimes a sintering differential stress between the conductor and the ceramic). This may take the form of a second conductor layer with a similar thickness and mass of material on the bottom of the board, which balances the CTE stress (and sintering differential stress) from top to bottom leaving the circuit board almost flat, rather than curled.

As the multi-layer structure and/or the circuit board becomes thicker, it becomes stiffer after full sintering. Particularly with 1 mm, 0.5 mm, and 250 micron thickness ceramic and conductor structures, rolling the article on small rolls of 30 to 7.5 cm in diameter can be problematic. Means for cutting the continuously sintered articles by laser, diamond saw, abrasive jet, water jet and other techniques can be adapted to the continuous sintering apparatus, such as where individual or groups of structures may be cut into sheets. The cutting apparatus may be added to the exit of the final sintering furnace, and the cutting means would travel or interface with the long article, such as while it is exiting the furnace.

Figure 56:
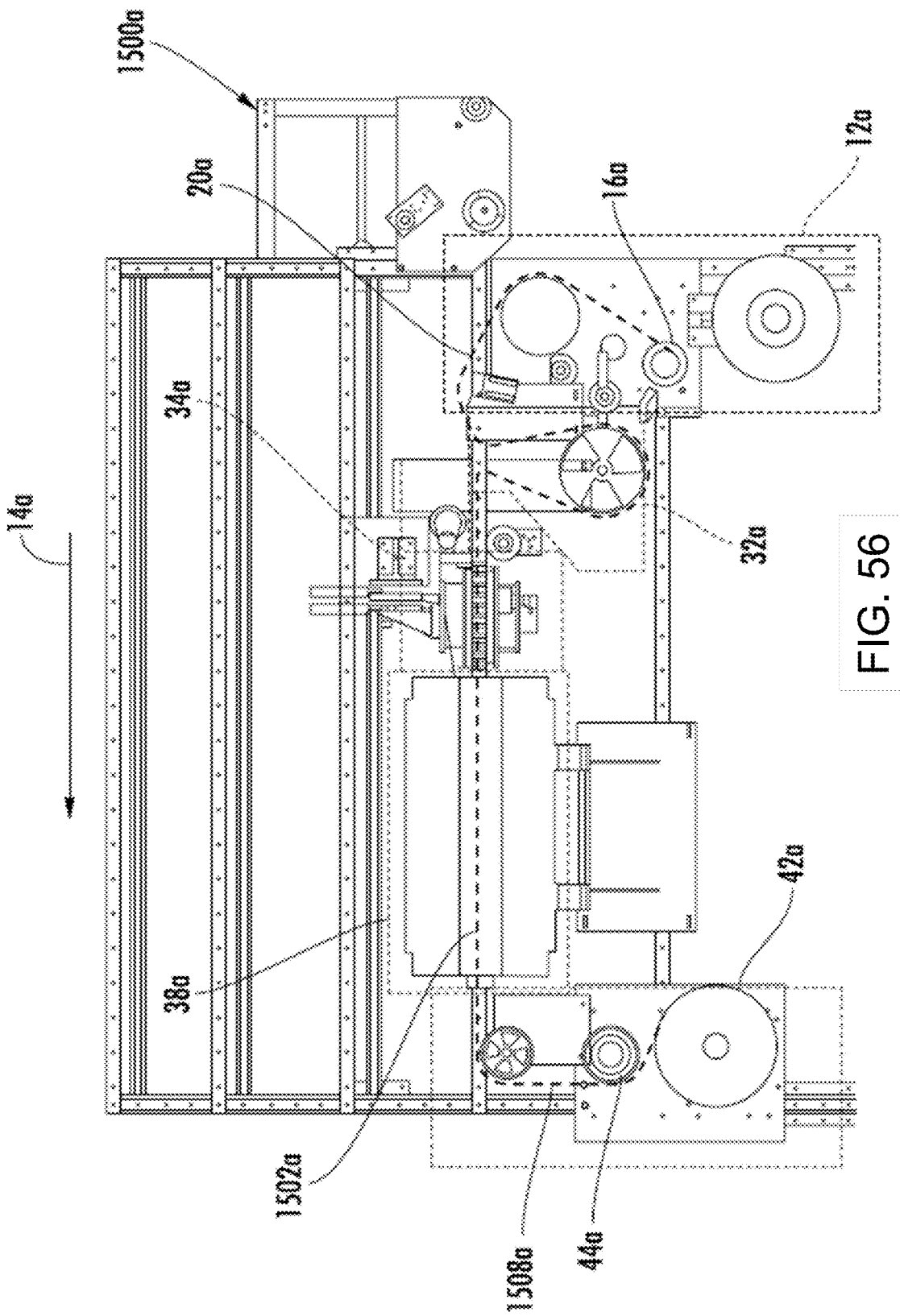
FIG. 56 shows a roll to roll system and related process for producing a sintered article including a length of threading material, according to an exemplary embodiment.
Figure 57:
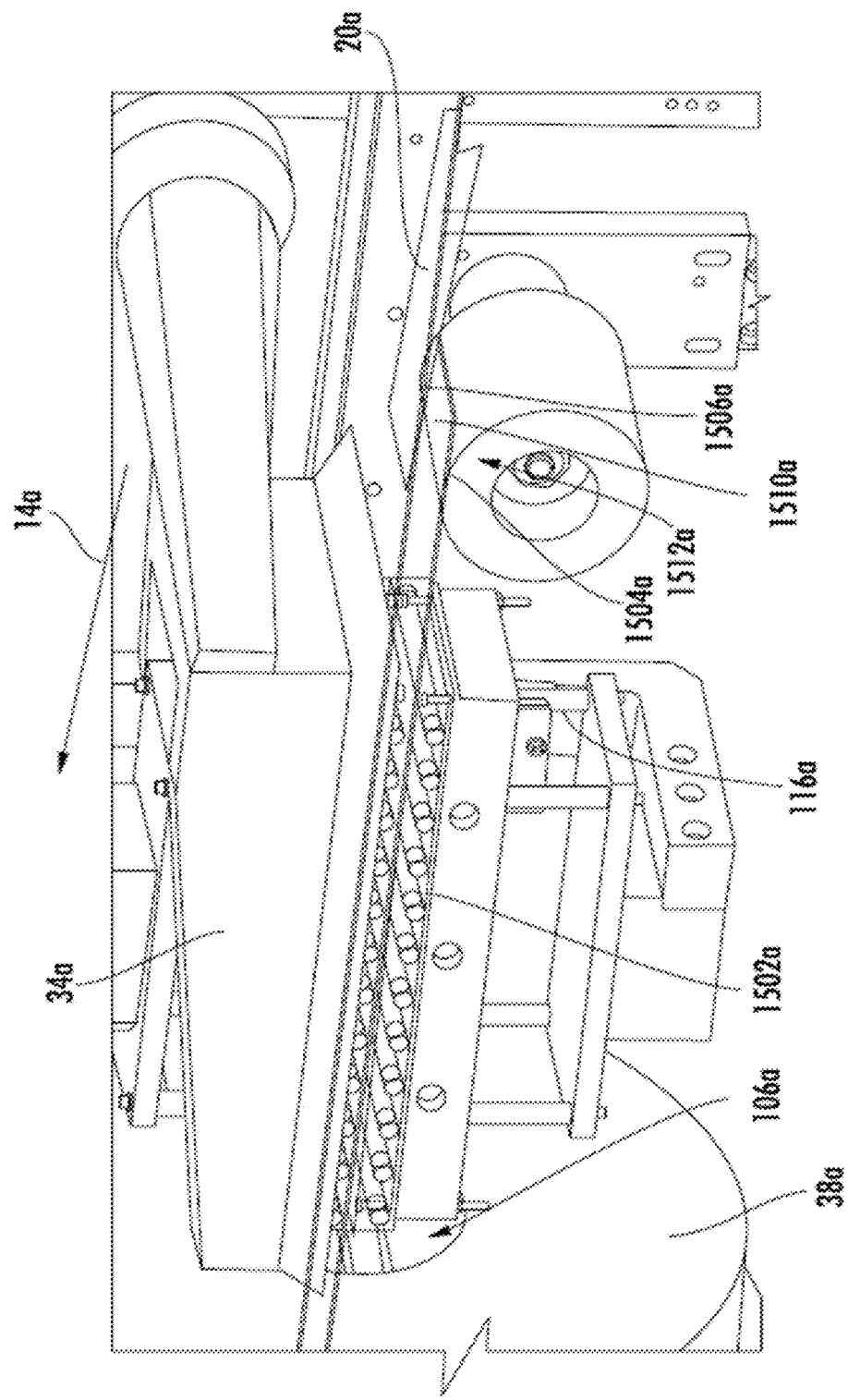
FIG. 57 is a detailed view showing bonding between a length of threading material and tape material in the system of FIG. 56, according to an exemplary embodiment.

Referring to FIGS. 56 and 57, a process for initiation of sintering and threading of green tape 20A through binder removal station 34A and through sintering station 38A of a system 1500A for producing a sintered tape article is shown according to an exemplary embodiment. In general, system 1500A is substantially the same as and functions the same as system 10 discussed above, except for slightly different, alternative reel arrangements/positioning in separation system 12A, tension control system 32A and uptake system 42A.

To initiate the reel to reel transfer of tape material from source reel 16A to uptake reel 44A, green tape 20A needs to be threaded through the channels of binder removal station 34A and through sintering station 38A in order for the green tape 20A to be connected to uptake reel 44A which applies the tension to pull green tape through binder removal station 34A and through sintering station 38A. Similarly, if during operation of binder removal station 34A and sintering station 38A the tape material breaks (which may occur following binder removal), the tape material needs to be threaded through binder removal station 34A and then through sintering station 38A while these stations are at full operating temperature. Applicant has determined that threading, particularly when binder removal station 34A and sintering station 38A are at temperature, can be particularly challenging due to the difficulty in threading unbound tape 36 (shown in FIG. 3) (i.e., the self-supporting tape material following removal of the organic binder) through sintering station 38A following binder removal. Thus, it should be understood that while the discussion of the threading process and system discussed herein relates primarily to threading green tape 20A, the threading process can be used to thread a variety of tape materials, including unbound tape 36 (shown in FIG. 3) and/or partially sintered tape material, through a sintering system such as system 10 or system 1500A.

As will be discussed in more detail below, Applicant has developed a process utilizing a threading material or leader to pull green tape 20A through binder removal station 34A and sintering station 38A in order to initiate the reel to reel processing discussed above. In such embodiments, the threading material is passed through sintering station 38A and binder removal station 34A, and the leader is coupled to the green tape 20A on the upstream or entrance side of binder removal station 34A.

Tension is then applied from the uptake reel 44A through the leader to green tape 20A to begin the process of moving green tape 20A through binder removal station 34A and through sintering station 38A. While a variety of approaches to threading green tape through binder removal station 34A and through sintering station 38A may allow for sintering of green tape to be achieved (e.g., manual threading), Applicant has determined that the leader based threading process discussed herein provides high quality/low warp in the sintered tape material even at the leading edge of the sintered material. This improved product quality decreases product waste, improves process efficiency by eliminating the need for handling/removal of warped sections on the green tape and improves integrity of the wind of sintered material on uptake reel 44A due to the shape consistency along the length of the sintered tape material. In addition, in the context of hot threading (e.g., threading when binder removal station 34A and sintering station 38A are at temperature), Applicant has found that use of the leader based process discussed herein provides an efficient way to support and pull the leading edge of the delicate, unbound portion of tape material (e.g., unbound tape 36 shown in FIG. 3 and discussed above) following exit from the binder removal station 34A until sintering has occurred during traversal of the sintering station 38A.

In the embodiment shown in FIGS. 56 and 57, threading material, shown as leader 1502A, is threaded from uptake reel 44A, in the reverse direction through the channels of both sintering station 38A and of binder removal station 34A such that a first section, shown as end section 1504A, of the leader 1502A is positioned outside of entrance opening 116A of binder removal station 34A. In this arrangement, as shown in FIG. 56, leader 1502A is a single contiguous piece of material positioned such that leader 1502A extends the entire distance from uptake reel 44A and all of the way through sintering station 38A and binder removal station 34A.

Green tape 20A is moved from source reel 16A (e.g., via unwinding of green tape 20A from the reel as discussed above) toward entrance opening 116A of binder removal station 34A such that a leading section 1506A of green tape 20A is located adjacent to and overlapping end section 1504A of leader 1502A. As shown in FIG. 57, after positioning leading section 1506A of green tape 20A and end section 1504A of leader 1502A adjacent each other, leading section 1506A of green tape 20A and end section 1504A are coupled or bonded together upstream of binder removal station (e.g., between entrance opening 116A of binder removal station and source reel 16A in the processing direction 14A). This forms a join or bond between leader 1502A and green tape 20A at the overlapped section.

Once leader 1502A is coupled to green tape 20A, a force is applied to a portion of leader 1502A located outside of (e.g., downstream from) binder removal station 34A and sintering station 38A such that leader 1502A and green tape 20A are pulled in the processing direction 14A through binder removal station 34A and sintering furnace 38A. In the specific embodiment shown in FIG. 56, a second or downstream end 1508A of leader 1502A is coupled to uptake reel 44A, and the force generated by rotation of uptake reel 44A provides the force for moving/pulling leader 1502A and green tape 20A through binder removal station 34A and sintering furnace 38A. In some embodiments, Applicant has found that processing speeds of about 3 inches/minute (e.g., the speed that the tape material is moved through system 1500A) are used during the thread up process, and in specific embodiments, this speed may be increased to about 6 inches/minute for sintering processing once the join between leader 1502A and green tape 20A has traversed binder removal station 34A and sintering furnace 38A.

Thus, through the use of leader 1502A, the downstream or rewind side of system 1500A is initially coupled to the upstream or unwind side of system 1500A, allowing for the initiation of reel to reel sintering of the material of green tape 20A. In addition, by providing this initial threading of binder removal station 34A and sintering station 38A via connection between the same unwind and uptake systems that advance green tape 20A during sintering processing, the leader-based threading process discussed herein is able to establish the proper tension and velocity for the entire length of green tape 20A that traverses binder removal station 34A and sintering station 38A, including the leading section 1506A of green tape 20A at the overlapped location. Further, by providing a horizontal pulling force through leader 1502A, the leader based process discussed herein allows for threading through the horizontally orientated channels of binder removal station 34A and sintering station 38A, which can otherwise be difficult (particularly given the delicate nature of the tape material following binder removal).

As discussed above in detail regarding system 10, binder removal station 34A is heated to remove or burn off binder from green tape 20A, and sintering station 38A is heated to cause sintering of the inorganic material of green tape 20A. In one potential use of the threading process discussed herein, binder removal station 34A and/or sintering station 38A are already at their respective operating temperatures when leader 1502A is threaded. This is the case when leader 1502A is used to thread green tape 20A following a break in the material during reel to reel sintering. In another potential use of the threading process discussed herein, binder removal station 34A and/or sintering station 38A are at a low temperature (e.g., below their respective operating temperatures, off at room temperature, etc.) when leader 1502A is threaded through. This is the case when leader 1502A is used to thread green tape 20A during initial start-up of system 1500A.

As discussed in more detail above, following the initial movement of the join or overlap between leader 1502A and the leading section 1506A of green tape 20A through binder removal station 34A and sintering furnace 38A, green tape 20A is continuously unwound from source 16A and moved through stations 34A and 38A, forming the length of sintered material as discussed above. Following sintering the sintered material is wound onto uptake reel 44A. In one embodiment, leader 1502A is decoupled from the sintered tape material once leading section 1506A of green tape 20A exits from sintering station 38A, and prior to winding of the sintered tape material onto uptake reel 44A. In another embodiment, leader 1502A is wound onto uptake reel 44A along with the sintered tape material forming the innermost layers of the reel including the sintered material.

In various embodiments, leader 1502A is an elongate and flexible piece of material that is able to resist the high temperatures of binder removal station 34A and sintering station 38A. In the coupling process shown in FIG. 57, leading section 1506A of green tape 20A overlaps end section 1504A of leader 1502A forming overlap section 1512A. In this arrangement, a lower surface of green tape 20A faces and contacts an upper surface of leader 1502A. In this arrangement, by positioning green tape 20A on top of leader 1502A, leader 1502A acts to support leading section 1506A of green tape 20A through binder removal station 34A and sintering furnace 38A.

In some embodiments, an adhesive material 1510A is used to form a bond joining leader 1502A to green tape 20A. As shown in FIG. 57, in some such embodiments, adhesive material 1510A is located on the upper surface of leader 1502A and forms a bond to the lower surface of green tape 20A. As discussed in more detail below, in various embodiments, Applicant has identified that the matching of various characteristics, (e.g., coefficient of thermal expansion (CTE) of the materials forming adhesive 1510A, leader 1502A and green tape 20A), facilitates maintenance of the bond between leader 1502A and the tape material, particularly during traversal of the high temperatures of sintering station 38A. Further, a strong bond between leader 1502A and green tape 20A allows for the desired level of tension to be applied to leader 1502A and transmitted through the bond provided by adhesive 1510A, to green tape 20A. As discussed herein, Applicant has found that a low (e.g., gram level), but consistent tension applied to the tape material during sintering reduces warp that may otherwise be formed across the width of the tape during sintering.

In various embodiments, Applicant has determined that the volume of adhesive material 1510A used as well as the shape of the applied adhesive material 1510A on leader 1502A influences the properties of the bond formed between leader 1502A and green tape 20A. In specific embodiments, adhesive material 1510A is a small volume (e.g., about 0.1 mL of an alumina-based adhesive material). In one embodiment, adhesive 1510A is used to bond a leader 1502A to an unsintered green tape material 20A, and in such embodiments, Applicant has found that a round dot of adhesive 1510A works well. Applicant hypothesizes that the round geometry helps to distribute the thermal and mechanical stresses induced by cement and tape shrinkage and CTE mismatch (if any) between the materials of leader 1502A, adhesive 1510A and green tape 20A. In another embodiment, adhesive 1510A is being used to bond a leader 1502A to a tape of partially sintered material, and in such embodiments, Applicant believes that a line of adhesive 1510A extending across the width of leader 1502A works well. Applicant hypothesizes that the line geometry acts to apply an even constraint across the web as it moves through the sintering station.

In specific embodiments, binder removal station 34A is operated to remove liquid and/or organic components from adhesive 1510A (as well as from green tape 20A) as the overlapped section 1512A between leader 1502A and green tape 20A traverses binder removal station 34A. Applicant believes that various properties of the adhesive material 1510A and of green tape 20A relate to the likelihood that the bond formed by adhesive material 1510A will break during traversal of binder removal station 34A and sintering station 38A. Applicant hypothesizes that the temperature profile through binder removal station 34A can cause the organic material in green tape 20A to soften and even melt prior to evolving from the tape, which can help to limit the stress intensity around the cement join as the individual components begin to change shape/size due to shrinkage and thermal expansion. Applicant hypothesizes that allowing green tape to 'deform' or re-form around the location of adhesive 1510A, prior to losing its elastic/plastic properties helps to decrease defects and improves the quality of the bond formed by adhesive 1510A. Similarly this elastic/plastic property may also allow for venting of liquids and organic materials from adhesive 1510A, which may otherwise cause an increase in pressure between leader 1502A and green tape 20A. This increase in pressure may cause the bond to fail or the gas build up may rupture through green tape 20A.

In specific embodiments, the tension applied during the process of pulling the overlapped section or join between leader 1502A and green tape 20A may be changed or increased as overlap section 1512A traverses binder removal station 34A and/or sintering station 38A. In a specific embodiment, a low level of tension, e.g., of below 25 grams, is provided initially, during traversal of overlap section 1512A across binder removal station 34A, and then tension is increased as the overlap section 1512A traverses sintering station 38A. In a specific embodiment, tension on the order of 25 grams or more is applied once overlap section 1512A and adhesive material 1510A reaches the center of sintering station 38A. Applicant believes that tension at this point can be increased without separation of the bond between leader 1502A and green tape 20A because of the sintering of material of green tape 20A that has occurred at this point. Applicant believes that applying a high level of tension too early, before the strength has had a chance to develop will generally lead to failure of the bond formed by adhesive 1510A.

In various embodiments, coupling and/or support between leader 1502A and green tape 20A is enhanced by various levels of overlap between leader 1502A and green tape 20A. As can be seen in FIG. 57, the greater the overlap between leader 1502A and green tape 20A, the greater the amount of support provided by leader 1502A to green tape 20A. Similarly, the level of overlap between leader 1502A and green tape 20A relates to the amount of friction-based coupling between leader 1502A and green tape 20A, which may supplement the bonding provided by adhesive 1510A. In embodiments utilizing adhesive 1510A, Applicant has found that an overlap section 1512A having a length measure in the processing direction 14A of between one to five inches has performed well. In some embodiments, coupling between leader 1502A and green tape 20A may be provided by friction only (e.g., without adhesive 1510A) and in such cases the length of the overlap section 1512A in the processing direction 14A may be greater than five inches, such as greater than 10 inches, between 10 inches and 30 inches, about 24 inches, etc.

In various embodiments, Applicant has identified a number of material combinations for leader 1502A, green tape 20A, and adhesive 1510A that provide the threading properties/functionality discussed herein. In general, leader 1502A is formed from a material that is different in at least one aspect from green tape 20A. In some such embodiments, leader 1502A is formed from the same material type as the inorganic grains of green tape 20A but has a different (e.g., higher) degree of sintering than the inorganic material of green tape 20A. In some such embodiments, leader 1502A is an elongate tape of sintered ceramic material, and green tape 20A supports unsintered or less sintered grains of the same type of ceramic material.

In some other embodiments, leader 1502A is formed from an inorganic material that is different from the material type of the inorganic grains of green tape 20A. In a specific embodiment, leader 1502A is formed from a ceramic material type that is different than the ceramic material type of the inorganic grains of green tape 20A. In some other embodiments, leader 1502A is formed a metal material, while the inorganic grains of green tape 20A are a ceramic inorganic material.

Applicant has found that the coupling arrangements shown in FIG. 57 and described herein provides a level of coupling between leader 1502A and green tape 20A that allows for good transmission of force/tension from leader 1502A to green tape 20A without significant risk of decoupling. Further, Applicant has found that the risk of decoupling and warp caused during sintering can be decreased by selecting materials for leader 1502A, adhesive 1510A and the inorganic grain material of green tape 20A that have relatively similar coefficients of thermal expansion (CTEs) as each other. In various embodiments, the CTE of the material of leader 1502A is within plus or minus 50 percent of the CTE of the inorganic material of green tape 20A, specifically within plus or minus 40 percent of the CTE of the inorganic material of green tape 20A, and more specifically within plus or minus 35 percent of the CTE of the inorganic material of green tape 20A. Similarly, in various embodiments, the CTE of the material of leader 1502A is within plus or minus 50 percent of the CTE of adhesive material 1510A, specifically within plus or minus 40 percent of the CTE of adhesive material 1510A, and more specifically within plus or minus 35 percent of the CTE of adhesive material 1510A.

Leader 1502A can be formed from a variety of suitable materials. In some embodiments, leader 1502A is formed from a sintered ceramic material, and in other embodiments, leader 1502A is formed from a metal material. In some embodiments, Applicant has found that using a porous ceramic material for leader 1502A increases the ability of adhesive material 1510A to bond to leader 1502A. Applicant believes that the porosity of leader 1502A allows adhesive material 1510A to bond more easily than if the leader had a less porous or polished surface. In specific embodiments, leader 1502A may be a platinum ribbon or a fully sintered ceramic material, such as alumina or yttria stabilized zirconia (YSZ)

In specific embodiments, leader 1502A is sized to allow handling and coupling to green tape 20A. In specific embodiments, leader 1502A has a width that substantially matches (e.g., within plus or minus 10%) of the width of green tape 20A. In specific embodiments, leader 1502A has a thickness of between 5 µm and 500 µm and more specifically a thickness within the range of 20 to 40 µm. Further, leader 1502A has a length sufficient to extend from uptake reel 44A through both sintering station 38A and binder removal station 34A and thus the length of leader 1502A varies with the size of system 1500A.

While FIGS. 56 and 57 generally show leader 1502A as a long, thin, flat section of sintered ceramic material, leader 1502A may take other forms. For example, in one embodiment, leader 1502A may be a ceramic board with a long length of platinum wire which is cemented to the green tape. In another embodiment, leader 1502A may be a length of ceramic fiber rope or ceramic fiber twine.

Adhesive material 1510A can be formed from a variety of suitable materials. In some embodiments, adhesive material 1510A is a ceramic adhesive material. In specific embodiments, adhesive material 1510A is an alumina-based adhesive material, such as alumina-based adhesive # C4002 available from Zircar Ceramics.

Referring to FIGS. 58-65, various systems and processes for bending unbound tape 36B in the longitudinal or lengthwise direction during sintering are shown and described. In general, Applicant has determined that one of the unexpected challenges when sintering wide, thin and continuous lengths of unbound tape 36B is ensuring that the final sintered tape 40B has high levels of cross-width flatness. A high level of cross-width flatness is desirable when using the sintered tape material discussed herein in a number of applications, such as substrates for thin-film circuitry, thick film circuitry, solid-state lithium ion batteries and the like.

Some continuous tape sintering processes may be susceptible to certain flatness distortions (e.g., cross-width bowing, edge wrinkle, bubble formation, etc.) believed to be formed due to creation in-plane stresses within the tape material during sintering. For example, Applicant has found that due to a variety of factors, such as variations in ceramic particle density in unbound tape 36B, large temperature differentials within the tape material along the length of the systems (e.g., which may be in excess of 1000 degrees C. due to the continuous nature of the systems and processes discussed herein), processing speeds, etc., contribute to the generation of the in-plane stresses during sintering, which in turn may induce buckling in the absence of a countervailing application of force in a manner that allows for release of these in-plane stresses.

For example, an alumina tape undergoing continuous sintering via the systems discussed herein may have regions simultaneously at room temperature and at the maximum sintering temperature. There may also be regions of the tape beginning the sintering process where shrinkage is minimal and areas of the tape where sintering is nearly complete, where the shrinkage exceeds 8% or even 10% on a linear basis. The gradient in shrinkage and temperature may be sources of complex, biaxial stresses that may induce distortions, such as by curling and wrinkling, even in a tape that enters the sintering station having a level of flatness. Such distortions may then become frozen into the sintered tape following cooling, thereby degrading its potential uses.

As will be discussed in detail below, Applicant has determined that stresses that may cause flatness distortions can be at least in part counteracted by inducing a lengthwise or longitudinal curve in the tape during sintering. During sintering, the tape material plastically relaxes and deforms to the shape of the induced lengthwise bend, which generates forces within the tape material that tends to reduce in-plane stresses that may otherwise occur, and a result may be to produce a sintered tape with a high level of cross-width flatness. Applicant believes that by utilizing lengthwise bending during sintering, a flatter sintered tape can be produced despite variations in green tape particle density and high production speed.

Further, in at least some embodiments, the flattening process discussed herein produces flat, thin sintered articles while avoiding/limiting surface contact and the resulting surface defects and scratches common with contact/pressure-based flattening devices, such as may be experienced when pressing a material between cover plates during sintering. As will be shown below, Applicant has developed a number of systems and processes for inducing the longitudinal bend that leave at least one major surface of the tape untouched during sintering, and some processes that leave both upper and lower (major) surfaces of the tape untouched during sintering. Applicant believes that other ceramic sintering processes may not achieve the high levels of cross-width flatness, in a continuous sintering process or with the limited degree of surface contact provided by the system and processes discussed herein.

Figure 58:
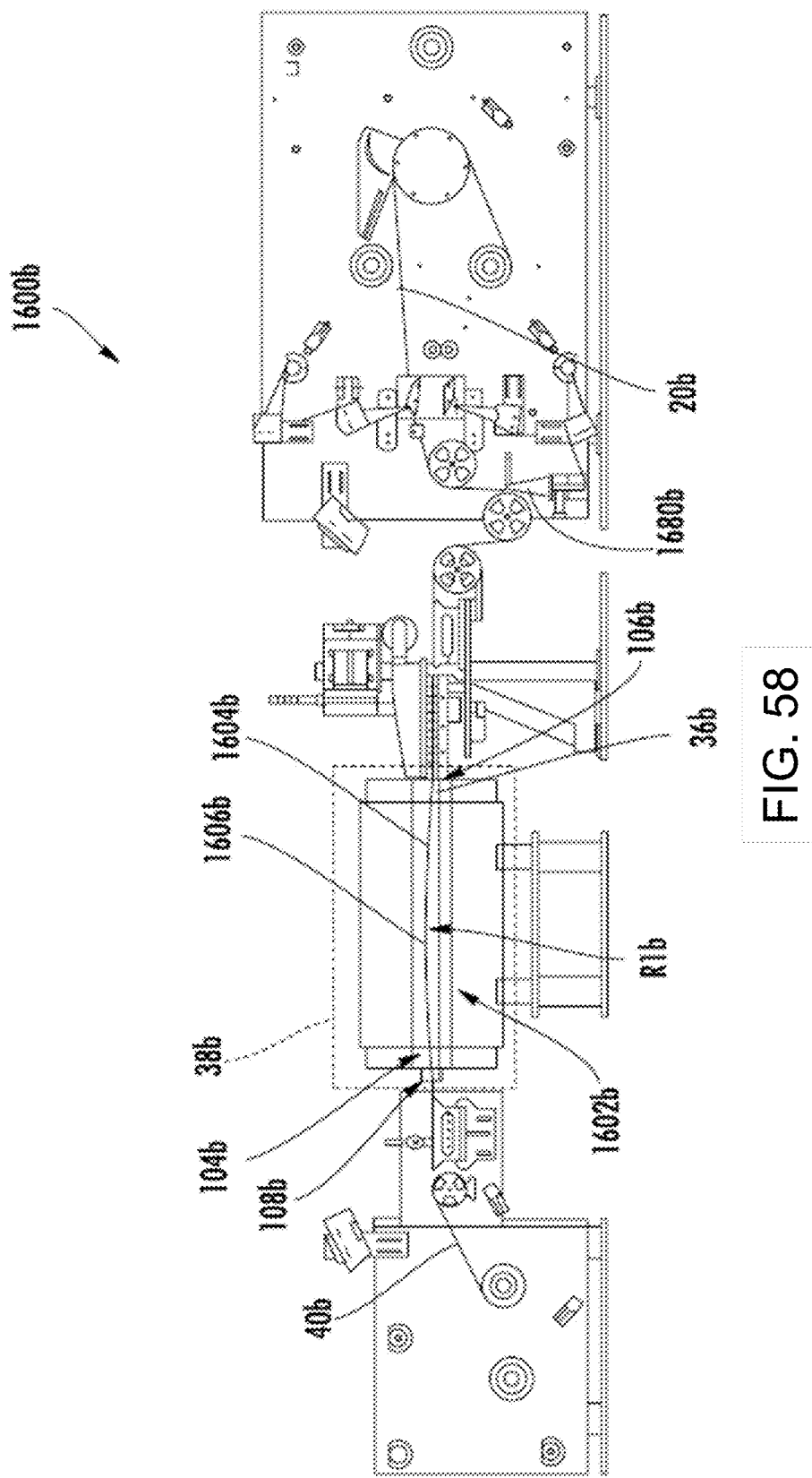
FIG. 58 shows a roll to roll system including a sintering station configured to form a curve along a longitudinal direction of a continuous length of tape material, according to an exemplary embodiment.

Referring to FIG. 58, a process and system for producing a high flatness, sintered continuous tape is shown. Specifically, FIG. 58 shows a system 1600B for producing a sintered tape article, according to an exemplary embodiment. In general, system 1600B is generally the same as and functions the same as system 10 discussed above, except that system 1600B includes a sintering station 38B that includes a bending system 1602B located within sintering station 38B. In general, bending system 1602B is configured or arranged to induce a radius of curvature along a lengthwise or longitudinal axis of unbound tape 36B while tape 36B is being sintered at high temperatures (e.g., above 500 degrees C.) within sintering station 38B. Applicant has determined that the inducement of a longitudinal curve in the tape material via bending during sintering may improve cross-width shape of the final sintered tape 40B via the mechanisms discussed herein.

In the specific embodiment shown in FIG. 58, bending system 1602B includes an upward facing convex curved surface 1604B that defines at least a portion of the lower channel surface through sintering station 38B. Upward facing convex curved surface 1604B defines at least one radius of curvature, shown as R1B, and in specific embodiments, R1B is or includes a radius of curvature within the range of 0.01 m to 13,000 m. In general, as unbound tape 36B is moved through sintering station 38B, as discussed above, gravity and/or the pulling tension in the tape causes tape to bend into at least partial conformity with curved surface 1604B, inducing a longitudinal bend into the tape during sintering at elevated temperatures. In specific embodiments, the tension applied to unbound tape 36B is at least 0.1 gram-force per linear inch of width of unbound tape 36B, and unbound tape 36B is moved at a speed of between 1 inch and 100 inches of tape length per minute through sintering station 38B.

As shown in FIG. 58, curved surface 1604B is curved around an axis that is parallel to the width axis of unbound tape 36B (and is perpendicular to the plane of the view of FIG. 58). Thus, in such embodiments, unbound tape 36B follows a path through sintering station 38B generally defined by the channel 104B, and convex curved surface 1604B defines a curved section of the path through sintering station 38B. The bending is induced in unbound tape 36B during sintering as it traverses the curved section of the path defined by convex curved surface 1604B by being shaped into conformity with curved surface 1604B.

In the specific embodiment shown in FIG. 58, curved surface 1604B forms a continuous curved surface, having a single radius of curvature, that extends the entire length of channel 104B, between the entrance and exit, of sintering station 38B. In such embodiments, the radius of curvature of surface 1604B needed to achieve both a sufficient level of bending and to fully extend the length of sintering station 38B may vary based on the length of sintering station. As such, for a given maximum rise, H1B, (shown in FIG. 60) of curved surface 1604B, a short sintering station 38B may have a smaller R1B than a longer sintering station 38B. As a specific example, a sintering station 38B that is (at least) 1 m long, may have a curved surface 1604B having an R1B between 1 m and 130 m. As a specific example, a sintering station 38B that is (at least) 3 m long, may have a curved surface 1604B having an R1B between 10 m and 1130 m. As a specific example, a sintering station 38B that is (at least) 6 m long, may have a curved surface 1604B having an R1 between 40 m and 4500 m. As a specific example, a sintering station 38B that is (at least) 10 m long, may have a curved surface 1604B having an R1B between 120 m and 13,000 m. In such embodiments, regardless of length, H1B may between 1 mm and 10 cm resulting in the R1B ranges shown above.

As discussed above regarding system 10, sintering station 38B is arranged such that a plane intersecting the entrance and the exit of the sintering station forms an angle relative to a horizontal plane that is less than 10 degrees. As discussed above, this generally horizontal sintering arrangement allows unbound tape 36B to move through sintering station 38B in a generally horizontal position. In such embodiments, curved surface 1604B defines the lower surface of the path that tape 36B traverses between the entrance and exit of sintering station 38B. Applicant believes that by combining the horizontal sintering arrangement (discussed as reducing air flow-based thermal gradients above) with the formation of the longitudinal curved shape in the tape during sintering, sintered tape with the high levels of flatness discussed herein can be produced and/or may be produced at rapid speeds, far faster than other sintering systems. It should be understood that while Applicant believes that the bending during sintering in combination with the horizontal sintering station 38B provides high levels of flatness, in other embodiments, sintering station 38B may be arranged at any angle from horizontal to vertical. In such non-horizontal embodiments, the dimensions and positioning of curved surface 1604B may be sufficient to achieve the desired level of flatness.

As shown in FIG. 58, in the processing arrangement of system 1600B, a contiguous length of tape material, such as unbound tape 36B, is moved into a heating station, such as sintering station 38B. In this arrangement, a portion of the contiguous tape, shown as unbound tape 36B, is located upstream from the entrance 106B into sintering station 38B. Following sintering, a sintered portion of the contiguous tape, such as sintered tape 40B, is located downstream from an exit 108B of sintering station 38B. As will be generally understood, at any one given point of time, the contiguous tape includes a third portion of tape that is currently being sintered within sintering station 38B. This third portion of the contiguous tape is located between unbound, unsintered tape 36B that is upstream from sintering station 38B and the sintered portion 40B of the contiguous tape that is downstream from sintering station 38B. The portion of the contiguous tape currently being sintered, shown as tape portion 1606B, is located within sintering station 38B as it is being heated to the desired sintering temperature (e.g., a temperature greater than 500 degrees C.).

In general, tape portion 1606B has a porosity that decreases or degree of sintering that increases in the processing direction (e.g., from right to left in the orientation of FIG. 58). As shown in FIG. 58, tape portion 1606B is bent into conformity with upward facing, convex curved surface 1604B such that tape portion 1606B generally adopts a curved shape having a radius of curvature matching R1B. As noted above, a longitudinally directed tension may be applied to the contiguous tape such that tape portion 1606B is bent into conformity with upward facing, convex curved surface 1604B.

As will generally be understood from the description of the unwind and take-up portions of system 10 discussed above, system 1600B provides for continuous, reel-to-reel processing of a long contiguous length of tape. In this manner, the entire contiguous length of tape being processed may be moved continuously and sequentially through sintering station 38B such that the entire contiguous length of the tape being processed experiences bending to the radius of curvature, R1B, of upward facing, convex curved surface 1604B during traversal of sintering station 38B.

Figure 59:
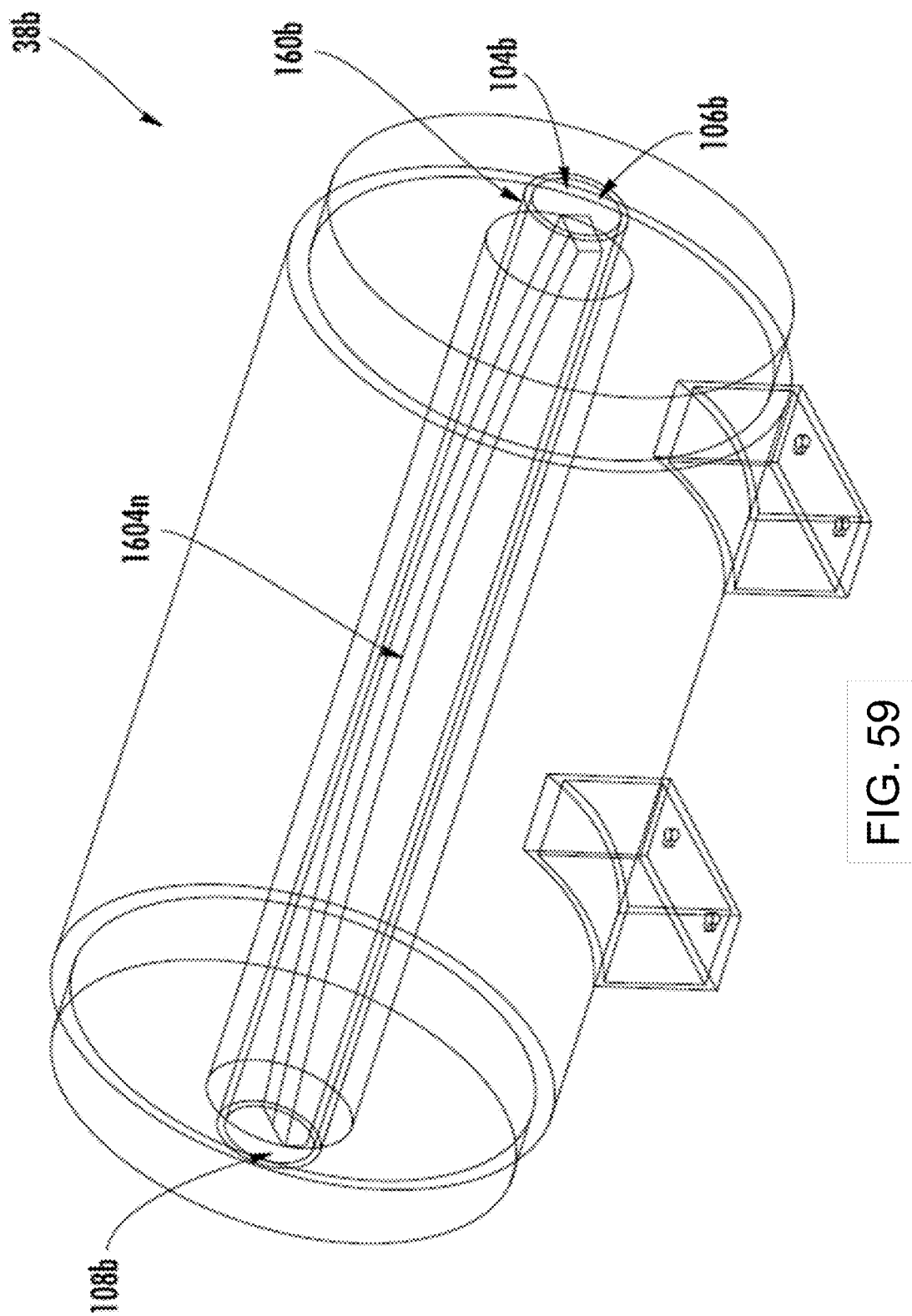
FIG. 59 is a detailed view of a sintering station including an insert defining a curved lower surface of a sintering channel, according to an exemplary embodiment.

Referring to FIG. 59, details of sintering station 38B including a bending system 1602B are shown according to an exemplary embodiment. In the embodiment shown in FIG. 59, sintering station channel 104B is defined, in part, by a tube 1608B (such as an alumina tube as discussed above). In this embodiment, upward facing, convex curved surface 1604B is defined by the upward facing surface of a furniture or insert 1610B that is placed within tube 1608B. As shown in FIG. 59, the length of furniture 1610B is at least 80%, specifically at least 90% and more specifically at least 95% of the length of channel 104B. In some embodiments, the length of furniture 1610B is greater than the length of channel 104B such that incoming and exiting sections of the tape are supported on the upward facing, convex curved surface 1604B as it enters and exits sintering station 38B.

As will generally be understood, in various embodiments, the radius of curvature that defines continuous convex curved surface 1604B is a function of maximum rise, H1B, and the longitudinal length, L2B, of surface 1604 (e.g., the distance in the horizontal orientation of FIG. 60). In specific embodiments, where convex curved surface 1604B extends the entire length of sintering station 38B, the longitudinal length of surface 1604B is substantially the same as the longitudinal length of sintering station 38B. Thus, in such embodiments, the radius of curvature of convex curved surface 1604B, R1B, is defined as R1B=H1B+(L2B$^2$)/H1B, and in various embodiments, 0.1 mm<H1B<100 mm, and 0.1 m<L2B<100 m. In other contemplated embodiments, only portion of furniture 1610B forms a circular arc, and the surface may have another geometry having a radius of curvature (among a more complex geometry) or a maximum radius of curvature in ranges disclosed herein for R1B of furniture 1610B.

In specific embodiments, insert 1610B is removable from channel 104B and is removably coupled to or supported by tube 1608B. In such embodiments, this allows the different inserts 1610B having differently curved surfaces 1604B to be placed into sintering station 38B to provide a specific bend radius needed to provide a desired level flattening for a particular process or tape material type, thickness, rate of sintering, etc.

Referring to FIG. 60, in various embodiments, the lower surface of channel 104B through sintering station 38B is defined by upward facing, convex curved surface 1604B, and the upper surface of channel 104B is defined by a downward facing, concave curved surface 1612B. In specific embodiments, a or the radius of curvature of downward facing, concave curved surface 1612B generally matches (e.g., within 1%, within 10%, etc.) a or the radius of curvature of upward facing, convex curved surface 1604B, such as the corresponding radius of curvature vertically aligned therewith. This curvature matchings ensures that the height channel 104B remains substantially constant along its length through sintering station. In at least some designs, by having a constant height and relatively low clearance relative to the tape being sintered, vertical movement of air within channel 104B due to thermal gradients can be reduced, which is believed to improve shape and flatness of the final sintered tape.

In some embodiments, downward facing, concave curved surface 1612B is a surface of an insert 1614B. In such embodiments, insert 1614B is removably coupled to or supported by tube 1608B which allows insert 1614B to be selected to match the curvature of the lower furniture 1610B as may be used for a particular process or material type.

Referring to FIG. 61, in various embodiments, the lower surface of channel 104B through sintering station 38B is defined by upward facing, convex curved surface 1604B that has more than one curved section, shown as curved sections 1620, 1622 and 1624. Put another way, curvature of the surface 1604B may include inflection points, discontinuities, non-circular-arcing, etc. As shown in FIG. 61 for example, curved section 1620B has a first radius of curvature, R1B', curved section 1622B has a second radius of curvature, R2B, and curved section 1624B has a third radius of curvature, R3B. In this embodiment, the path of the tape through sintering station 38B is defined by R1B', R2B and R3B, and the tape during sintering is bent to each of radiuses R1B', R2B and R3B sequentially while being heated within sintering station 38B. In various embodiments, R1B', R2B and R3B are or include a radius of curvature between 0.01 m to 10 m. In specific embodiments, R1B', R2B and/or R3B are different from each other.

Further, as shown in FIG. 61, in some embodiments, sintering station 38B heats tape 36B traversing the different curved sections 1620B, 1622B and 1624B to different temperatures. In one specific embodiment, the temperature to which tape 36 is heated is inversely proportional to radius of curvature to which tape 36B is bent.

Figure 62:
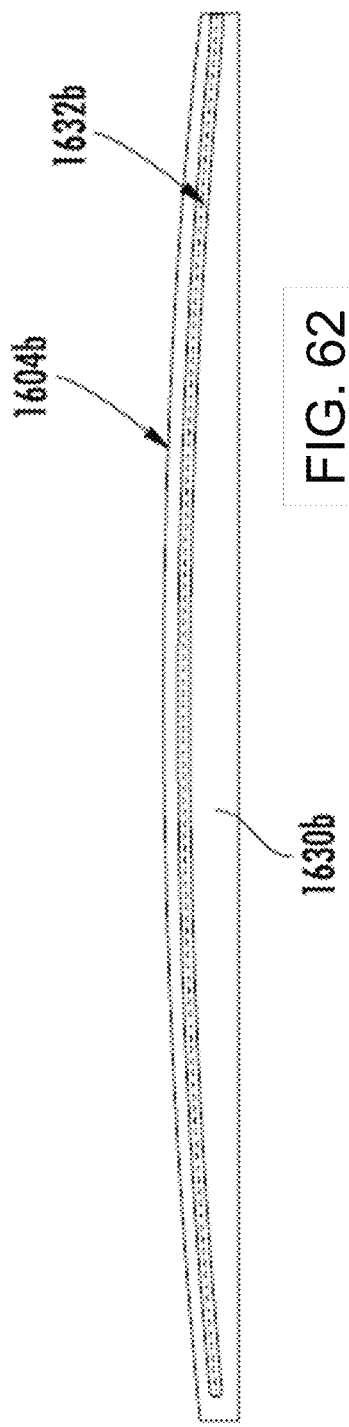
FIG. 62 shows a gas bearing having a curved upper surface that defines a curved surface of a sintering channel, according to an exemplary embodiment.

Referring to FIG. 62, in at least one embodiment, upward facing convex curved surface 1604B is the upper surface of a gas bearing 1630B. Gas bearing 1630B includes a gas supply channel 1632B which delivers pressurized gas (e.g., air, nitrogen, helium, argon, etc.) to channel 104B (see FIG. 60). In this manner, the pressurized gas supports tape 36B during traversal of sintering station 38B which allows tape to be bent to the radius of curvature of surface 1604B without requiring or with less contact with surface 1604B.

Figure 63:
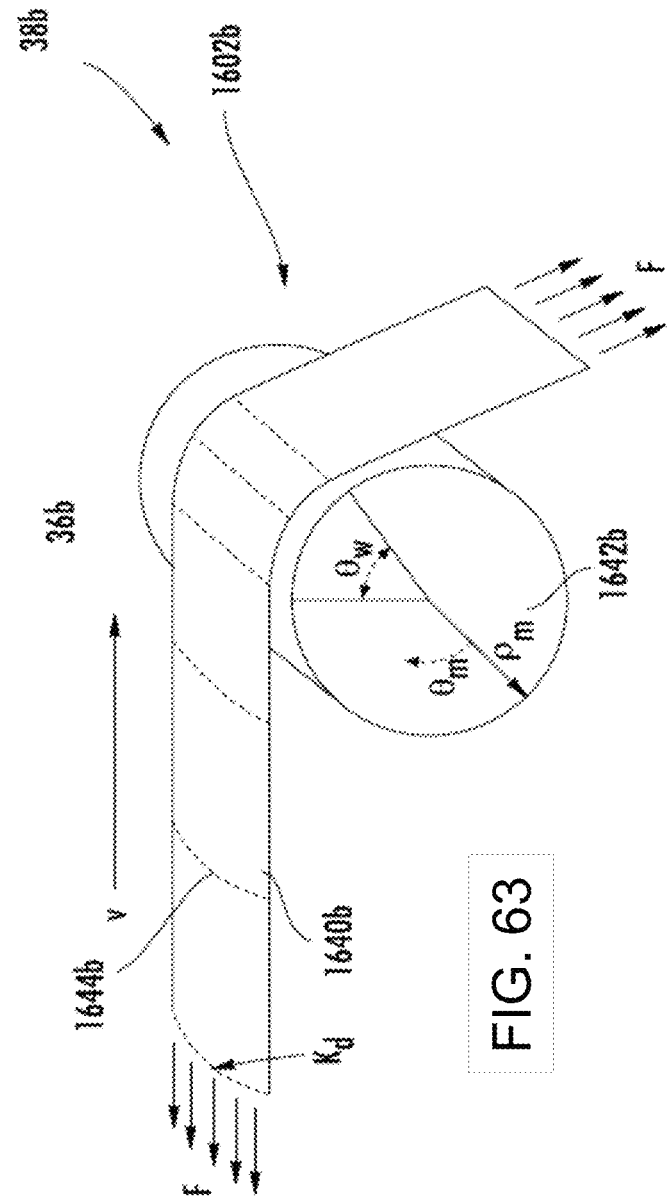
FIG. 63 shows a roller arrangement for forming the longitudinal curve in a continuous length of tape during sintering, according to an exemplary embodiment.
Figure 64:
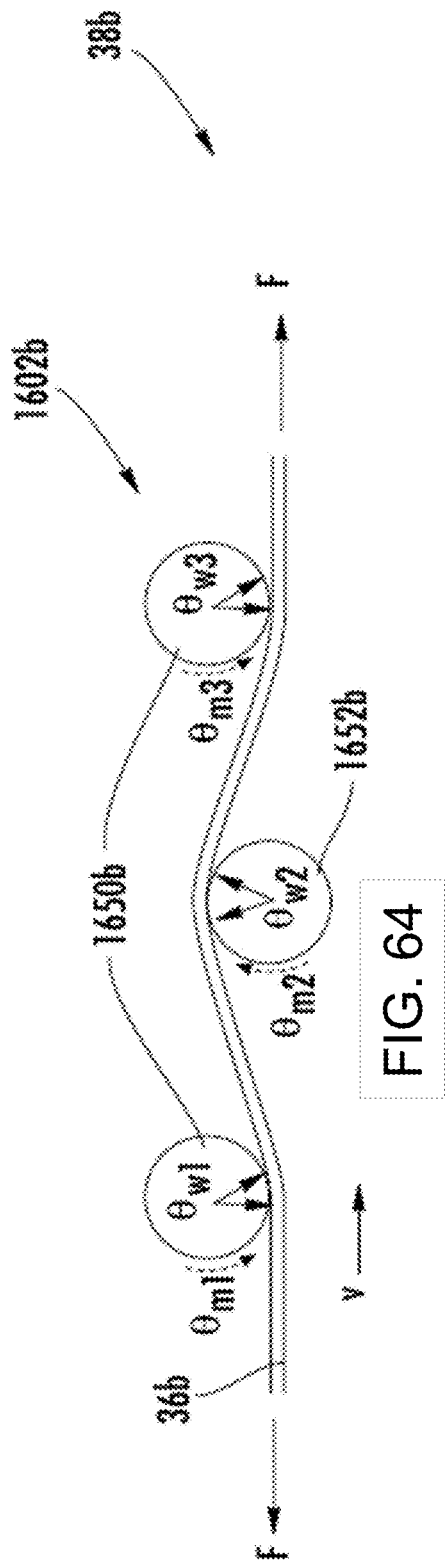
FIG. 64 shows an arrangement including multiple rollers for forming multiple longitudinal curves in a continuous length of tape during sintering, according to an exemplary embodiment.

Referring to FIGS. 63 and 64, in various embodiments, bending system 1602B includes one or more mandrel or roller, the outer surfaces of which define a convex curved surface around which tape 36B is bent during sintering within sintering station 38B.

The flattening provided by bending tape 36B around a curved structure, such as roller 1642B, is explained in more detail in relation to FIG. 63. As shown in FIG. 63, a portion 1640B of tape 36B located upstream from roller 1642B may have a buckle or flatness distortions shown as cross-width bow, represented by the curved dotted-line 1644B. This defect may be caused by the complex bi-axial stresses created within tape 36B during sintering, as discussed above. As tape 36B is conveyed through sintering station 38B, it approaches roller 1642B with a radius of curvature, $\rho_m$. Tape 36B bends around roller 1642B and becomes flat in shape. Tape 36B may have a lesser stiffness in the flat configuration than it does when it has the cross-width bow 1644B. The effect is a form of reverse-buckling or reduces changes of buckling. In the bent state, tape 36B with cross-width bow 1644B experiences a stress, $\sigma_d$, on its surface in the direction normal to that of conveyance that is directly proportional to the curvature of cross-width bow 1644B, $\kappa_d$, such that:

$$\sigma_d = \frac{1}{2} E \kappa_d t$$

where t is the thickness of the tape and E is its elastic modulus. This technique helps reduce other flatness distortions such as edge curl or bubble formation, with the result that local stress may be proportionate to the local curvature. Thus, bending, such as around roller 1642B or along surface 1604B discussed above, aids in flattening across many defect types. As will be explained in more detail below regarding FIG. 65, flattening via bending does not require a surface against which the tape is pulled, and as such, flattening may also be achieved via bending through a free-loop configuration.

However, utilizing a curved surface such as the outer surface of roller 1642B or surface 1604B, discussed above, is advantageous in that it allows a tensile force to be applied externally to the tape, by devices such as a weighted dancer 1680B (FIG. 58). In such embodiments, the force, F (FIG. 63), pulls the tape against the outer surface of roller 1642B or surface 1604B and generates a second stress to aid in flattening the tape. The stress, $\sigma_F$, from the applied tensile force during bending around a curved surface is defined by:

$$\sigma_F = \frac{2F}{wt} \sin\left(\frac{\theta_w}{2}\right)$$

where w is the width of the tape and $\theta_w$ is the angle of contact between as the curved surface (whether the outer surface of roller 1642B or surface 1604B) and tape 36B, often referred to as the wrap angle.

In various embodiments, roller 1642B can be fixed and unable to rotate. In other embodiments, roller 1642B may rotate freely. In yet other embodiments, the rate of rotation of roller 1642B may be controlled to match the speed of conveyance of the tape or even to drive or retard conveyance. In various embodiments, roller 1642B may also be configured to move up or down normal to the tape to change the wrap angle.

As shown in FIG. 64, in some embodiments, bending system 1602B may include multiple rollers against which tape 36B is pulled during sintering to provide flattening. In the specific embodiment shown in FIG. 64, bending system 1602B includes a pair of upper rollers 1650B and a single lower roller 1652B. As tape 36B is pulled through this roller arrangement, tape 36B is bent in the longitudinal direction via contact with the outer surfaces of rollers 1650B and 1652B. Similar arrangements of gas bearings may be used, where one or more of the roller-to-tape interfaces shown in FIG. 64 correspond to outward blowing surfaces of a respective gas bearing, as shown in FIG. 62.

Figure 65:
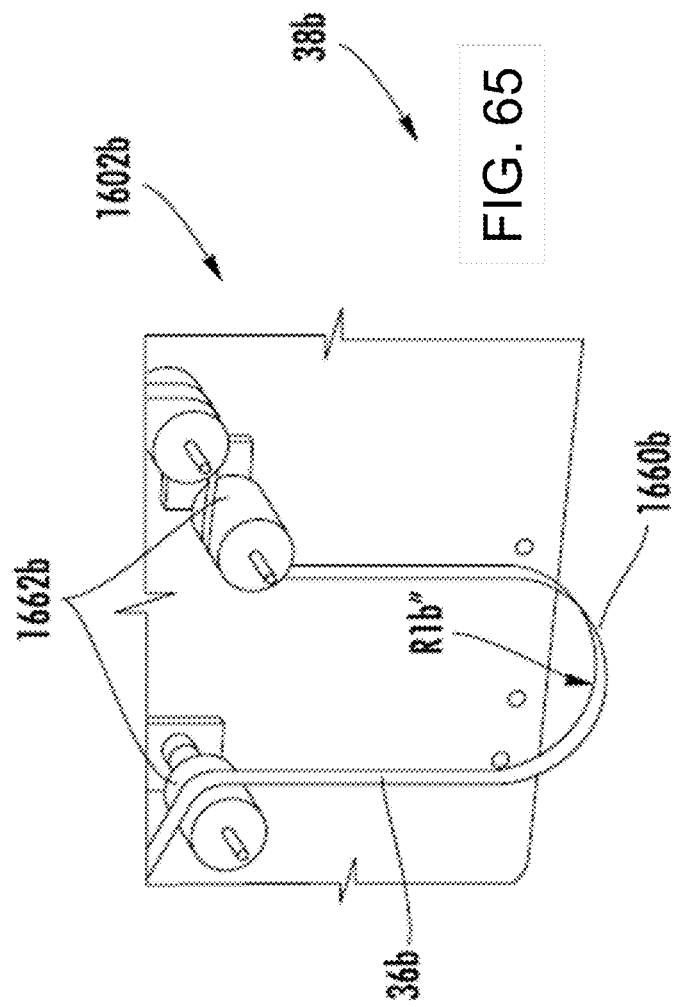
FIG. 65 shows a free-loop arrangement for forming the longitudinal curve in a continuous length of tape during sintering, according to an exemplary embodiment.

Referring to FIG. 65, in various embodiments, the curve or bend-forming path that tape 36B traverses through sintering station 38B is formed via free loop segment 1660B. In this embodiment, a section of tape 36B hangs under the influence of gravity to generate the longitudinal bending as discussed herein. In such embodiments, bending system 1602B includes one or more supports 1662B that are spaced apart from each other. The spacing of supports 1662B defines a gap which allows tape 36B to hang downward due to gravity between the supports to form free loop segment 1660B having a radius of curvature, R1B", as discussed above. In this particular embodiment, the radius of curvature R1B" formed via the non-contact, free-loop segment 1660B may improve surface quality in final sintered tape 40B as compared to the various contact-based bending systems discussed herein. For example, utilizing free loop segment 1660B eliminates or reduces scratches that may form in contact-based systems. As another example, utilizing free loop segment 1660B eliminates or reduces diffusion of chemical constituents from surfaces which the sintering tape may come in contact with in contact-based systems.

Applicant has performed tests that demonstrate that longitudinal bending while sintering of various contiguous tape materials decreases flatness distortions. Some results from these tests are illustrated in FIG. 66. For example, as shown in FIG. 66, 40 µm thick tapes of 3 mole percent yttria-doped zirconia (left) and titanium oxide (right) were bent during sintering. The tapes were cast onto a flat surface and were reformed to a curved shape over the alumina rod. More specifically the tapes were draped across a 9.5 mm diameter alumina rod and then heated at 100° C./hr to 1150° C. The dwell time was five minutes. The regions of tape bent across the alumina rod are locally flat from one edge to the next (in the width direction). In contrast, regions of the tape not supported by the curved surface of the rod were free to respond to shrinkage mismatches and forming flatness distortions. Specifically, wrinkles in the zirconia tape are visible and emphasized with dotted black lines. The images also evidence the plasticity of the tapes, where stresses over the rod induce flattening.

Figure 67B:
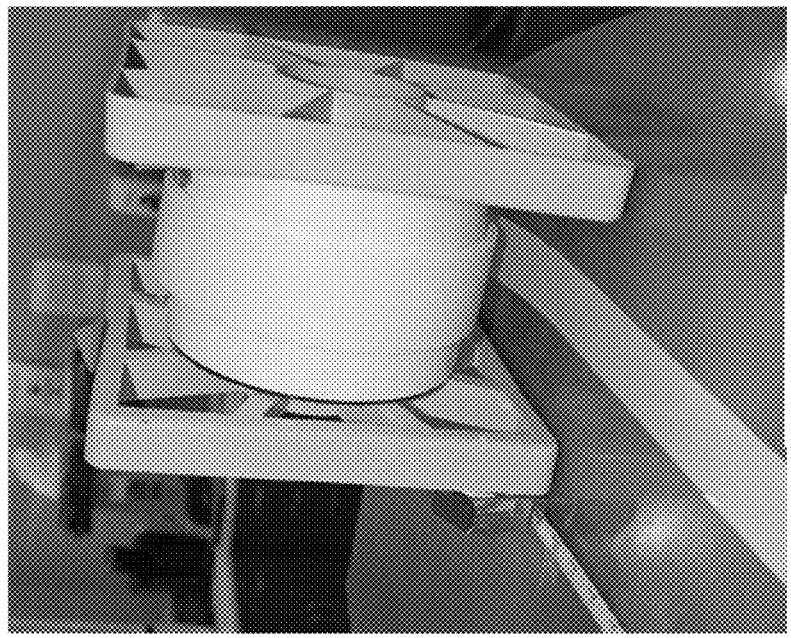
FIGS. 67A and 67B are digital images of a roll of sintered ceramic tape according to an exemplary embodiment.
Figure 67A:
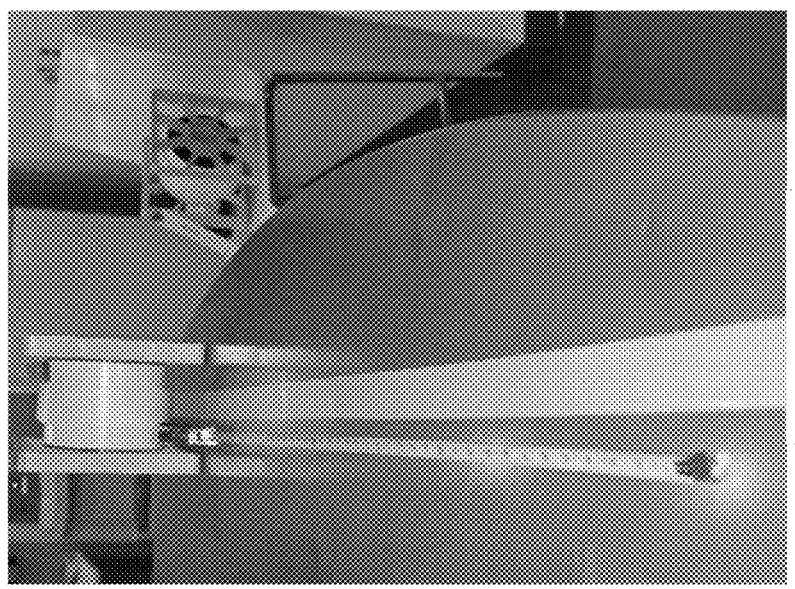

Referring now to FIGS. 67A and 67B, an example of products described above is shown. More specifically, a roll of polycrystalline ceramic tape includes alumina with 1% by volume yttria-stabilized zirconia with constituents $ZrO_2$ and 3 mol % $Y_2O_3$. The polycrystalline ceramic tape is 70 micrometers thick, 36 millimeters wide, and over 8.5 m long. This tape was sintered with the above-described processes using the above-described equipment at a sintering temperature of 1650° C. and at a rate of about 10 cm per minute along the manufacturing line. The roll has a 3 to 6 inch diameter core. The tape is flat or flattenable as discussed above.

Figure 68:
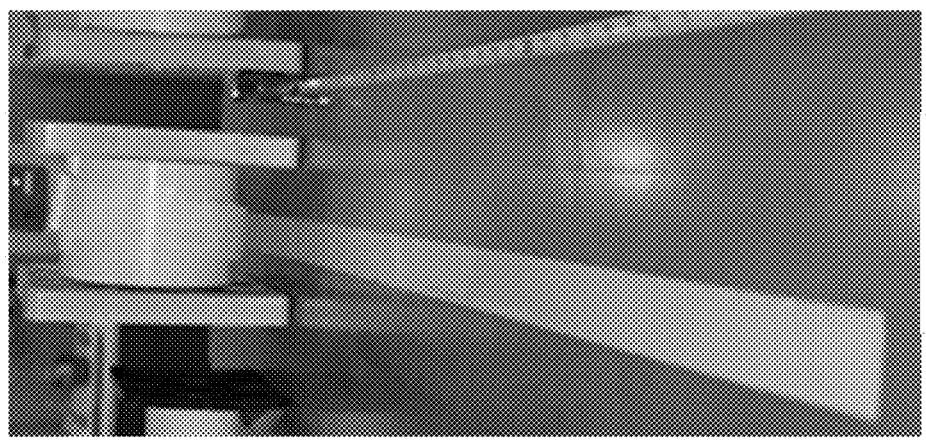
FIG. 68 is a digital image of a roll of a sintered ceramic tape according to another embodiment.

FIG. 68 shows an example of a roll of polycrystalline ceramic tape that is alumina with 300 parts per million magnesium oxide. The tape in FIG. 68 is 77 microns thick, 36 mm wide, and longer than 8 m. This tape was sintered with the above-described processes using the above-described equipment at a sintering temperature of 1650° C. and at a rate of about 10 cm per minute along the manufacturing line. The roll has a 3 to 6 inch diameter core. The tape is flat or flattenable as discussed above.

Figure 69:
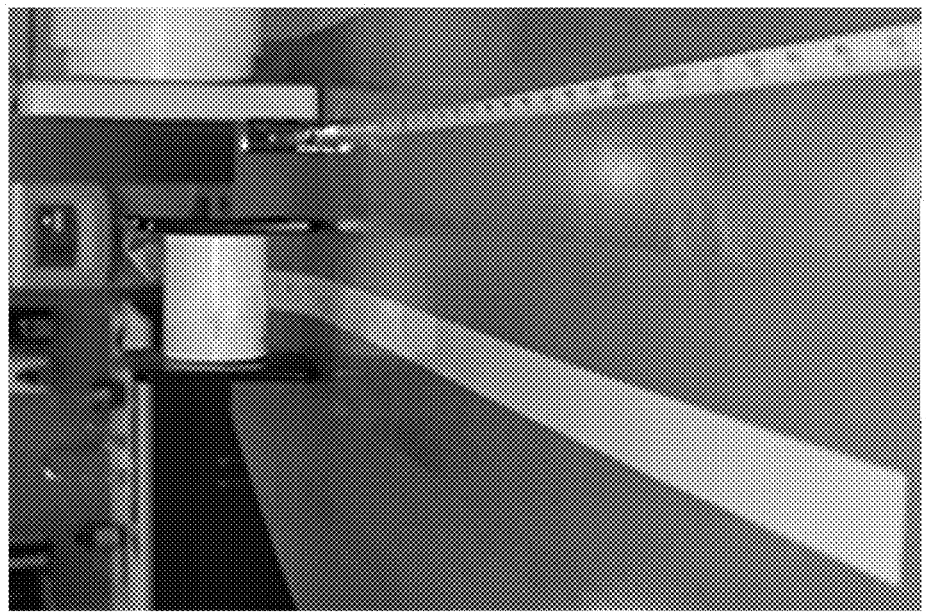
FIG. 69 is a digital image of a roll of a sintered ceramic tape according to yet another embodiment.

FIG. 69 shows an example of a roll of polycrystalline ceramic tape that is yttria-stabilized zirconia ($ZrO_2$ with 3 mol % $Y_2O_3$). The tape in FIG. 69 is 33 mm wide and about a meter long. This tape was sintered with the above-described processes using the above-described equipment at a sintering temperature of 1575° C. and at a rate of about 15 to 23 cm per minute along the manufacturing line. The roll has a 3 to 6 inch diameter core. The tape is flat or flattenable as discussed above.

Accordingly, aspects of the present disclosure, as discussed above, relate to a roll of flat or flattenable polycrystalline ceramic or synthetic mineral tape of materials disclosed or described herein, such as alumina tape as in FIGS. 67A and 67B, that is at least partially sintered such that grains of the polycrystalline ceramic or synthetic mineral are fused to one another, the polycrystalline ceramic or synthetic mineral tape comprising a thickness of no more than 500 micrometers, a width at least 10 times greater than the thickness, and a length such that the width is less than 1/10th the length, wherein the length of the polycrystalline ceramic or synthetic mineral tape is at least 1 meter. In some such embodiments, the width of the polycrystalline ceramic or synthetic mineral is at least 5 millimeters, and the width of the polycrystalline ceramic or synthetic mineral tape is less than 1/20th the length of the polycrystalline ceramic or synthetic mineral tape, such as where the thickness of the polycrystalline ceramic or synthetic mineral tape is at least 10 micrometers and/or where the thickness of the polycrystalline ceramic or synthetic mineral tape is no greater than 250 micrometers, such as where the thickness of the polycrystalline ceramic or synthetic mineral tape is no greater than 100 micrometers and/or where the thickness of the polycrystalline ceramic or synthetic mineral tape is no greater than 50 micrometers. In some such embodiments, the polycrystalline ceramic or synthetic mineral tape has fewer than 10 pin holes of a cross-sectional area of at least a square micrometer passing through the polycrystalline ceramic or synthetic mineral tape, per square millimeter of surface on average over a full surface of the polycrystalline ceramic or synthetic mineral tape. In some such embodiments, the polycrystalline ceramic or synthetic mineral tape has fewer than 1 pin hole of a cross-sectional area of at least a square micrometer passing through the polycrystalline ceramic or synthetic mineral tape, per square millimeter of surface on average over a full surface of the polycrystalline ceramic or synthetic mineral tape. In some such embodiments, the length of the polycrystalline ceramic or synthetic mineral tape is at least 10 meters, the width of the polycrystalline ceramic or synthetic mineral tape is at least 10 millimeters, such as where the width of the polycrystalline ceramic or synthetic mineral tape is no greater than 20 centimeters and/or where the polycrystalline ceramic or synthetic mineral tape has high surface quality such that first and second surfaces of the polycrystalline ceramic or synthetic mineral tape both have at least a square centimeter of area having fewer than ten surface defects from adhesion or abrasion with a dimension greater than five micrometers, the high surface quality facilitating strength of the sintered article. In some such embodiments, the polycrystalline ceramic or synthetic mineral tape supports greater than 1 kilogram of weight without failure, and/or the polycrystalline ceramic or synthetic mineral tape supports about 20 megapascals of tension without failure, such as where the width of the polycrystalline ceramic or synthetic mineral tape is at least 50 millimeters. In some such embodiments, the polycrystalline ceramic or synthetic mineral tape has total transmittance of at least 30% at wavelengths from about 300 nm to about 800 nm and/or the polycrystalline ceramic or synthetic mineral tape has diffuse transmission through the polycrystalline ceramic or synthetic mineral tape of at least about 10% up to about 60% at wavelengths from about 300 nm to about 800 nm, and/or the polycrystalline ceramic or synthetic mineral tape is translucent such that text in contact with the polycrystalline ceramic or synthetic mineral tape may be read through the polycrystalline ceramic or synthetic mineral tape. In some embodiments the roll is further comprising a mandrel or spool, where the polycrystalline ceramic or synthetic mineral tape bends around the mandrel or spool at a diameter of 1 meter or less such as where the polycrystalline ceramic or synthetic mineral tape is wound on the spool, such as where the spool has a diameter of at least 0.5 centimeters and no greater than 1 meter. In some such embodiments, the polycrystalline ceramic or synthetic mineral tape is fully sintered and dense, having a porosity of less than 1%, such as where the polycrystalline ceramic or synthetic mineral tape has a porosity of less than 0.5%. In some such embodiments, the polycrystalline ceramic or synthetic mineral tape is substantially unpolished such that surfaces of the polycrystalline ceramic or synthetic mineral tape have a granular profile, such as where the granular profile includes grains with a height in a range from twenty-five nanometers to one-hundred-and-fifty micrometers relative to recessed portions of the surfaces at boundaries between the respective grains and/or the granular profile includes grains with a height in a range from twenty-five nanometers to one-hundred micrometers relative to recessed portions of the surfaces at boundaries between the respective grains and/or the granular profile includes grains with a height of at least fifty nanometers relative to recessed portions of the surfaces at boundaries between the respective grains and/or the granular profile includes grains with a height of no more than eighty micrometers relative to recessed portions of the surfaces at boundaries between the respective grains. In some such embodiments, while being substantially unpolished, at least one surface of the In some such embodiments, the tape has a roughness in a range of one nanometer to ten micrometers over a distance of one centimeter in a lengthwise direction along the surface.

According to an exemplary embodiment, an article (e.g., tape of sintered ceramic, as disclosed herein), has a thickness of less than 50 micrometer or other thicknesses as disclosed herein, and fewer than 10 pin holes (i.e., passage or opening through body from first to second major surface having a cross-sectional area of at least a square micrometer and/or no larger than a square millimeter), per square millimeter of surface on average over the full surface (or fewer than 10 pin holes over the full surface, if the surface area is less than a square millimeter; or alternatively on average over a long length of the article, such as over 1 meter, over 5 meters), such as fewer than 5 pin holes, fewer than 2 pin holes, and even fewer than fewer than 1 pin hole per square millimeter of surface on average over the full surface or long length. Pin holes are distinguished from vias, which are purposely cut, typically in pattern of a repeating geometry (e.g., circular, rectilinear) to be filled with conductive material for example, or perforations formed in a pattern of a repeating geometry, which may help as fiducial marks with alignment in roll-to-roll processing for example.

Figure 70:
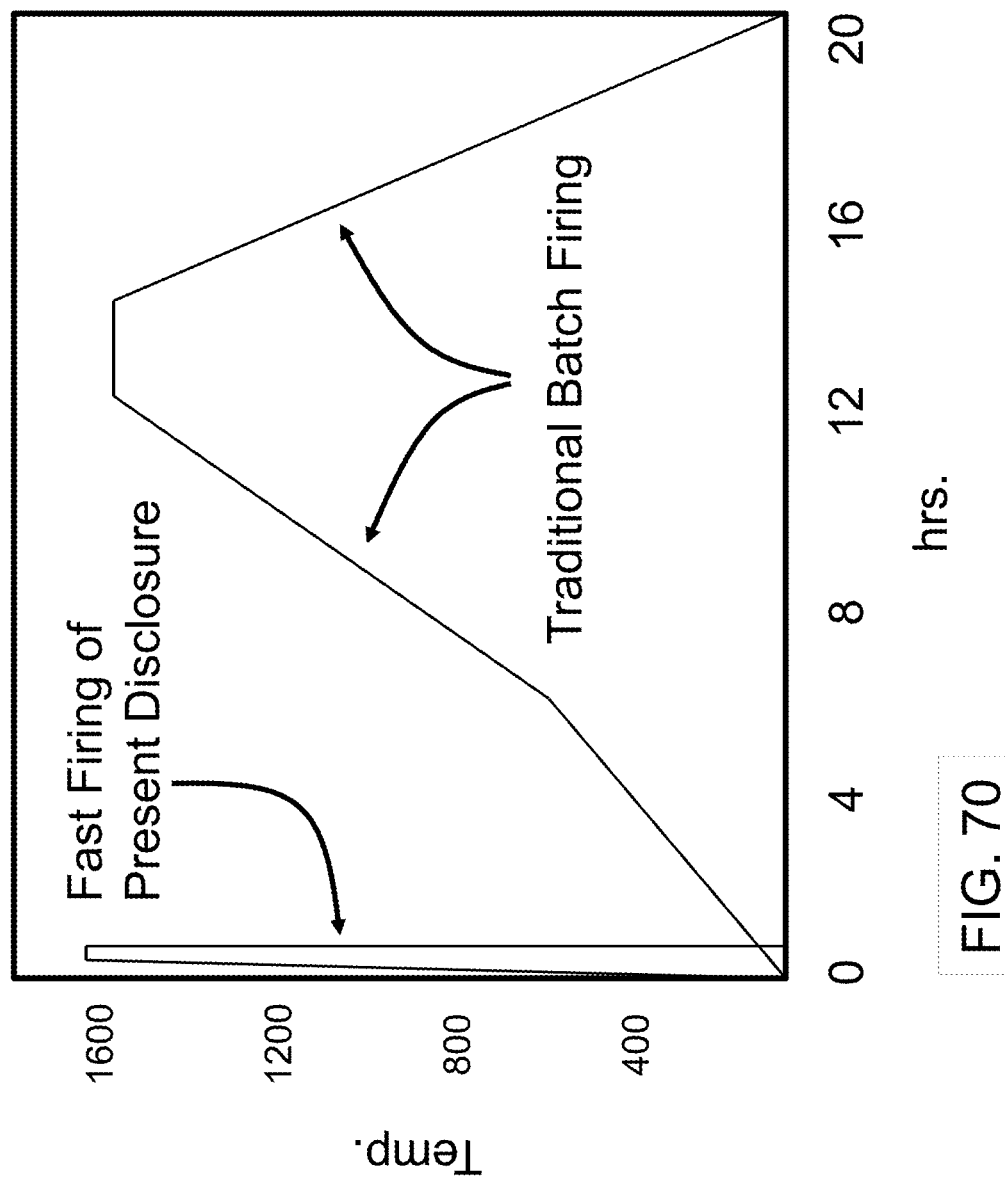
FIG. 70 is a graphical representation of time sintering for traditional batch firing versus the presently disclosed technology according to an exemplary embodiment.

FIG. 70 compares sintering schedules for sintering of ceramics (e.g., alumina) using the processes disclosed herein, compared to traditional batch firing in a kiln using setters, and stacked green ceramic plates. The total time for processing at sintering temperatures, including multiple passes (e.g., 2, 3, 4 passes) through the furnace system disclosed above, may be less than one hour. Conventional sintering may take 20 hours. Applicants have discovered measurable, identifiable differences between the "fast" sintering of the present disclosure versus traditional, such as with respect to the microstructure of ceramics manufactured according to the present technology. More specifically, Applicants have found that fast firing of thin, unstacked tapes, as disclosed above, results in less melding or combining of individual particles or grains into one another. The resulting sintered grain size of the present technology is substantially smaller and closer to the original green state grain size or particle size. Whereas traditional sintering may result in sintered grains that are ten times the original particle sizes, grains of polycrystalline ceramics manufactured with the fast sintering schedule disclosed herein may have sintered grain sizes that are less than five times the original green state grain or particle sizes, such as less than three times on average. Furthermore, and surprisingly, articles manufactured according to the present technology also may have correspondingly high density, such as at least 90% relative density, at least 95% relative density, at least 98% relative density, and this high relative density is achieved with the relatively small grain size, as just described, which may be less than 10 micrometers mean particle size, such as less than 5 micrometers, such as less than 3 micrometers, depending upon the starting particles sizes and composition, such as for alumina, cubic zirconia, ferrites, barium titanate, magnesium titanate, and other inorganic materials that may be processed into tapes, sheets, etc. using the technology as disclosed herein.

Some embodiments may use multiple passes through a furnace for sintering the same article (e.g., tape), such as a first pass ("bisque pass") to increase strength of the tape after organic binder is removed, as second pass to partially sinter the tape, a third pass to further sinter the tape, and a forth pass to sinter to final density. Use of multiple passes or a series of furnaces or hot zones may help to control stresses in the tape due to shrinkage of the tape material during sintering. For example, some furnaces for sintering may be 12 to 14 inches long, while others may be 40 to 45 inches long, others over 60 inches, and still others of other lengths. For shorter furnaces, multiple passes or arrangements of multiple furnaces in series may be particularly helpful for sintering inorganic materials with greater degrees of shrinkage. Also, longer furnaces or arrangements of furnaces in series may also allow for faster rates of green tape movement, by increasing soak times (i.e. exposure to sintering conditions) at such faster rates.

After analyzing samples sintered at a high speed (e.g., rate of 4 inches per minute) with a sintering temperature (e.g., 1650° C.), that are particularly thin, as described herein (e.g., a thickness of 20 to 77 micrometers), alumina or other materials disclosed herein made with the presently disclosed technology may have the following attributes: material purity of at least 90% by volume, such as at least 95%, such as at least 99%, where high purity may result from the narrow passage and control of air flow as well as the time of sintering, efficiency of the binder removal, and starting constituents, among other factors described herein; surface roughness measured by AFM in units of nanometers of less than 100, such as less than 60, such as about 40 for shiny face and/or less than 150, such as less than 100, such as about 60 for mat face, when measured at a 30 mm scan, where the mat face is rougher than the shiny face due to interface with a floor of the sintering furnace; grain size of about 1 mm in cross-section, or other grain sizes as disclosed herein; porosity of less than 10% by volume for a sintered article, such as less than 5%, such as less than 3%, such as less than 1%, such as less than even 0.5%, which may in part be due to the fast firing process, which maintains small grain/particles sizes as disclosed above, whereby gas may be less likely to be trapped within grains, as may be a characteristic limitation for traditional batch sintering and longer firing processes (limiting phenomenon known as 'pore/boundary separation' which may be overcome by sintering processes as disclosed herein). Alumina tape manufactured according to technology disclosed herein has a specific heat capacity of at least and/or no more than about 0.8 J/gK at 20° C. and 1.0 J/gK at 100° C. as measured via ASTM E1269 standard test protocol/method; hardness at room temperature (23° C.) measured via nano-indentation of at least and/or no more than about 23.5 GPa, such as on at least and/or no more than about a 40 μm thick alumina tape, and/or other tape or sheet sizes disclosed herein; two-point bending strength of at least and/or no more than about 630 MPa, such as at least in part due to control of voids and smaller grain size; elastic modulus of at least and/or no more than about 394 GPa as measured via dynamic mechanical analysis (DMA) for 3 point bend; coefficient of thermal expansion of at least and/or no more than about 6.7 ppm/° C. average over the range of 25-300° C., at least and/or no more than about 7.6 ppm/° C. average over the range of 25-600° C., at least and/or no more than about 8.0 ppm/° C. average over the range of 25-300° C.; dielectric strength of at least about 124.4 kV/mm at 25° C. as per ASTM D149 standard test protocol/method, such as on at least and/or no more than about a 40 μm thick alumina tape; dielectric constant (Dk) of at least and/or no more than about 9.4 at 5 GHz and of at least and/or no more than about 9.3 at 10 GHz as per ASTM D2520 standard test protocol/method; dielectric loss/loss tangent of at least and/or no more than about $8 \times 10^{-5}$ at 5 GHz and of at least and/or no more than about $1 \times 10^{-4}$ at 10 GHz as per ASTM standard test protocol/method (D2520); volume resistivity of at least and/or no more than about $3 \times 10^{15}$ ohm-centimeter at 25 as per D257, at least and/or no more than about $4 \times 10^{14}$ ohm-centimeter at 300 as per D1829, and/or at least and/or no more than about $1 \times 10^{13}$ ohm-centimeter at 500 as per D1829; transmittance of at least about 50%, such as at least about 60%, such as at least about 70% for one, most, and/or all wavelengths between about 400-700 nanometers, such as on at least and/or no more than about a 40 μm thick alumina tape, and/or other tape or sheet sizes disclosed herein; transmittance of at least about 50%, such as at least about 65%, such as at least about 80% for one, most, and/or all wavelengths between about 2-7 micrometers and/or between about 2-7 millimeters, such as on at least and/or no more than about a 40 μm thick alumina tape, and/or other tape or sheet sizes disclosed herein; and less than 100 ppm outgassing as measured via GC-MS at 200° C., such as less than 50 ppm, such as less than 10 ppm.

Figure 71B:
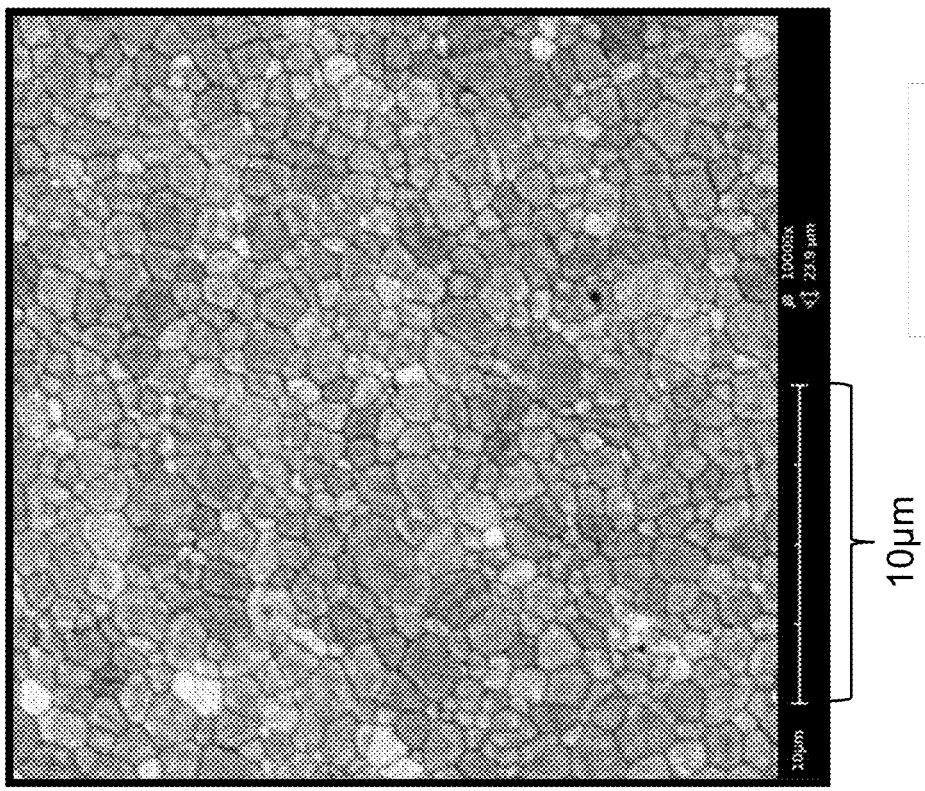
FIGS. 71A and 71B are top views of surfaces of sintered articles according to exemplary embodiments.
Figure 71A:
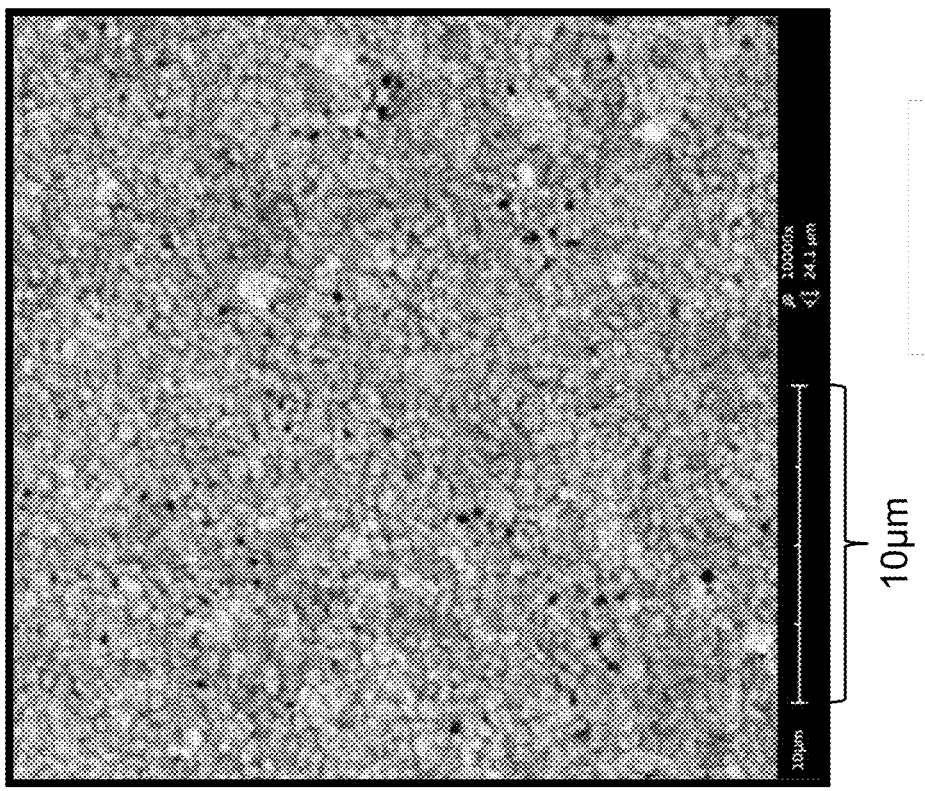
Figure 72B:
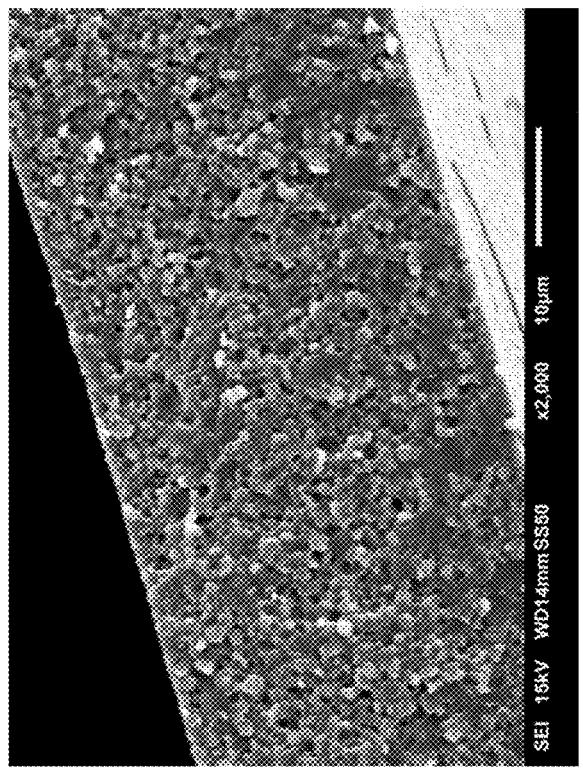
FIGS. 72A and 72B are side perspective views of surfaces of sintered articles according to exemplary embodiments.
Figure 72A:
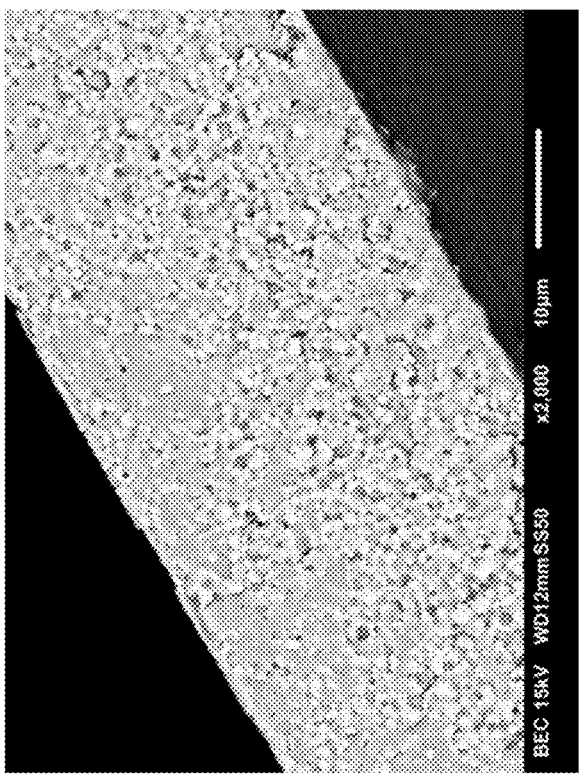

Referring now to FIGS. 71A and 71B, two samples of alumina as shown side-by-side to demonstrate impact of sintering time and temperature. The alumina of FIG. 71A was processed through above disclosed manufacturing system at a rate of 4 inches per minute, having a 4 minute hot "soak" or exposure to 1650° C. sintering temperature, while the alumina of FIG. 71B was manufactured at 8 inches per minute, having a 2 minute soak at 1600° C. As can be seen, the grain size greatly increases as sintering time increases, however porosity is low in both figures, such as below 5% by volume. FIGS. 72A and 72B show cross-sectional digital images of ceramic tape made via corresponding processes: FIG. 72A at 8 inches per minute at 1650° C. and FIG. 72B at 4 inches per minute at 1600° C.

Figures 73A, 73B, 73C:
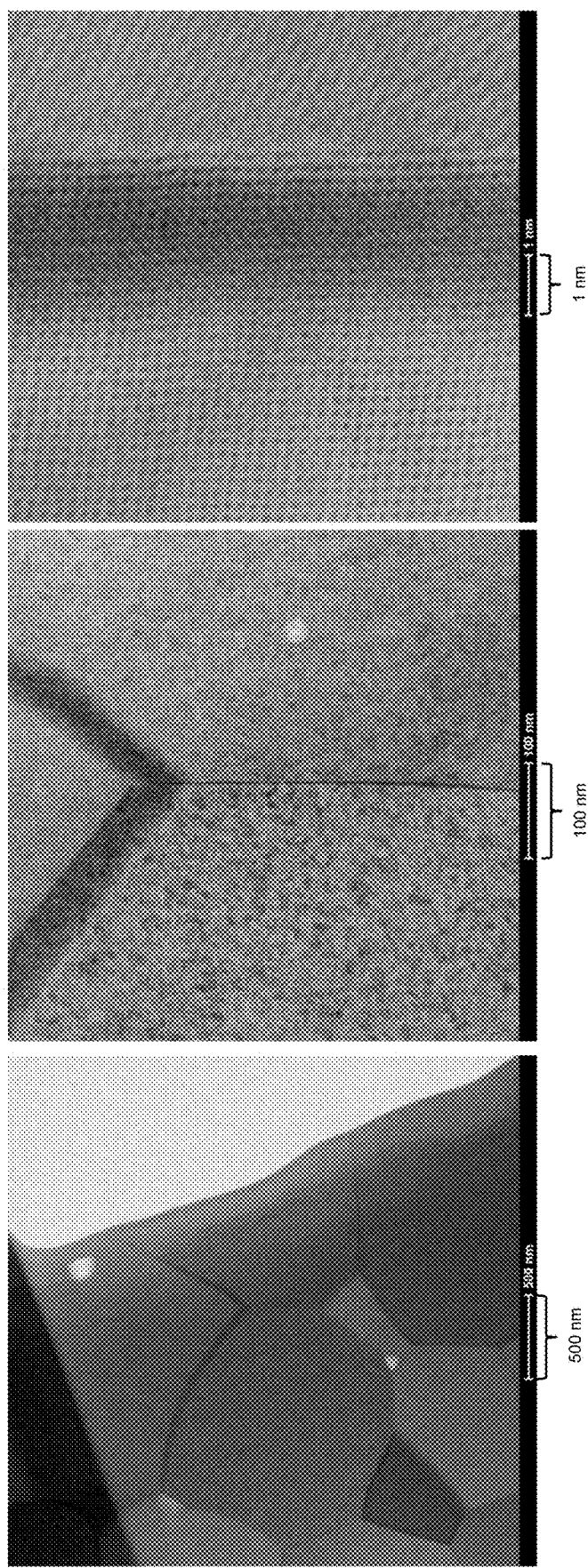
FIGS. 73A, 73B, and 73C are micrographs of grain boundaries of sintered articles according to exemplary embodiments.
Figure 75:
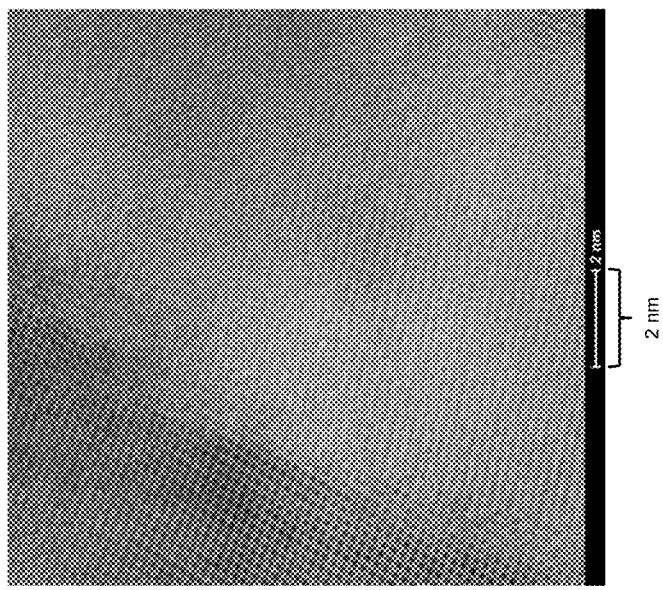
FIGS. 74 and 75 are micrographs of grain boundaries of sintered articles according to other exemplary embodiments.
Figure 74:
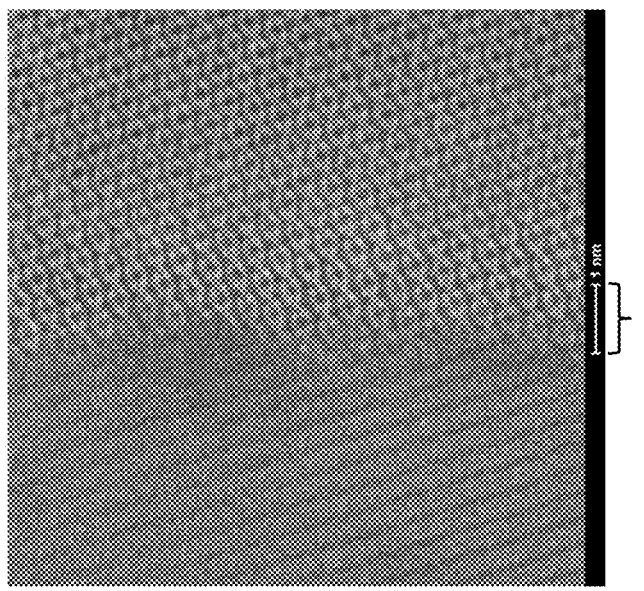

FIGS. 73A, 73B, and 73C show increasing magnification of grain boundaries of alumina manufacturing according to the present technology. Of interest is that the grain boundaries of articles manufactured according to the present technology are particularly pristine. As shown in FIG. 73C, the molecular arrays of the adjoining crystal grains (crystal lattices) essentially directly contact one another, such that there is less than 5 nm of intermediate amorphous material, such as less than 3 nm of intermediate amorphous material, such as less than 1 nm of intermediate amorphous material. Applicants believe that the crystal grain interface may be, at least in part, attributed to the fast sintering, gas flow control, and binder burn-off technology disclosed herein. FIGS. 74 and 75 show other grain boundaries of articles of polycrystalline ceramic or synthetic mineral according to the present technology. Applicants believe hermeticity and/or strength of such articles may be particularly advantageous relative to ceramics having some or more amorphous material between grains. The images of FIGS. 73-75 were gathered via transmission electron microscope.

Figure 77:
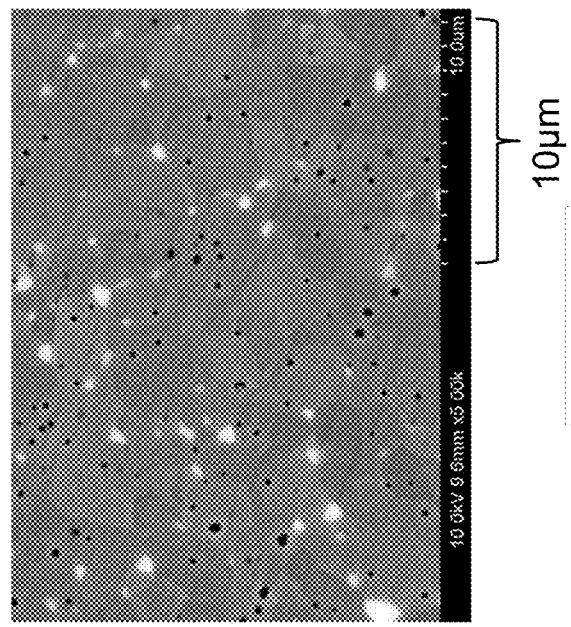
FIGS. 76 and 77 are top views of surfaces of sintered articles according to exemplary embodiments.
Figure 76:
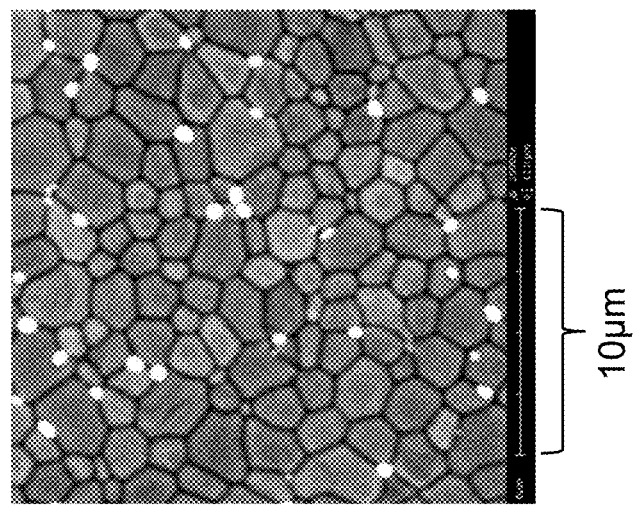

FIGS. 76 and 77 show similar microstructure for different materials. FIG. 76 corresponds to alumina with 1% by volume yttria-stabilized zirconia ($ZrO_2$ with 3 mol % $Y_2O_3$) processed at 4 inches per minute and at 1650° C. Similarly, FIG. 77 shows a polished cross-section of alumina with 1% by volume titanium oxide ($TiO_2$) processed at 4 inches per minute and at 1550° C.

Figure 78:
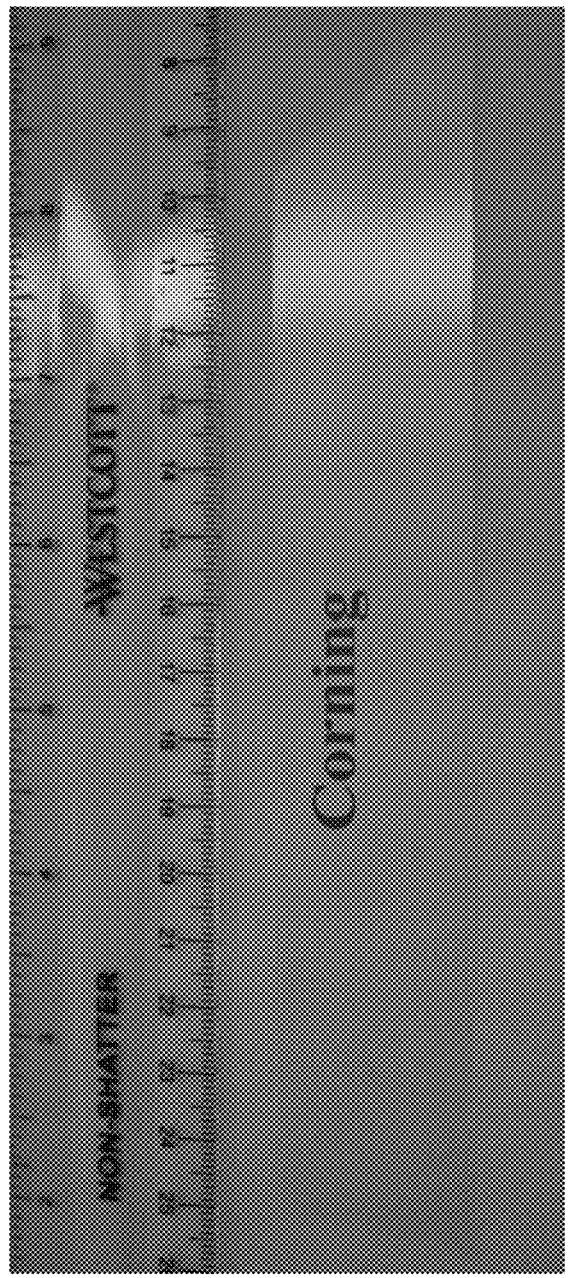
FIG. 78 is a digital image of a tape of a sintered article according to an exemplary embodiment.

FIG. 78 is a digital image of a ribbon of high purity fused silica manufactured from loose silica particles bound in green tape as disclosed herein. The silica particles are inorganic, but may not be crystalline or a synthetic mineral. Accordingly, Applicants have found that the technology disclosed herein may be used to manufacture tapes, with geometries as disclosed herein for polycrystalline ceramic and synthetic mineral, but comprising, consisting essentially of, or consisting of inorganic material that may be amorphous, such as glass that is difficult to manufacture via float or fusion forming processes, such as silica or other glasses having a high melting temperature and/or high viscosity, such as a glass transition temperature of at least 1000° C.

Figure 79B:
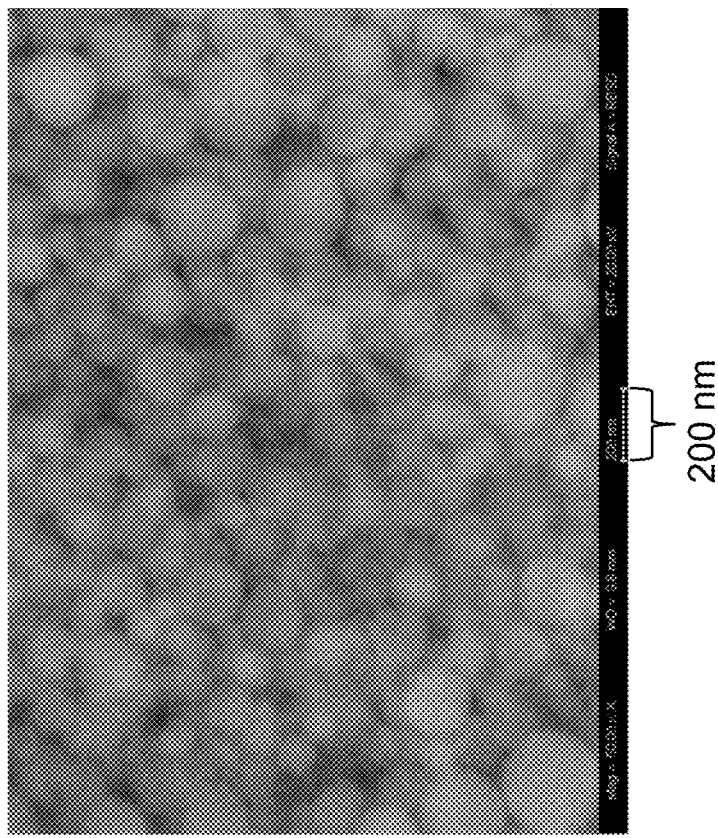
FIGS. 79A and 79B are side views sintered articles according to exemplary embodiments.
Figure 79A:
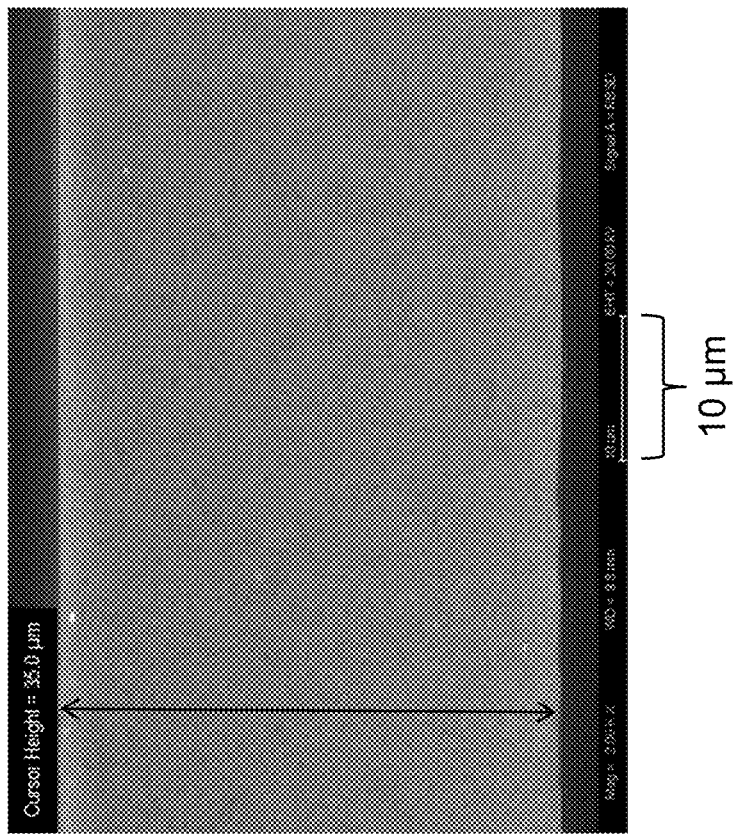
Figure 81:
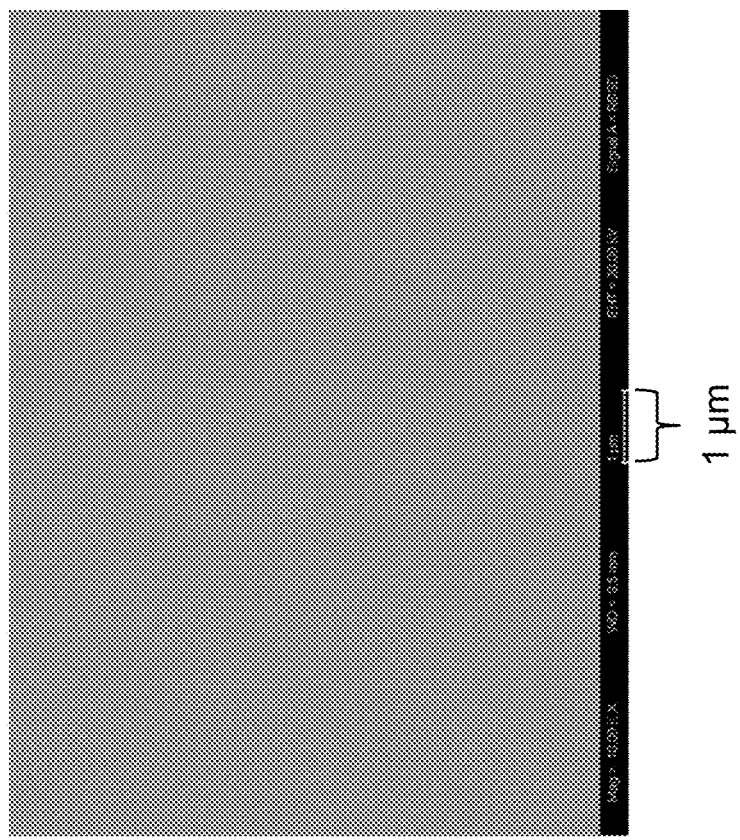
FIG. 81 is a side view of a sintered article according to another exemplary embodiment, where the sintered material appears amorphous.
Figure 80:
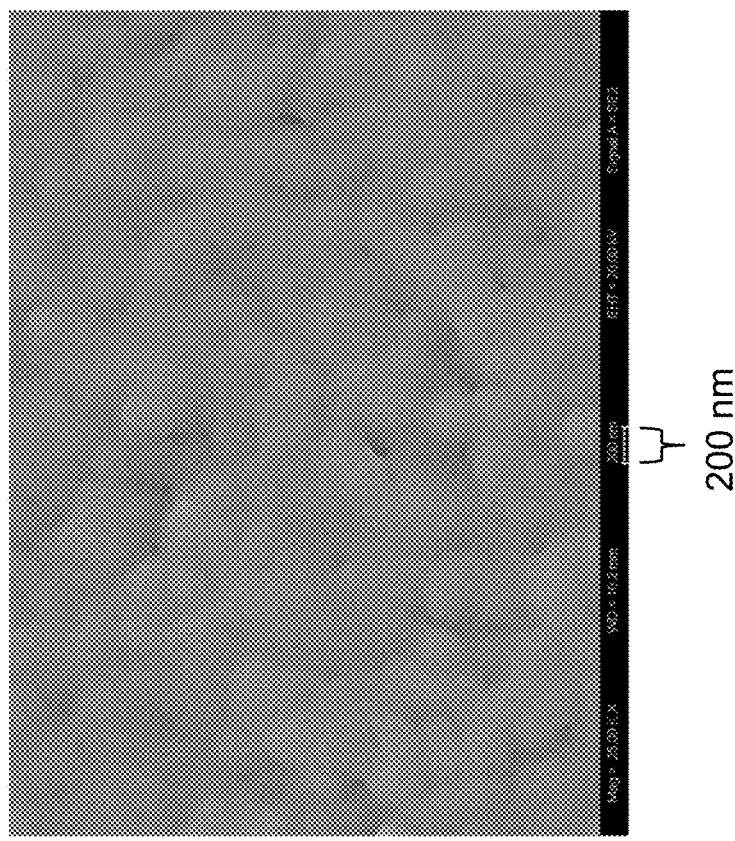
FIG. 80 is a side view of a sintered article according to an exemplary embodiment.

FIGS. 79A and 79B show the polished cross-section of sintered tape of silica having a granular profile. The tape of 79A and 79B was manufactured at a sintering temperature of 1150° C. Individual particle so silica have been fused together to form the tape. As shown in FIG. 79B, the particles are generally spherical and have a cross-section of less than a micrometer. By contrast, FIG. 80 shows silica tape manufactured according to the technology disclosed herein, as sintered at 1250° C. The granular profile is still present, but is muted relative to the silica of FIG. 79B. FIG. 81 shows fully dense and amorphous silica that has been sintered according to the present disclosure at 1300° C. Applicants contemplate that silica tape with a granular profile may be useful for scattering of light or other applications. Accordingly, FIGS. 79 to 81 demonstrate that compositions disclosed herein may be in the form of an amorphous article, such as a tape, if processed at a high enough temperature. With that said, Applicants have found that if the tape is heated too much, the tape may become difficult to handle and/or may lose shape.

Figure 82:
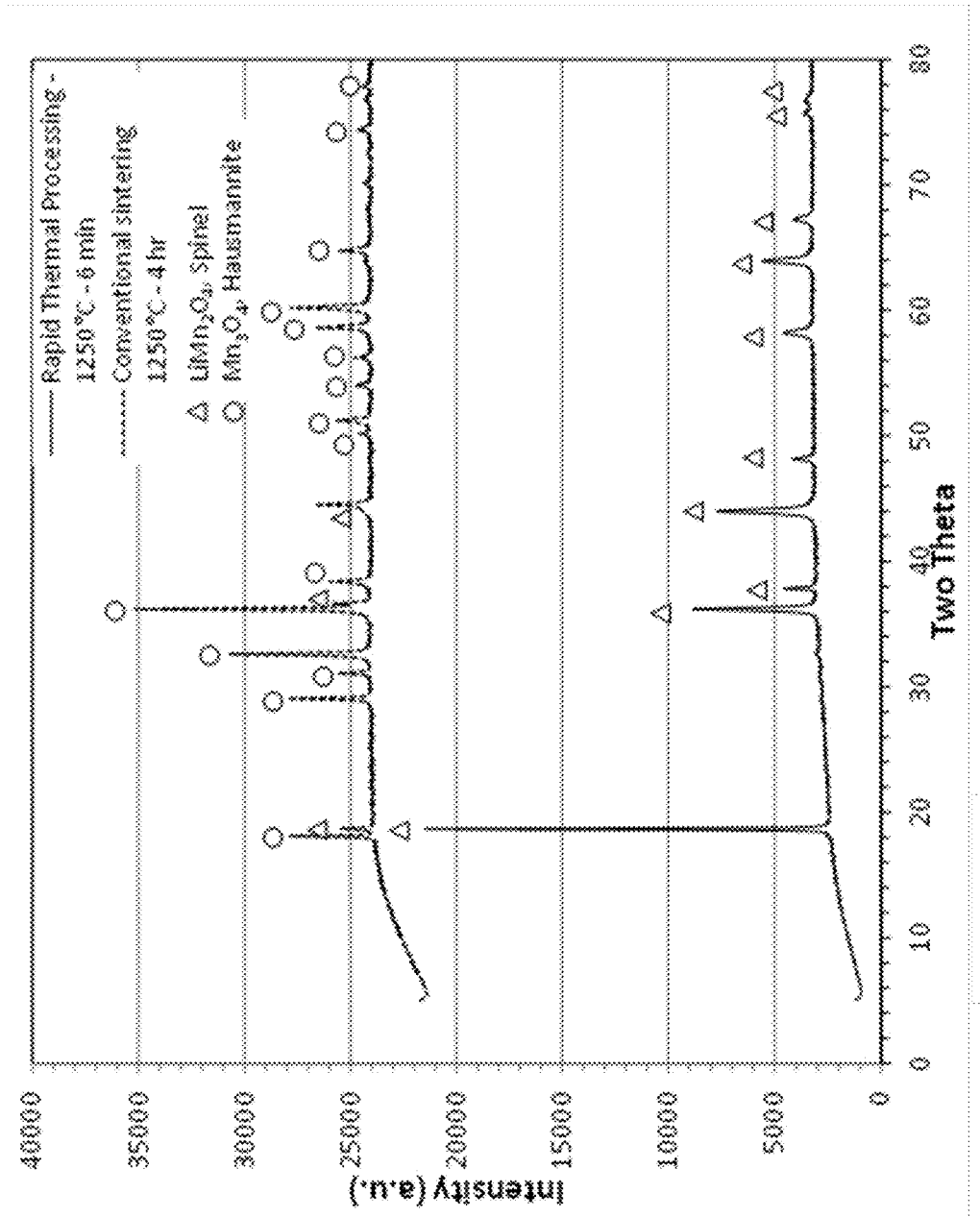
FIG. 82 is a graphical representation of compositions.

Referring now to FIG. 82, rapid thermal processing and continuous sintering, such as of inorganic tape, may be used to produce lithium-containing materials, as discussed above, such as for use as a thin cathode structure in lithium batteries. For example, Applicants believe lithium-containing materials, such as lithium manganate spinel ($LiMn_2O_4$), $LiCoO_2$ or $LiFePO_4$, are good candidates cathode structure. Unexpectedly, Applicants have found that the presently disclosed technology mitigates lithium loss due to high vapor pressure and/or mitigates change in reduction in valence of the transition metal oxide and release of oxygen on heating. For example, FIG. 82 shows powder x-ray diffraction traces for similar 30 μm thick tapes containing $LiMn_2O_4$ powder (commercially available from Novarials, Sigma Aldrich, Gelon, Mtixtl, and/or others) that was rapidly sintered at 1250° C. for 6 minutes using the presently disclosed technology and $LiMn_2O_4$ powder conventionally sintered at 1250° C. for 4 hours. As shown in FIG. 82, the rapidly sintered material is still single phase spinel with peak intensities and positions of $LiMn_2O_4$. The lithium is retained and so is the average valence of 3.5 for the manganese ions. Accordingly, such lithium-containing articles (e.g., tapes, sheets) sintered by the presently disclosed technology may meet minimum chemical and phase requirements for a cathode supported battery. In contrast, the conventionally sintered tape is mostly $Mn_3O_4$ with lesser amount of $LiMn_2O_4$ remaining, as shown in FIG. 82. There was extensive loss of lithium and a drop in average manganese valence to 2.67.

Applicants have also found that the presently disclosed sintering system may be advantageous for pore removal during sintering, such as when rapidly sintering lithium-containing inorganic materials, such as $LiMn_2O_4$, and/or other materials susceptible to vaporization of volatile constituents. With conventional sintering techniques, grain growth may limit pore removal, such as by trapping pores within larger grains.

For comparison purposes, Applicants manufactured a pill of die-formed $LiMn_2O_4$ sintered at 1300° C. The mean particle diameter of the powder used to make the pill was 0.5 μm; to enhance surface tension and favor pore removal. Loss of lithium and change of Mn-valence were controlled or slowed in three ways. First, the size of the pill was large, greater than 25 mm in diameter and 5 mm in thickness to provide surplus material. Second, the sintering was performed under a cover. Third, the pill was supported on platinum. Powder x-ray diffraction confirmed the resulting pill is single phase lithium manganite spinel and chemical analysis shows negligible lithium loss relative to the as-received material and that the average valence of Mn is 3.5. The average grain size of the sintered pill is about 40 μm and there is more than 15% of porosity.

Figure 84:
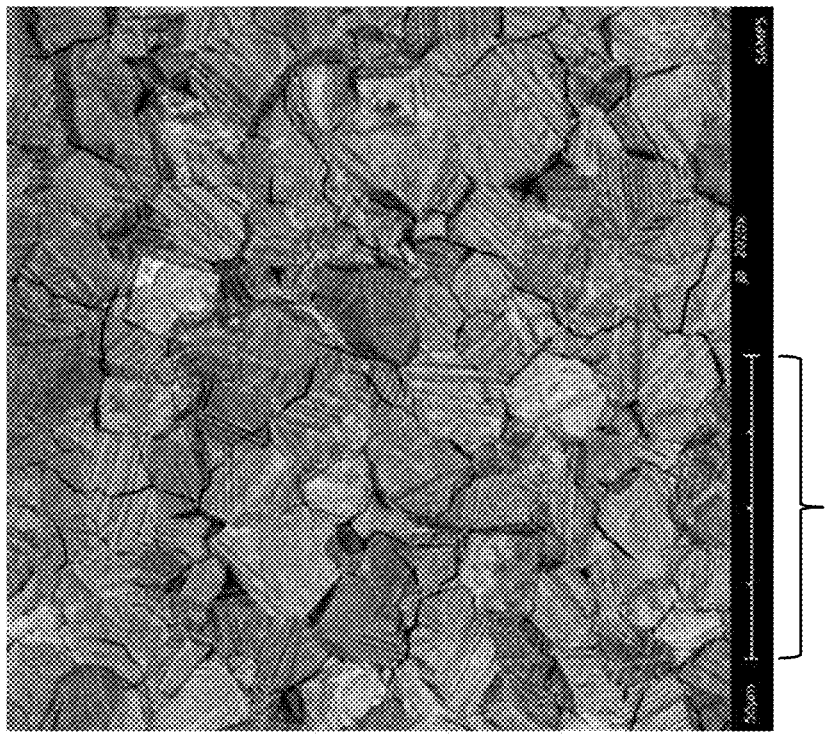
FIGS. 83 and 84 are side perspective views of surfaces of sintered articles according to exemplary embodiments.
Figure 83:
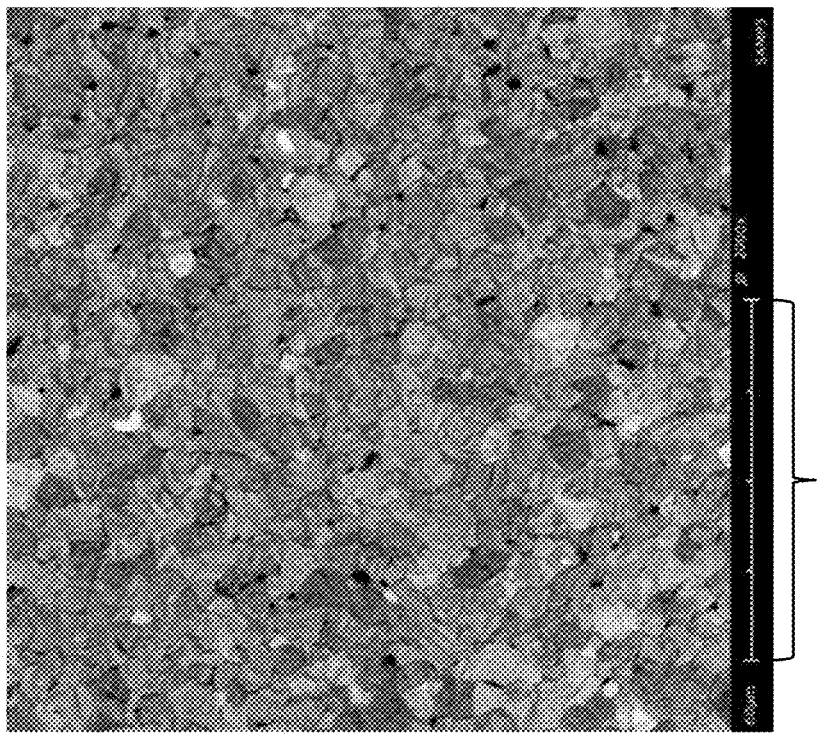

Returning to the presently disclosed technology, porosity in sintered materials may be limited or particularly low, and grains may be particularly small, which may be beneficial in applications, such as cathode support. By contrast, excess porosity and large grains may be detrimental to strength of most ceramics. Further, Applicants have found that rapid thermal sintering, using techniques and equipment disclosed herein, favors pore removal over grain growth. Referring to FIGS. 83 and 84, as-fired surfaces of rapidly sintered $LiMn_2O_4$ tape (FIG. 83, sintered at 1250° C. for 6 min; and FIG. 84 sintered at 1350° C. for 3 min). The initial mean particle diameter was 0.5 μm, like the above pill example. The amount of porosity is much lower than in the example of the conventionally sintered pill. More specifically, the porosity appears closed and in an amount less than 5%. The grains are also smaller than the above pill example. More specifically, the grains are about 10 μm and 25 μm, respectively in FIGS. 83 and 84. Put another way, porosity of lithium-containing sintered material (e.g., lithium manganite) was less than 15%, such as less than 10%, such as less than 7%, such as less than about 5% and/or the grains were less than 40 μm, such as less than 30 μm. Also different than conventional sintering of lithium-containing materials, the present technology uses thin sheets or tapes as disclosed herein, as opposed to large volume pills or boules, which facilitates the rapid sintering; controlling loss of volatile constituents by reducing the time of sintering, with or without control of surrounding vapor pressures. Applicants contemplate that the presently disclosed sintering system, including the rapid thermal sintering, may also facilitate sintering at an even lower temperature and/or sintering on an alumina or other low-cost support in a continuous process as disclosed herein.

$LiCO_2$ and $LiFePO_4$ are other examples of lithium-containing inorganic materials that may be sintered using the presently disclosed technology, and may be useful as cathode material or for other applications. More generally, sintering of other transition metal oxides with minimal loss of oxygen is possible is possible using the presently disclosed technology.

Figure 85B:
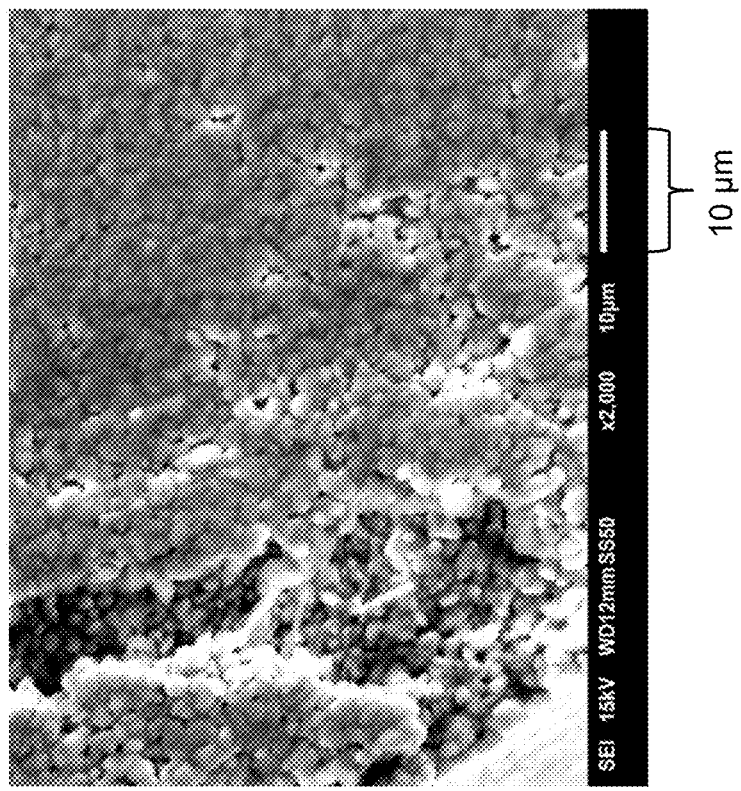
FIGS. 85A and 85B are side perspective views of surfaces of un-sintered green material according to exemplary embodiments.
Figure 85A:
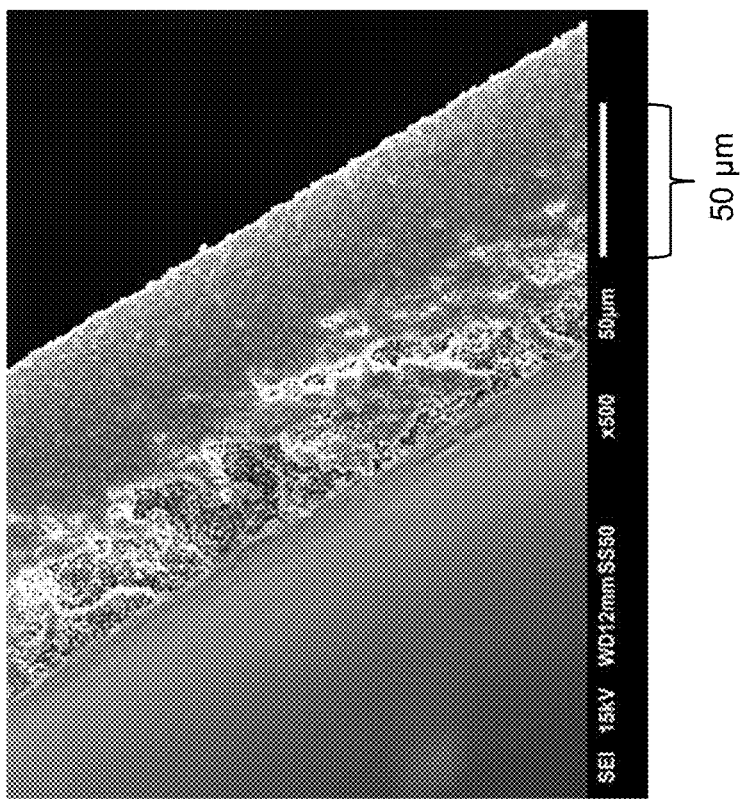

Referring now to FIGS. 85A and 85B, the cross-section of a green tape is shown under two different levels of magnification. More specifically, a slip for the green tape was made of about 47.35 wt % of a garnet powder with the composition $Li_{6.5}La_3Zr_{1.5}Ta_{0.5}O_{12}$, 6.45 wt % lithium carbonate, 31.74 wt % n-propyl propionate, 1.30 wt % glyceryl Trioleate, 3.56 wt % n-butyl stearate, and 9.60 wt % Lucite International Elvacite 2046, a high molecular weight isobutyl/n-butyl methacrylate co-polymer. The slip mixture was vibratory milled for 18 hours. The slip was cast on a Teflon carrier film with a 10 mil blade and dried overnight. The resulting dried tape was about 85 to 90 μm thick with particles averaging 0.6 μm. The green tape has been released from the carrier film in FIGS. 85A and 85B.

Figure 86B:
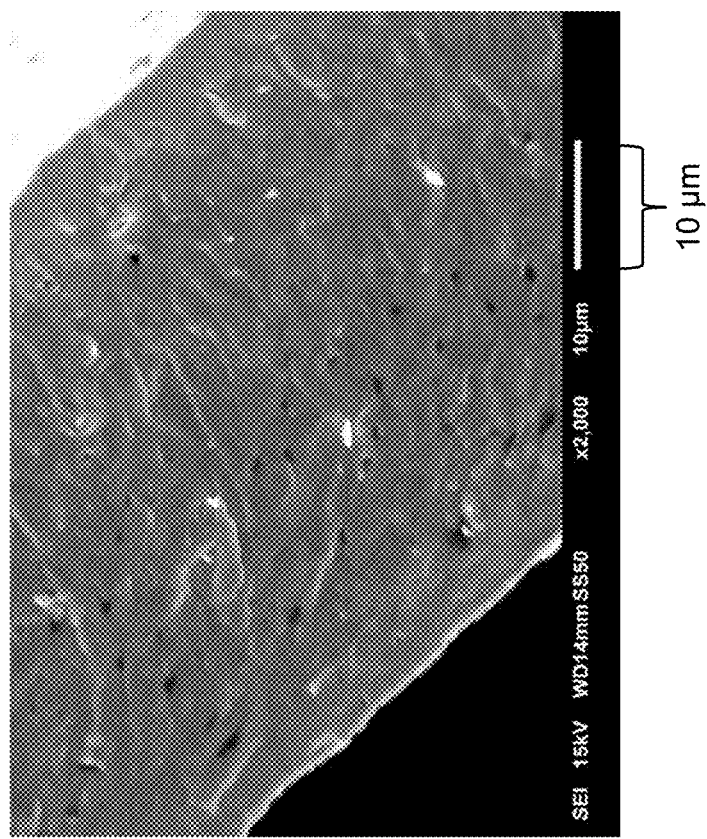
FIGS. 86A and 86B are side perspective views of surfaces of sintered material according to exemplary embodiments.
Figure 86A:
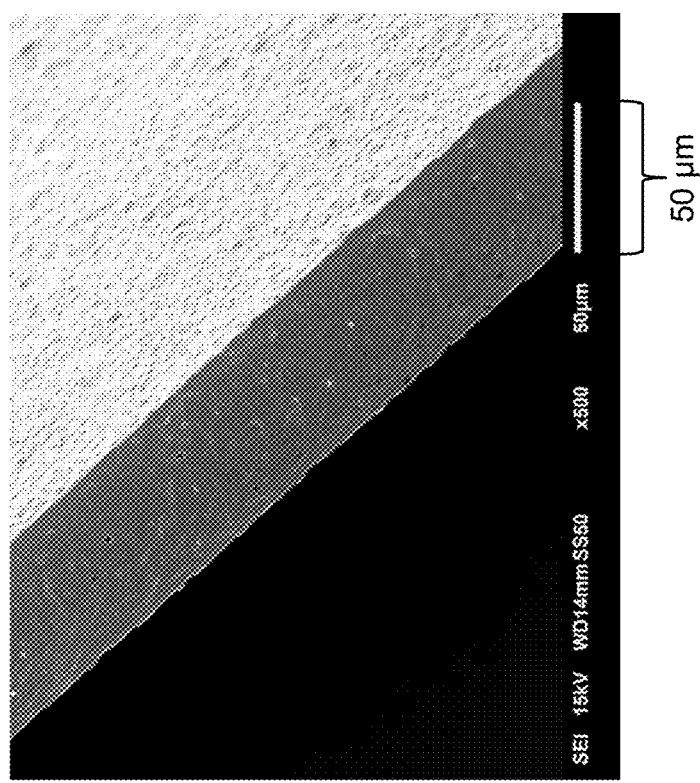

In this example, the binder was subsequently burned off of the green tape of FIGS. 85A and 85B at 400° C., where environment for the burn-off was controlled to be argon gas and time for the binder burn-off was 30 minutes. Next the tape with burned-out/charred binder was fired in a continuous sintering furnace as disclosed herein at 1200° C. for 15 minutes in air. The fired tape was at least and/or no more than about 50 to 55 μm thick with grain sizes averaging at least and/or no more than about 2 to 3 μm, as shown in FIGS. 86A and 86B. The resulting tape had conductivities at least and/or no more than about $3.7 \times 10^{-4}$ to $3.8 \times 10^{-4}$ S/cm, where S is siemens. The fired samples were at least and/or no more than about 96 to 98 wt % cubic garnet phase.

Using the presently disclosed technology, some embodiments include use of high-lithium content for forming particularly dense garnet tape or other articles. Applicants have found that excess lithium (excess in terms of more than the lithium according to stoichiometry of the sintered article, such as at least 1 vol % excess, at least 10 vol % excess, at least 20 vol % excess, at least 50% vol %, and/or no more than 100 vol % more than the stoichiometric amount in the sintered article) in the green tape may promote dense garnet tape sintering and/or compensate for loss of lithium during the sintering. Such high-lithium content powder for use in the green tape may be made by batching with excess amounts of lithium precursor in the raw material in garnet powder preparation and/or by making stoichiometric or slightly excess (no more than 50 vol % excess relative to final article stoichiometry) lithium garnet powder and then adding in more lithium precursor during slip preparation for tape casting. Some advantages of the latter approach include that the lower lithium-containing batch may be easier to prepare because high lithium content may be hygroscopic and difficult to mill and/or the amount of excess lithium may be easily adjusted to compensate for different processing conditions. Examples of lithium precursors for adding such excess lithium during the slip preparation include $Li_2CO_3$, LiOH, $LiNO_3$, LiCl, etc. Methods of adding excess lithium as just described include having lithium precursor pre-react with the garnet powder, such as by heating the lithium precursor and garnet powder mixture to about 900 to 950° C. for about 1 to 5 hours. Alternatively, without pre-reaction, the excess lithium may be added as a fine precursor powder and/or by providing enough milling to decrease the particle size to prevent leaving pores in the ceramic, such as precursor powder particle size of less than 3 micrometers, such as less than 1 micrometer. Applicants have found that the amount of excess lithium is enough for sintering via the above-described technology, but not too much so as to leave excess lithium in the sintered article or to cause tetragonal phase formation. Accordingly, at least and/or no more than about 5.8 to 9 mol total lithium per mol of garnet, for garnet that sinters at at least and/or no more than about 1000° C. in at least and/or no more than about 3 minutes (e.g., low lithium-content garnet); at least and/or no more than about 7 to 9 mol total lithium per mol of garnet, for garnet that sinters at at least and/or no more than about 1150° C. in at least and/or no more than about 3 minutes. With that said, for garnet, especially high lithium-content garnet, that may be highly reactive to organics used in tape casting slip, to stabilize the garnet, the powder may be treated beforehand using an acid treatment, such as peracetic acid (peroxyacetic acid, PAA), citric acid, stearic acid, hydrochloric acid, acetic acid; a solvent, such as a non-water containing solvent, such as isopropyl alcohol, PA, PP, etc.; with a treatment of soaking the garnet powder, which may be excess lithium precursor pre-reacted garnet powder as disclosed above, in 1 to 5 wt % acid/solvent solution for 2 hours, with solid loading of about 50%, then drying the solvent, where the obtained/treated powder may be used for making tape casting slip. Alternatively, low lithium-content garnet powder plus inert lithium precursor, such as $Li_2CO_3$, may be used in making a casting slip directly.

At least one embodiment of acid treatment includes ball milling for 3 hours and oven drying at 60° C. 100 grams of MAA ($Li_{5.39}La_3Zr_{1.7}W_{0.3}Ga_{0.5}O_x$, lithium garnet or cubic LLZO (e.g., $Li_7La_3Zr_2O_{12}$), low lithium-content garnet powder) plus 10.7 grams $Li_2CO_3$, 2.2 grams of citric acid, and 100 grams of isopropyl alcohol. At least one embodiment of tape casting slip manufacturing includes attrition milling for 2 hours 100 grams of acid treated MAA plus 10.7 wt % $Li_2CO_3$, 84.67 grams methoxy propyl acetate solvent, 12.14 grams PVB Butvar B-79 binder, and 2.4 grams dibutyl phthalate plasticizer. Another embodiment of tape casting slip manufacturing includes attrition milling for 2 hours 100 grams of acid treated MAA plus 8.4 wt % $Li_2CO_3$ that has been pre-reacted in turbular mix for 30 minutes and calcine at 900° C. for 1 hour, 66.67 grams ethanol and 33.33 grams butanol solvent, 12 grams PVB Butvar B-79 binder, and 10 grams dibutyl phthalate plasticizer. Another embodiment of tape casting slip manufacturing includes 100 grams of GP ($Li_{6.1}La_3Zr_2Al_{0.3}O_{12}$, lithium garnet or cubic LLZO) plus 8.4 wt % $Li_2CO_3$ that has been pre-reacted (e.g., mixed for 30 minutes and heated to 900° C. for 1 hour), 66.67 grams ethanol and 33.33 grams butanol solvent, 12 grams PVB Butvar B-79 binder, and 10 grams dibutyl phthalate plasticizer. Applicants have found that low lithium content garnet with $Li_2CO_3$ for excess lithium precursor, as described above, may not require acid treatment; for example, attrition milling for 2 hours 100 grams of MAA with 10.7% $Li_2CO_3$, 84.67 grams methoxy propyl acetate solvent, 2.08 grams fish oil (Z1) dispersant, 12.14 grams of PVB Butvar B-79 binder, and 2.4 grams of dibutyl phthalate plasticizer. Alternatively, acid based dispersant may be added into the slip, such as with up-milling for two hours 100 grams MAA with 10.7% $Li_2CO_3$, 104 grams EtOH and BuOH in a 2:1 ratio solvent, 1 gram of citric acid as dispersant, 16 grams PVB B-79 as binder, and 14 grams of dibutyl phthalate as plasticizer.

Aspects of the present technology relate to sintering of higher viscosity, higher processing temperature glasses, such as fused silica or ultra-low-expansion (amorphous) glass compositions that may be difficult or impossible to manufacture as rolls of high viscosity glass tape and/or cut into sheets via other methods, such as fusion drawing, float glass, or other ordinary glass tank melters. Accordingly, inorganic material with geometries (e.g., thicknesses, rolled format, lengths, widths) and attributes (e.g., flatness, low warpage) disclosed herein include higher viscosity, higher processing temperature glasses manufactured with the present technology. Additional benefits of the present technology include compositional homogeneity at small (sub-millimeter) length scale and large length scale (millimeter to multi-centimeter variations) via use of controlled air flow during sintering, tension control of the tape, and mixed powders in a slurry as opposed to flame deposition techniques, which may lead to compositional variations at different scales. Additionally, the rolls or sheets of higher viscosity, higher processing temperature glasses may be annealed. Applicants have found that the presently disclosed technology, including furnace with heat zones, not only allows sintering but also an ability to continuously anneal the glass tape as it is being formed and/or via a set of one or more lower temperature furnaces. A corresponding low and uniform stress field in annealed glass facilitates uniform dimensional changes during post-firing leading to less warpage in thin, post-treated annealed sheets compared to unannealed articles. Further, technology disclosed herein, including lower temperature processing (compared to flame deposition with temperatures typically greater than 2100° C.) and rapid sintering (compared to batch sintering), also facilitates incorporation of volatile dopants such as boron and phosphorous at levels greater than 0.5 wt % of such inorganic material (e.g., viscous, high temperature amorphous glasses), which may be difficult or impossible to add via flame deposited materials. With that said, equipment disclosed herein may be used to heat green or partially sintered materials to a higher temperature than would typically be used in a conventional sintering process, where the short time at soak limits grain growth and accelerates pore removal.

Applicants have found a high level of compositional homogeneity with viscous, high temperature amorphous glass articles, when green tape is made with glass powder mixed in slurry form, such as in the solgel, extrusion, or casting processes and sintering is performed as described above. More specifically, Applicants have found hydroxide (OH), deuterium (OD), chlorine (Cl) and fluorine (F) variations less than +/−2.5 ppm at spatial variations of 1 mm and less than +/−5 ppm within distances 3 cm, such as with variations less than +/−1 ppm at frequencies less than 1 mm and less than +/−3 ppm at frequencies less than 3 cm. In some embodiments, compositional homogeneity is with chemical variations of titania of less than +/−0.2 wt %, such as less than +/−0.1 wt % at distances of 1 mm in titania containing glass, and less than 10 wt % at distances of 1 mm variations in Germania levels in Germania containing glass. In some embodiments, index variations less than 10 ppm, such as less than 5 ppm as measured via XRF techniques (wt % metals) when mixed component glasses are used.

Figure 87:
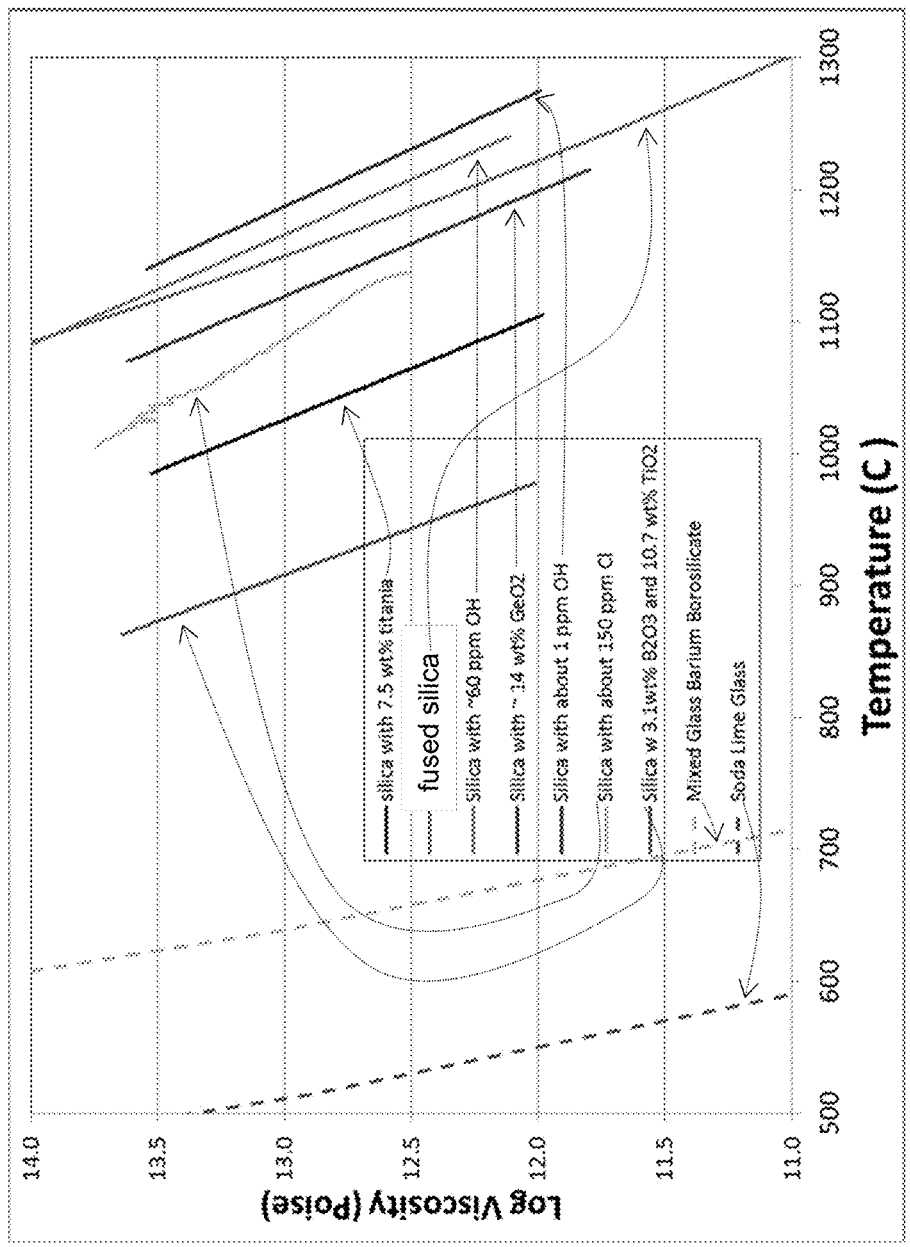
FIG. 87 is a graphical representation of viscosity versus temperature for various materials.

Referring now to FIG. 87, examples of viscous, high temperature amorphous glasses made with the present technology are shown in solid lines, and those made with conventional techniques are shown with a dotted line (soda lime glass (SLG) and a mixed barium borosilicate glass) where viscosities are low and the glasses may be processed by conventional glass methods such as the float glass process where many soda lime glasses are produced such as ordinary window glasses. FIG. 1 also identifies the viscosity behavior of many high temperature glasses (solid lines), such as silica with 7.5 wt % titania, fused silica, silica with about 60 parts per million OH, silica with about 14 wt % $GeO_2$, silica with about 1 ppm OH, silica with about 150 ppm Cl, silica with 3.1 wt % $B_2O_3$ and 10.7 wt % $TiO_2$. Characteristics for glasses that may be uniquely processed with technology disclosed herein are: anneal points (viscosities of 1013 poise) greater than 800° C. and/or a silica ($SiO_2$) content of greater than 85 wt %, such as with greater than 95 vol % amorphous or less than 5 vol % crystals present, such as no crystals present (amorphous). Such glass may be in the form of rolls of high temperature annealed glass. For some such embodiments, glass thicknesses less than about 400 µm (e.g., less than 200 µm) facilitate the glass to be rollable in diameters less than a few meters, such as less than 1 meter, such as less than 0.5 meters.

Applicants have found that cooling rate differences resulting from air flow differences, turbulence in air flow, as well as radiative cooling or heating differences from surrounding furnace environments or fixturing may produce localized stress differences in the glass as the glass cools to temperatures below the anneal point, which are locked into the glass. Compositional variations may also impact glass viscosity, and these compositional differences may result in different stresses, fictive temperatures, index of refractions, thermal expansions. If the glass is next re-heated to temperatures where the free standing glass could deform, then unconstrained glass warpage may occur. Such reheating may be needed in downstream processing, such as for thin film deposition for example and warping may be undesirable. However, Applicants have found that annealing glasses manufactured via processes disclosed herein, such as by controlled cooling in a multi-zone furnace, or by passage through an annealing furnace subsequent to sintering (opposite the binder burnout system), helps mitigate differences in tension across the article (e.g., sheet) width as the glass is being rolled and/or helps mitigate instances of different stress levels remaining trapped in the glass. Low and uniform stress levels are identified in glass taken from the roll and left free standing. More specifically, absolute stress levels less than 10 MPa with variations across the article (e.g., sheet or tape) less than +/−5 MPa are identified when the tape is freely resting on a flat surface, such as with absolute stress levels less than 5 MPa with variations less than +/−2 MPa, such as with absolute stress fields less than 2 MPa with variations less than +/−1 MPa. Some embodiments of the present disclosure include glass, as described, having a relatively uniform structure in terms of fictive temperature, such as variations less than +/−20° C., such as less than +/−10° C., such as less than +/−5° C. as measured by FTIR across a width of the respective article. Uniform structure in terms of fictive temperature, may influence properties of the glass, such as optical or thermal expansion of the glass, such as where better expansivity may be obtained via uniform lower fictive temperature, for example.

As indicated above, the present technology may be uniquely suited to process thin ribbons or sheets of viscous, high temperature amorphous glasses. Such glasses may have a viscosity of 12.5 poise only at temperatures exceeding 900° C., where at lower temperatures the viscosity is higher than 12.5; such as a viscosity of 13 poise only at temperatures exceeding 900° C., such as only at temperatures exceeding 1000° C., as shown in FIG. 87. In other embodiments, glass (not limited to viscous, high temperature amorphous glasses) may be manufactured to have a granular profile via processes disclosed herein, such as where the sintering temperatures are low enough to leave individual grains or portions thereof, as shown with silica above in FIGS. 79A, 79B, and 80. The granular profile may be useful for light scattering, for example. Still other embodiments may include glasses such as chalcogenide, or glasses that have little or no silica, which may be viscous, high temperature glasses.

Use of slurries for green tape and the sintering system disclosed herein may help make glass with low solid inclusion levels via purification processes and also low seed or low gaseous inclusion levels. For example, liquid filtering of the slurry prior to casting is one such process, such as for example where sub-micron (e.g., 22 m$^2$/g) powder mixed in the solvents may be filtered through different size filters (40 to 200 μm sieves for example) in order to capture larger size solid defects, such as solid oxide debris or organic debris such as hair. Also, debris may be removed via different settling rates in suspensions, such as where higher density agglomerated particles settle faster than dispersed silica and lighter organic impurities rise to the surface. A middle percentage, such as the middle 80%, could then be used to cast. Centrifuges may accelerate the settling or rising process.

Uniform, consistent and filtered slurry that has been thoroughly degased (or de-aired) prior to casting to create a very uniform and consistent tape may help minimize the seed levels. Index matching tapes may also facilitate detection of both seeds and solid inclusions. The binder burn out step described above, to remove organics, may occurs at temperatures less than 700° C., and oxygen at elevated temperatures may help remove final residues of carbon, which could be trapped or react with silica to create gases such as CO or $CO_2$ and SiO.

The particularly thin forms of at least some articles described herein have short permeation paths for gases, which result in very little trapped gases even when air is used. To further minimize trapping of insoluble gases such as argon, nitrogen, and (to a lesser extent) oxygen, consolidation in an air free atmosphere may be used, such as in vacuum and/or vacuum with helium or hydrogen, or atmospheric helium or hydrogen, or mixtures thereof. If the consolidating glass has trapped these gases (helium or hydrogen), then the gases may permeate out of the structure in minutes or seconds at any reasonable temperature greater than 1000° C. and leave behind a vacuum or seed with no gases present. The seed may then collapse from atmospheric pressure combined with capillary stresses at temperatures where glass deformation occur. In most, seed minimization would take place preferably during the consolidation operation, prior to annealing. However, the glass could be reheated to outgas trapped gas, collapsed the seeds, and then annealed. Accordingly, at least some embodiments include glass articles (e.g., rolls, tapes, sheets) with little to no trapped gas, such as less than 5% by volume, such as less than 3% by volume, such as less than 1% by volume.

Some embodiments of the present invention, as disclosed above, may use rollers within the sintering furnace to control tension, speed, deformation, or other attributes of the article (e.g., tape or ribbon) during sintering. According to some embodiments, the rollers rotate at different speeds from one another, such as a function of shrinkage of the respective article. For example, in at least one embodiment the furnace includes at least two rollers, wherein a first roller interfaces with a less sintered portion of the article, and the second roller interfaces with a more sintered portion of the article. The second roller rotates at a slower speed than the first roller. In some such embodiments, rotation of the roller(s) within the furnace correspond to free body sintering rates of the respective article being sintered, or have a slightly greater speed to impart tension in the article, such as to flatten the article or control warp. The rollers may be made from refractory materials. Stationary supports (e.g., furnace floor) may be located between rollers in the furnace. In contemplated embodiments, multiple rows of rollers at different levels within the furnace may be used, such as to increase output and/or control airflow within the furnace. Such rollers may be used with lengths of rigid materials, such as rods or sheets.

Figure 89:
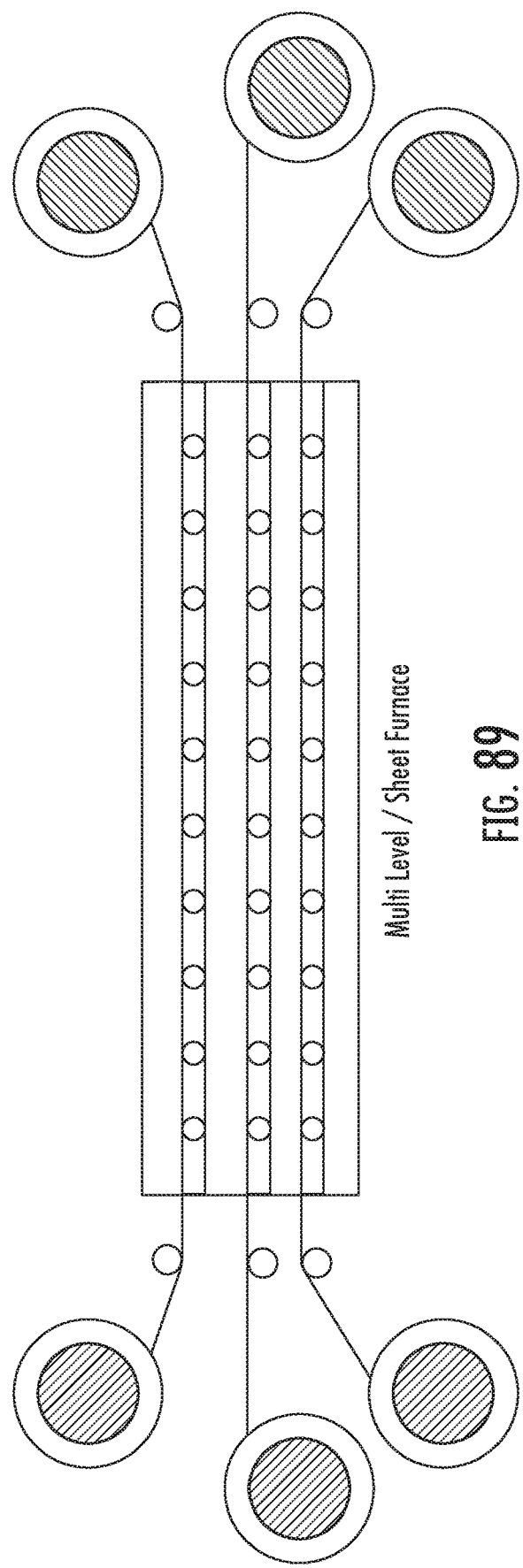
FIG. 89 is a schematic diagraph of a sintering furnace according to another exemplary embodiment.
Figure 90A:
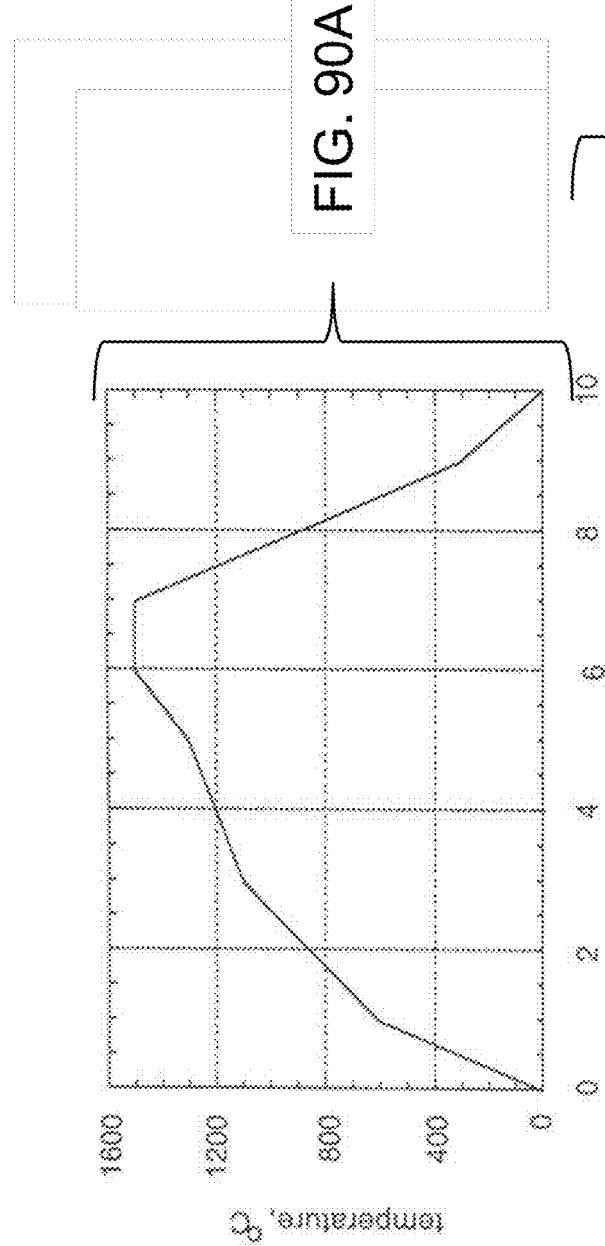
FIG. 90A is a graphical representation of a temperature profile through a sintering furnace according to another exemplary embodiment.
Figure 90B:
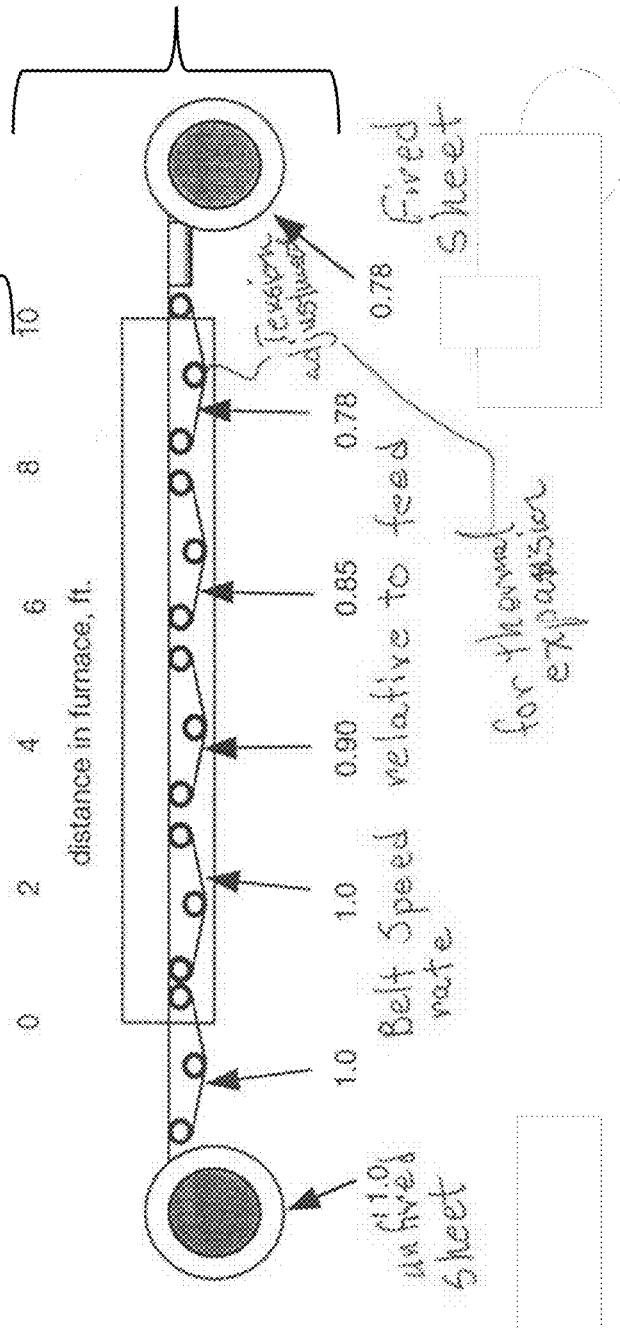
FIG. 90B is a schematic diagraph of the sintering furnace of FIG. 90A.

FIGS. 88A to 88B show an embodiment of such a sintering system. More specifically, FIG. 88A shows a sintering temperature versus distance through the furnace of FIG. 88B for sintering yttria-stabilized zirconia. The article (e.g., ribbon, tape) moves from left to right through the furnace, from a first roll as an unfired sheet (or less sintered tape) to a second roll as a sintered ceramic sheet (or more sintered tape). Through the furnace are rotating surfaces in the form of rollers that rotate with normalized speeds ranging from 1.0 to 0.78, which are a function of the rate of shrinkage of the yttria-stabilized zirconia. FIG. 89 shows a furnace with intermediate rollers, as shown in FIGS. 88A and 88B, but with multiple levels. In some embodiments, a sintering station or other furnace as disclosed herein includes more than one tape or ribbon traversing the furnace at the same time. Referring to FIGS. 90A and 90B, in other contemplated embodiments, moving (e.g., rotating) surfaces within the furnace, other than rollers as disclosed above, include belts, tracks, or other elements. Some embodiments may include only a single belt or loop of tracks.

Figure 91B:
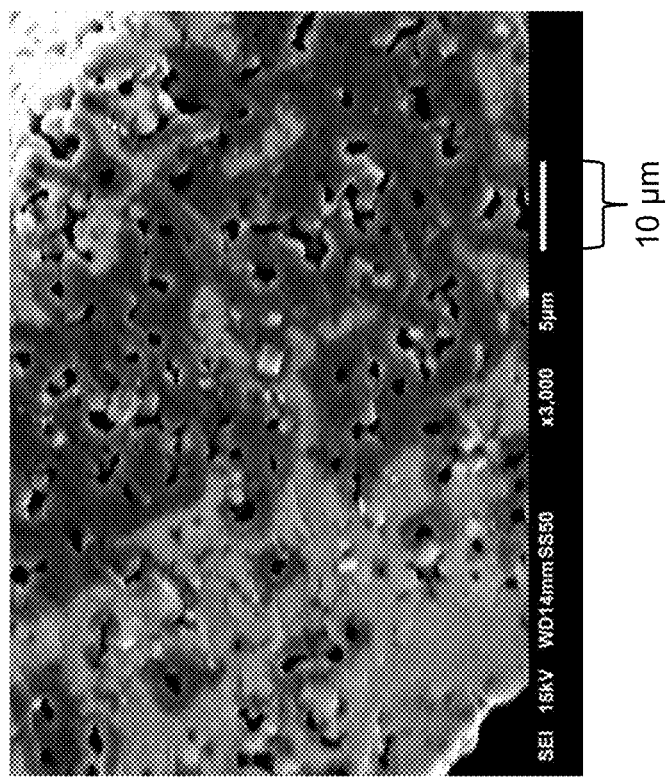
FIGS. 91A and 91B are side perspective views of surfaces of sintered material according to exemplary embodiments.
Figure 91A:
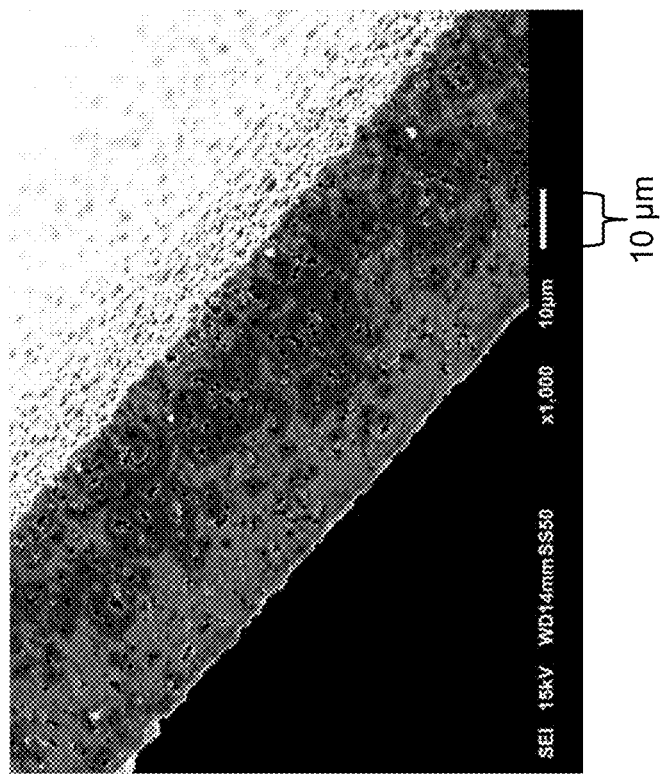

Referring to FIGS. 91A and 91B, an article (e.g., tape as described above, sheet, etc.) comprises a lithium-containing ceramic, specifically sintered $Li_{6.1}La_3Zr_2Al_{0.3}O_{12}$ manufactured using technology disclosed above. An excess lithium source, in the form of 6.7 wt % $Li_2CO_3$, cast at 6 mil in acrylic binder (e.g., produced by Elvacite) was processed in a binder burnout furnace with five heat zones at temperatures of 180, 225, 280, 350, and 425° C., respectively, at a rate of 4 inches per minute. The article was then sintered at 1125° C. The resulting sintered article, as shown in FIGS. 91A and 91B, consisted of greater than 80 percent by weight (wt %) cubic lithium garnet crystals, such as greater than 90 wt %, such as greater than 95 wt %, such as consisted of about 99 wt % cubic lithium garnet crystals, as measured by x-ray diffraction. Traditional approaches of sintering of lithium garnet, such as batch sintering in a sealed crucibles, typically result in higher percentages of non-cubic crystals. The resulting sintered article, as shown in FIGS. 91A and 91B, had an ionic conductivity, as measured by complex impedance analysis of greater than $5 \times 10^{-5}$ S/cm, such as greater than $1 \times 10^{-5}$ S/cm, such as about $1.72 \times 10^{-5}$ S/cm. The resulting sintered article, as shown in FIGS. 91A and 91B, had less than 10 percent by volume (vol %) porosity, such as less than 5 vol %, and/or the corresponding porosity comprised at least some, most, at least 80%, at least 90% closed porosity, meaning that pores were completely sealed off. Applicants believe such characteristics are due to the fast firing, tension control, air flow control, and other technology disclosed herein.

Figure 92:
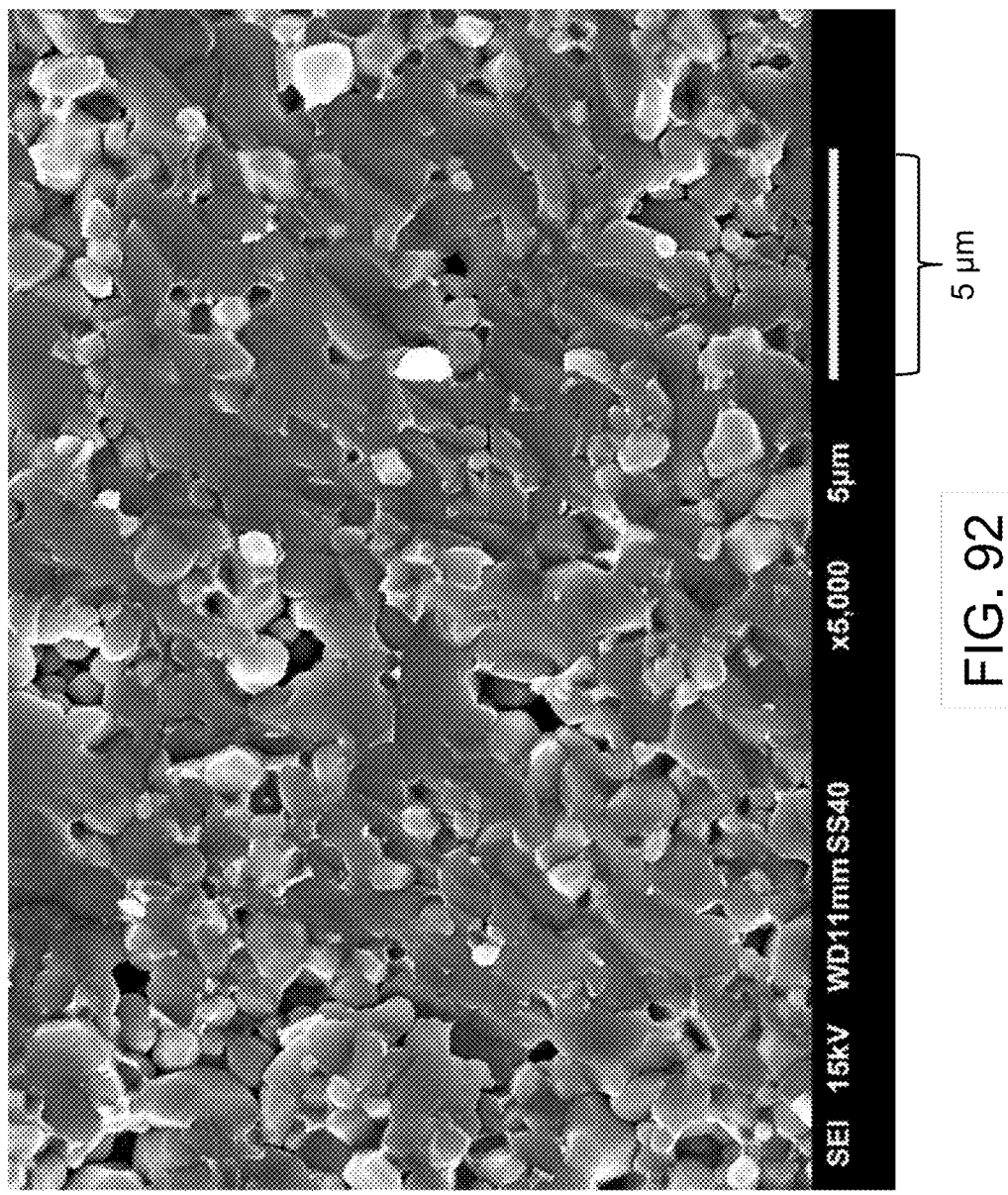
FIG. 92 is a side view of a sintered material according to an exemplary embodiment.

Referring to FIG. 92, an article comprises a lithium-containing ceramic, specifically sintered $Li_{5.39}La_3Zr_{1.7}W_{0.3}Ga_{0.5}O_x$ with "excess" lithium from 10.7 wt % $Li_2CO_3$ cast at 12 mil ("mil" is one thousandth of an inch) in acrylic binder and sintered at 1050° C. with the above-described technology. The image in FIG. 92 is not polished, but shows closed porosity and "pull-out" grains. Applicants have observed that the sintering system of the present disclosure may result smaller grains in sintered lithium-containing ceramic (garnet) when compared to conventional sintering of "pills" in sealed crucibles. For example, some articles of lithium-containing garnet of the present disclosure have a grain size of 5 μm or less, such as 3 μm or less. By "grain size," Applicants are referring to ASTM E-112-13 "Standard Test Methods for Determining Average Grain Size," using the basic linear intercept method, sections 12, 13 and 19 as well as Paragraph A2.3.1, using Equation A2.9 average grain size is 1.5 times average intercept length for a spherical assumption of grain shape. Smaller grain sizes may yield higher strength tapes or other articles, which may be rolled without fracture on diameters of cores disclosed herein. With that said, tapes or other articles of lithium-containing ceramics may be produced using technology disclosed herein with larger grain sizes, such as by starting with larger grains or increasing sintering time.

Figure 93:
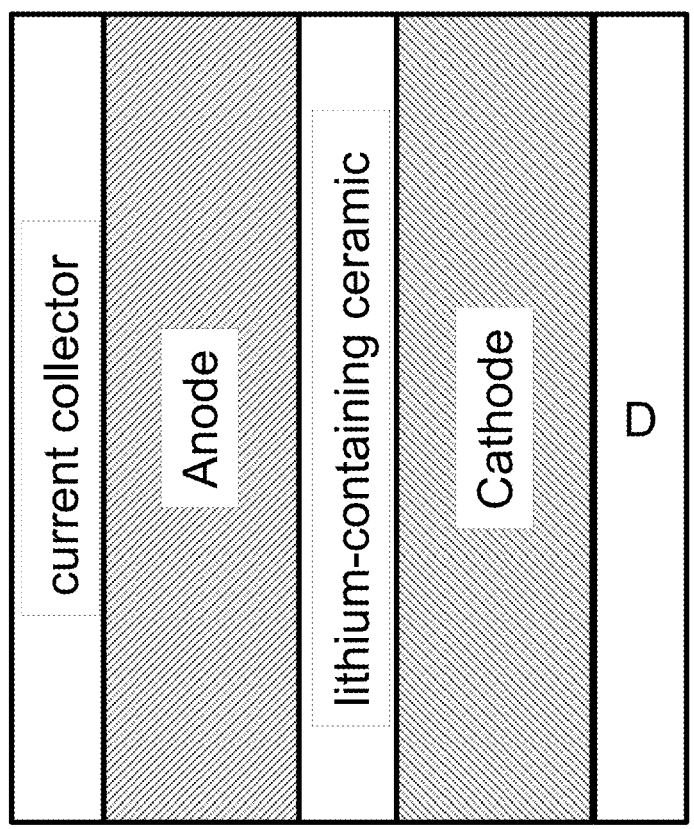
FIG. 93 is a schematic diagraph of electronics in the form of a battery according to an exemplary embodiment.

In some embodiments, a lithium-containing garnet article (e.g., sheet, tape) of the present disclosure may be integrated in electronics, such as a solid state lithium battery as an electrolyte, such as positioned between an anode and cathode, as shown in FIG. 93 for example, with an electrically-conductive metal current collector coupled to (e.g., bonded to, overlaying) the lithium-containing garnet article, such as by way of the anode and/or cathode. In other electronics, such as packaging componentry, a metal layer may be directly bonded to, as in direct contact with, a ceramic article as disclosed above. In contemplated embodiments, the anode and/or the cathode may be tape cast as a green tape and co-fired with the electrolyte, which may improve performance of the electronics by enhancing electrolyte interface(s) with the anode and/or cathode. Accordingly, articles as disclosed herein may comprise layers, with thicknesses described above for each layer (e.g., 100 μm or less per layer) of two or more different inorganic materials as disclosed herein sintered from green tape and directly contacting and overlaying one another and fired as disclosed above, as a thin co-fired tape for example. The lithium-containing garnet in the electronics has closed pores, few defects (as disclosed above), few or no pin holes, ionic conductivity (as disclosed above), and/or small grain size (as disclosed above).

Figure 94:
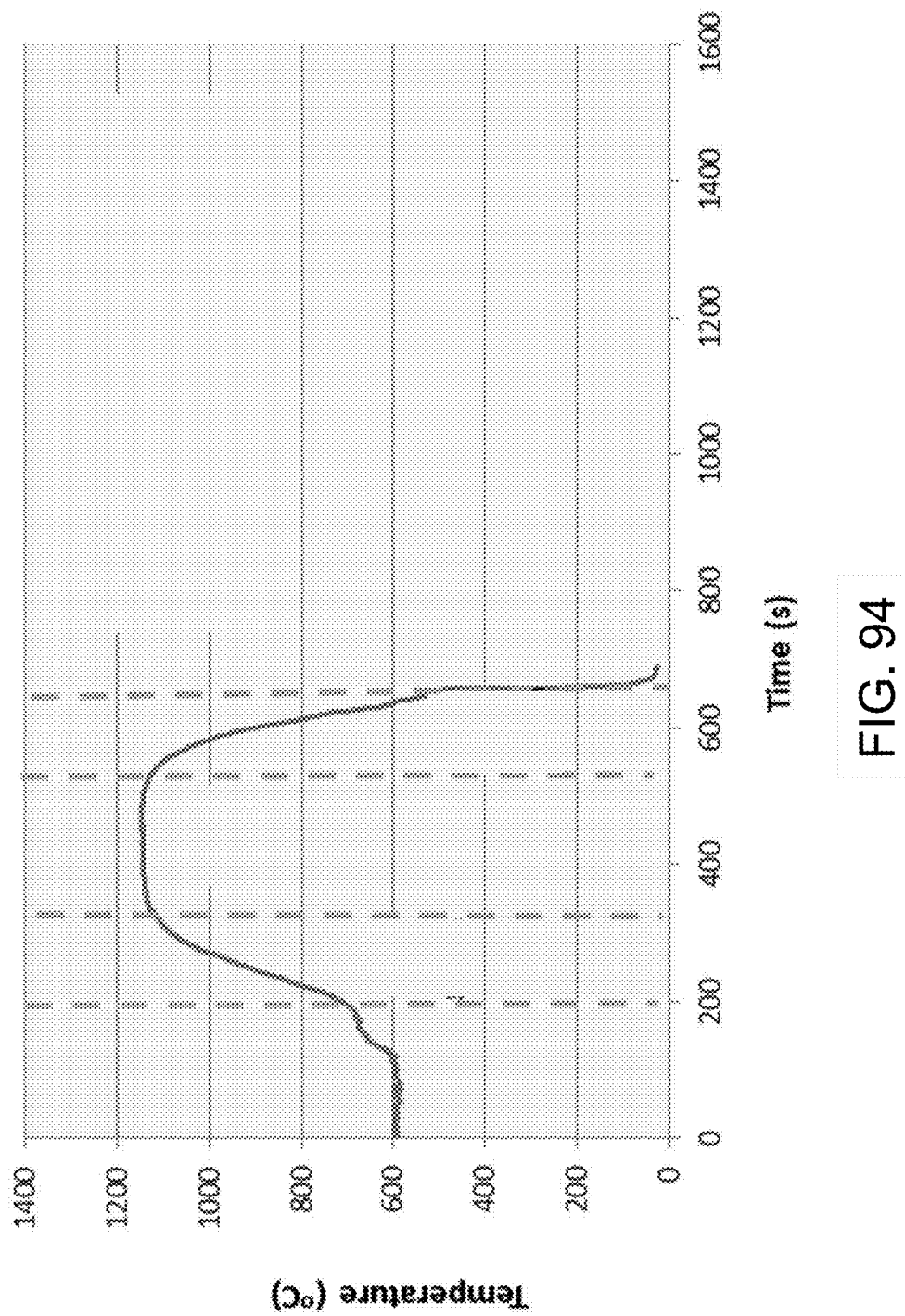
FIGS. 94 and 95 are graphical representations of sintering schedules according to exemplary embodiments.
Figure 95:
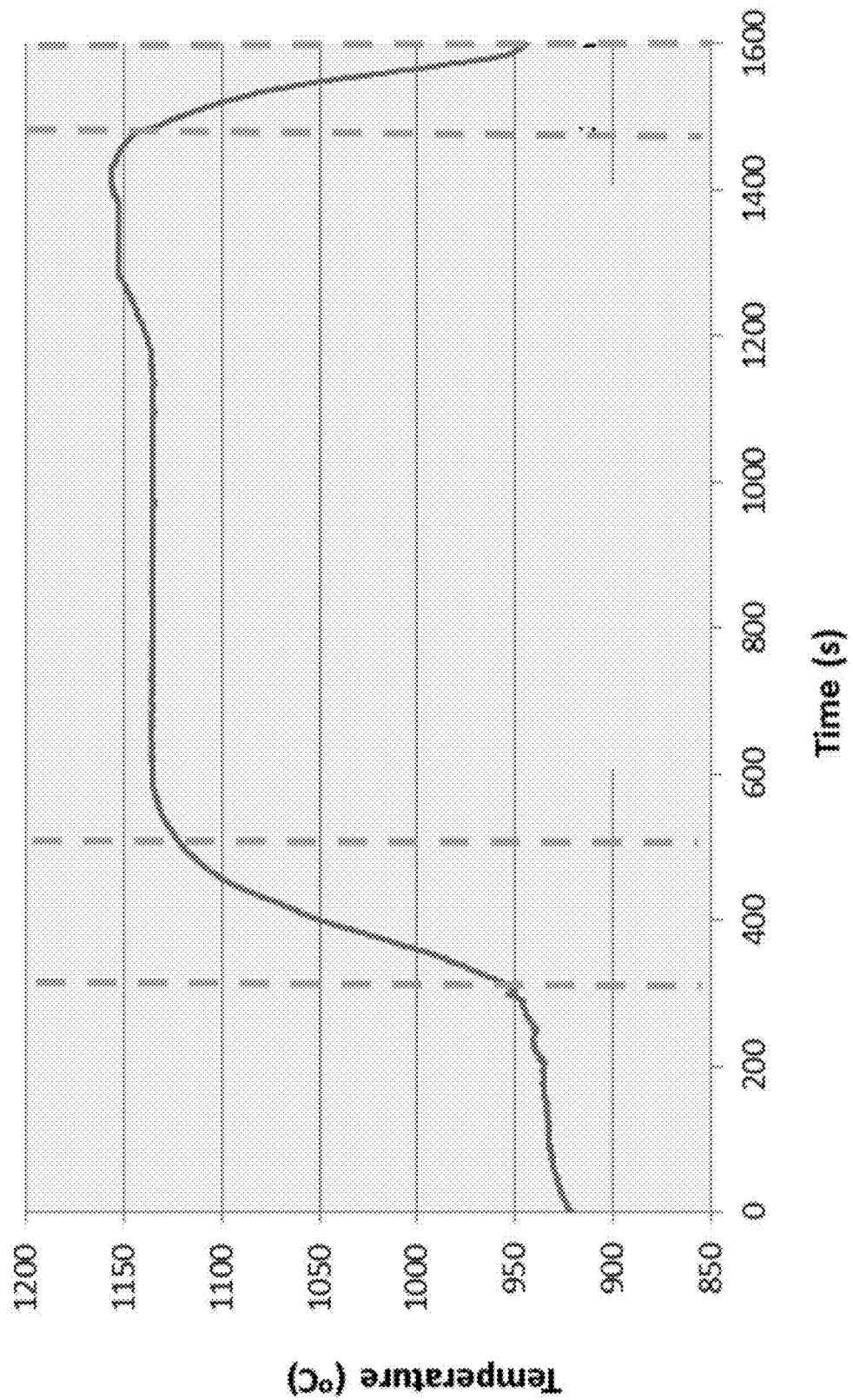

Referring to FIGS. 94 and 95, two example firing cycles for lithium-containing are shown. Such temperature versus time profiles may be implemented by rate of moving articles, as disclosed herein, through the presently disclosed sintering system, and by controlling heat zones within the system to provide such heating. Alternatively, shorter length articles may be moved into and out of furnaces as disclosed herein, and held stationary within such furnaces to control sintering time, for example. As shown in FIGS. 93 and 94, sintering time (i.e. time at temperatures that induce sintering) is relatively short, such as less than 2000 seconds per cycle. In some embodiments, the same article may be sintered in multiple cycles, such as in a first cycle at a first level of tension and first peak temperature, and then in a second cycle of different tension, temperature, and/or time cycle time, which may help control distortion of the article due to shrinkage during sintering.

Applicants have found that use of "excess" volatile constituents (e.g., lithium) in the green material greatly improves resulting ceramic tape. For example, without excess lithium, lithium lost from garnet due to vaporization may result in a second phase material, such as $La_2Zr_2O_7$ "pyrochlore," which may act as an insulator and inhibit sintering. Accordingly, ceramic with pyrochlore may result the material that is highly porous, mechanically weak, and/or has poor conductivity. Put another way, Applicants believe that cubic phase, sintering extent and density (inverse of porosity), strength, and ionic conductivity all decrease as pyrochlore phase increases, such as from lithium loss.

Figure 96:
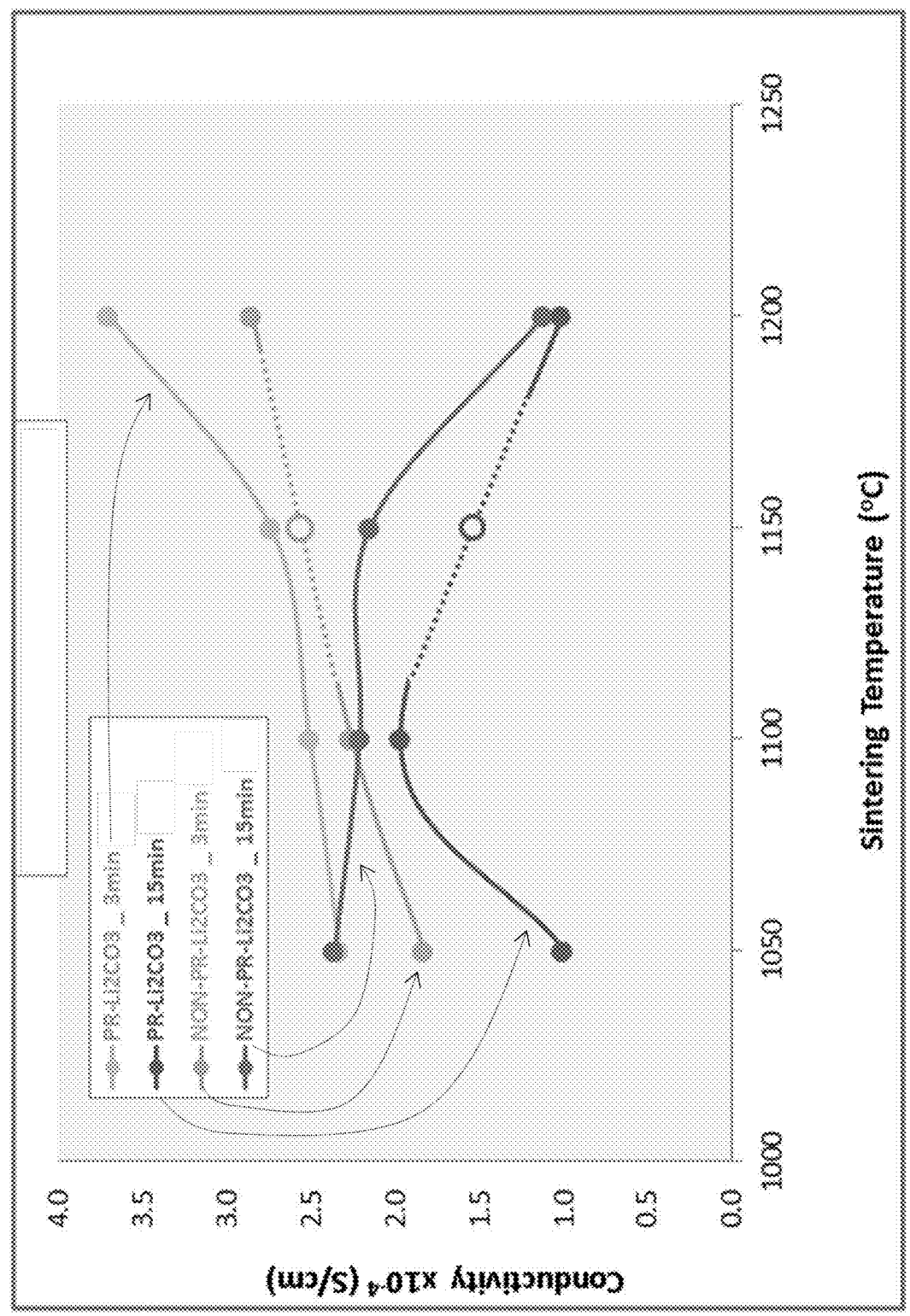
FIG. 96 is a graphical representation of sintering temperature versus ionic conductivity for sintered articles according to exemplary embodiments.
Figure 97:
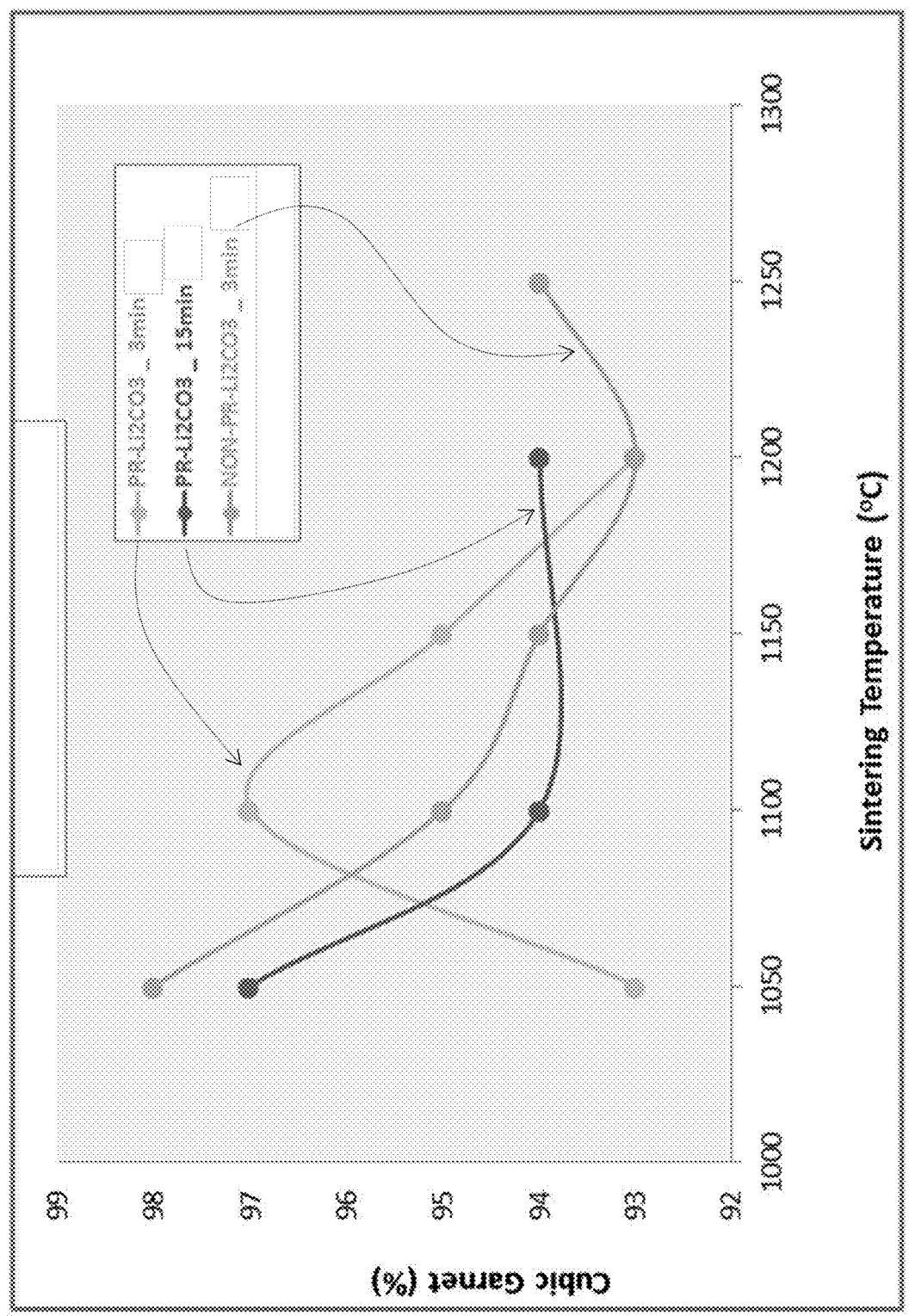
FIG. 97 is a graphical representation of sintering temperature versus percentage of cubic garnet for sintered articles according to exemplary embodiments.

FIGS. 96 and 97 show ionic conductivity (FIG. 96) and weight percentage of cubic garnet for $Li_{5.39}La_3Zr_{1.7}W_{0.3}Ga_{0.5}O_x$ with 10.7 wt % $Li_2CO_3$ as a source of excess lithium, as described above, either pre-reacted ("PR") or not, with a 3 minute sintering time, as shown in FIG. 94, or a 15 minute sintering time, as shown in FIG. 95. The open dots in FIG. 96 are interpolated. Each of the examples in FIG. 96 had ionic conductivity of greater than $5 \times 10^{-5}$ S/cm, and some had greater than $2 \times 10^{-4}$ S/cm, such as greater than $3 \times 10^{-4}$ S/cm. Surprisingly, the shorter sintering times generally resulted in higher ionic conductivity, which may be synergistic in terms of production efficiency. Referring to FIG. 97, each of the examples had greater than 90 wt % cubic garnet, such as greater than 93 wt % cubic garnet, and some had greater than 95 wt %. By comparison, $Li_{6.1}La_3Zr_2Al_{0.3}O_{12}$ with 6.7 wt % $Li_2CO_3$ excess lithium source cast at 6 mil in acrylic binder and sintered at 1030° C. resulted in 33 wt % cubic and $3.84 \times 10^{-6}$ S/cm conductivity.

Figure 99:
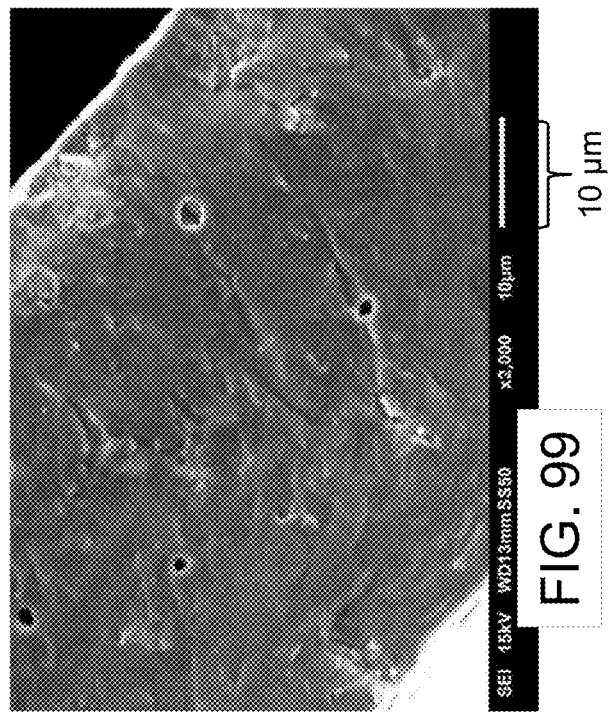
FIGS. 98 and 99 are side perspective views of surfaces of sintered material according to exemplary embodiments.
Figure 98:
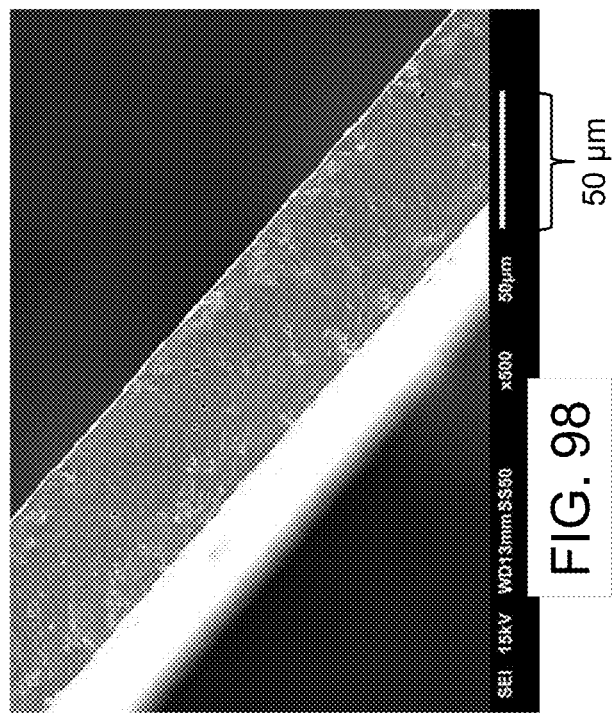

In other examples, $Li_{6.5}La_3Zr_{1.5}Ta_{0.5}O_{12}$ with 11.98 wt % $Li_2CO_3$ added in the slip of the tape cast, cast with 10 mil blade, had binder burned off in an argon atmosphere, and then was sintered using the technology disclosed herein for 15 or 8 minutes in air. FIGS. 85A and 85B show a green tape of $Li_{6.5}La_3Zr_{1.5}Ta_{0.5}O_{12}$ with 11.98 wt % $Li_2CO_3$, where the unfired median particle size ($D_{50}$) about 0.60 micrometers, the tape thickness was about 85 to 88 micrometers, and the slip was about 18 vol % solid. FIGS. 98 and 99 show micrographs of a corresponding sintered tape after 15 minutes sintering at about 1200° C. The sintered tape of FIGS. 98 and 99 is about 54 micrometers thick due to about 37 to 38% shrinkage. As can be seen in FIG. 99, the tape includes some closed pores but no pin holes. FIGS. 100A and 100B show micrographs of a first major surface of the sintered tape of FIGS. 98 and 99, and FIGS. 101A and 101B show the second major surface. The surfaces have a granular profile. Grain size is between about 1 to 5 micrometers, on average, with some grains as large as about 10 micrometers. Ionic conductivity was measured to be $3.83 \times 10^{-4}$ S/cm using standard complex impedance analysis. Phase quantification showed 96 wt % cubic garnet. For a similar sample instead sintered for 8 minutes, about 100 wt % cubic garnet. In another $Li_{6.5}La_3Zr_{1.5}Ta_{0.5}O_{12}$ sample, with instead 6.7% excess $Li_2CO_3$ added and sintered at 1150° C. for 3 minutes, conductivity was about $1.18 \times 10^{-4}$ S/cm. Some lithium-containing ceramics included silicone added to the green tape that became silica in the sintered article, which Applicants believe may strengthen the sintered article, such as 2 wt % M97E Silicone (SILRES®) added to the MAA with 10.7 wt % $Li_2CO_3$, and sintered at 1050° C. for 3 minutes, resulting in $2.38 \times 10^{-4}$ S/cm conductivity. When sintered at 1100° C. for 3 minutes, the same material combination had $2.59 \times 10^{-4}$ S/cm conductivity. In another example 7 wt % of LiOH excess lithium source was added to MAA and sintered at 1200° for 3 minutes, resulting in $1.97 \times 10^{-4}$ S/cm conductivity.

As indicated above, the present technology (e.g., binder burn-off, sintering station with multi-heat zones and air flow control, tension control, etc.) may be used to sinter green material (tape or other articles) to have the structures, geometries, and properties/attributes disclosed herein, such as green material that includes an organic binder (e.g., polyvinyl butyral, dibutyl phthalate, polyalkyl carbonate, acrylic polymers, polyesters, silicones, etc.) supporting particles of inorganic material, such as polycrystalline ceramic, synthetic mineral, viscous glasses that may be hard to otherwise process into a thin tape or ribbon structure for roll-to-roll manufacturing, or other inorganic materials (e.g., metals, less viscous glasses). For example, the inorganic materials include zirconia (e.g., yttria-stabilized zirconia, nickel-yttria stabilized zirconia cermet, NiO/YSZ), alumina, spinel (e.g., $MgAl_2O_4$, zinc ferrite, NiZn spinel ferrite, or other minerals that may crystallize as cubic and include the formulation of $A_{2+}B_2^{3+}O_4^{2-}$, where A and B are cations and may be magnesium, zinc, aluminum, chromium, titanium, silicon, and where oxygen is the anion except for chalcogenides, such as thiospinel), silicate minerals such as garnet (e.g., lithium garnet or lithium-containing garnet, of formula $X_3Z_2(TO_4)_3$ where X is Ca, Fe, etc., Z is Al, Cr, etc., T is Si, As, V, Fe, Al), lithium lanthanum zirconium oxide (LLZO), cordierite, mullite, perovskite (e.g., porous perovskite-structured ceramics), pyrochlore, silicon carbide, silicon nitride, boron carbide, sodium bismuth titanate, barium titanate (e.g., doped barium titanate), magnesium titanium oxide, barium neodymium titanate, titanium diboride, silicon alumina nitride, aluminum nitride, silicon nitride, aluminum oxynitride, reactive cerammed glass-ceramic (a glass ceramic formed by a combination of chemical reaction and devitrification, which includes an in situ reaction between a glass frit and a reactant powder(s)), silica, doped silica, ferrite (e.g., NiCuZnFeO ferrite, BaCO ferrite), lithium-containing ceramic, including lithium manganate, lithium oxide, viscous glasses as discussed above, such as high-melting temperature glasses, glasses with a Tg greater than 1000° C. at standard atmospheric pressure, high purity fused silica, silica with an $SiO_2$ content of at least 99% by volume, silica comprising a granular profile, a silica tape without a repeating pattern of waves or stria extending across a width of the tape, iron sulfide, piezoelectric ceramic, potassium niobate, silicon carbide, sapphire, yttria, cermet, steatite, forsterite, lithium-containing ceramics (e.g., gamma-$LiAlO_2$), transition metal oxide (e.g., lithium manganite, which may also be a spinel, ferrite), materials with volatile constituents as described above (e.g., lithium manganite (again)) lead oxide, garnets, alkali-containing materials, sodium oxide, glass-ceramic particles (e.g. LAS lithium aluminosilicates), and other inorganic materials as disclosed herein or otherwise.

In contemplated embodiments, inorganic binders like colloidal silica, alumina, zirconia, and hydrates thereof may be used in place of or in combination with organic binders as disclosed herein, such as to strengthen the tape. Applicants have found that stronger tape makes the sintering process more robust in terms of stability and access to a wider process space, such as greater tension. In some embodiments, a green material (e.g., green tape) as used herein, includes an inorganic binder. For example, a source of tape material may comprise a green tape and a carrier web supporting the green tape, the green tape comprising grains of inorganic material and an inorganic binder in an organic binder. In some embodiments, inorganic particles, such as inorganic binder includes particles of about 5 nm to about 100 micrometers in $D_{50}$ particle size.

In contemplated embodiments, materials, such as ceramics disclosed herein, may be fired to have a high degree of porosity, such as greater than 20% by volume, such as greater than 50%, such as greater than 70%, and/or such materials may then be filled with a polymeric filler. Use of partially sintered inorganic material, as disclosed herein may have advantages over loose inorganic material in a composite because the partially sintered inorganic material may serve as a rigid skeleton to hold shape of the composite at high temperatures where the polymeric filler softens. Accordingly, some embodiments include a composite tape having dimensions disclosed above, of partially sintered ceramic, where (at least some, most, almost all) particles are the ceramic are sintered to one another and/or where porosity of the ceramic is at least partially, mostly, or fully filled with a polymer filler.

Figure 102:
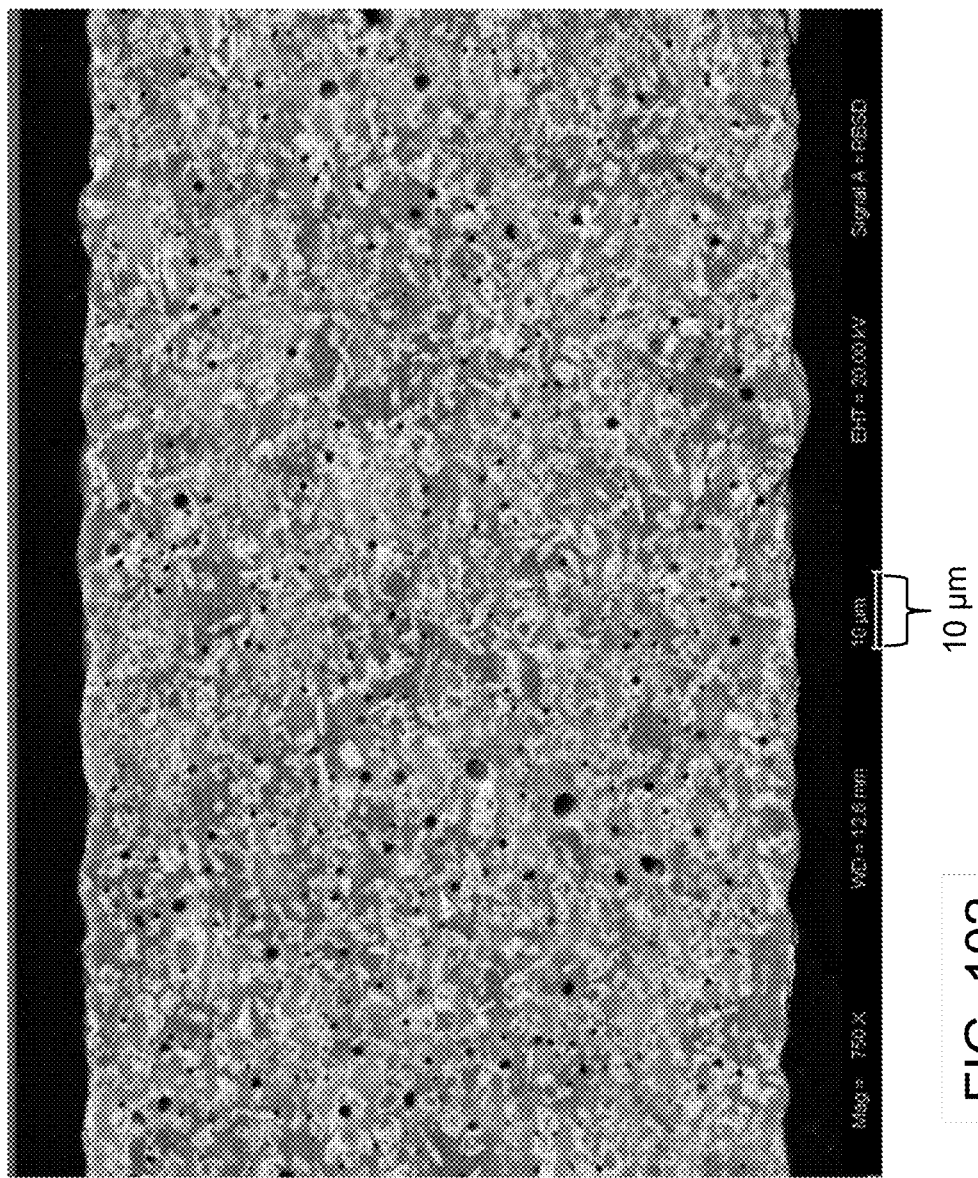
FIG. 102 is a side view of a sintered material according to an exemplary embodiment.

As indicated above, in some embodiments different inorganic materials may be co-fired using technology disclosed herein, such as discrete layers of the different inorganic materials (e.g., anode plus electrolyte of solid state battery), or in other arrangements, such as an evenly distributed mixture of two or more inorganic materials co-fired, such as to influence thermal expansion, strength, or other characteristics of the resulting article. In some embodiments, glass and ceramic may be co-fired, such as where a glass phase is mixed with particles of ceramic. For example, FIG. 102 shows low-temperature co-fired ceramic tape (glass and alumina) sintered at 1000° C. using a sintering station comprising an air bearing such that the tape was sintered without direct contact with walls/floors in the furnace.

Some embodiments of the present disclosure include an article (e.g., sheet, tape or ribbon), such as of inorganic material, such as ceramic, such as alumina or zirconia, with a granular profile and a layer (or coating) overlaying the granular profile to reduce roughness of the granular profile, such as on one or more major surfaces of the article. The layer may be applied in a liquid form through spin coating, slot die coating, spray coating, dip coating, or other processes. In some embodiments, the layer may be amorphous and inorganic, such as glass or converted into solid glass upon thermal annealing or curing. In some such embodiments, the layer is mostly silicon and oxygen, such as with some phosphorous, boron, carbon, nitrogen or other constituents. The layer may also include oxides of Ti, Hf, and/or Al. Such a layer may be applied and cured as part of the same manufacturing line as the binder burnout and sintering, and the resulting article (e.g., tape) may be rolled and include the layer when rolled. In some embodiments, the layer is annealed at temperatures of 850° C. or higher and is very thin, such as a positive thickness less than a micrometer, such as less than 560 nm. In some embodiments, roughness of the layer is less than half that of the granular profile, such as less than a third. In some embodiments, roughness of the layer is less than 15 nm, such as about 5 nm average roughness (Ra or Rq) over a distance of 1 cm along a single axis.

In yttrium-stabilized zirconia and alumina articles were laser cut into 30×30 mm squares and coated by spin-on-glass, spin coating techniques. A pure silica solution (Desert Silicon NDG series) was tested along with a lightly doped ($10^{21}$ atoms/cm$^3$) phosphorous-doped silica solution (Desert Silicon P-210). The solution was applied in a liquid form, and upon curing solidified. A final anneal densified the glass film. The solutions were applied using spin coating. Samples were then cured either in a hot plate at temperatures between 150° C. and 200° C. or in a vacuum oven with temperatures between 170° C. and 250° C. After the initial cure, samples were annealed in nitrogen atmosphere at temperatures between 850° C. and 1000° C. One-inch square silicon pieces were processed in parallel to the ceramic pieces to provide "witness" samples, used to accurately measure the glass film thickness using optical ellipsometer.

In one example a sheet of 40 μm thick alumina was coated with phosphorous-doped silica (Desert Silicon P210) by spinning at 1500 revolutions per minute (rpm) for 60 seconds, with 133 rpm/second acceleration, resulting in a coating of about 320 nm thick, 15.3 nm Ra, 12.1 nm Rq, 130 nm $Z_{max}$ on one side and 25.9 nm Ra, 20 nm Rq, and 197 nm $Z_{max}$ on the other, where the coated layer had good film quality after furnace anneal at 850° C., with no cracking. In another example a sheet of 40 μm thick alumina was coated with non-doped silica (Desert Silicon NDG-2000) by spinning at 1500 revolutions per minute (rpm) for 60 seconds, with 133 rpm/second acceleration, resulting in a coating of about 444 nm thick, 11 nm Ra, 8.8 nm Rq, 79.4 nm $Z_{max}$ on one side and 22.6 nm Ra, 17 nm Rq, and 175 nm $Z_{max}$ on the other, again where the coated layer had good film quality after furnace anneal at 850° C., with no cracking. By contrast, in another example a sheet of 40 μm thick alumina was coated with non-doped silica (Desert Silicon P210) by spinning at 4000 revolutions per minute (rpm) for 60 seconds, with 399 rpm/second acceleration, resulting in a coating of about 946 nm thick, 5.1 nm Ra, 6.5 nm Rq, 48 nm $Z_{max}$ on one side and 10.8 nm Ra, 14 nm Rq, and 89 nm $Z_{max}$ on the other, where the coated layer had pronounced cracking after furnace anneal at 850° C.

Figure 103:
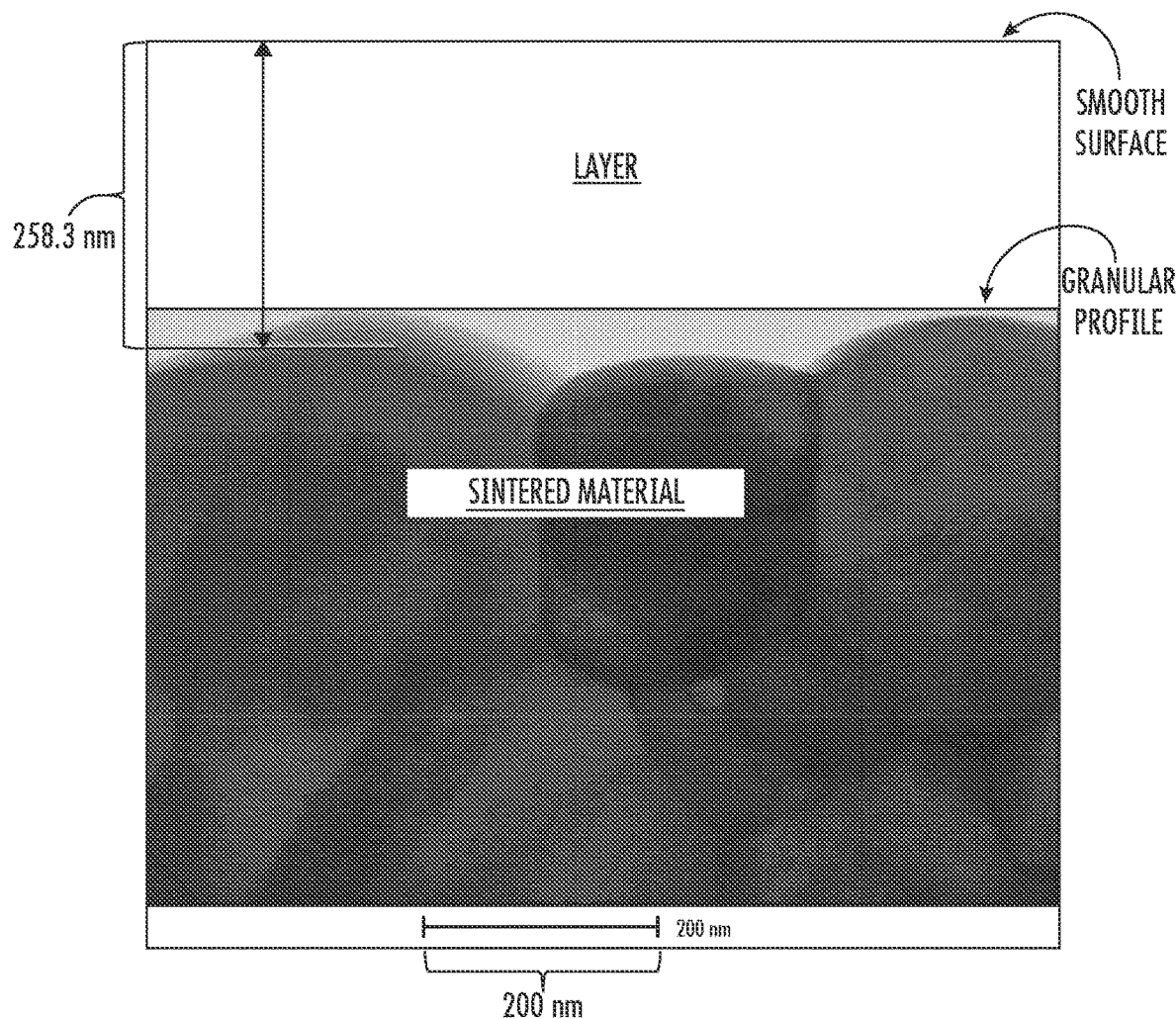
FIG. 103 is a digital image of a sintered material with a layer providing a smooth surface according to an exemplary embodiment.

In one example a sheet of 40 μm thick yttria-stabilized zirconia was coated with non-doped silica (Desert Silicon NDG-2000) by spinning at 2000 revolutions per minute (rpm) for 60 seconds, with 1995 rpm/second acceleration, resulting in a coating of about 258 nm thick, 5.9 nm Ra, 4.7 nm Rq, 92 nm $Z_{max}$ on one side, where the coated layer had good film quality after furnace anneal at 1000° C. for 60 minutes, with no cracking. In another example a sheet of 40 μm thick yttria-stabilized zirconia was coated with phosphorous-doped silica (Desert Silicon P210) by spinning at 1500 revolutions per minute (rpm) for 60 seconds, with 133 rpm/second acceleration, resulting in a coating of about 320 nm thick, 8.9 nm Ra, 11.7 nm Rq, 135 nm $Z_{max}$ on one side, again where the coated layer had good film quality after furnace anneal at 850° C. for 30 minutes, with no cracking. By contrast, in another example a sheet of 40 μm thick yttria-stabilized zirconia was coated with non-doped silica (Desert Silicon P210) by spinning at 1500 revolutions per minute (rpm) for 60 seconds, with 133 rpm/second acceleration, resulting in a coating of about 444 nm thick, 7.7 nm Ra, 9.5 nm Rq, 75 nm $Z_{max}$ on one side, where the coated layer had some cracking after furnace anneal at 850° C. Surface morphology of the samples was measured using Atomic-Force-Microscopy on a 10 micron field of view. FIG. 103, for example, shows an electron microscope image of pure silica (Desert Silicon NDG-2000) coated yttria-stabilized zirconia. The layer of silica is about 250 nm thick. Such layers may improve dielectric properties of the tape, and/or serve as a barrier layer to prevent transmission of impurities to/from the underlying material. For example, such layers may be used with LEDs, as disclosed above, or other electronics and packaging, and/or may be applied to sintered tape and rolled as a roll of the tape, as disclosed herein. In other contemplated embodiments, the layer may be another inorganic material, or a polymeric material, such as for different uses.

Aspects of the present disclosure relate to a sintered article that comprises (1) a first major surface, (2) a second major surface opposing the first major surface, and (3) a body extending between the first and second surfaces, where the body comprises a sintered inorganic material, where the body has a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width, and where the width is about 5 mm or greater, the thickness is in a range from about 3 μm to about 1 mm, and the length is about 300 cm or greater. This sintered article may be such that the inorganic material comprises an interface having a major interface dimension of less than about 1 mm, where the interface comprises either one of or both a chemical inhomogeneity and crystal structure inhomogeneity, and optionally where the inorganic material comprises a ceramic material or a glass ceramic material and/or where the inorganic material comprises any one of a piezoelectric material, a thermoelectric material, a pyroelectric material, a variable resistance material, or an optoelectric material. In some such embodiments, the inorganic material comprises one of zirconia, alumina, spinel, garnet, lithium lanthanum zirconium oxide (LLZO), cordierite, mullite, perovskite, pyrochlore, silicon carbide, silicon nitride, boron carbide, sodium bismuth titanate, barium titanate, titanium diboride, silicon alumina nitride, aluminum oxynitride, or a reactive cerammed glass-ceramic. In any one of the above sintered articles, the sintered article may comprise at least ten square centimeters of area along the length that has a composition where at least one constituent of the composition varies by less than about 3 weight %, across the area; and/or where the sintered article comprises at least ten square centimeters of area along the length that has a crystalline structure with at least one phase having a weight percent that varies by less than about 5 percentage points, across the area; and/or where the sintered article comprises at least ten square centimeters of area along the length that has a porosity that varies by less than about 20%; and/or where one or both the first major surface and the second major surface has a granular profile comprising grains with a height in a range from 25 nm to 150 µm relative to recessed portions of the respective surface at boundaries between the grains; and/or where one or both the first major surface and the second major surface has a flatness in the range of 100 nm to 50 µm over a distance of one centimeter along the length or the width; and/or where one of or both the first major surface and the second major surface comprises at least ten square centimeters of area having fewer than one hundred surface defects from adhesion or abrasion with a dimension greater than 5 µm, such as optionally where the other of the first major surface and the second major surface comprises surface defects from adhesion or abrasions with a dimension of greater than 5 µm; and/or further comprising a striated profile along the width dimensions, wherein the thickness is within a range from about 0.9t to about 1.1t, such as where the striated profile comprises 2 or more undulations along the width and/or where the striated profile comprises less than 20 undulations along the width.

Aspects of the present disclosure relate to a sintered article, comprising (1) a first major surface, (2) a second major surface opposing the first major surface, and (3) a body extending between the first and second surfaces, the body comprising a sintered inorganic material, where the body has a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width, and where (at least) a portion of the sintered article is flattenable. In some such sintered articles, the article, when flattened, exhibits a maximum in plane stress (the absolute value of stress, as measured by the thin plate bend bending equation) of less than or equal to 25% of the bend strength (measured by 2-point bend strength) of the article; and/or the article, when flattened, exhibits a maximum in plane stress (the absolute value of stress, as measured by the thin plate bend bending equation) of less than or equal to 1% of the Young's modulus of the article. In some such embodiments, where the article has a thickness of about 80 µm and a bend radius of greater than 0.03 m, the article exhibits a maximum in plane stress (the absolute value of stress, as measured by the thin plate bend bending equation) of less than or equal to 25% of the bend strength (measured by 2-point bend strength) of the article; or where the article has a thickness of about 40 µm and a bend radius of greater than 0.015 m, the article exhibits a maximum in plane stress (the absolute value of stress, as measured by the thin plate bend bending equation) of less than or equal to 25% of the bend strength (measured by 2-point bend strength) of the article; or where the article has a thickness of about 20 µm and a bend radius of greater than 0.0075 m, the article exhibits a maximum in plane stress (the absolute value of stress, as measured by the thin plate bend bending equation) of less than or equal to 25% of the bend strength (measured by 2-point bend strength) of the article. In some such embodiments, the width of the sintered article is about 5 mm or greater, the thickness is in a range from about 3 µm to about 1 mm, and the length is about 300 cm or greater, and/or the portion of the sintered article that is flattenable comprises a length of about 10 cm. In some such embodiments, one or both the first major surface and the second major surface has a flatness in the range of 100 nm to 50 µm over a distance of one centimeter along the length or the width. In some such embodiments, the inorganic material comprises a ceramic material or a glass ceramic material; the inorganic material comprises any one of a piezoelectric material, a thermoelectric material, a pyroelectric material, a variable resistance material, or an optoelectric material; and/or the inorganic material comprises one of zirconia, alumina, spinel, garnet, lithium lanthanum zirconium oxide (LLZO), cordierite, mullite, perovskite, pyrochlore, silicon carbide, silicon nitride, boron carbide, sodium bismuth titanate, barium titanate, titanium diboride, silicon alumina nitride, aluminum oxynitride, or a reactive cerammed glass-ceramic. In some such embodiments, the sintered article comprises at least ten square centimeters of area along the length that has a composition where at least one constituent of the composition varies by less than about 3 weight %, across the area; and/or the sintered article comprises at least ten square centimeters of area along the length that has a crystalline structure with at least one phase having a weight percent that varies by less than about 5 percentage points, across the area; and/or the sintered article comprises at least 10 square centimeters of area along the length that has a porosity varies by less than about 20%, across the area; and/or one or both the first major surface and the second major surface has a granular profile comprising grains with a height in a range from 25 nm to 150 µm relative to recessed portions of the respective surface at boundaries between the grains; and/or one or both the first major surface and the second major surface has a flatness in the range of 100 nm to 50 µm over a distance of one centimeter along the length or the width; and/or one of or both the first major surface and the second major surface comprises have at least ten square centimeters of area having fewer than one hundred surface defects from adhesion or abrasion with a dimension greater than 5 µm, such as where the other of the first major surface and the second major surface comprises surface defects from adhesion or abrasions with a dimension of greater than 5 µm; and/or the sintered article further comprising a striated profile along the width dimensions, wherein the thickness is within a range from about 0.9t to about 1.1t, such as where the striated profile comprises 2 or more undulations along the width; and/or the article comprises a saddle shape; and/or the article comprises a c-shape having a concave shape along the length.

Aspects of the present disclosure relate to a rolled sintered article comprising (1) a core having a diameter of less than 60 cm and (2) a continuous sintered article wound around the core, the continuous sintered article comprising (2a) a first major surface, (2b) a second major surface opposing the first major surface, (2c) a body extending between the first and second surfaces, the body comprising a sintered inorganic material, where the body has a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width, and where the width is about 5 mm or greater, the thickness is in a range from about 3 µm to about 1 mm, and the length is about 30 cm or greater. In some such embodiments, the continuous sintered article is disposed on an interlayer support material, and the continuous sintered article and interlayer support material are wound around the core such that each successive wrap of the continuous sintered article is separated from one another by the interlayer support material, such as where the interlayer support material comprises a first major surface and a second major surface opposing the first major surface, an interlayer thickness (t) defined as a distance between the first major surface and the second major surface, an interlayer width defined as a first dimension of one of the first or second surfaces orthogonal to the interlayer thickness, and an interlayer length defined as a second dimension of one of the first or second major surfaces orthogonal to both the interlayer thickness and the interlayer width of the interlayer support material, and where the interlayer thickness is greater than the thickness of the sintered article and/or where the inlayer comprises a tension that is greater than a tension on the continuous sintered article, as measured by a load cell, and/or where the rolled article comprises a diameter and a side wall width that are substantially constant, and/or where the core comprises a circumference and a core centerline along the circumference, where the continuous sintered article comprises an article centerline along a direction of the length, and where distance between the core centerline and the article centerline is 2.5 mm or less, along the length of the continuous sintered article, and/or where the interlayer support material is compliant, and/or where the interlayer width is greater than the width of the continuous sintered article, and/or where the interlayer support material comprises any one or both a polymer and a paper, such as where the polymer comprises a foamed polymer, such as where the foamed polymer is closed cell.

Aspects of the present disclosure relate to a plurality of sintered articles each comprising (1) a first major surface, (2) a second major surface opposing the first major surface, and (3) a body extending between the first and second surfaces, the body comprising a sintered inorganic material, where the body has a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width, and where each of the plurality of sintered articles is flattenable. In some such embodiments, each article, when flattened, exhibits a maximum in plane stress (the absolute value of stress, as measured by the thin plate bend bending equation) of less than or equal to 25% of the bend strength (measured by 2-point bend strength) of the article; and/or each article, when flattened, exhibits a maximum in plane stress (the absolute value of stress, as measured by the thin plate bend bending equation) of less than or equal to 1% of the Young's modulus of the article. In some such embodiments, where each article has a thickness of about 80 µm and a bend radius of greater than 0.03 m, the article exhibits a maximum in plane stress (the absolute value of stress, as measured by the thin plate bend bending equation) of less than or equal to 25% of the bend strength (measured by 2-point bend strength) of the article; and/or where each article has a thickness of about 40 µm and a bend radius of greater than 0.015 m, the article exhibits a maximum in plane stress (the absolute value of stress, as measured by the thin plate bend bending equation) of less than or equal to 25% of the bend strength (measured by 2-point bend strength) of the article; and/or where the article has a thickness of about 20 µm and a bend radius of greater than 0.0075 m, the article exhibits a maximum in plane stress (the absolute value of stress, as measured by the thin plate bend bending equation) of less than or equal to 25% of the bend strength (measured by 2-point bend strength) of the article. In some such embodiments, the thickness of the plurality of sintered articles is within a range from about 0.7t to about 1.3t; and/or at least 50% of the sintered articles comprises an area and a composition, where at least one constituent of the composition varies by less than about 3 weight % across the area; and/or at least 50% the sintered articles comprise an area and a crystalline structure with at least one phase having a weight percent that varies by less than about 5 percentage points across the area; and/or at least 50% of the sintered articles comprise an area and a porosity that varies by less than about 20% across the area.

Aspects of the present disclosure relate to a separation system for separating two materials, where the separation system comprises a source of a continuous tape material comprising a green tape material and a carrier web supporting the green tape material; a vacuum drum positioned in proximity to the source of a continuous tape material and configured to receive and convey the continuous material from the source to a peeler, where the vacuum drum comprises a plurality of vacuum holes for facilitating applying tension by the separation system to the carrier web that is greater than a tension applied to the green tape material, as the continuous roll is conveyed to the peeler; and a peeler for directing the carrier web in a rewind direction and directing the green tape material in a downstream processing direction that differs from the rewind direction. In some such embodiments, the source of continuous tape material comprises a spool or a belt comprising the continuous material wound thereon. In some embodiments, the rewind and downstream processing directions form an angle therebetween that is greater than about 90 degrees. In at least some of such embodiments, the separation system applies essentially no tension to the green tape material (excluding weight of the green tape itself). In at least some of such embodiments, the tension applied to the carrier web at least 2 times greater than the tension applied to the green tape material. In at least some of such embodiments, the peeler comprises a tip that separates the carrier web from the green tape material before directing the carrier web in a rewind direction and directing the green tape material in a downstream processing direction that differs from the rewind direction. In at least some of such embodiments, the peeler comprises a tip that separates the carrier web from the green tape material simultaneously with directing the carrier web in a rewind direction and directing the green tape material in a downstream processing direction that differs from the rewind direction, where the tip may comprise a radius of about 0.05 inches or less. In at least some of such embodiments, the separation system further comprises a furnace for sintering the green tape material, an uptake reel for spooling the carrier web, and/or a load controller for maintaining the tension on the carrier web.

Other aspects of the present disclosure include a separation system for separating two materials, which comprises a source of a continuous tape material comprising a green tape material disposed on a carrier web, the carrier web comprising a first tension; a tension isolator positioned in proximity to the source configured to apply a second tension to carrier web that is greater than the first tension when conveying the continuous material to a peeler; and a peeler for directing the carrier web in a rewind direction and directing the green tape material in a downstream processing direction that differs from the rewind direction. In at least some of such embodiments (any one or more of the above embodiments), the source comprises a spool or a belt comprising the continuous material. In at least some of such embodiments, the rewind direction and the downstream processing direction form an angle that is greater than about 90 degrees. In at least some of such embodiments, the second tension is about 2.5 pounds per linear inch of width or less. In at least some of such embodiments, the first tension is equal to or less than about 50% of the second tension. In at least some of such embodiments, the peeler comprises a tip that separates the carrier web from the green tape material before directing the carrier web in a rewind direction and directing the green tape material in a downstream processing direction that differs from the rewind direction; and/or the tip that separates the carrier web from the green tape material simultaneously with directing the carrier web in a rewind direction and directing the green tape material in a downstream processing direction that differs from the rewind direction; where in neither, either, or both such embodiments the tip comprises a radius of about 0.05 inches or less. In at least some of such embodiments, the tension isolator comprises a vacuum drum comprising a plurality of vacuum holes that apply the second tension to the carrier web. In at least some of such embodiments, the separation system further comprises a furnace for sintering the green tape material, an uptake reel for spooling the carrier web, and/or a load controller for maintaining the tension on the carrier web.

Aspects of the present disclosure relate to a method for separating two materials, the method comprising steps, not necessarily in the following order, of (1) feeding a continuous material to a tension isolator, the continuous material comprising a green tape material disposed on a carrier web, (2) applying tension to the carrier web that is greater than a tension applied to the green tape material with the tension isolator, and (3) directing the carrier web to move in a rewind direction and directing the green tape material in a downstream processing direction that differs from the rewind direction. In at least some such embodiments, the method further comprises a step of separating the carrier web from the green tape material before directing the carrier web in a rewind direction and directing the green tape material in a downstream processing direction that differs from the rewind direction, and/or separating the carrier web from the green tape material simultaneously with directing the carrier web in a rewind direction and directing the green tape material in a downstream processing direction that differs from the rewind direction, such as where the rewind direction and the downstream processing direction form an angle that is greater than about 90 degrees. In at least some such embodiments, the method further comprises a step of applying essentially no tension to the green tape material, such as where the tension applied to the carrier web at least 2 times greater than the tension applied to the green tape material. In at least some such embodiments, the method further comprises a step of at least partially sintering the green tape material. In at least some such embodiments, the method further comprises a step of spooling the carrier web onto an uptake reel. In at least some such embodiments, the method further comprises a step of maintaining the tension on the carrier web.

Aspects of the present disclosure relate to a method for separating two continuous materials, where the method comprises steps, not necessarily in the following order, of (1) feeding a continuous tape material comprising a green tape supported on a carrier web to a tension isolator and applying a first tension to the carrier web; (2) applying a second tension to the carrier web that is greater than the first tension; and (3) directing the carrier web to move in a rewind direction and directing the green tape material in a downstream processing direction that differs from the rewind direction. In at least some such embodiments, the method further comprises a step of separating the carrier web from the green tape material before directing the carrier web in a rewind direction and directing the green tape material in a downstream processing direction that differs from the rewind direction and/or separating the carrier web from the green tape material simultaneously with directing the carrier web in a rewind direction and directing the green tape material in a downstream processing direction that differs from the rewind direction, such as where the rewind direction and the downstream processing direction form an angle that is greater than about 90 degrees. In at least some such embodiments, the method further comprises a step of applying a first tension comprises applying essentially no tension (i.e. very little as disclosed herein). In at least some such embodiments, the second tension is about 2.5 pounds per linear inch of width or less. In at least some such embodiments, the first tension is equal to or less than about 50% of the second tension. In at least some such embodiments, the method further comprises a step of at least partially sintering the green tape material, spooling the carrier web onto an uptake reel, and/or maintaining the tension on the carrier web.

Aspects of the present disclosure relate to a roll-to-roll tape sintering system, the system comprising (1) an input roll of a length of tape material comprising grains of inorganic material, the inorganic material of the tape material on the input roll having a first porosity; (2) a sintering station comprising (2a) an entrance, (2b) an exit, (2c) a channel extending between the entrance and the exit, and (2d) a heater heating the channel to a temperature greater than 500 degrees C., where the exit, the entrance, and the channel of the sintering station lie in a substantially horizontal plane, such that an angle defined between the exit and the entrance relative to a horizontal plane is less than 10 degrees, and where the tape material passes from the input roll, into the entrance of the sintering station, through the channel of the sintering station and out of the exit of the sintering station and heat within the channel sinters the inorganic material of the tape material; and (3) an uptake roll winding the length of tape material following exit from the sintering station, where the inorganic material of the tape material on the uptake roll has a second porosity that is less than the first porosity. In at least some such embodiments, the angle defined between the exit and the entrance relative to a horizontal plane is less than 1 degree. In at least some such embodiments, the tape material on the input roll has a width greater than 5 mm and a length greater than 10 m. In at least some such embodiments, the tape material on the input roll has a thickness between 3 microns and 1 millimeter. In at least some such embodiments, the tape material moves through the sintering station at a high speed of greater than 6 inches per minute. In at least some such embodiments, the tape material on the input role includes an organic binder material supporting the grains of inorganic material, and the system further comprises (4) a binder removal station located between the input roll and the sintering station, the binder removal station comprising (4a) an entrance, (4b) an exit, (4c) a channel extending between the entrance and the exit, and (4d) a heater heating the channel to a temperature between 200 degrees C. and 500 degrees C., wherein the exit of the binder station, the entrance of the binder station, and the channel of the binder station lie in a substantially horizontal plane such that an angle defined between the exit of the binder station and the entrance of the binder station relative to a horizontal plane is less than 10 degrees, where the channel of the binder station is aligned with the channel of the sintering station such that the tape material passes from the input roll, into the entrance of the binder removal station, through the channel of the binder removal station and out of the exit of the binder removal station into the entrance of the sintering station while moving in a substantially horizontal direction, where heat within the channel of the binder removal station chemically changes and/or removes at least a portion of the organic binder material prior to the tape material entering the sintering station. In at least some such embodiments, the heater of the sintering station includes at least two independently controlled heating elements, the heating elements generate a temperature profile along the length of the channel of the sintering station that increases along the channel in a direction from the entrance toward the exit; where in some such embodiments the temperature profile is shaped such that stress at edges of the tape material during sintering remains below an edge stress threshold and such that stress at a centerline of the tape material during sintering remains below a centerline stress threshold, where the edge stress threshold and the centerline stress threshold are defined as those stresses above which the tape material experiences out of plane deformation at the edge and centerline, respectively, of greater than 1 mm, such as where the edge stress threshold is less than 300 MPa and the centerline stress threshold is less than 100 MPa. In at least some such embodiments, the channel of the sintering station is at least 1 m long. In at least some such embodiments, the sintering station comprises (2d-i) a first sintering furnace defining a first portion of the sintering station channel extending from the entrance of the sintering station to an exit opening of the first sintering furnace, (2d-ii) a second sintering furnace defining a second portion of the sintering station channel extending from an entrance opening of the second sintering furnace to the exit of the sintering station, and (2e) a tension control system located between the first sintering furnace and the second sintering furnace, the tension control system helping to isolate tension between the first and second sintering furnaces, wherein tension in the tape material within the second sintering furnace that is greater than a tension within the tape material in the first sintering furnace. In at least some such embodiments, the sintering station comprises (2f) an upward facing channel surface defining a lower surface of the channel and (2g) a downward facing channel surface defining an upper surface of the channel, where a lower surface of the tape material is in contact with and slides along the upward facing surface as the tape material moves from the entrance to the exit of the sintering station, where the downward facing channel surface is positioned close to an upper surface of the tape material such that a gap between the upper surface of the tape material and the downward facing channel surface is less than 0.5 inches, where at least a portion of the upward facing channel surface is substantially horizontal measured in the direction between the entrance and exit of the sintering station such that the portion of the upward facing channel surface forms an angle of less than 3 degrees relative to the horizontal plane. In at least some such embodiments, the inorganic material of the tape is at least one of a polycrystalline ceramic material and synthetic mineral.

Aspects of the present disclosure include a manufacturing furnace comprising (1) a housing having an upstream face and a downstream face, (2) an entrance opening formed in the upstream face, (3) an exit opening defined in the downstream face, (4) an upward facing surface located between the entrance opening and the exit opening, (5) a downward facing flat surface located between the entrance opening and the exit opening, (6) a heating channel extending between the entrance opening and the exit opening and defined between the upward facing surface and the downward facing surface, (7) a continuous length of tape extending into the entrance opening, through the heating channel and out of the exit opening, the continuous length of tape comprising: (7a) grains of inorganic material, (7b) a left edge extending through the heating channel the entire distance between the entrance opening and the exit opening, (7c) a right edge extending through the heating channel the entire distance between the entrance opening and the exit opening, and (7d) a centerline parallel to and located between the left edge and the right edge; and (8) a plurality of the independently controlled heating elements delivering heat to the heating channel generating a temperature profile along the length of the heating channel, the temperature profile having temperatures greater than 500 degrees C. sufficient to cause shrinkage of the inorganic material of the tape as the tape moves through the heating channel, where the temperature profile increases gradually along at least a portion of the length of the heating channel such that the stress within the tape during shrinkage at the left and right edge remain below an edge stress threshold along the entire length of the heating channel or stress within the tape material measured at the centerline remain below a centerline stress threshold along the entire length of the heating channel. In at least some such embodiments, the edge stress threshold is less than 100 MPa and the centerline stress threshold is less than 100 MPa. In at least some such embodiments, the continuous length of tape has an average width greater than 5 mm. In at least some such embodiments, the entrance opening and the exit opening are aligned with each other in the vertical direction such that a straight line located along the upward facing surface forms an angle relative to a horizontal plane that is less than 10 degrees. In at least some such embodiments, the continuous length of tape moves in a direction from the entrance to the exit and the lower surface of the tape moves relative to the upward facing surface, such as where the lower surface of the tape is in contact with and slides relative to the upward facing surface. In at least some such embodiments, the temperature profile includes a first section having a first average slope, a second section having second average slope and a third section have a third average slope, where the first average slope is greater than the second average slope, and where the first and second average slopes are positive slopes and the third average slope is a negative slope, such as where the first, second and third sections are directly adjacent with one another and in numerical order, and most or all of the temperature profile; for example, in at least some such embodiments, the second section has a minimum temperature that is greater than 500 degrees C. and a maximum temperature that is less than 3200 degrees C., and extends from the minimum temperature to the maximum temperature over a length of at least 50 inches. In at least some such embodiments, the heating channel is narrow, such that at a cross-section along the length thereof the maximum vertical distance between the upward facing surface and the downward facing surface is less than one inch. In at least some such embodiments, the heating channel is divided into at least a first heating section and second heating section, where a tension control system is located between the first heating section and the second heating section, where the tension control system at least in part isolates tension in the tape such that tension in the tape material within the second heating section that is greater than tension within the tape material in the first heating section. In at least some such embodiments, the inorganic material of the tape is at least one of a polycrystalline ceramic material and synthetic mineral.

Aspects of the present disclosure relate to a process for forming a spool of sintered tape material comprising steps, not necessarily in the following order, of (1) unwinding a tape from an input reel, the tape comprising grains of inorganic material and a width greater than 5 mm, (2) moving the unwound length of tape through a heating station, (3) heating the tape within the heating station to a temperature above 500 degrees C. such that the inorganic material of the tape is sintered as it moves through the heating station, and (4) winding the tape on an uptake reel following heating and sintering. In at least some such embodiments, the tape material is held in a substantially horizontal position during heating. In at least some such embodiments, the tape material on the input reel further comprises an organic binder material supporting the grains of inorganic material, the process further comprising heating the tape material to a temperature between 200 degrees C. and 500 degrees C. to remove the binder material before the step of heating the tape material to a temperature above 500 degrees C. In at least some such embodiments, the width of tape material is greater than 10 mm and the length of the tape material is greater than 10 m. In at least some such embodiments, the tape material is unwound at a speed of at least 6 inches per minute. In at least some such embodiments, the inorganic material is at least one of a polycrystalline ceramic material and synthetic mineral.

Aspects of the present disclosure relate to a manufacturing system that comprises a tape advancing through the manufacturing system, the tape including a first portion having grains of an inorganic material bound by an organic binder; and a station of the manufacturing system that receives the first portion of the tape and prepares the tape for sintering by chemically changing the organic binder and/or removing the organic binder from the first portion of the tape, leaving the grains of the inorganic material, to form a second portion of the tape and thereby at least in part prepare the tape for sintering. In at least some such embodiments, at an instant, the tape simultaneously extends to, through, and from the station such that at the instant the tape includes the first portion continuously connected to the second portion. In at least some such embodiments, the station chars or burns at least most of the organic binder, in terms of weight, from the first portion of the tape without substantially sintering the grains of the inorganic material. In at least some such embodiments, the station comprises an active heater to char or burn at least most of the organic binder from the first portion of the tape as the tape interfaces with the station to form the second portion of the tape, such as where the active heater includes heating zones of different temperatures, such as where the rate of heat energy received by the tape increases as the tape advances through the station. In at least some such embodiments, the station is a first station and the manufacturing system further comprises a second station, where the second station at least partially sinters the inorganic material of the second portion of the tape to form a third portion of the tape, such as where, at an instant, the tape includes the first portion continuously connected to the third portion by way of the second portion, and/or such as where the first station is close to the second station such that distance between the first and second stations is less than 10 m, thereby mitigating thermal shock of the second portion of the tape. In at least some such embodiments, the second portion of the tape is under positive lengthwise tension as the tape advances, such as where the lengthwise tension in the second portion of the tape is less than 500 grams-force per $mm^2$ of cross section. In at least some such embodiments, the manufacturing system blows and/or draws gas over the tape as the tape advances through the station, such as where the station heats the tape above a temperature at which the organic binder would ignite without the gas blown and/or drawn over the tape, whereby the organic binder chars or burns but the tape does not catch fire, and/or such as where flow of the gas blown and/or drawn over the tape as the tape advances through the station is laminar at least over the second portion of the tape. In at least some such embodiments, the tape advances horizontally through the station, and in some such embodiments the tape is directly supported by a gas bearing and/or an underlying surface and moves relative to that surface as the tape advances through the station. In at least some such embodiments, the first portion of the tape is substantially more bendable than the second portion such that a minimum bend radius without fracture of the first portion is less than half that of the second portion.

Aspects of the present technology relate to a furnace to prepare green tape for sintering, the furnace comprising walls defining a passage having inlet and outlet openings on opposing ends of the passage, where the passage has a length between the inlet and outlet openings of at least 5 cm, and where the outlet opening is narrow and elongate, having a height and a width orthogonal to the height, wherein the height is less than a fifth of the width, and wherein the height is less than 2 cm; and the furnace further includes a heater that actively provides heat energy to the passage, where the heater reaches temperatures of at least 200° C. In at least some such embodiments, the furnace is further comprising a gas motivator that blows and/or draws gas through the passage, such as where the gas motivator delivers at least 1 liter of gas per minute through the passage. In at least some such embodiments, the passage is horizontally oriented, as described above. In at least some such embodiments, the heater comprises heat zones that increase temperature along the passage with distance from the inlet toward the outlet.

Aspects of the present technology relate to a method of processing tape, comprising steps of (1) advancing a tape through a manufacturing system, the tape including a first portion having grains of an inorganic material bound by an organic binder; and (2) preparing the tape for sintering by forming a second portion of the tape at a station of the manufacturing system by chemically changing the organic binder and/or removing the organic binder from the first portion of the tape, leaving the grains of the inorganic material. In at least some such embodiments, at an instant, the tape extends to, through, and from the station such that at the instant the tape includes the first portion continuously connected to the second portion. In at least some such embodiments, the step of preparing the tape for sintering further comprises charring or burning at least most of the organic binder from the first portion of the tape without (substantially) sintering the grains of the inorganic material. In at least some such embodiments, the first portion of the tape is substantially more bendable than the second portion such that a minimum bend radius without fracture of the first portion is less than half that of the second portion. In at least some such embodiments, the station of the manufacturing system is a first station and the method of processing further comprises steps of receiving the second portion of the tape at a second station, and at least partially sintering the inorganic material of the second portion of the tape at the second station to form a third portion of the tape, such as in at least some such embodiments, at an instant, the tape includes the first portion continuously connected to the third portion by way of the second portion. In at least some such embodiments, the process further comprises a step of positively tensioning the second portion of the tape as the tape advances, such as where the step of positively tensioning is such that lengthwise tension in the second portion of the tape is less than 500 grams-force per mm$^2$ of cross section. In at least some such embodiments, the process further comprises a step of blowing and/or drawing gas over the tape as the tape advances through the station. In at least some such embodiments, the step of advancing the tape further comprises horizontally advancing the tape through the station. In at least some such embodiments, the process further comprises a step of directly supporting the tape by a gas bearing and/or an underlying surface and moving the tape relative to that surface.

Aspects of the present disclosure relate to package comprising: a substrate; a sintered article comprising a body extending between a first major surface and a second major surface;

the body comprises a sintered inorganic material, a thickness (t) defined as a distance between the first major surface and the second major surface, a width defined as a first dimension of one of the first or second surfaces orthogonal to the thickness, and a length defined as a second dimension of one of the first or second surfaces orthogonal to both the thickness and the width; and the sintered article joined directly or indirectly to the substrate. In some such embodiments, the body width is about 5 mm or greater, the body thickness is in a range from about 3 μm to about 1 mm, and the body length is about 300 cm or greater. In some such embodiments, the a portion of the sintered article is flattenable, such as where the sintered article, when flattened, exhibits a maximum in plane stress (the absolute value of stress, as measured by the thin plate bend bending equation) of less than or equal to 25% of the bend strength (measured by 2-point bend strength) of the article and/or such as where the sintered article, when flattened, exhibits a maximum in plane stress (the absolute value of stress, as measured by the thin plate bend bending equation) of less than or equal to 1% of the Young's modulus of the article. In some such embodiments, the sintered article has a thickness of about 80 μm and a bend radius of greater than 0.03 m, the article exhibits a maximum in plane stress (the absolute value of stress, as measured by the thin plate bend bending equation) of less than or equal to 25% of the bend strength (measured by 2-point bend strength) of the article; or the sintered article has a thickness of about 40 μm and a bend radius of greater than 0.015 m, the article exhibits a maximum in plane stress (the absolute value of stress, as measured by the thin plate bend bending equation) of less than or equal to 25% of the bend strength (measured by 2-point bend strength) of the article; or the sintered article has a thickness of about 20 μm and a bend radius of greater than 0.0075 m, the article exhibits a maximum in plane stress (the absolute value of stress, as measured by the thin plate bend bending equation) of less than or equal to 25% of the bend strength (measured by 2-point bend strength) of the article. In some such embodiments, a portion of the sintered article that is flattenable comprises a length of about 10 cm. In some such embodiments, one or both the first major surface and the second major surface of the sintered article has a flatness in the range of one hundred nanometers to fifty micrometers over a distance of one centimeter along the length or the width. In some such embodiments, the sintered inorganic material comprises an interface having a major interface dimension of less than about 1 mm, wherein the interface comprises either one of or both a chemical inhomogeneity and crystal structure inhomogeneity. In some such embodiments, the sintered inorganic material comprises a ceramic material or a glass ceramic material. In some such embodiments, the sintered inorganic material comprises any one of a piezoelectric material, a thermoelectric material, a pyroelectric material, a variable resistance material, or an optoelectric material. In some such embodiments, the sintered inorganic material comprises one of zirconia, alumina, yttria stabilized zirconia (YSZ), spinel, garnet, lithium lanthanum zirconium oxide (LLZO), cordierite, mullite, perovskite, pyrochlore, silicon carbide, silicon nitride, boron carbide, sodium bismuth titanate, barium titanate, titanium diboride, silicon alumina nitride, aluminum oxynitride, or a reactive cerammed glass-ceramic. In some such embodiments, the sintered article comprises at least ten square centimeters of area along the length that has a composition wherein at least one constituent of the composition varies by less than about 3 weight % across the area. In some such embodiments, the sintered article comprises at least ten square centimeters of area along the length that has a crystalline structure with at least one phase having a weight percent that varies by less than about 5 percentage points, across the area. In some such embodiments, the sintered article comprises at least ten square centimeters of area along the length that has a porosity varies by less than about 20%. In some such embodiments, the one or both the first major surface and the second major surface of the sintered article has a granular profile comprising grains with a height in a range from 25 nm to 150 μm relative to recessed portions of the respective surface at boundaries between the grains. In some such embodiments, the one or both the first major surface and the second major surface of the sintered article has a flatness in the range of 100 nm to 50 μm over a distance of one centimeter along the length or the width. In some such embodiments, the one of or both the first major surface and the second major surface of the sintered article comprises have at least ten square centimeters of area having fewer than one hundred surface defects from adhesion or abrasion with a dimension greater than 5 μm. In some such embodiments, the other of the first major surface and the second major surface of the sintered article comprises surface defects from adhesion or abrasions with a dimension of greater than 5 μm, such as due to sliding along a surface of the furnace during sintering. In some such embodiments, the substrate comprises an electrically conductive metal. In some such embodiments, the substrate comprises aluminum, copper, or combinations thereof. In some such embodiments, the substrate comprises a compliant polymer material. In some such embodiments, the substrate comprises a polyimide. In some such embodiments, the sintered article joined directly or indirectly to the substrate is rolled around a core at least once, the core having a diameter of less than 60 cm. In some such embodiments, the package is further comprising an interlayer that joins the sintered article and the substrate, such as where the interlayer has a thickness less than 40 μm and/or where the substrate comprises grooves that contact the interlayer. In some such embodiments, the package is further comprising a metal-based layer on at least a portion of one or both the first major surface and the second major surface of the sintered article, such as where the metal-based layer comprises copper, nickel, gold, silver, gold, brass, lead, tin, or combinations thereof and/or where the metal-based layer and the substrate are joined to same major surface of the sintered article, and/or where the metal-based layer is joined to the sintered article through an aperture in the substrate. In some such embodiments, the package is further comprising a semiconductor device electrically connected to the metal-based layer, such as where light that emanates from an LED on the semiconductor device transmits through the body thickness of the sintered article, and/or wherein the sintered article has a thermal conductivity greater than 8 W/m·K.

Additional aspects of the present disclosure relate to method of making some or all of the packages just described, the method comprising a step of joining the substrate directly or indirectly to the first or second major surface of the sintered article. In some such embodiments, the substrate comprises a compliant polymer material. In some such embodiments, the substrate comprises an electrically conductive metal. In some such embodiments, the method further comprises applying a precursor interlayer to one or both of the substrate and the sintered article, the precursor interlayer joins the substrate and the sintered article. In some such embodiments, the method further comprises thermally deactivating the temporary adhesive to separate the substrate from the sintered article. In some such embodiments, the method further comprises bonding a metal-based layer on at least a portion of one or both the first major surface and the second major surface of the sintered article, and the method may further comprise electrically connecting a semiconductor device to the metal-based layer.

Aspects of the present disclosure relate to a process for forming a sintered tape material comprising steps of (1) moving a tape toward a heating station, the tape comprising grains of inorganic material, (2) coupling a first section of a threading material to a leading section of the tape, (3) pulling both the first section of threading material and the leading section of the tape through the heating station by applying a force to a second section of the threading material located outside of the heating station, and (4) heating at least a portion of the tape within the heating station to a temperature above 500 degrees C. such that the inorganic material of the tape is sintered as it moves through the heating station. In some such embodiments, the heating station has an entrance and an exit, and the process is further comprising a step of positioning the threading material such that the threading material extends through the heating station, that the first section of the threading material is located upstream from the entrance and that a second section of threading material is located downstream from the exit, where the coupling step occurs after the positioning step. In some such embodiments, the threading material is an elongate strip of material that is different from the inorganic material of tape, such as where the difference between the threading material and the inorganic material of tape is at least one of a different material type and different degree of sintering, and/or where the leading section of the tape overlaps the first section of the threading material such that a lower surface of the tape contacts an upper surface of the threading material. In some such embodiments, the coupling step comprises bonding the threading material to the tape via an adhesive material, such as where a coefficient of thermal expansion of the threading material is within plus or minus 50% of a coefficient of thermal expansion of the inorganic material of the tape and is within plus or minus 50% of a coefficient of thermal expansion of the adhesive material, and/or where the inorganic material of the tape is at least one of a polycrystalline ceramic material and synthetic mineral, where the adhesive material is a ceramic containing adhesive material, and where the threading material is at least one of a sintered ceramic material and a metal material. In some such embodiments, the step of moving the tape toward the heating station includes unwinding the tape from an input reel, where the second section of the threading material is coupled to an uptake reel, and the force is generated by rotation of the uptake reel. In some such embodiments, the process further comprises a step of continuing to move the tape through a heating station following unwinding from the input reel forming a length of sintered inorganic material of the tape; and another step of winding the tape on an uptake reel following heating and sintering, such as where the tape is held in a substantially horizontal position during heating, such as where the tape on the input reel further comprises an organic binder material supporting the grains of inorganic material, and the process further comprises heating the tape to a temperature between 200 degrees C. and 500 degrees C. to remove the binder material before the step of heating the tape to a temperature above 500 degrees C.

Aspects of the present disclosure relate to a process for forming a spool of sintered tape material comprising steps of (1) unwinding a tape from an input reel, the tape comprising grains of inorganic material; (2) moving a threading material through a channel of a heating station in a direction from an exit of the heating station toward an entrance of the heating station such that a first section of a threading material extends out of the entrance of the heating station; (3) coupling the first section of the threading material to the tape; (4) coupling a second section of the threading material to an uptake reel located downstream from the exit of the heating station; (5) rotating the uptake reel such that tension is applied to the threading material by the uptake reel which in turn is applied to the tape pulling the tape through the heating station; (6) heating at least a portion of the tape within the heating station to a temperature above 500 degrees C. such that the inorganic material of the tape is sintered as it moves through the heating station; and (7) winding the tape on an uptake reel following heating and sintering. In some such embodiments, at least one of: (i) the threading material and the inorganic material of tape are different from each other and (ii) a degree of sintering of the threading material is greater than a degree of sintering of the inorganic material of the tape on the input reel. In some such embodiments, the leading section of the tape overlaps the first section of the threading material such that a lower surface of the tape contacts an upper surface of the threading material, and the coupling step comprises bonding the threading material to the tape via an adhesive material.

Aspects of the present technology relate to a roll to roll tape sintering system comprising (1) an input roll of a length of tape material comprising grains of inorganic material, the inorganic material of the tape material on the input roll having a first porosity; (2) a sintering station comprising: (2a) an entrance; (2b) an exit; (2c) a channel extending between the entrance and the exit; and (2d) a heater heating the channel to a temperature greater than 500 degrees C., where wherein the tape material extends from the input roll toward the entrance of the sintering station, where heat within the channel causes sintering of the inorganic material of the tape material; (3) an uptake roll winding the length of tape material following exit from the sintering station; and (4) a length of threading material extending through the exit and out of the entrance of the sintering station, wherein a first end section of the threading material is coupled to a leading section of the tape material before the entrance of the sintering station and a second end section of the threading material is wrapped around the uptake roll such that tension applied to the threading material by winding of the uptake roll is applied to the tape material. In some such embodiments, at least one of: (i) the threading material and the inorganic material of tape material are different from each other and (ii) a degree of sintering of the threading material is greater than a degree of sintering of the inorganic material of the tape on the input roll. In some such embodiments, the leading section of the tape material overlaps the first section of the threading material such that a lower surface of the tape material contacts an upper surface of the threading material, and the threading material is coupled to the tape material via a bond formed by an adhesive material, such as where the inorganic material is at least one of a polycrystalline ceramic material and synthetic mineral, where the adhesive material is a ceramic adhesive material, and where the threading material is at least one of a sintered ceramic material and a metal material. In some such embodiments, the exit, the entrance and the channel of the sintering station lie in a substantially horizontal plane, such that an angle defined between the exit and the entrance relative to a horizontal plane is less than 10 degrees.

Aspects of the present disclosure relate to a process for forming a sintered tape material comprising steps of (1) unwinding a tape from an input reel, the tape comprising grains of inorganic material, wherein the tape on the input reel has an average thickness between 1 micron and 1 millimeter; (2) moving the unwound length of tape through a heating station along a path having a first curved section such that the tape is bent through a radius of curvature of 0.01 m to 13,000 m; (3) heating the tape within the heating station to a temperature above 500 degrees C. while the unwound length of tape is bent through the radius of curvature, wherein the inorganic material of the tape is sintered as it moves through the heating station; and (4) winding the tape on a take-up reel following heating and sintering. In contemplated embodiments, such a process may be broader, and may not include the unwinding and/or the winding steps. In some such embodiments, the heating station includes a lower surface and an upper surface defining a channel extending between an entrance and an exit of the heating station, where the lower surface includes a convex curved surface extending in a longitudinal direction between the entrance and the exit, wherein the convex curved surface defines the first curved section of the path. In some such embodiments, the upper surface includes a concave curved surface matching the convex curved surface of the lower surface such that a height of the channel remains constant along at least a portion of a length of the channel. In some such embodiments, the convex curved surface is an upper surface of a gas bearing, and the gas bearing delivers pressurized gas to the channel to support the tape above the convex curved surface as the tape moves through the heating station. In some such embodiments, the convex curved surface is continuous curved surface the extends an entire longitudinal length between the entrance and the exit, wherein a maximum rise of the convex curved surface is between 1 mm and 10 cm. In some such embodiments, the path through the heating station has a second curved section having a radius of curvature of 0.01 m to 13,000 m, where the tape is heated within the heating station to a temperature above 500 degrees C. while the unwound length of tape is bent through the radius of curvature of the second curved section, such as where the tape is heated to a first temperature when the tape traverses the first curved section and is heated to a second temperature, different from the first temperature, when the tape traverses the second curved section. In some such embodiments, the first curved section of the path is defined by a free loop segment in which the tape hangs under the force of gravity between a pair of supports to form the radius of curvature in the tape. In some such embodiments, the heating station has a convex curved surface located therein defining the first curved section of the path, and the process further comprises a step of applying tension to the tape such that the tape bends into conformity with the convex curved surface, such as where the convex curved surface is an outer surface of at least one of a mandrel and a roller. In some such embodiments, the tape is moved through the heating station at a speed of between 1 inch and 100 inches of tape length per minute. In some such embodiments, tension is applied to the tape in a longitudinal direction, where the tape has a width and the tension is at least 0.1 gram-force per linear inch of width of the tape. In some such embodiments, the inorganic material of the tape is at least one of a polycrystalline ceramic material and synthetic mineral.

Aspects of the present disclosure relate to a process for forming a sintered tape material comprising steps of (1) moving a contiguous length of tape through a heating station such that a first portion of the contiguous length of tape is located upstream from an entrance of the heating station, a second portion of the contiguous length of tape is located downstream from an exit of the heating station, and a third portion of the contiguous length of tape is located between the first portion and the second portion, the contiguous length of tape comprising grains of inorganic material, (2) heating the third portion of the contiguous length of tape within the heating station to a temperature above 500 degrees C. such that the inorganic material is sintered within the heating station, and (3) bending the third portion of the contiguous length of tape to a radius of curvature of 0.01 m to 13,000 m while at the temperature above 500 degrees C. within the heating station. In at least some such embodiments, the bending includes applying a longitudinally directed force to the contiguous length of tape such that third portion bends around a curved surface located within the heating station. In at least some embodiments, the contiguous length of tape is unrolled from an input reel, the contiguous length of tape is moved continuously and sequentially through the heating station such that entire contiguous length of the tape experiences bending to the radius of curvature of 0.01 m to 13,000 m while moving through the heating station, and where the contiguous length of tape is rolled onto a take-up reel following bending and heating.

Aspects of the present disclosure relate to a roll-to-roll tape sintering system comprising (1) an input roll of a length of tape material comprising grains of inorganic material, the inorganic material of the tape material on the input roll having a first porosity; (2) a sintering station comprising: (2a) an entrance; (2b) an exit; (2c) a channel extending between the entrance and the exit; (2d) a heater heating the channel to a temperature greater than 500 degrees C.; where the tape material passes from the input roll, into the entrance of the sintering station, through the channel of the sintering station and out of the exit of the sintering station and the heat within the channel causes sintering of the inorganic material of the tape material; (3) a bending system located within the sintering station inducing a radius of curvature along a longitudinal axis of the tape material as the tape material passes through the heating station, wherein the radius of curvature is 0.01 m to 13,000 m; and (4) a take-up roll winding the length of tape material following exit from the sintering station; where the inorganic material of the tape material on the take-up roll has a second porosity that is less than the first porosity. In some such embodiments, the exit and the entrance lie in a substantially horizontal plane such that an angle defined between the exit and the entrance relative to a horizontal plane is less than 10 degrees, wherein the bending system includes a convex curved surface located along a path between the entrance and the exit, wherein the tape is bent around the convex curved surface as the tape moves through the heating station, wherein the convex curved surface defines the radius of curvature and is curved around an axis parallel to a width axis of the tape material. In some such embodiments, the convex curved surface is an outer surface of at least one of a mandrel and a roller and/or the convex curved surface is a lower surface of the sintering station that defines the channel of the sintering station, such as where the convex curved surface forms a continuous curve that extends the entire length of the channel from the entrance to the exit of the sintering station. In some such embodiments, the convex curved surface is an upper surface of a gas bearing that delivers gas to the channel supporting the tape within the channel without contacting the convex curved surface. In other such embodiments, the bending system includes a pair of support structures located with the sintering station, wherein the support structures are spaced from each other forming a gap and the tape sags downward due to gravity between the support structures to form the radius of curvature.

Aspects of the present disclosure relate to a roll-to-roll tape sintering system comprising (1) an input roll of a length of tape material comprising grains of inorganic material, the inorganic material of the tape material on the input roll having a first porosity; (2) a sintering station comprising: (2a) an entrance; (2b) an exit; (2c) a channel extending between the entrance and the exit having a longitudinal length, L, wherein a lower surface of the channel is defined by a continuously curved surface extending the longitudinal length L and having a radius of curvature, R, and a maximum rise, H; wherein $R=H+(L^2)/H$; wherein 0.1 mm<H<100 mm, and 0.1 m<L2<100 m; (3) a heater heating the channel to a temperature greater than 500 degrees C.; wherein the tape material passes from the input roll, into the entrance of the sintering station, through the channel of the sintering station and out of the exit of the sintering station and the heat within the channel causes sintering of the inorganic material of the tape material; and (4) a take-up roll winding the length of tape material following exit from the sintering station, wherein the inorganic material of the tape material on the take-up roll has a second porosity that is less than the first porosity.

Some aspects of the present disclosure relate to a tape separation system for sintering preparation by separating parts of the tape from one another, as disclosed above and discussed with regard to FIGS. 3, 4, 6, 8 for example. More specifically, the tape separation system includes a source of tape material (e.g., pre-made roll, pre-made long strip, in-line green tape manufacturing) comprising a green tape and a carrier web (e.g., a polymeric substrate) supporting the green tape. The green tape comprising grains of inorganic material in a binder (e.g., organic binder as disclosed above, and may further include inorganic binder). The tape separation system further includes a peeler (see FIG. 8) for directing the carrier web in a rewind direction and directing the green tape in a downstream processing direction that differs from the rewind direction, such as by angle C in FIG. 8; and a vacuum drum positioned and configured to receive the tape material from the source and convey the tape material to the peeler. The vacuum drum comprises holes for applying suction to the carrier web to facilitate tensioning the carrier web. For example, suction of the vacuum drum applies attractive force to the tape beyond the forces of gravity and friction. In alternative embodiments, other sources of attractive force may be used, such as magnetic forces acting on a magnetic carrier web, electrostatic forces, etc., where the vacuum drum may be more broadly characterized as an attractive drum. According to an exemplary embodiment, tension, in force per cross-sectional area, in the carrier web is greater than tension in the green tape as the tape material is conveyed from the vacuum drum to the peeler, thereby mitigating deformation of the green tape during separation of the green tape from the carrier web. The carrier web bears the brunt of force used to move and control the tape. Similarly the peeler with the removal of carrier web acts to protect the shape of the green tape, which in turn facilitates the particularly high quality sintered article in terms of geometric consistency.

Other aspects of the present disclosure relate to a system for processing tape for sintering preparation, as shown and discussed with regard to FIGS. 9, 10, and 12 for example. The system includes a tape comprising a green portion of the tape, the green portion having grains of an inorganic material in an organic binder; and a binder burnout station comprising an active heater. The tape advances through the binder burnout station such that the binder burnout station receives the green portion of the tape and chars or burns the organic binder as the green portion of the tape interfaces with heat from the heater, thereby forming a second portion of the tape prepared for sintering the inorganic material of the tape. In some embodiments, at an instant, the tape simultaneously extends to, through, and from the binder burnout station such that, at the instant, the tape includes the green portion continuously connected to the second portion, such as where the binder burnout station chars or burns at least most of the organic binder, in terms of weight, from the green portion of the tape without substantially sintering the grains of the inorganic material. Such a system may be particularly surprising to those of skill in the art because of perceived weakness of the tape with the organic binder removed or charred, and with associated changes in dimensions of the tape during such processing. In some embodiments, system for processing tape for sintering preparation further includes an ultra-low tension dancer that includes light-weight, low-inertia rollers to redirect the tape without exerting significant tension such that tension in the second portion of the tape is less than 500 grams-force per mm$^2$ of cross section, thereby reducing chances of fracture of the second portion of the tape and facilitating long continuous lengths of the tape for sintering. In some embodiments, system for processing tape for sintering preparation blows and/or draws gas over the tape as the tape advances through the binder burnout station, and the binder burnout station heats the tape above a temperature at which the organic binder would ignite without the gas blown and/or drawn over the tape, whereby the organic binder chars or burns but the tape does not catch fire.

Additional aspects of the present disclosure relate to a manufacturing line comprising the above system for processing tape, where the binder burnout station is a first station and the manufacturing line further comprises a second station spaced apart from the first station. The second station may be spaced apart from the first station as shown in FIG. 12, and/or there may be a common housing and separation may be due to an intermediate ventilation system that controls air flow relative to the two stations for example. The second station at least partially sinters the inorganic material of the second portion of the tape to form a third portion of the tape, where, at an instant, the tape includes the green portion continuously connected to the third portion by way of the second portion. In some embodiments, the third portion of the tape is substantially more bendable than the second portion such that a minimum bend radius without fracture of the third portion is less than half that of the second portion, and the green portion is substantially more bendable than the second portion such that a minimum bend radius without fracture of the green portion is less than half that of the second portion. In other embodiments, the tape or other article may not comprise three different such portions, such as if only shorter lengths of articles were processed using the sintering system. The manufacturing line may further include the tape separation system described above, such as with the peeler and vacuum drum.

Some aspects of the present disclosure relate to a sintering system comprising a tape material comprising grains of inorganic material and a sintering station, such as discussed above with regard to FIG. 3 for example. The sintering station includes an entrance, an exit, and a channel extending between the entrance and the exit. At an instant, the tape material extends into the entrance of the sintering station, through the channel, and out of the exit. Heat within the channel sinters the inorganic material such that the inorganic material has a first porosity at the entrance and a second porosity at the exit that is less than the first porosity, such as at least 10% less by volume. Further, the wherein the tape material is positively tensioned as the tape material passes through the channel of the sintering station, thereby mitigating warpage, such as by tension applied via the low-tension dancer, by reel winding/unwinding, directional air bearings, variation in roller speed, or other components of the system to positively apply tension to the tape material beyond gravitational and frictional forces. In some embodiments, the tape material moves through the sintering station at a speed of at least 1 inch per minute, such as at least 10, at least 20, at least 40 inches per minute. For discrete articles, as opposed to long tapes as disclosed herein, the articles may stop or dwell within the sintering station, or may move different speeds. In some embodiments, the channel of the sintering station is heated by at least two independently controlled heating elements, where the heating elements generate a temperature profile where the channel increases in temperature along the length of the channel in a direction from the entrance toward the exit of the sintering station, and where a sintering temperature in the channel exceeds 800° C. (see, e.g., FIG. 19 and related discussion above). In some embodiments, the sintering system further includes a curved surface located along the channel of the sintering station (see, e.g., FIG. 58 and related discussion above), where the tape material bends relative to a widthwise axis of the tape material around the curved surface as the tape material moves through the sintering station, thereby influencing shape of the tape material, such as flattening the tape material and/or preventing bulges or other distortions (see, e.g., FIG. 1). In some embodiments, the exit and the entrance of the sintering station lie in a substantially horizontal plane, such that an angle defined between the exit and the entrance of the sintering station relative to a horizontal plane is less than 10 degrees, thereby at least in part controlling flow of gases relative to the channel. Applicants have found that, alternatively or in addition thereto, flow of gasses may be controlled by vents and fans and/or by confining the tape in a narrow space. For example, in some such embodiments, the sintering station further comprises an upward facing channel surface defining a lower surface of the channel, and a downward facing channel surface defining an upper surface of the channel, where the downward facing channel surface is positioned close to an upper surface of the tape material such that a gap between the upper surface of the tape material and the downward facing channel surface is less than 0.5 inches, thereby at least in part controlling flow of gases in the channel. The tape material may be particularly wide, long, and thin, having a width greater than 5 millimeters, a length greater than 30 centimeters, and a thickness between 3 micrometers and 1 millimeter, and the inorganic material of the tape may be at least one of a polycrystalline ceramic material and synthetic mineral. In other embodiments, the tape or other article may be narrower, shorter, and/or thicker, but sintering may not be efficient in terms of sintering time/energy cost, the tape may not roll and/or flatten as disclosed above, etc.

Other aspects of the present disclosure relate to a process for manufacturing ceramic tape, the process comprising a step of sintering tape comprising polycrystalline ceramic to a porosity of the polycrystalline ceramic of less than 20% by volume, by exposing particles of the polycrystalline ceramic to a heat source to induce the sintering between the particles. The tape is particularly thin such that a thickness of the tape is less than 500 µm, thereby facilitating rapid sintering via heat penetration. Further, the tape is at least 5 mm wide and at least 300 cm long. In some embodiments, the process further includes a step of positively lengthwise tensioning the tape during the sintering. In some such embodiments, the process further includes a step of moving the tape toward and then away from the heat source during the sintering, such as through the channel of the sintering station. In some embodiments, the amount of time of the sintering is particularly short, that being less than two hours in aggregate for any particular portion of the tape, thereby helping to maintain small grain size in the ceramic tape, improving strength, reducing porosity, saving energy; for example, in some such embodiments, the time in aggregate of the sintering is less than one hour, such as compared to 20 hour for conventional batch sintering, and density of the polycrystalline ceramic after the sintering is greater than 95% dense by volume and/or the tape comprises closed pores after the sintering, no pin holes, few surface defects, geometric consistency, etc. In some embodiments, the tape comprises a volatile constituent that vaporizes during the sintering, such as lithium, where the volatile constituent is inorganic, and where the tape comprises at least 1% by volume (e.g., at least 5%, at least 10%, and/or no more than 200%, such as no more than 100% by volume) more of the volatile constituent prior to the sintering than after the sintering. While some of the volatile constituent may vaporize, Applicants believe that the present sintering technology is far more efficient than conventional processes that use sealed crucibles that surround the sintering material in sand containing the volatile constituent to prevent release of the volatile constituent through high vapor pressures. Applicants have discovered that speed of sintering and geometry of the article may be used to rapidly sinter such volatile materials before too much of the volatile constituent escapes, and a source of excess volatile constituent can be added to green tape, as disclosed above, to greatly improve properties of the resulting sintered article, such as in terms of percentage of cubic crystals, small grain size, less porosity, and greater ionic conductivity, hermeticity, strength, etc.

Still other aspects of the present disclosure relate to a tape (see FIGS. 67A, 67B, 68, 69, for example, and related discussion; see also FIGS. 29 and 78 and related discussion above) or other article (e.g., sheet) comprising a body comprising grains of inorganic material (ceramic, glass-ceramic, glass, metal) sintered to one another, such as where atoms in particles of the inorganic material diffuse across boundaries of the particles, fusing the particles together and creating one solid piece, such as without fully melting the particles to liquid state. With that said, embodiments include articles of amorphous or nearly amorphous material (e.g., FIG. 81). The body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width. The tape is long, having a length of about 300 cm or greater. The tape is thin, having a thickness in a range from about 3 µm to about 1 mm. The tape is particularly wide, having a width of about 5 mm or greater. In other embodiments, the tape or other article may have other dimensions, as disclosed herein.

According to an exemplary embodiment, geometric consistency of the tape is such that a difference in width of the tape, when measured at locations lengthwise separated by a distance, such as 10 cm, 50 cm, 1 m, 2 m, 10 m is less than a small amount, such as less than 200 µm, less than 100 µm, less than 50 µm, less than 10 µm; and/or a difference in thickness of the tape, when measured at locations lengthwise separated by a distance, such as 10 cm, 50 cm, 1 m, 2 m, 10 m along a widthwise center of the tape (i.e. along the centerline extending the length of the tape), is less than a small amount, such as less than 50 µm, less than 20 µm, less than 10 µm, less than 5 µm, less than 3 µm, less than 1 µm in some such embodiments. Laser trimming may help improve the geometric consistency of the width of the tape. A layer (e.g., silica, a material with melting temperature above 500° C., above 800° C., above 1000° C.), as shown in FIG. 103 overlaying the granular profile, may improve geometric consistency of the thickness and/or may be polished or provide an alternative to polishing.

In some embodiments, the tape is flat or flattenable, as described above, such that a length of 10 cm of the tape pressed between parallel flat surfaces flattens to contact or to within 0.25 mm of contact with the parallel flat surfaces, such as within 0.10 mm, such as within 0.05 mm, such as within 0.03 mm, such as within 0.01 mm, without fracturing; and for example in some such embodiments, when flattened to within 0.05 mm of contact with the parallel flat surfaces, the tape exhibits a maximum in plane stress of no more than 10% of the Young's modulus thereof, such as no more than 5% of the Young's modulus thereof, such as no more than 2% of the Young's modulus thereof, such as no more than 1% of the Young's modulus thereof, such no more than 0.5% of the Young's modulus thereof. In some embodiments, the first and second major surfaces of the tape have a granular profile, such as where the grains are ceramic (see FIG. 30B and related discussion, for example), and where at least some individual grains of the ceramic adjoin one another with little to no intermediate amorphous material such that a thickness of amorphous material between two adjoining grains is less than 50 nm, such as less than 10 nm, such as less than 5 nm, such as less than 2 nm, such as where crystal lattices of adjoining grains directly abut one another, as viewed by transition electron microscopy for example (see, e.g., FIGS. 73C, 74, 75 and related discussion).

In some embodiments, the body has less than 10% porosity by volume and/or the body has closed pores, as shown in FIGS. 86B, 99B, 102 for example. In some embodiments, the grains comprise lithium and/or another volatile constituent, and the body has ionic conductivity of greater than $5 \times 10^{-5}$ S/cm, such as ionic conductivity of greater than $1 \times 10^{-4}$ S/cm, such as ionic conductivity of greater than $2 \times 10^{-4}$ S/cm, such as ionic conductivity of greater than $3 \times 10^{-4}$ S/cm. In some embodiments, the body has a particularly fine grain size (average), that being 15 µm or less, such as 10 µm or less, such as 5 µm or less, such as 2 µm or less, as measured by ASTM standard, as described above.

In some embodiments, the tape further includes an electrically-conductive metal coupled to the first major surface of the body, where in some such embodiments the body comprises a repeating pattern of vias, and the electrically-conductive metal is arranged in a repeating pattern (see generally FIGS. 51 and 104). In some embodiments, the first and second major surfaces have a granular profile, the tape further includes a coating overlaying the granular profile of the first major surface, and an outward facing surface of the coating is less rough than the granular profile of the first surface, such as by at least half (see, e.g., FIG. 103), where electrically-conductive metal coupled to the first major surface is so coupled by way of bonding to the outward facing surface of the coating. In some embodiments, the inorganic material has viscosity of 12.5 poise at a temperature greater than 900° C. (see, e.g., FIGS. 78 and 87).

Additional aspects of the present disclosure relate to a roll of the tape of any one of the above-described embodiments (see, e.g., FIGS. 67A, 67B, 68, 69), wherein the tape is wrapped around and overlapping itself, such as in a spiral, bent to a radius of less than 1 m, such as less than 30 cm, such as less than 20 cm, such as less than 10 cm. A core of the roll may be round in cross-section, or otherwise shaped.

Still other aspects of the present disclosure relate to a plurality of sheets cut from tape of any one of the above-described embodiments (see, generally FIGS. 93, 104). According to an exemplary embodiment, the sheets have a common attribute with one another that is detectable to determine that the sheets were manufactured using technology disclosed herein. For example, the common attribute may be at least one of: (a) a commonly positioned surface groove (b) a pattern of grooves in common; (c) a commonly present stress profile irregularity extending lengthwise; (d) a compositional incongruity in common, and (e) a common asymmetric crystal phase distribution or common pattern in crystal concentration.

Some aspects of the present disclosure relate to a tape, comprising a body comprising ceramic grains sintered to one another, the body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width; where the tape is thin, having a thickness in a range from about 3 µm to about 1 mm; and where first and second major surfaces of the tape have a granular profile, and at least some individual grains of the ceramic adjoin one another with little to no intermediate amorphous material such that a thickness of amorphous material between two adjoining grains is less than 5 nm.

Some aspects of the present disclosure relate to a tape or other sintered article (e.g., fiber, tube, sheet, discs), comprising a body comprising ceramic grains sintered to one another, the body extending between first and second major surfaces, where the body has a thickness defined as distance between the first and second major surfaces, a width defined as a first dimension of the first major surface orthogonal to the thickness, and a length defined as a second dimension of the first major surface orthogonal to both the thickness and the width; where the tape is thin, having a thickness in a range from about 3 µm to about 1 mm; where first and second major surfaces of the tape have a granular profile; and where the grains comprise lithium and the body has ionic conductivity greater than $5 \times 10^{-5}$ S/cm or higher, as discussed above. Such an article may have a thickness of amorphous material between two adjoining grains is less than 5 nm. In some embodiments, the article is at least 95% dense and has a grain size of less than 10 µm, such as at least 97% dense and has a grain size of less than 5 µm. The article may be co-fired with an anode and/or cathode material as part of a solid state battery, for example.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one. Similarly, pieces of equipment and process steps disclosed herein may be used with materials other than continuous tape. For example, while continuous tape may be particularly efficient for roll-to-roll processing, Applicants have demonstrated that a sled of zirconia or other refractory material may be used to draw discrete sheets of material or other articles through equipment disclosed herein.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. Electrolyte for a solid-state battery, comprising:
   a body comprising ceramic grains sintered to one another, wherein the grains comprise lithium,
   wherein thickness of the body, between first and second major surfaces thereof, is in a range from 3 µm to 1 mm;
   wherein the first and second major surfaces of the body have an unpolished granular profile such that the profile includes grains protruding outward from the respective major surface with a height of at least 25 nm and no more than 150 µm relative to recessed portions of the respective major surface at boundaries between the respective grains;
   wherein the body has ionic conductivity greater than $5 \times 10^{-5}$ S/cm.

2. The electrolyte of claim 1, wherein fewer than 10 pin holes of a cross-sectional area of at least a square micrometer pass through the body, per square millimeter of surface on average.

3. The electrolyte of claim 1, wherein the granular profile includes grains with a height of at least 150 nanometers relative to recessed portions of the respective major surface at boundaries between the respective grains.

4. The electrolyte of claim 3, wherein the height of the grains is no more than 80 micrometers relative to recessed portions of the respective major surface at boundaries between the respective grains.

5. The electrolyte of claim 1, wherein the body has a length of 5 m or greater.

6. The electrolyte of claim 1, wherein the grains sintered to one another have an average grain size of 5 µm or less.

* * * * *

UNITED STATES PATENT AND TRADEMARK OFFICE
CERTIFICATE OF CORRECTION

PATENT NO. : 10,581,115 B2
APPLICATION NO. : 16/295673
DATED : March 3, 2020
INVENTOR(S) : Michael Edward Radding et al.

Page 1 of 1

It is certified that error appears in the above-identified patent and that said Letters Patent is hereby corrected as shown below:

On the Title Page

Page 2, Column 2, item [56], Line 1, delete "Interantional" and insert -- International --, therefor.

Signed and Sealed this
Sixteenth Day of June, 2020

Andrei Iancu
*Director of the United States Patent and Trademark Office*